United States Patent
Jiang et al.

(10) Patent No.: US 11,085,625 B2
(45) Date of Patent: *Aug. 10, 2021

(54) LED LAMP

(71) Applicant: JIAXING SUPER LIGHTING ELECTRIC APPLIANCE CO., LTD, Jiaxing (CN)

(72) Inventors: Tao Jiang, Jiaxing (CN); Mingbin Wang, Jiaxing (CN); Aiming Xiong, Jiaxing (CN); Lin Zhou, Jiaxing (CN)

(73) Assignee: JIAXING SUPER LIGHTING ELECTRIC APPLIANCE CO., LTD, Jiaxing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/859,983

(22) Filed: Apr. 27, 2020

(65) Prior Publication Data

US 2020/0263866 A1 Aug. 20, 2020

Related U.S. Application Data

(63) Continuation of application No. 16/267,747, filed on Feb. 5, 2019, now Pat. No. 10,677,438.

(30) Foreign Application Priority Data

Feb. 8, 2018 (CN) .......................... 201810130085.3
May 18, 2018 (CN) .......................... 201810479044.5
(Continued)

(51) Int. Cl.
*F21V 29/503* (2015.01)
*F21K 9/235* (2016.01)
(Continued)

(52) U.S. Cl.
CPC ............. *F21V 29/503* (2015.01); *F21K 9/235* (2016.08); *F21K 9/237* (2016.08); *F21K 9/238* (2016.08);
(Continued)

(58) Field of Classification Search
CPC ...... F21V 29/503; F21V 29/773; F21V 29/83; F21V 7/0025; F21K 9/66; F21K 9/238;
(Continued)

(56) References Cited

U.S. PATENT DOCUMENTS 7,748,770 B2 7/2010 Heuel et al.
7,748,870 B2 ‡ 7/2010 Chang et al. ........... F21V 29/83
362/29
(Continued)

FOREIGN PATENT DOCUMENTS

CN 201606689 U 10/2010
CN 201606689 U ‡ 10/2010
(Continued)

*Primary Examiner* — Anne M Hines
(74) *Attorney, Agent, or Firm* — Simon Kuang Lu

(57) ABSTRACT

An LED lamp includes: a lamp shell; a passive heat dissipating element having a heat sink connected to the lamp shell, wherein the heat sink comprises fins and a base; a power source disposed in the lamp shell; a light board connected to the base of the passive heat dissipating element and comprising LED chips electrically connected to the power source; and a first heat dissipating channel formed in a first chamber of the lamp shell for dissipating heat generated from the power source while the LED lamp is working; wherein the first heat dissipating channel comprises a first end on the light board to allow air flowing from outside of the LED lamp into the first chamber, and a second end on the upper portion of the lamp shell to allow air flowing from inside of the first chamber out of the LED lamp.

20 Claims, 71 Drawing Sheets

(30) Foreign Application Priority Data

| Date | | |
|---|---|---|
| May 28, 2018 | (CN) | 201810523952.X |
| Jun. 6, 2018 | (CN) | 201810573322.3 |
| Jun. 20, 2018 | (CN) | 201810634571.9 |
| Jul. 12, 2018 | (CN) | 201810763089.5 |
| Jul. 12, 2018 | (CN) | 201810763800.7 |
| Aug. 24, 2018 | (CN) | 201810972904.9 |
| Oct. 9, 2018 | (CN) | 201811172470.0 |
| Nov. 1, 2018 | (CN) | 201811295618.X |
| Nov. 2, 2018 | (CN) | 201811299410.5 |
| Nov. 13, 2018 | (CN) | 201811347198.5 |
| Nov. 19, 2018 | (CN) | 201811378174.6 |
| Dec. 3, 2018 | (CN) | 201811466198.7 |

(51) Int. Cl.

| | |
|---|---|
| F21V 29/77 | (2015.01) |
| F21K 9/238 | (2016.01) |
| F21K 9/237 | (2016.01) |
| F21V 29/83 | (2015.01) |
| F21K 9/66 | (2016.01) |
| F21K 9/68 | (2016.01) |
| H05B 45/50 | (2020.01) |
| H05B 45/395 | (2020.01) |
| F21V 7/00 | (2006.01) |
| H03H 11/04 | (2006.01) |
| F21Y 115/10 | (2016.01) |
| F21Y 105/18 | (2016.01) |
| H03H 7/01 | (2006.01) |

(52) U.S. Cl.
CPC ............... *F21K 9/66* (2016.08); *F21K 9/68* (2016.08); *F21V 7/0025* (2013.01); *F21V 29/773* (2015.01); *F21V 29/83* (2015.01); *H05B 45/395* (2020.01); *H05B 45/50* (2020.01); *F21Y 2105/18* (2016.08); *F21Y 2115/10* (2016.08); *H03H 7/0115* (2013.01); *H03H 11/04* (2013.01)

(58) Field of Classification Search
CPC . F21K 9/68; F21K 9/235; F21K 9/237; H05B 45/395; H05B 45/50
See application file for complete search history.

(56) References Cited

U.S. PATENT DOCUMENTS

| | | | |
|---|---|---|---|
| 8,985,815 B2 | 3/2015 | Chen et al. | |
| 9,341,362 B2 ‡ | 5/2016 | Holmes | F21V 29/83 |
| 9,897,304 B2 ‡ | 2/2018 | Shum | F21V 29/83 |
| 10,677,438 B2 | 6/2020 | Jiang et al. | |
| 2003/0147254 A1 | 8/2003 | Yoneda et al. | |
| 2007/0230188 A1 ‡ | 10/2007 | Lin | F21V 29/773 362/29 |
| 2009/0067182 A1 ‡ | 3/2009 | Hsu | F21S 6/003 362/373 |
| 2009/0141500 A1 | 6/2009 | Peng | |
| 2010/0124058 A1 | 5/2010 | Miller | |
| 2010/0242519 A1 ‡ | 9/2010 | Breidenassel | F21V 29/74 62/264 |
| 2011/0162823 A1 | 7/2011 | Sharma et al. | |
| 2011/0204790 A1 | 8/2011 | Arik et al. | |
| 2011/0234076 A1 ‡ | 9/2011 | Simon | F21V 29/83 313/46 |
| 2012/0085516 A1 ‡ | 4/2012 | McClellan | F21V 15/013 165/80 |
| 2012/0230028 A1 | 9/2012 | Foo | |
| 2013/0163247 A1 ‡ | 6/2013 | Lee | F21V 29/004 362/249.01 |
| 2014/0133153 A1 | 5/2014 | Boomgaarden et al. | |
| 2016/0025322 A1 ‡ | 1/2016 | Chen | F21V 29/773 362/37 |
| 2017/0211771 A1 | 7/2017 | Nishimura et al. | |
| 2017/0276335 A1 | 9/2017 | Yun et al. | |
| 2018/0299114 A1 ‡ | 10/2018 | Inan | F21V 29/77 |
| 2019/0285263 A1 | 9/2019 | Jiang et al. | |
| 2020/0124265 A1 | 4/2020 | Jiang et al. | |
| 2020/0149733 A1 | 5/2020 | Jiang et al. | |
| 2020/0182449 A1 | 6/2020 | Jiang et al. | |
| 2020/0208827 A1 | 7/2020 | Jiang et al. | |

FOREIGN PATENT DOCUMENTS

| | | | | |
|---|---|---|---|---|
| CN | 201651880 U | | 11/2010 | |
| CN | 201651880 U | ‡ | 11/2010 | |
| CN | 102032491 A | ‡ | 4/2011 | |
| CN | 102032491 A | | 4/2011 | |
| CN | 102374427 A | ‡ | 3/2012 | F21V 29/83 |
| CN | 102374427 A | | 3/2012 | |
| CN | 102859256 A | | 1/2013 | |
| CN | 102859256 A | ‡ | 1/2013 | |
| CN | 203190364 U | ‡ | 9/2013 | |
| CN | 203190364 U | | 9/2013 | |
| CN | 203442750 U | ‡ | 2/2014 | |
| CN | 203442750 U | | 2/2014 | |
| CN | 203656721 U | | 6/2014 | |
| CN | 203656721 U | ‡ | 6/2014 | |
| CN | 204114712 U | ‡ | 1/2015 | |
| CN | 204114712 U | | 1/2015 | |
| CN | 104728631 A | | 6/2015 | |
| CN | 104728631 A | ‡ | 6/2015 | F21V 3/02 |
| CN | 204717489 U | ‡ | 10/2015 | |
| CN | 204717489 U | | 10/2015 | |
| CN | 204785745 U | ‡ | 11/2015 | |
| CN | 204785745 U | | 11/2015 | |
| CN | 205690117 U | | 11/2016 | |
| CN | 107345628 A | ‡ | 11/2017 | F21V 29/763 |
| CN | 107345628 A | | 11/2017 | |
| CN | 108368977 A | ‡ | 8/2018 | F21V 29/67 |
| CN | 108368977 A | | 8/2018 | |
| KR | 100932192 B1 | ‡ | 12/2009 | |
| KR | 100932192 B1 | | 12/2009 | |

‡ imported from a related application

FIG. 53A                    FIG. 53B

LED LAMP

CROSS-REFERENCE TO RELATED APPLICATIONS

This application is a continuation application of U.S. application Ser. No. 16/267,747 filed on 2019 Feb. 5, which claims priority to the following Chinese Patent Applications Nos. CN 201810130085.3 filed on 2018 Feb. 8, CN 201810479044.5 filed on 2018 May 18, CN 201810523952.X filed on 2018 May 28, CN 201810573322.3 filed on 2018 Jun. 6, CN 201810634571.9 filed on 2018 Jun. 20, CN 201810763800.7 filed on 2018 Jul. 12, CN 201810763089.5 filed on 2018 Jul. 12, CN 201810972904.9 filed on 2018 Aug. 24, CN 201811172470.0 filed on 2018 Oct. 9, CN 201811295618.X filed on 2018 Nov. 1, CN 201811299410.5 filed on 2018 Nov. 2, CN 201811347198.5 filed on 2018 Nov. 13, CN 201811378174.6 filed on 2018 Nov. 19, and CN 201811466198.7 filed on 2018 Dec. 3, the disclosures of which are incorporated herein in their entirety by reference.

FIELD OF THE INVENTION

The invention relates to lighting, particularly to high-power LED lamps.

BACKGROUND OF THE INVENTION

Because LED lamps possess advantages of energy saving, high efficiency, environmental protection and long life, they have been widely adopted in the lighting field. For LED lamps used as an energy-saving green light source, a problem of heat dissipation of high-power LED lamps becomes more and more important. Overheating will result in attenuation of lighting efficiency. If waste heat from working high-power LED lamps cannot be effectively dissipated, then the life of LED lamps will be directly negatively affected. As a result, in recent years, solution of the problem of heat dissipation of high-power LED lamps is an important issue for the industry.

In some applications, there may be a weight limit for a whole LED lamp. For example, when an LED lamp is provided with a lamp head with a specific specification and the LED lamp is used in a hanging manner, a maximum weight of the LED lamp is subject to a limited range. Accordingly, other than necessary components such as a power source, a lamp cover and a lamp shell, weight of a heat sink of an LED lamp is restricted to a limited range. For those high-power LED lamps (also known as LED high-bay lights), such as those using power of 150 W~300 W, their luminous flux can reach about 20000 lumens~45000 lumens. In this case, a heat sink must dissipate heat from an LED lamp with 20000~45000 lumens under its weight limit.

Currently mainly available heat dissipating components for LED lamps are fans, heat pipes, heat sinks or their combination to dissipate heat of an LED lamp by thermal conduction, convection and/or radiation. Under a condition of merely adopting passive heat dissipation (without a fan), an overall effect of heat dissipation depends upon thermal conductivity and heat dissipation area of material of the heat sink. Under a condition of the same thermal conductivity, heat sinks merely rely on both convection and radiation to dissipate heat regardless of types thereof. Heat dissipating ability of these two types of heat sinks is in proportion to a heat dissipating area thereof. Thus, under a precondition of a weight limit for a heat sink, how to improve efficiency of heat dissipation of a heat sink is an important way to enhance quality of LED lamps and reduce cost of LED lamps.

A currently available LED lamp generally includes a light source, a heat sink, a power source, a lamp shell and a lamp cover. The light source is fastened onto the heat sink. The power source is disposed in the lamp shell. The lamp shell connects to the heat sink. The lamp shell includes a head for connecting a lamp socket. Currently available LED lamps have the following drawbacks:

1. Concerns with Designs of Heat Sinks:

Under a condition of merely adopting a manner of passive heat dissipation within the weight limit of a heat sink, a problem of heat dissipation of LEDs of some high-power LED lamps may exist so that heat from working LEDs cannot be dissipated timely. Life of these LEDs will be affected after long term use. As an example, a heat sink may include fins, but a relative positional relationship between the fins and LEDs may be arranged so as to make a heat conduction path of the heat from the LEDs to the fins too long to dissipate heat of LEDs fast enough.

Further, certain convection designs between fins of a heat sink may be impractical or ineffective. For example, Chinese patent No. 204717489U teaches a fanless LED projection light. There is no convection from bottom to top between wing sheets of '489's heat sink so that heat in the air cannot be timely dissipated after heat in the wing sheets has been radiated to the air. As a result, the temperature of air around the wing sheets increases. An important factor of affecting thermal radiation of the wing sheets is a temperature difference between the wing sheets and air therearound. Accordingly, a raise in air temperature would affect thermal radiation of the wing sheets.

Moreover, certain structural designs of fins of a heat sink may be impractical or ineffective. For example, Chinese patent No. 107345628A teaches an LED lamp whose fins in a direction of a height of the LED lamp have the same width. For heat dissipation of an LED lamp, fins near LEDs in a direction of a height of the LED lamp are mainly used for conducting heat of the LEDs to the fins and the fins away from the LEDs are used for dissipating heat to air therearound by thermal convection and radiation. The fins away from the LEDs dissipate heat to air therearound by thermal convection and radiation, so no excessive heat dissipating area is required. However, the design of fins of the LED lamp disclosed by '628 would cause increase of overall weight of the LED lamp without proportioned increase of efficiency of heat dissipation.

In addition to the above issues, fins of a heat sink may still have some structural problems. For example, a high-power LED lamp with a larger size, whose width may be above 150 mm and height may be above 180 mm, should match fins with correspondingly larger length and width. If such fins lack sufficient support, they tend to be skewed in assembling. In addition, an unreasonable design of radial outlines of fins would reduce an effect of heat dissipation and may not properly match a lamp.

2. Concerns with Arrangement of Power Sources:

For some high-power LED lamps, such as power of up to 150 W~300 W, heat dissipation of their power sources is also important. If heat from a power source of a working LED lamp cannot be dissipated timely, then life of some electronic components will be affected and finally life of a whole lamp will be affected. Usually, there is no effective heat management between a heat sink and a power source in a currently existing LED lamp. This will result in mutual influence between heat of a heat sink and a power source.

For example, Chinese patent No. 203190364U teaches a heat dissipating structure with double-channeled air convection for a lamp. No effective thermal isolation is provided between its fins and a chamber (a part of the chamber is directly formed on the heat sink) receiving a power source or between its light source and the chamber receiving the power source. Heat from the fins and the light source may therefore directly enter the chamber through thermal conduction to affect the power source in the chamber.

Furthermore, certain layouts of electronic components of a power source may cause problems for heat dissipation. For example, laying out heat-generating components (such as resistors, inductors and transformers) together may be disadvantageous to forming of temperature gradients between the heat-generating components and air therearound so as to adversely affect efficiency of heat radiating from the heat-generating components to air. It is noted that when external air is thermally transferred to the power source and no particular design is provided, then bugs and dust tends to be attached on the power source to affect heat dissipation of the power source.

Besides the problem of heat dissipation, high-power LED lighting possesses relatively heavier weight and a higher working temperature, so a requirement of structure of high mechanic strength under a high temperature should be considered. A general high-power LED lighting is assembled by screwing components to connect. Considering a requirement of distance of insulated creepage, a lamp neck above a heat sink usually adopts a plastic material. The most common structure is that a casing of a plastic element is together with a lamp head thread, the lamp head is screwed to the casing and riveting pinholes are added to implement positioning connection. Connection using screws not only requires complicated process in manufacture, but also cost is higher. Thus, mechanic connection of high-power LED lighting is another important issue for these products.

When packing and shipping of LED lamps are involved, a lamp cover of an LED lamp protrudes from a light board. For example, in Chinese patent No. 107345628A, the lamp cover of the LED lamp may touch external objects to cause damage. Therefore, when packing and shipping, the lamp cover needs to be particularly protected to avoid damage resulting from collision. This will increase packing cost.

When considering light emission of LED lamps, usually, under an ideal condition, light from an LED lamp is expected to be projected onto a specific area under the LED lamp to guarantee intensity in this area. However, in fact, a considerably large part of light may be projected to a lateral area to cause waste of light and decrease of output efficiency of light. For example, Chinese patent No. 107345628A discloses a solid state lamp including a solid state light source on a circuit board. A part of the solid state light source is laterally disposed. A lamp is usually used with the light source. A solid state light source which is laterally disposed may use a lamp to reflect its light to project downward. In the process of reflection, there is typically light loss. Thus, efficiency of light emission will be adversely affected.

Furthermore, for circuits, a bias of conventional driving circuits is generated by acquiring voltage division on a mother line. In applications of HID-LED (High intensity Discharge-LED), however, large capacitors are usually used in conventional biasing circuits to avoid excessive power waste. This may cause a situation where the HID-LED cannot be lit up immediately. Typical starting time of general biasing is about 1 second. This can affect convenience of use.

OBJECT AND SUMMARY OF THE INVENTION

The LED lamp described in the present disclosure includes an LED (light emitting diode) lamp including a lamp shell; a passive heat dissipating element having a heat sink connected to the lamp shell, wherein the heat sink comprises fins and a base; a power source disposed in the lamp shell; a light board connected to the base of the passive heat dissipating element and comprising LED chips electrically connected to the power source; and a first heat dissipating channel formed in a first chamber of the lamp shell for dissipating heat generated from the power source while the LED lamp is working; wherein the first heat dissipating channel comprises a first end on the light board to allow air flowing from outside of the LED lamp into the first chamber, and a second end on the upper portion of the lamp shell to allow air flowing from inside of the first chamber out of the LED lamp.

In some embodiment, a second heat dissipating channel formed between the fins and the base of the heat sink for dissipating the heat generated from the LED chips and transferred to the heat sink.

In some embodiment, the second heat dissipating channel comprises a third end on the light board to allow air flowing from outside of the LED lamp into the second heat dissipating channel, and flowing out from spaces between every adjacent two of the fins.

In some embodiment, a weight of the heat sink accounts for at least 50% of that of the LED lamp, and a volume of the heat sink accounts for at least 20% of an overall volume of the LED lamp.

In some embodiment, a volume of the heat sink accounts for 20%~60% of an overall volume of the LED lamp.

In some embodiment, the heat sink comprises first fins and second fins, bottoms of both the first fins and the second fins in an axis of the LED lamp connect to the base, the first fins interlace with the second fins at regular intervals, and each of the second fins is of a Y-shape.

In some embodiment, further comprising a lamp cover with a light output surface and an end surface, wherein the end surface is formed with a vent to let air flowing from outside of the LED lamp into both the first heat dissipating channel and the second heat dissipating channel through the vent.

In some embodiment, a ratio of area of the light output surface to area of the end surface is 4~7.

In some embodiment, a ratio of area of the lamp cover to area of the end surface is 6~7.

In some embodiment, further comprising an inner reflecting surface disposed inside the light output surface of the lamp cover, wherein the inner reflecting surface is disposed in a position of an inner circle of the array of the LED chips.

In some embodiment, further comprising an outer reflecting surface disposed in the outer circle of the array of the LED chips, wherein the outer reflecting surface is set to correspond to the LED chips on the light board.

In some embodiment, the inner reflecting surface is configured to reflect part of light emitted from the innermost LED chips of the array of LED chips, the outer reflecting surface is configured to reflect part of light emitted from the outermost LED chips of the array of LED chips, and the outermost LED chips of the array of LED chips are greater than the innermost LED chips of array of LED chips in number, and the outer reflecting surface is greater than the inner reflecting surface in area.

In some embodiment, a relationship as follows is satisfied between the LED chips and the inner and outer reflecting surface:

$$(A1/N1):(A2/N2)=0.4\sim1$$

where A1 and A2 respectively represent area of the inner and outer reflecting surface; where N1 and N2 respectively represent number of the innermost and outermost of the array of LED chips of the light board.

In some embodiment, an angle is formed between two extending lines of both the inner and outer reflecting surfaces, and the angle is between 80 degrees and 150 degrees.

In some embodiment, further comprising a second chamber formed between the lamp cover and the light board, and the light board and the LED chips of the light board are located in the second chamber.

In some embodiment, the distance between the light output surface and the light board is gradually outwardly larger and larger, such that the light output surface is made concave in shape.

In some embodiment, further comprising a third heat dissipating channel formed between adjacent two of the fins or in a space between two sheets extending from a single of the fins of the heat sink, such that air flows from outside of the LED lamp into the third heat dissipating channel through the radial outer portion of the LED lamp to bring out heat radiated from the heat sink to air.

In some embodiment, the base of the heat sink further has a lower end located under the base and protruding from the light board in an axis direction of the LED lamp.

In some embodiment, the fins of the heat sink comprises a first portion and a second portion in a radial direction of the LED lamp, and the first portion is less than the second portion in curvature.

In some embodiment, the heat sink includes first heat dissipating units and second heat dissipating units, both the first heat dissipating units and the second heat dissipating units are of fin type; wherein each of the first heat dissipating units includes a first fin radially arranged on the heat sink and a radial first channel, the first channel is a gap between two of the first heat dissipating units.

Various aspects of the disclosed embodiments may result in certain advantages, as described below.

1. Heat in the first heat dissipating channel from the working power source can be brought out. The second heat dissipating channel can enhance convection of the heat sink. Both the first and second heat dissipating channels can enhance efficiency of natural convection of the whole lamp so as to reduce required area of heat dissipation of the heat sink.

2. The aperture may simultaneously communicate with both the first heat dissipating channel and the second heat dissipating channel and the apertures may be located in a central region of the light board so that the aperture forms a common air intake of both the first heat dissipating channel and the second heat dissipating channel. As a result, area of the light board may be occupied as little as possible to prevent the region of the light board where LED chips are placed from being occupied by other air intakes.

3. Weight of the heat sink may account for above 50% of overall weight of the LED lamp, and volume of the heat sink may account for above 20% of overall volume of the LED lamp. Under a condition of the same thermal conductivity of the heat sink, the larger the heat sink accounting for a percentage of overall volume of the LED lamp is, the larger the available area of heat dissipation is. As a result, to a certain extent, when volume of the heat sink accounts for above 20% of overall volume of the LED lamp, there is more usable space in the heat sink to increase area of heat dissipation.

4. By using Y-shaped second fins, the heat sink can obtain more area of heat dissipation under the same volume.

5. The vent in the first portion may have greater area than the vent in the second portion, which may be advantageous to most air entering the first heat dissipating channel so as to improve heat dissipation to the power source and to prevent electronic components of the power source from aging rapidly due to being heated.

BRIEF DESCRIPTION OF THE DRAWINGS

The following detailed descriptions, given by way of example, and not intended to limit the present invention solely thereto, will be best be understood in conjunction with the accompanying figures:

FIGS. 53A~53C are schematic views of some embodiments of the power source board;

DETAILED DESCRIPTION OF THE EMBODIMENTS

To make the present invention understandable and readable, the following disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just examples and many implementations and variations are possible without the details provided herein. Some terms mentioned in the following description, such as "in an axis", "above" or "under", are used for clear structural relationship of elements, but not a limit to the present invention. In the present invention, the terms "perpendicular", "horizontal" and "parallel" are defined in a range of ±10% based on a standard definition. For example, "perpendicular" (perpendicularity) means the relationship between two lines which meet at a right angle (90 degrees). However, in the present invention, "perpendicular" may encompass a range from 80 degrees to 100 degrees. In addition, "using condition" or "using status" mentioned in the present disclosure means a "head-up" hanging scenario. Exceptions will be particularly described.

Figure 1:
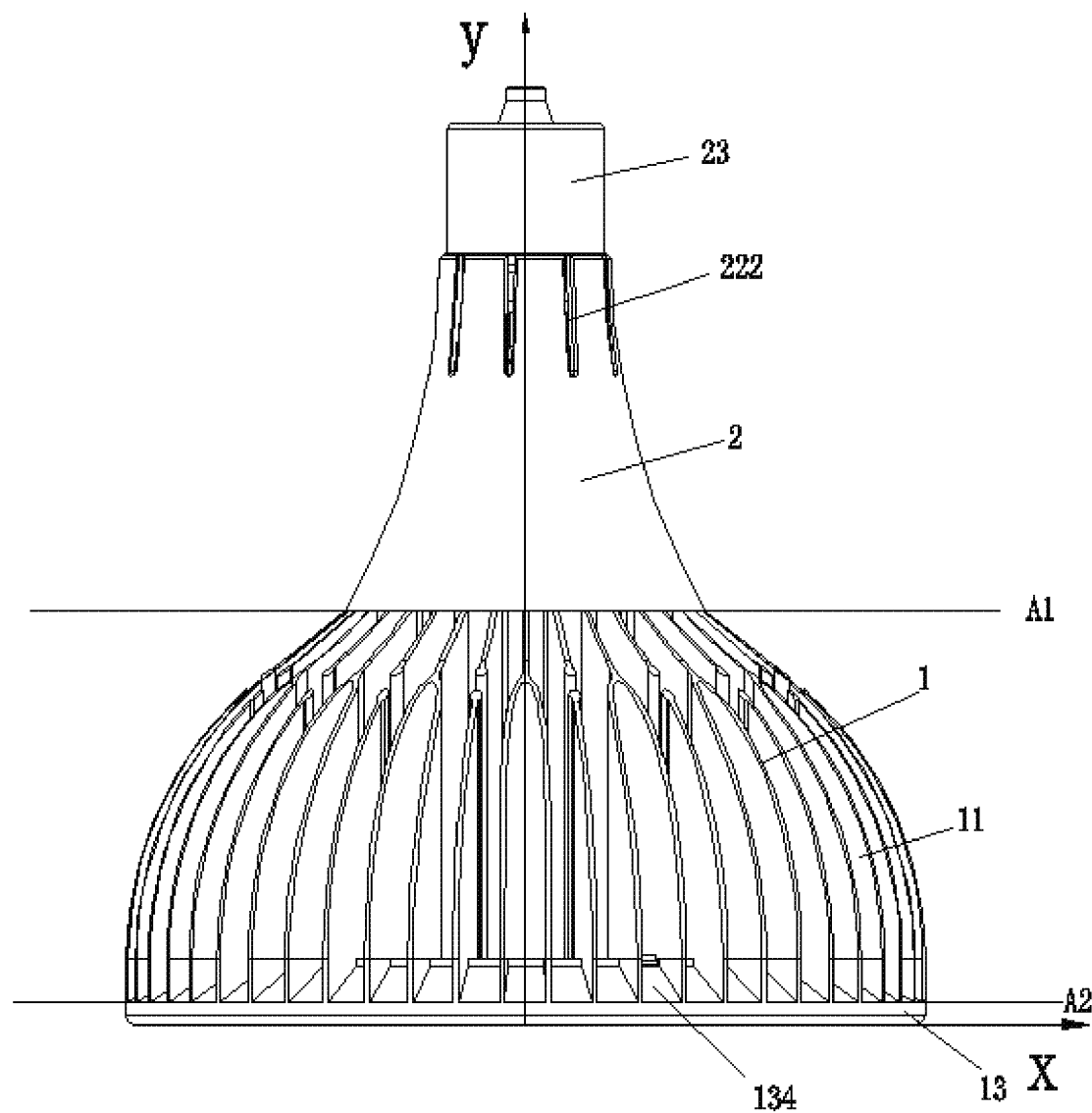
FIG. 1 is a structural schematic view of one embodiment of an LED lamp according to aspects of the invention.
Figure 2:
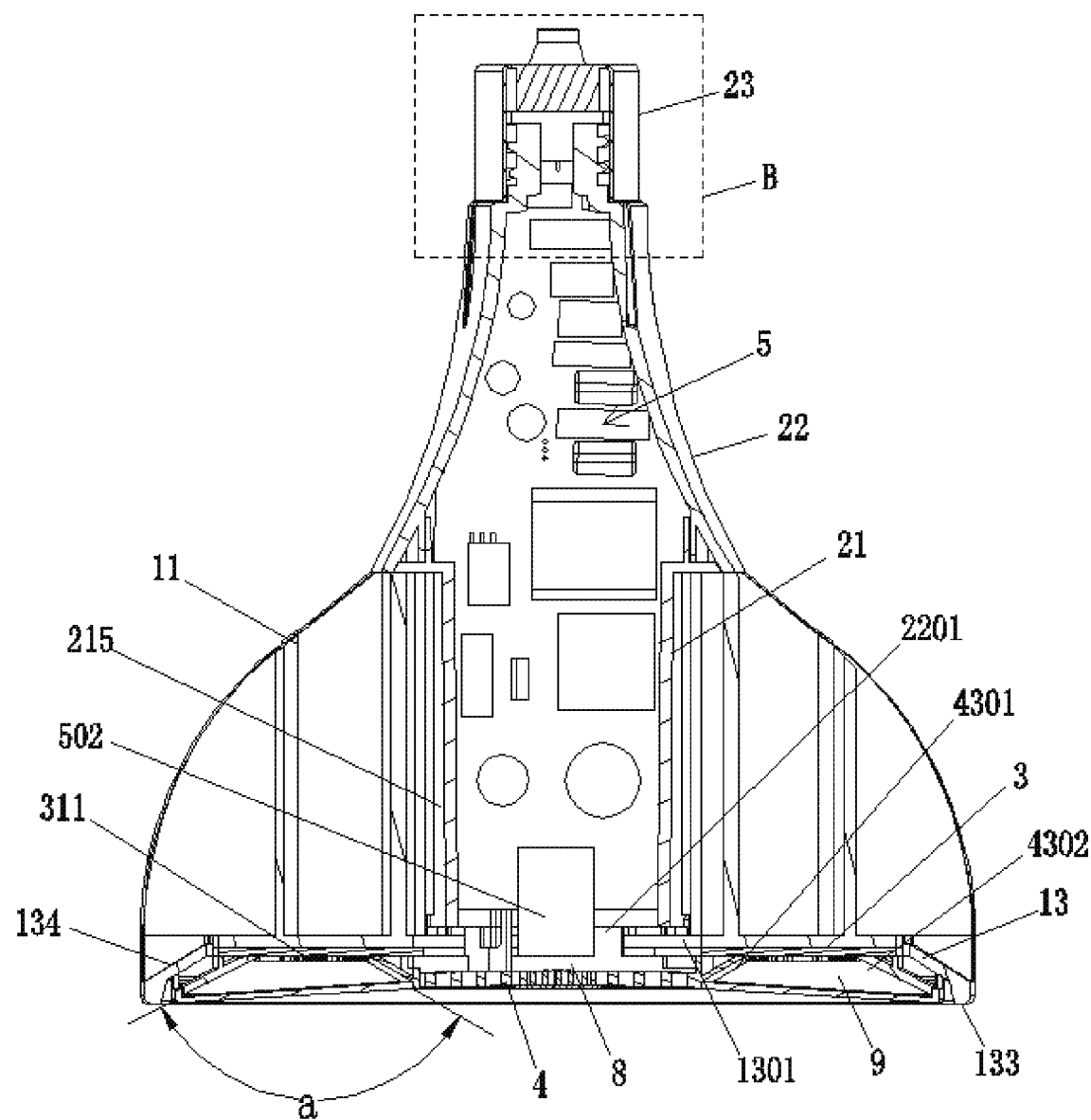
FIG. 2 is a schematic cross-sectional view of the LED lamp of FIG. 1.
Figure 3:
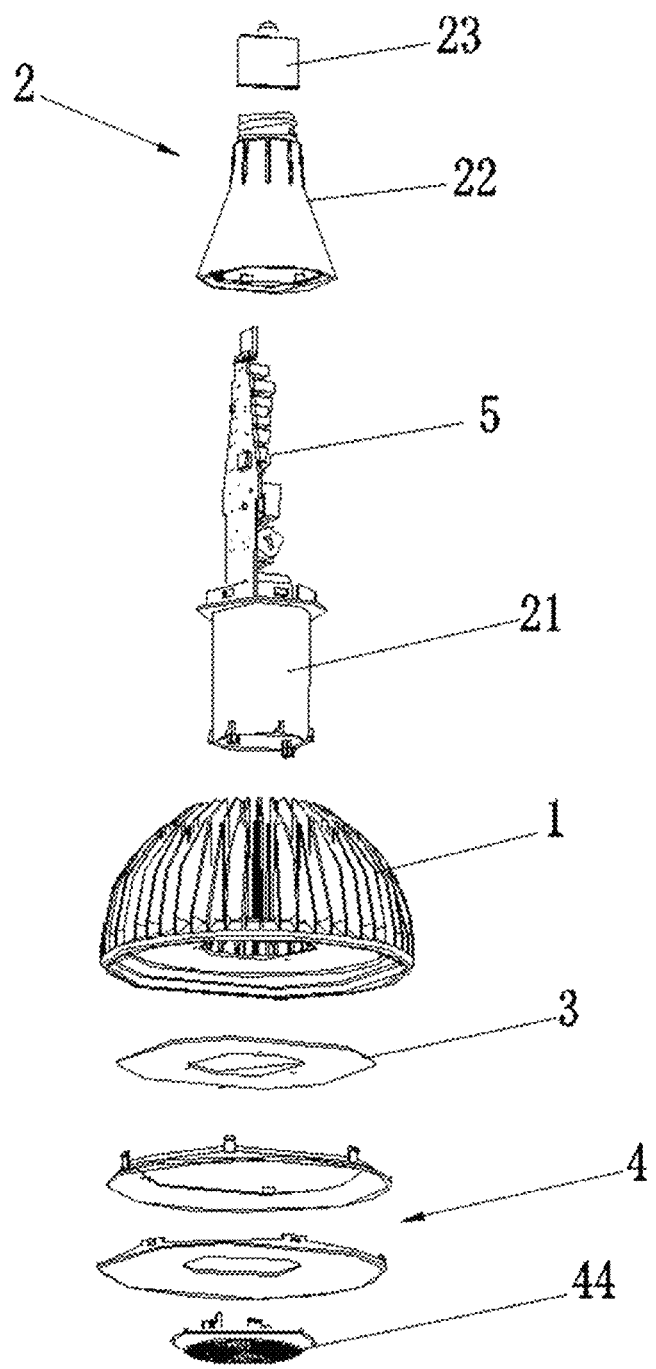
FIG. 3 is an exploded view of the LED lamp of FIG. 1.

FIG. 1 is a structural schematic view of an embodiment of an LED lamp according to certain aspects of the invention. FIG. 2 is a schematic cross-sectional view of the LED lamp of FIG. 1. FIG. 3 is an exploded view of the LED lamp of FIG. 1. As shown in the figures, the LED lamp includes a heat sink 1, a lamp shell 2, a light board 3, a lamp cover 4 and a power source 5. In this embodiment, the light board 3 is connected to the heat sink 1 by attachment for rapidly transferring heat from the light board 3 to the heat sink 1 when the LED lamp is working. In some embodiments, the light board 3 is riveted to the heat sink 1. In some embodiments, the light board 3 is screwed to the heat sink 1. In some embodiments, the light board 3 is welded to the heat sink 1. In some embodiments, the light board 3 is adhered to the heat sink 1. In this embodiment, the lamp shell 2 is connected to the heat sink 1, the lamp cover 4 covers the light board 3 to make light emitted from the light board 3 pass through the lamp cover to project out. The power source 5 is located in a chamber of the lamp shell 2 and the power source 5 is EC to the LED chips 311 for providing electricity.

Figure 4:
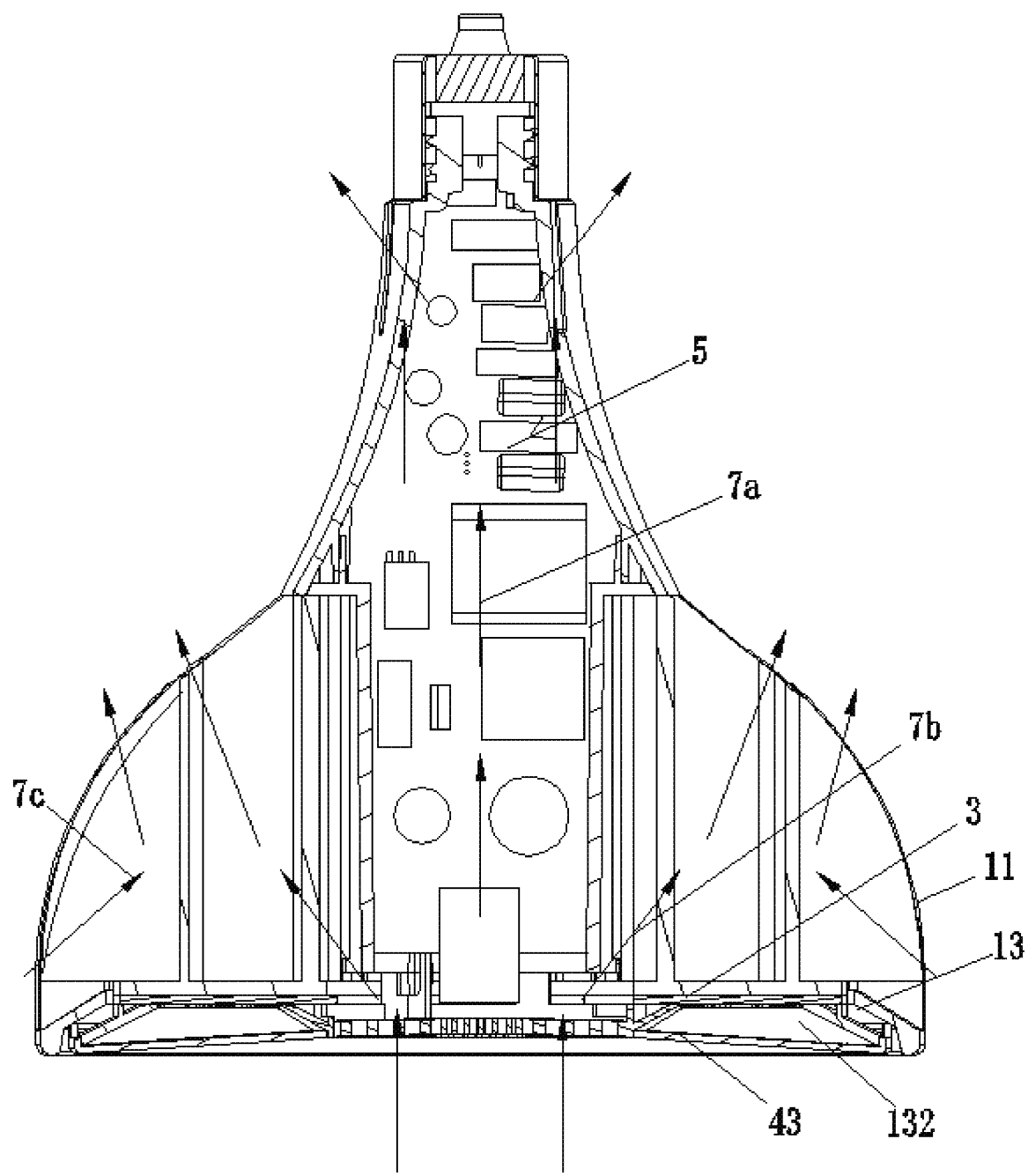
FIG. 4 is a schematic cross-sectional view of the LED lamp of FIG. 1, which shows the first heat dissipating channel and the second heat dissipating channel.

FIG. 4 is a schematic cross-sectional view of the LED lamp. As shown in FIGS. 2 and 4, the chamber of the lamp shell 2 of this embodiment is formed with a first heat dissipating channel 7a. An end of the first heat dissipating channel is formed with a first air inlet 2201. An opposite end of the lamp shell 2 is formed with a venting hole 222 (at an upper portion of the lamp neck 22). Air flows into the first heat dissipating channel 2201 and flows out from the venting hole 222 for bringing out heat in the first heat dissipating channel 7a (primarily, heat of the working power source 5). As for the path of heat dissipation, heat generated from the heat-generating components of the working power source 5 is transferred to air (around the heat-generating components) in the first heat dissipating channel 7a by thermal radiation first, and then external air enters the first heat dissipating channel 7a by convection to bring out internal air to make heat dissipation. In this embodiment, the venting hole 222 at the lamp neck 22 can also make direct heat dissipation.

As shown in FIGS. 1, 2 and 4, a second heat dissipating channel 7b is formed in the fins and the base 13 of the heat sink 1. The second heat dissipating channel 7b has a second air inlet 1301. In this embodiment, the first air inlet 2201 and the second air inlet 1301 share the same opening formed on the light board 3. This will be described in more detail later. Air flows from outside of the LED lamp into the second air inlet 1301, passes through the second heat dissipating channel 7b and finally flows out from spaces between the fins 11 so as to bring out heat of the fins 11 to enhance heat dissipation of the fins 11. As for the path of heat dissipation, heat generated from the LED chips is conducted to the heat sink 1, the fins 11 of the heat sink 1 radiate the heat to surrounding air, and convection is performed in the second heat dissipating channel 7b to bring out heated air in the heat sink 1 to make heat dissipation.

As shown in FIGS. 1 and 4, the heat sink 1 is provided with a third heat dissipating channel 7c formed between adjacent two of the fins 11 or in a space between two sheets extending from a single fin 11. A radial outer portion between two fins 11 forms an intake of the third heat dissipating channel 7c. Air flows into the third heat dissipating channel 7c through the radial outer portion of the LED lamp to bring out heat radiated from the heat sink 11 to air.

Figure 5:
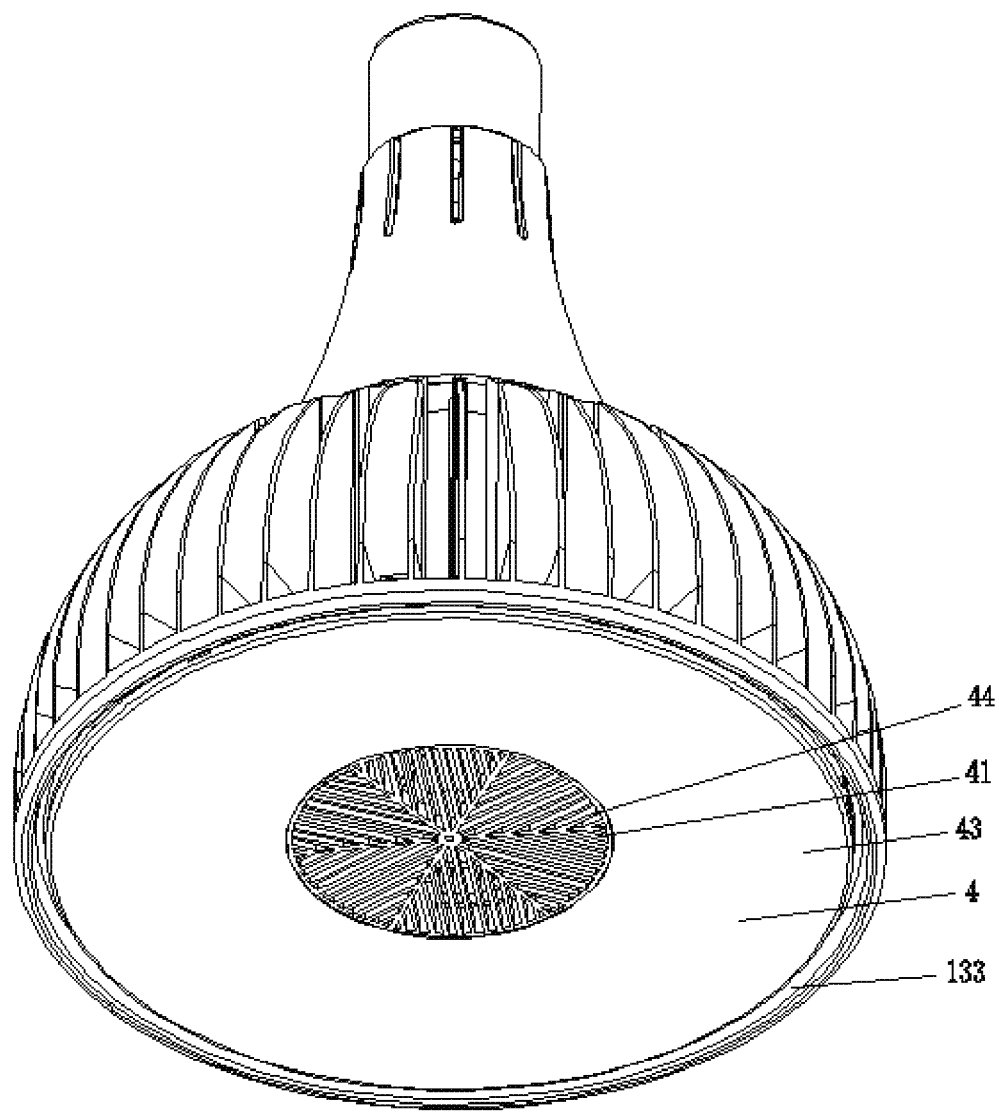
FIG. 5 is a perspective view of the LED lamp of FIG. 1.
Figure 6:
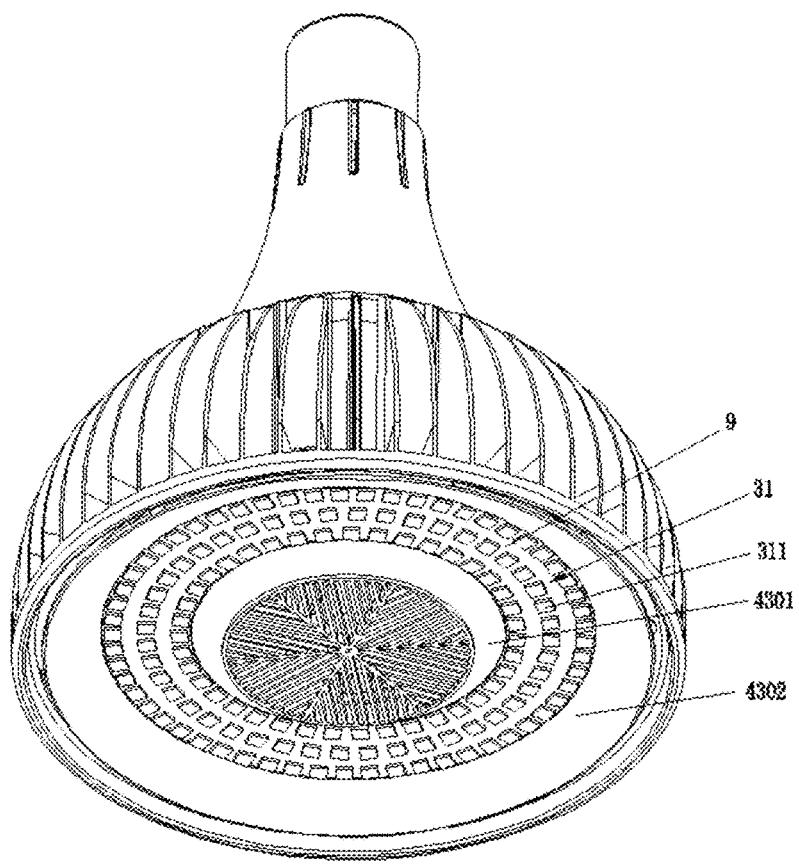
FIG. 6 is a structural schematic view of FIG. 5 without the light output surface.

FIG. 5 is a perspective view of the LED lamp of an embodiment, which shows assembling of the heat sink 1 and the lamp cover 4. FIG. 6 is a structural schematic view of FIG. 5 without the light output surface 43. As shown in FIGS. 5 and 6, in this embodiment, the lamp cover 4 includes a light output surface 43 and an end surface 44 with a vent 41. Air flows into both the first heat dissipating channel 7a and the second heat dissipating channel 7b through the vent 41. When the LED chips 311 (shown in FIG. 6) are illuminated, the light passes through the light output surface 43 to be projected from the lamp cover 4. In this embodiment, the light output surface 43 may use currently available light-permeable material such as glass, PC, etc. The term "LED chip" mentioned in all embodiments of the invention means all light sources with one or more LEDs (light emitting diodes) as a main part, and includes but is not limited to an LED bead, an LED strip or an LED filament. Thus, the LED chip mentioned herein may be equivalent to an LED bead, an LED strip or an LED filament. As shown in FIG. 5, in this embodiment, the ratio of area of the light output surface 43 to area of the end surface 44 is 4~7. Preferably, the ratio of area of the light output surface 43 (area of a single side of the light output surface 43, i.e. area of surface of the side away from the LED chips 311) to area of the end surface 44 (area of a single side of the end surface 44, i.e. area of surface of the side away from the LED chips 311, including area of the vent 41) is 5~6. More preferably, the ratio of area of the light output surface 43 to area of the end surface 44 is 5.5. The end surface 44 is used for allowing air to pass to enter both the first heat dissipating channel 7a and the second heat dissipating channel 7b. The light output surface 43 allows light from the light source to output. As a result, a balance can be accomplished between the light output and the heat dissipation. In this embodiment, to satisfy the requirement of air intake of both the first heat dissipating channel 7a and the second heat dissipating channel 7b, the ratio of area of the lamp cover 4 to area of the end surface 44 is 6~7. As a result, a balance can be accomplished between the light output and air required by the heat dissipation.

In this embodiment, area of the light output surface 43 (area of a single side of the light output surface 43, i.e. area of surface of the side away from the LED chips 311) is above three times as large as area of light emitting surface of all the LED chips 31 but does not exceed ten times. Width of the light output region can be controlled when it is provided sufficiently.

Figure 7:
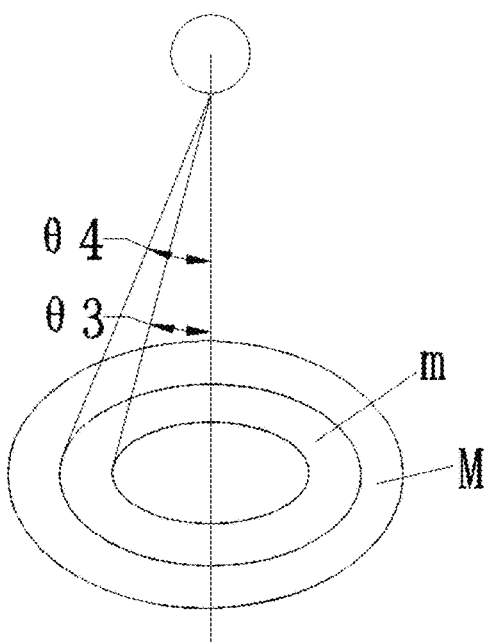
FIG. 7 is a schematic view of light projection of the LED lamp of FIG. 1.
Figure 8:
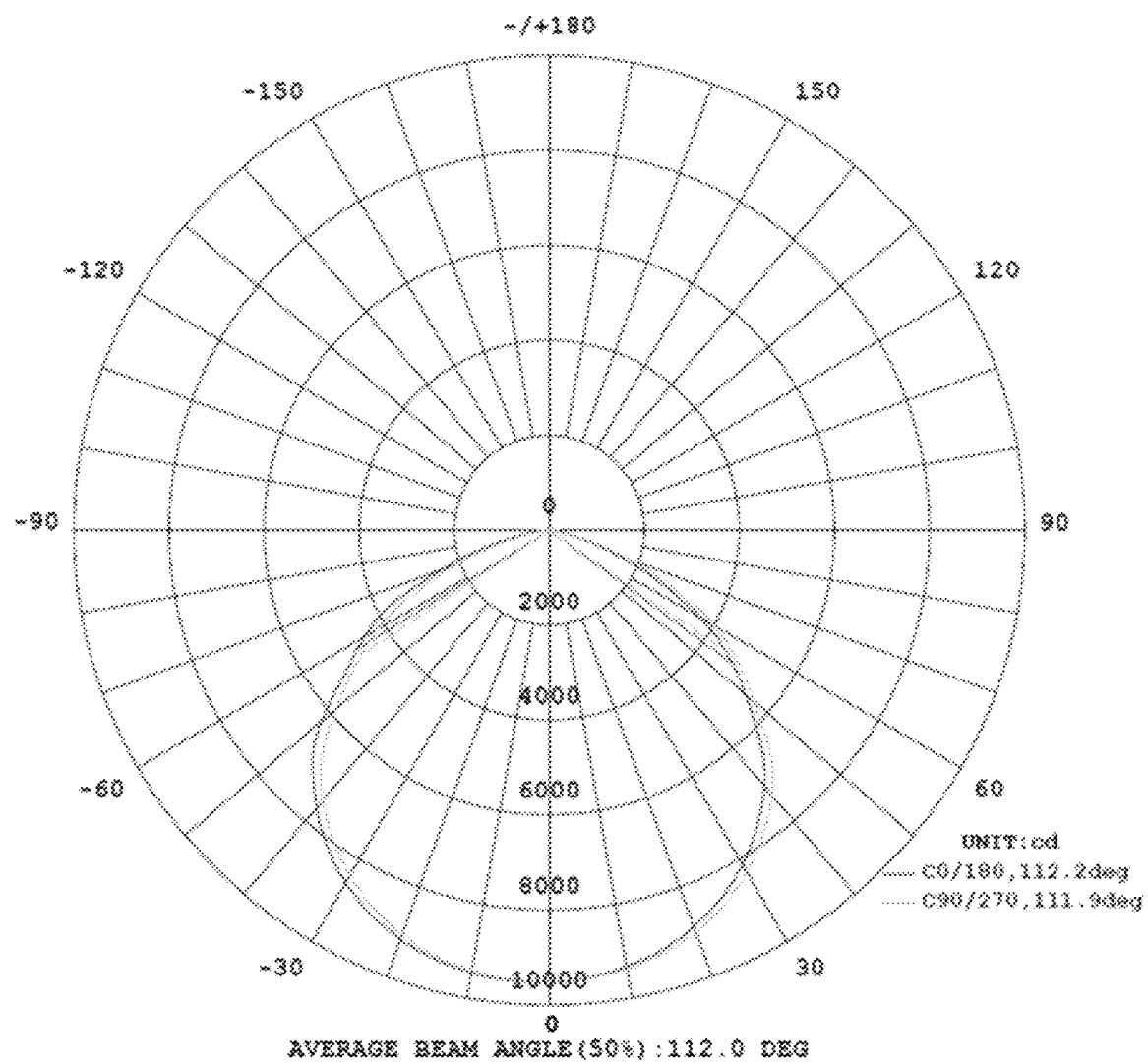
FIG. 8 is a light pattern of FIG. 7.

As shown in FIGS. 5 and 6, in this embodiment, an inner reflecting surface 4301 is disposed inside the light output surface 43 of the lamp cover 4. The inner reflecting surface 4301 is disposed in the inner circle of the array of LED chips 311. In an embodiment, an outer reflecting surface 4302 is disposed in the outer circle of the array of LED chips 311. The outer reflecting surface 4302 corresponds to the LED chips 311 on the light board 3. The arrangement of both the inner reflecting surface 4301 and the outer reflecting surface 4302 is used for adjusting a light emitting range of the LED chip set 31 to make the light concentrated and to increase brightness in a local area. For example, under the condition of the same luminous flux, illuminance of the LED lamp can be increased. In one example, all the LED chips 311 in this embodiment are mounted on the bottom side of the light board 3 (in a using status). In this embodiment, the LED lamp of the present embodiment do not emit lateral light from the LED chips 311. When working, the primary light emitting surfaces of the LED chips 311 are completely downward. At least 60% of the light from the LED chips 311 are emitted through the light output surface 43 without reflection. As a result, in comparison with those LED lamps with lateral light (the lateral light is reflected by a cover or a lampshade to be emitted downward, and in theory there must be part of light loss in the process of reflection.) The LED chips 311 in this embodiment possess better light emitting efficiency. In one example, under the condition of the same lumen value (luminous flux), the LED lamp in the present embodiment possesses higher illuminance. And the emitted light can be concentrated to increase illuminance in a local area by the arrangement of both the inner reflecting surface 4301 and the outer reflecting surface 4302, for example, in an area under the LED lamp between 120 degrees and 130 degrees (a light emitting range under the LED lamp between 120 degrees and 130 degrees). When the LED lamp is installed at a relatively high position, in the same angular range of light emitting, the lit area of the LED lamp still satisfies the requirement and illuminance in this area can be higher. FIG. 7 is a schematic view of light transmission of this embodiment and FIG. 8 is a light pattern of FIG. 7. As shown in FIGS. 5-8, in the aspect of the light emitting effect, in the projected area of the LED lamp, i.e. the projected area M under the LED lamp, there is a light concentrating area m within the projected area M, the LED lamp including the reflecting surface reflects at least part of light from the LED chips 311 onto the light concentrated area m to increase brightness of the light concentrated area m. The reflecting surface includes the inner reflecting surface 4301 and the outer reflecting surface 4302. Both the inner reflecting surface 4301 and the outer reflecting surface 4302 reflect at least part of light from the LED chips 311 onto the light concentrated area m. Preferably, in this embodiment, at least 5% of luminous flux of the light source is reflected to pass through the light output surface 43. In practice, total luminous flux of the light reflected by both the inner reflecting surface 4301 and the outer reflecting surface 4302 and emitted through the light output surface 43 is at least 1000 lm. Preferably, total luminous flux of the light reflected by both the inner reflecting surface 4301 and the outer reflecting surface 4302 and emitted through the light output surface 43 is at least 1500 lm. Total luminous flux of the light reflected by the outer reflecting surface 4302 is greater than that of the light reflected by the inner reflecting surface 4301. This shows that, about the problem of glare resulting from an LED lamp with high lumen, disposing the outer reflecting area 4302 can reflect considerable part of lateral luminous flux. This can significantly reduce the glare. In this embodiment, the light concentrated area m is an annular region. In this embodiment, a center angle between an inner edge of the light concentrated area m and an axis of the LED lamp is 20 degrees, and a center angle between an outer edge of the light concentrated area m and an axis of the LED lamp is 50 degrees. In this embodiment, luminous flux of the light projected by the LED lamp onto the light concentrated area m accounts for 35%~50% of the total luminous flux, so that the light concentrated area m possesses a better lighting effect. In addition, by the arrangement of both the inner reflecting surface 4301 and the outer reflecting surface 4302, not only can the lateral light be reduced to prevent glare, but also at least part of light from the LED chips 311 can be reflected onto the projected area M to enhance illuminance in the projected area M.

The inner reflecting surface 4301 is used for reflecting part of light emitted from the innermost LED chips 311 of the LED chip set 31. The outer reflecting surface 4302 is used for reflecting part of light emitted from the outermost LED chips of the LED chipset 31. The outermost LED chips 311 are greater than the innermost LED chips 311 in number. The outer reflecting surface 4302 is greater than the inner reflecting surface 4301 in area. Because the outermost portion of the LED chip set 31 includes more LED chips than the innermost portion, larger reflecting area is beneficial to regulate light output.

In this embodiment, the inner reflecting surface 4301 and the outer reflecting surface 4302 have first area A1 and second area A2, respectively. The LED chips 311 in the outermost portion of the LED chip set 31 and in the innermost portion of the LED chip set 31 are N1 and N2 in number, respectively. Their relationship is:

$(A1/N1):(A2/N2)=0.4\sim1$

When the ratio of area of the inner reflecting surface 4301 corresponding to a single LED chip 311 in the innermost portion of the LED chip set 31 to area of the outer reflecting surface 4302 corresponding to a single LED chip 311 in the outermost portion of the LED chip set 31 falls in the above range, both the LED chips 311 in the innermost portion of the LED chip set 31 and the LED chips 311 in the outermost portion of the LED chip set 31 have a better effect of light output.

As shown in FIG. 6, an inner edge of the inner reflecting surface 4301 abuts against the light board 3 to prevent light from passing through gaps between the inner reflecting surface 4301 and the light board 3 to avoid loss of part of light. Identically, an inner edge of the outer reflecting surface 4302 abuts against the light board 3 to prevent light from passing through gaps between the outer reflecting surface 4302 and the light board 3 to avoid loss of part of light.

As shown in FIG. 2, in this embodiment, an angle a is formed between two extending lines of both the inner and outer reflecting surfaces 4301, 4302. The angle a is between 80 degrees and 150 degrees. Preferably, the angle a is between 90 degrees and 135 degrees. More preferably, the angle a is between 100 degrees and 120 degrees. A reflecting-cup-like structure is formed between the inner and outer reflecting surfaces 4301, 4302 so as to control a light output range of the LED chips 311 or increase local intensity. In this embodiment, an angle between the outer reflecting surface 4302 and the light board 2 is 30 to 60 degrees. In some embodiments, the angle is 40 to 50 degrees.

As shown in FIG. 2, in this embodiment, the inner reflecting surface 4301 is lower than the outer reflecting surface 4302 in height. The height means a height of each of the both in an axis of the LED lamp. By the configuration of the inner reflecting surface 4301 being lower than the outer reflecting surface 4302 in height, decrease of a light distribution under the LED lamp can be avoided and a central portion of the light distribution region of the LED lamp can be prevented to be a dark part. In this embodiment, height of the outer reflecting surface 4302 in the axis of the LED lamp is not greater than 20 mm. Preferably, height of the outer reflecting surface 4302 in the axis of the LED lamp is not greater than 15 mm. On the other hand, to control overall height of the LED lamp, height of the outer reflecting surface 4302 accounts for not over 9% of overall height of the LED lamp. Preferably, height of the outer reflecting surface 4302 accounts for not over 6% of overall height of the LED lamp. As for functions of the outer reflecting surface 4302, in some embodiments, height of the outer reflecting surface 4302 has to account for above 2% of overall height of the LED lamp. Preferably, in some embodiments, height of the outer reflecting surface 4302 accounts for above 3% of overall height of the LED lamp. In one example, comprehensively considering control of height of the LED lamp and functions of reflection, light concentration, anti-glare, etc., it is necessary that height of the outer reflecting surface 4302 accounts for 2%~9% of overall height of the LED lamp. Preferably, height of the outer reflecting surface 4302 accounts for 3%~6% of overall height of the LED lamp.

Figure 9:
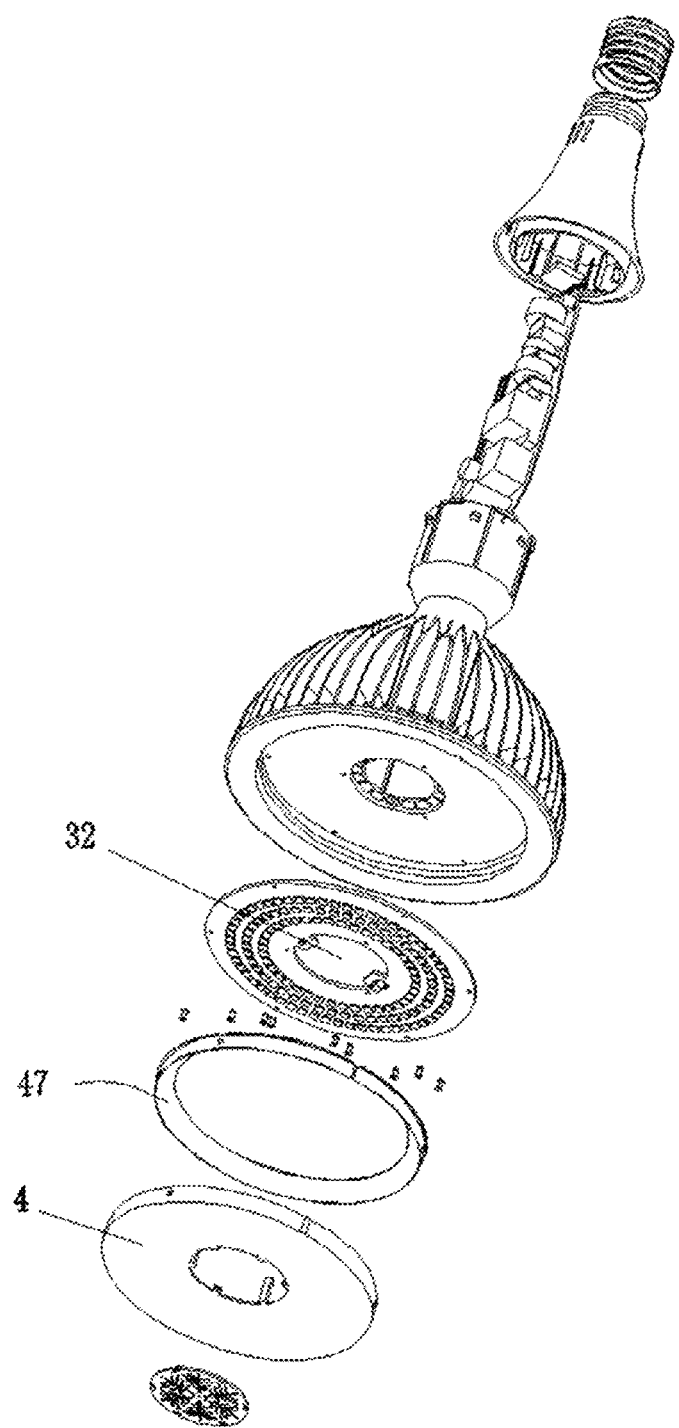
FIG. 9 is an exploded view of another embodiment of an LED lamp according to aspects of the invention, which shows a shading ring.

In the LED lamps in some embodiments, both the inner and outer reflecting surfaces can be omitted, for example, a shading ring 47 may be disposed. As shown in FIG. 9, the shading ring 47 is disposed on a periphery of the lamp cover 4 to improve efficiency of light output of the lamp. A surface of the shading ring 47 possesses a reflecting effect (similar to the outer reflecting surface 4302 as mentioned in the previous embodiment). When the lamp cover 4 is attached on the heat sink 1, the shading ring 47 nears a periphery of the light board 3, for example, an outer diameter of the shading ring 47 is the same as or slightly greater than that of the light board 3.

As show in FIGS. 5 and 6, in this embodiment, in order to prevent dust from covering on the LED chips 311 to reduce light efficiency of the LED chips or affect heat dissipation of the LED chips 311, the LED chips 311 may be received in a sealed room. For example, a sealed chamber 9 is formed between the light output surface 43, the inner reflecting surface 4301, the outer reflecting surface 4302 and the light board 3 (this term "sealed" mentioned here may mean "without obvious pores", not including unavoidable gaps in an assembling process). In some embodiments, when omitting both the inner and outer reflecting surfaces 4301, 4302, the sealed chamber 9 is formed between the light output surface 43 and the light board 3 or between the light output surface 43, the heat sink 1 and the light board 3.

Figure 10:
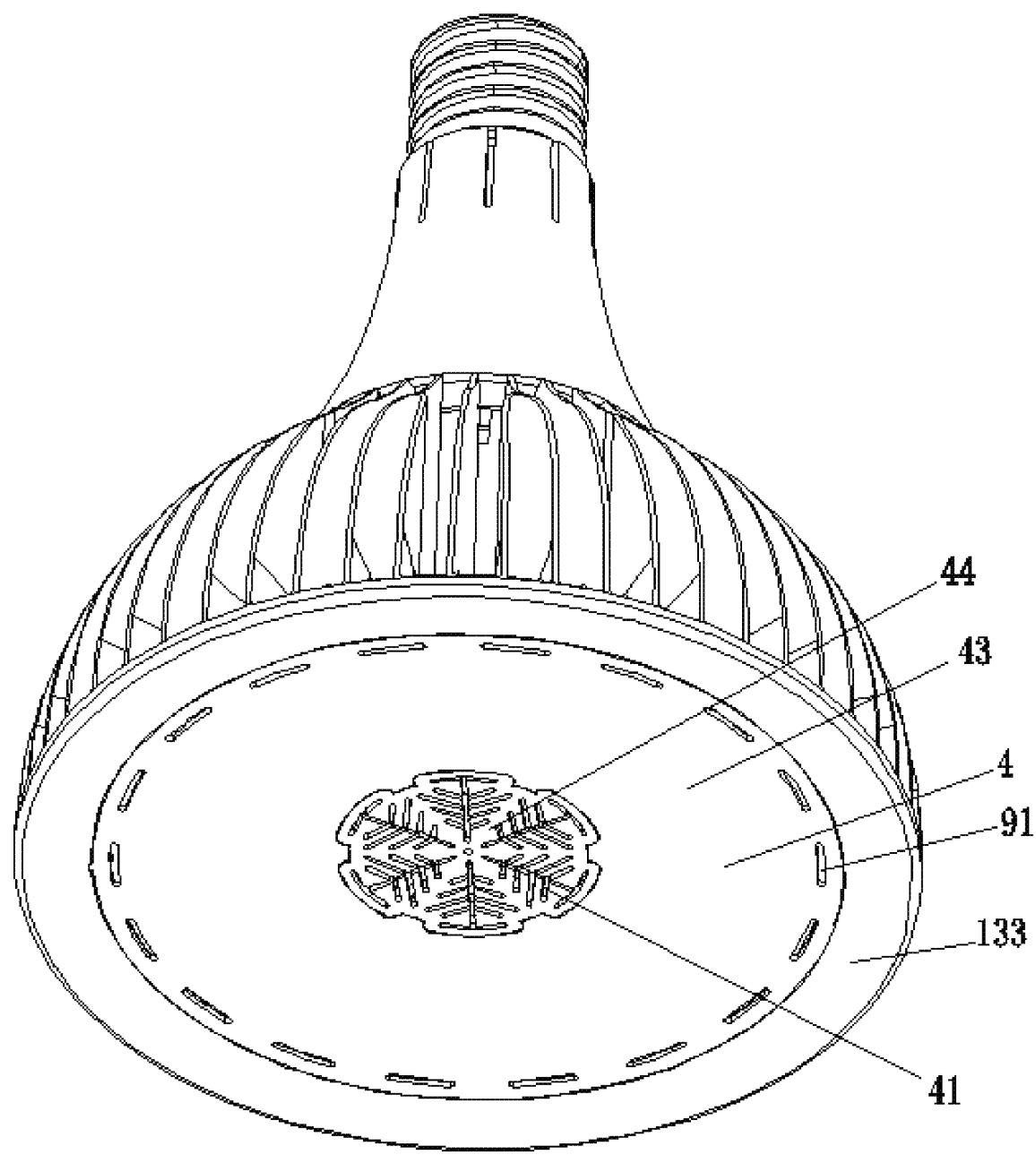
FIG. 10 is a perspective view of another embodiment of an LED lamp according to aspects of the invention.
Figure 11:
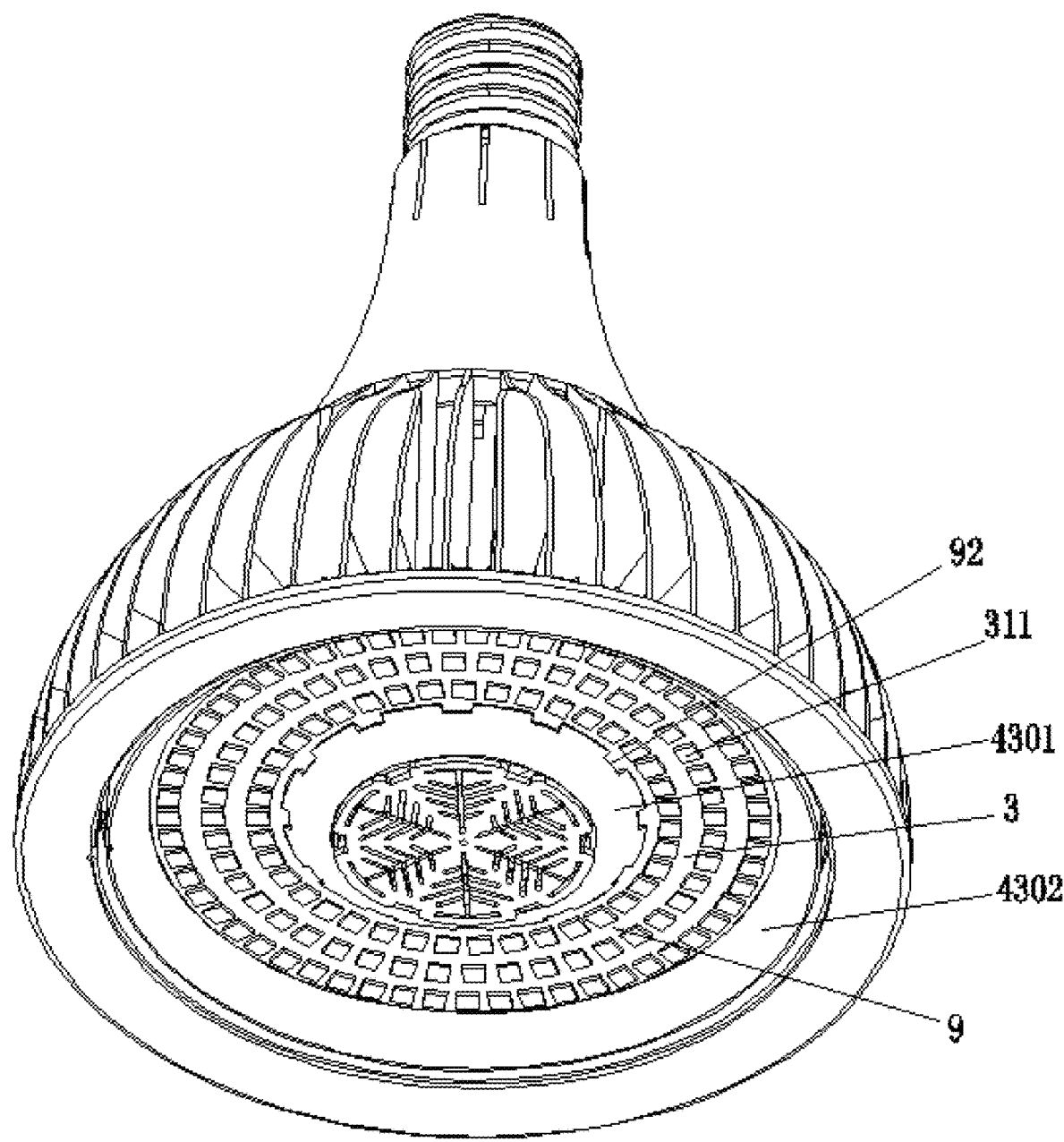
FIG. 11 is a schematic view of FIG. 10 without the light output surface.

FIG. 10 is a perspective view of another embodiment of the LED lamp of the invention. It differs from the above embodiment by holes formed in the chamber 9. FIG. 11 is a schematic view of FIG. 10 without the light output surface 43. As shown in FIGS. 10 and 11, in some embodiments, a chamber 9 is formed between the lamb cover 4 and the light board 3. In detail, the chamber 9 is formed between the light output surface 43, the inner reflecting surface 4301, the outer reflecting surface 4302 and the light board 3 and the LED chips of the light board 3 are located in the chamber 9. The chamber 9 has first apertures 91 and second apertures 92. The first apertures 91 are configured to communicate with the outside, and the second apertures 92 are configured to communicate simultaneously with both the first heat dissipating channel 7a and the second heat dissipating channel 7b. In an aspect of heat dissipation, air convection is formed in the chamber 9 to bring out part of heat generated from the LED chips 311, and outside air flows into the LED lamp through the chamber 9 so as to enhance convection in both the first heat dissipating channel 7a and the second heat dissipating channel 7b. In some embodiments, both the inner and outer reflecting surfaces 4301, 4302 may be omitted. In one example, a chamber 9 is formed between the light output surface 43 and the light board 3.

As shown in FIG. 10, in some embodiments, the light output surface 43 is provided with a hole to form the first apertures 91. Preferably, the first apertures 91 are annularly located at a circumferential portion of the light output surface 43 to make it not affect the effect of light penetration of the light output surface 43. In an aspect of structure, the light output surface 43 may be thermally deformed while the LED lamp is working. The first apertures 91 makes the light output surface 43 have a deformable space to prevent the light output surface 43 from being deformed to press the heat sink and cause damage of the light output surface 43. In this embodiment, the first apertures 91 are annularly located at a circumferential portion of the light output surface 43. As a result, air convection can be enhanced and structural strength of the light output surface 43 heated can also be reinforced.

As shown in FIG. 11, in some embodiments, the inner reflecting surface 4301 is provided with notches to form the second apertures 92. In this embodiment, the second apertures 92 are annularly located at a circumferential portion of the inner reflecting surface 4301. The ratio of the number of the second apertures 92 to that of the first apertures 91 is about 1:1~2, preferably, 1:1.5. Thus, air intake and outtake can be balanced. In other embodiments, both the first apertures 91 and the second apertures 92 may also be formed at other portions of the lamp cover 4 such as the light board 3 or the base 13 of the heat sink 1.

As shown in FIGS. 10 and 11, in some embodiments, a chamber 9 is formed between the lamp cover 4 and the light board 3. In detail, the chamber 9 is formed between the light output surface 43, the inner reflecting surface 4301, the outer reflecting surface 4302 and the light board 3 and the LED chips 311 of the light board 3 are located in the chamber 9. The chamber 9 has pressure release apertures to prevent temperature and pressure in the chamber from being raised by the working LED chips 311. The pressure release aperture may be the first apertures 91 of the light output surface 43, the second apertures 92 of the inner reflecting surface 4301, or holes at the heat sink 1 or the light board 3, which communicate with the chamber 9.

As shown in FIG. 4, the distance between the light output surface 43 and the light board 3 is gradually outwardly larger and larger so as to make the light output surface 43 concave. Thus, in comparison with a flat surface, such a light output surface 43 can be structurally reinforced. In addition, the gradually smooth slant of the light output surface 43 does not has an angle so as to make thickness of the light output surface 43 even not to affect an effect of light output. Finally, in an aspect of use, the light board 3 generates heat from the light source while the LED lamp is working. If the light output surface 43 is a flat plane parallel to the horizon (the LED lamp is hung on a ceiling), then the heated light output surface 43 will horizontally thermally expand. As a result, the heat sink 1 may be damaged by being pressed. In this embodiment, when the light output surface 43 is of a concave shape, its expansion direction will be different from the above, for example, the expansion direction is divided into a horizontal portion and a downward vertical portion. This can reduce the thermal expansion in the horizontal direction to prevent the lamp cover 4 from being damaged by being pressed by the heat sink 1.

Figure 12:
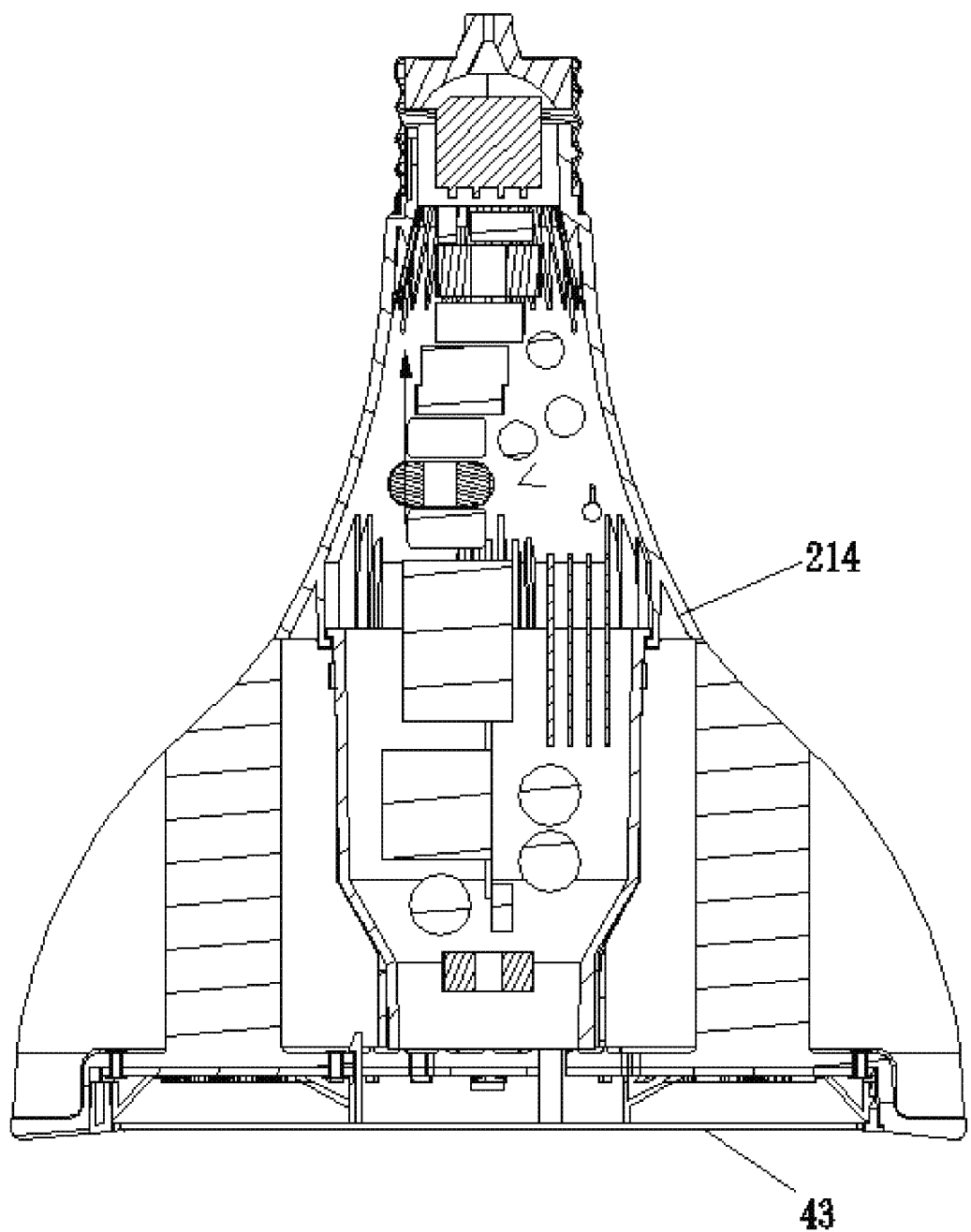
FIG. 12 is a cross-sectional view of another embodiment of the LED lamp according to aspects of the invention, which shows the flat light output surface.

As shown in FIG. 12, in some embodiments, the light output surface 43 may also be a flat plane, but a thermal expansion coefficient of the material of the light output surface 43, a distance between the light output surface 43 and the heat sink 1 and resistance to deformation of the light output surface 43 should be seriously considered. For example, when the light output surface 43 is a flat plane, the distance between the light output surface 43 and the heat sink 1 should be large enough to guarantee expansion of the light output surface 43 not to be pressed by the heat sink 1.

Figure 13A:
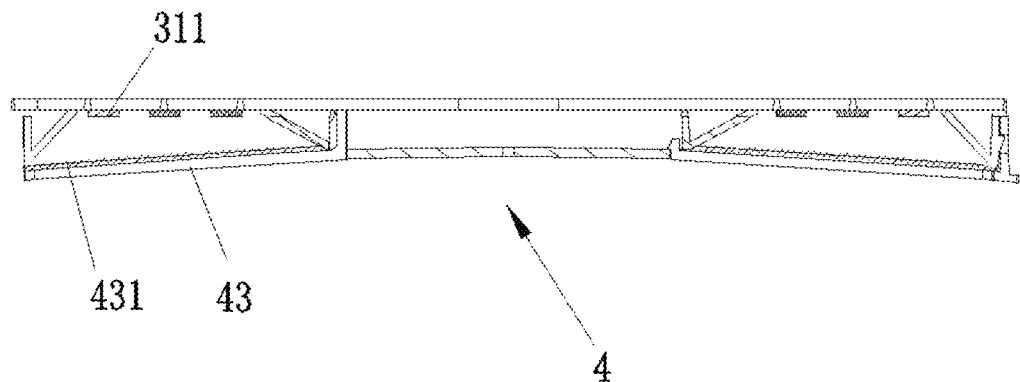
FIG. 13A is a schematic view of an embodiment of the combination of the light board and the lamp cover.
Figure 13B:
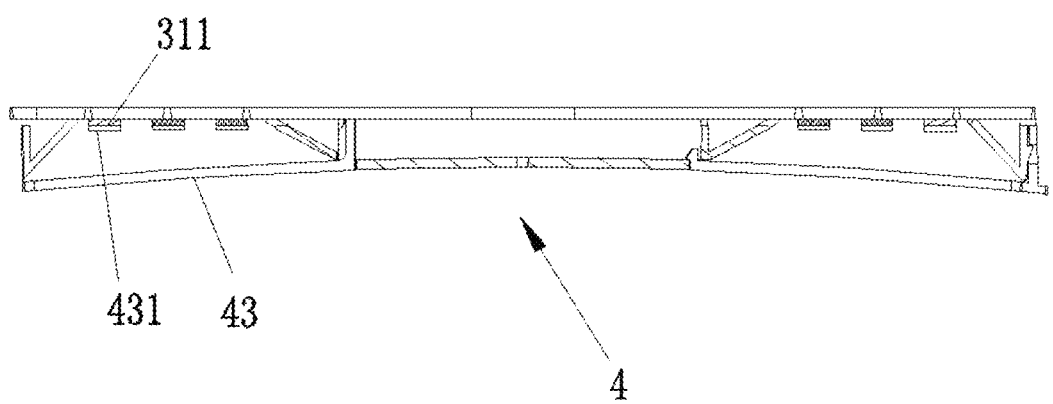
FIG. 13B is a schematic view of another embodiment of the combination of the light board and the lamp cover.
Figure 13C:
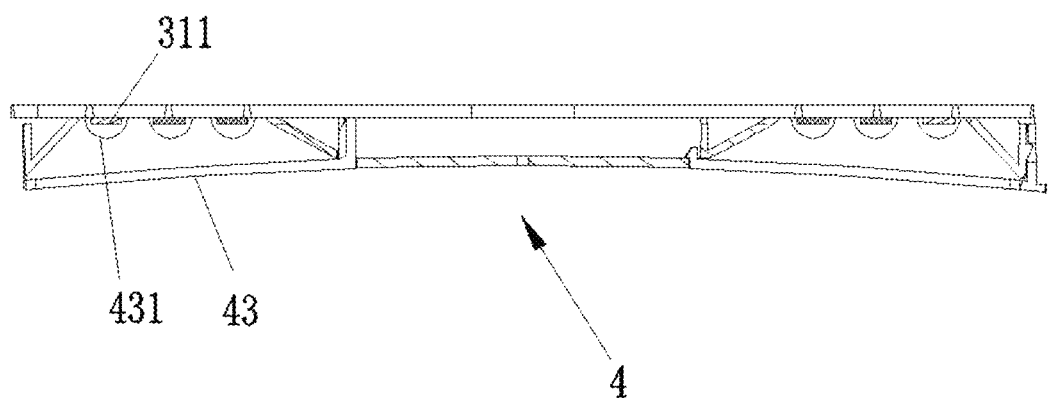
FIG. 13C is a schematic view of still another embodiment of the combination of the light board and the lamp cover.

In some embodiments, the light output surface 43 is provided with an optical coating, for example, the light output surface 43 is coated with a diffusion film 431 through which light emitted from the LED chips 311 passes to penetrate the lamp cover 4. In a few words, the diffusion film 431 diffuses light emitted from the LED chips 311. The diffusion film 431 can be disposed in various manners, for example, the diffusion film may be coated or cover an inner surface of the light output surface 43 (as shown in FIG. 13A), or a diffusion coating coated on the LED chips 311 (as shown in FIG. 13B), or a cloak covering the LED chips 311 (as shown in FIG. 13C).

Figure 14:
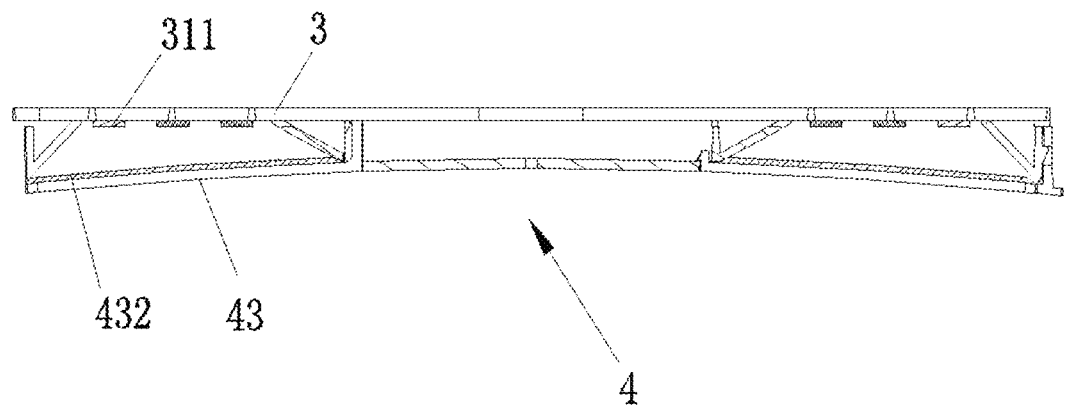
FIG. 14 is a schematic view of yet another embodiment of the combination of the light board and the lamp cover.

FIG. 14 is a schematic view of the combination of the light board 3 and the lamp cover 4. As shown, in some embodiments, a side of the light output surface 43, which nears the LED chips 311, i.e. an inner side of the light output surface 43, is provided with an anti-reflection coating 432 to reduce reflection of light from the LED chips 311 to the light output surface 43 and increase light-permeability of the light output surface 43. The refractive index of the anti-reflection coating 432 in this embodiment is between the reflectivity of air and glass. The anti-reflection coating 432 includes metal oxide which accounts 1%~99% of overall weight of the anti-reflection coating 432. The reflectivity of the anti-reflection coating 432 is less than 2%. Metal oxide in this embodiment may be zirconia, tin oxide, tin oxide, aluminum oxide, etc.

The diffusion film 431 (in FIG. 13) and the anti-reflection coating 432 may be used together or alternatively used. It can be selected according to actual requirements.

Figure 15:
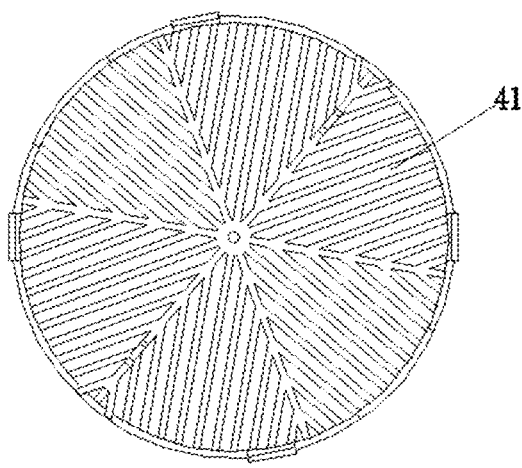
FIG. 15 is a schematic view of an end surface of the lamp cover of an embodiment.

FIG. 15 is a schematic view of an end surface 44 of the lamp cover 4 of an embodiment. As shown, the ratio of a total of cross-sectional area of the vent 41 to overall area of the end surface 44 (area of a single side of the end surface 44, such as the side away from the LED chips 311) is 0.01~0.7. Preferably, the ratio of a total of cross-sectional area of the vent 41 to overall area of the end surface 44 is 0.3~0.6. More preferably, the ratio of a total of cross-sectional area of the vent 41 to overall area of the end surface 44 is 0.4~0.55. By limiting the ratio of a total of cross-sectional of the vent 41 to overall area of the end surface 44 to the above ranges, not only can air intake of the vent 41 be guaranteed, but also adjustment of area of the vent 41 is implemented under ensuring structural strength of the end surface 44. When the ratio of area of the vent 41 to area of the end surface 44 is 0.4~0.55, not only can air intake of the vent 41 be guaranteed to satisfy requirements of heat dissipation of the LED lamp, but also the vent 41 does not affect structural strength of the end surface 44 to prevent the end surface 44 with the vent 41 from being fragile due to collision or pressure.

Figure 16:
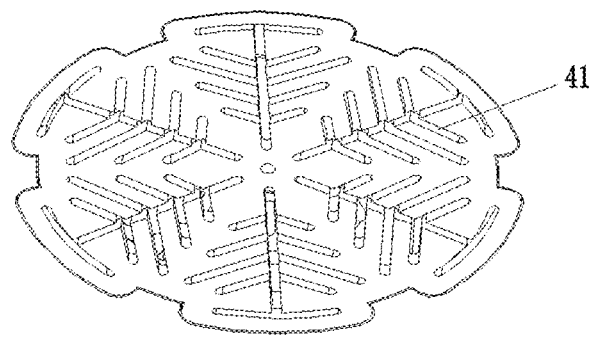
FIG. 16 is a schematic view of an end surface of the lamp cover, according to another embodiment of the present invention.
Figure 17:
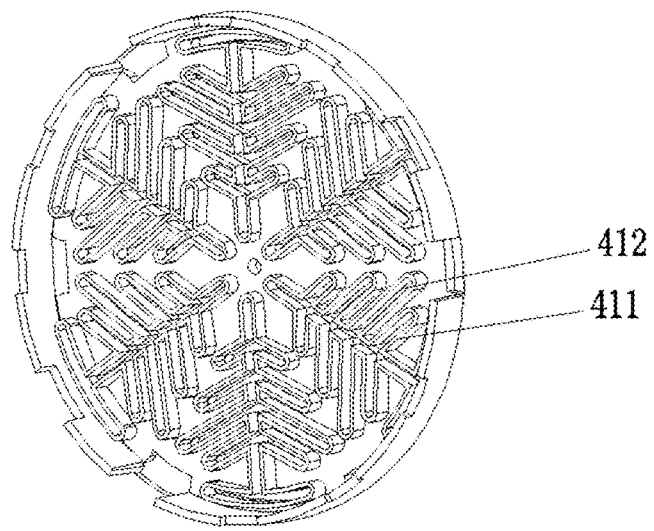
FIG. 17 is another view of the end surface of FIG. 16.

FIG. 16 is a schematic view of an end surface 44 of the lamp cover 4 of another embodiment. As shown in FIGS. 16 and 17, a periphery of the vent 41 has an enlarged thickness to form rib portions 411. An air guide opening 412 in a direction of air intake of the vent 41 is formed between adjacent two of the rib portions 411. A periphery of the vent 41 with an enlarged thickness can enhance structural strength of the end surface 44 to avoid reduction of overall structural strength due to the vent 41. On the other hand, the air guide opening 412 has an effect of air guiding to make air flowing into the air guide opening 412 have a specific direction. In addition, when the end surface 44 is being formed, the rib portions 411 avoid reduction of overall structural strength of the end surface 44. Thus, the end surface 44 is hard to be deformed because of the vent 41 to increase the yield rate of manufacture. In this embodiment, the rib portions 411 are formed on the side of the end surface 44, which is adjacent to the light board.

As shown in FIG. 17, the thickness of periphery of the vent 41 is greater than that of other portions of the end surface 44 so as to improve strength of the parts around the vent 41 and the effect of air guiding.

As shown in FIG. 15, a diameter of a maximum inscribed circle of the vent 41 is less than 2 mm, preferably, 1.0~1.9. mm. As a result, both bugs and most dust can be resisted, and venting efficiency of the vent 41 can be kept great enough. In one example, alternatively, the vent 41 defines both a length direction and a width direction, i.e. the vent has a length and a width, and the length is greater than the width. The largest width of inscribed circle of the vent 41 may be less than 2 mm. In an embodiment, the largest width is from 1 mm to 1.9 mm. In addition, the largest width of the vent 41 may be greater than 1 mm. If the width of the vent 41 is less than 1 mm, then more pressure is required to push air to enter the vent 41, which is advanced for venting.

Figure 18A:
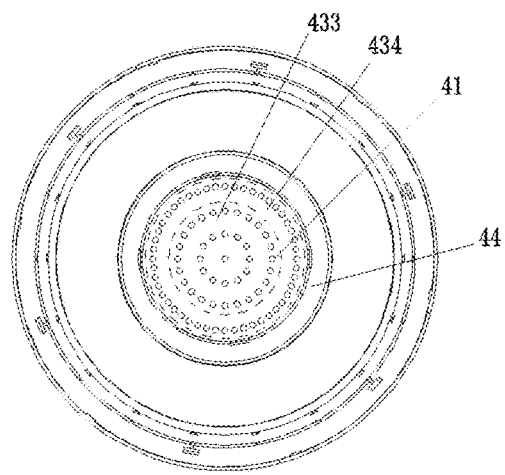
FIGS. 18A~18I are schematic views of some embodiments of the lamp cover.
Figure 18B:
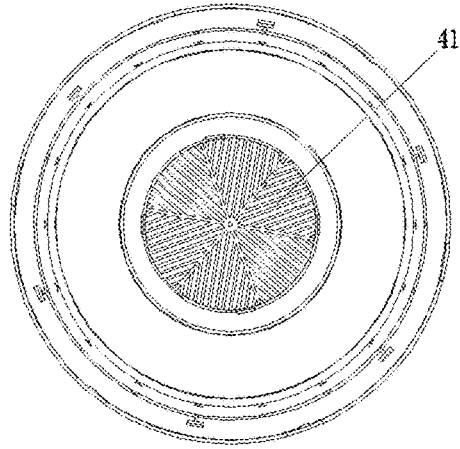
Figure 18C:
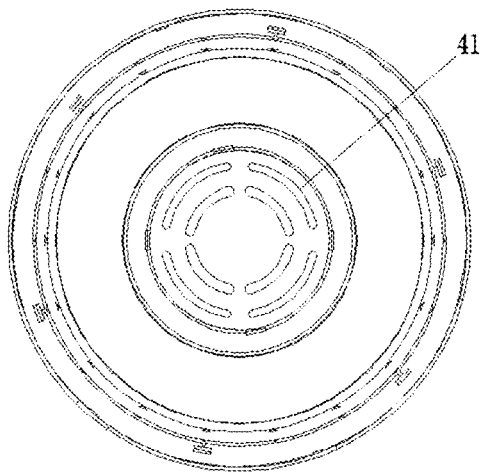
Figure 18D:
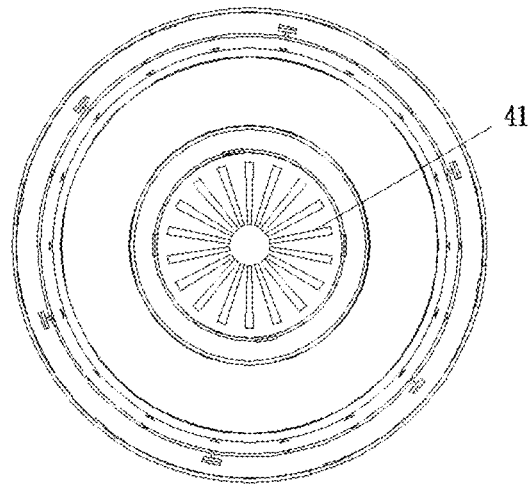
Figure 18E:
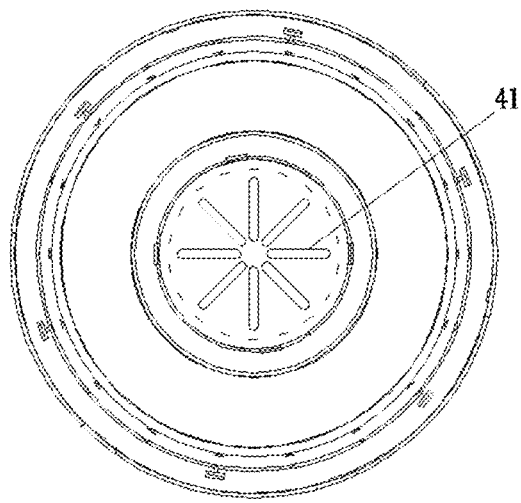
Figure 18F:
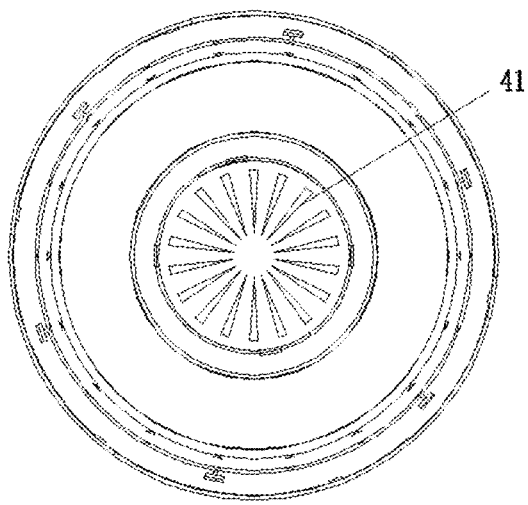
Figure 18G:
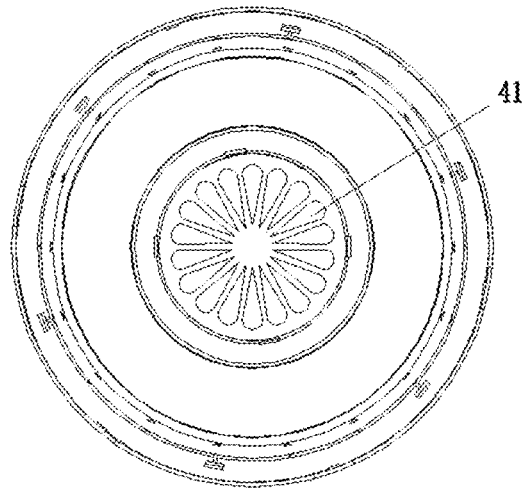

FIGS. 18A~18G show shapes of some embodiments of the vent 41. As shown in FIGS. 18A~18G, the vent 41 may be circular, strip-shaped, arced, trapezoidal, diamond or their combination. As shown in FIG. 18A, when the vent 41 is configured to be circular, its diameter should be less than 2 mm to resist bugs and most dust and venting efficiency of the vent 41 can be kept great enough. As shown in FIGS. 18B and 18C, when the vent 41 is configured to be strip-shaped or arced, its width should be less than 2 mm to accomplish the above effects. As shown in FIG. 18D, when the vent 41 is configured to be trapezoidal, its lower base should be less than 2 mm to accomplish the above effects. As shown in FIG. 18E, when the vent 41 is configured to be round-cornered rectangular, its width should be less than 2 mm to accomplish the above effects. As shown in FIGS. 18F and 18G, when the vent 41 is configured to be triangular or drop-shaped, a diameter of its maximum inscribed circle should be less than 2 mm.

In some embodiments, the vent 41 on the end surface 44 is multiple in number. For example, the vents 41 may be annularly arranged on the end surface 44 for even air intake. The vents 41 may also be radially arranged on the end surface 44. The vents 41 may also be irregularly arranged.

Figure 18H:
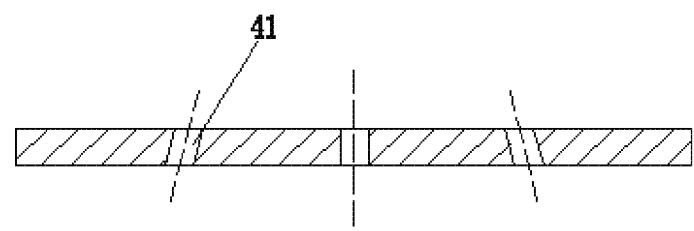
Figure 18I:
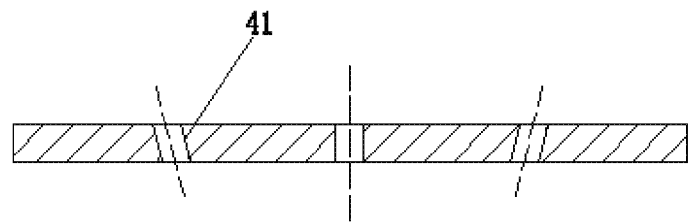

In some embodiments, in an axial direction of the LED lamp, the vents may be inclined to an axis of the LED lamp. In one example, an angle is formed between an axis of the vent 41 and the axis of the LED lamp. As shown in FIG. 18H, axes of at least part of the vents 41 are inclined to the axis of the LED lamp, and the inclined directions of the part of vents 41 are toward the first air inlet 2201 of the first heat dissipating channel 7a. Thus, after air passes the part of vents 41, it will flow to the first air inlet 2201 of the first heat dissipating channel 7a to perform convection for allowing more air to flow into the first heat dissipating channel 7a to dissipate heat from the power source 6 therein. As shown in FIG. 18I, axes of at least part of the vents 41 are inclined to the axis of the LED lamp, and the inclined directions of the part of vents 41 are toward the second air inlet 1301 of the second heat dissipating channel 7b. Thus, after air passes the part of vents 41, it will flow to the second air inlet 1301 of the second heat dissipating channel 7b to perform convection for allowing more air to flow into the second heat dissipating channel 7b to dissipate heat from the heat sink 1 therein.

In FIG. 18A, there are two broken lines on the end surface 44. The inner broken line represents a position the first air inlet 2201 (as shown in FIG. 2) is projected onto the end surface 44. The region within the inner broken line is defined as a first portion (first opening region 433). The region between the inner circle and the outer circle is defined as a second portion (second opening region 434). In this embodiment, the first air inlet 2201 is projected onto the end surface in an axis of the LED lamp to occupy an area on the end surface 44, it is the first portion (first opening region 433). The other area on the end surface 44 is the second portion (second opening region 434). The vent 41 in the first portion is greater than the vent 41 in the second portion in area. Such an arrangement is advantageous to making most air flow into the first heat dissipating channel 7a for better effect of heat dissipation to the power source 5 and reduction of rapidly aging of electronic components of the power source 5. These features are also available to the vent 41 in other embodiments.

In other embodiments, the first air inlet 2201 is projected onto the end surface 44 in an axis of the LED lamp to occupy an area on the end surface 44, which may be a first portion (first opening region 433). The other area on the end surface 44 may be a second portion (second opening region 434). The vent 41 in the first portion is smaller than the vent 41 in the second portion in area. As a result, heat of the fins 11 can be better dissipated to perform better heat dissipation to the LED chips 311 and prevent a region around the LED chips 311 from forming high temperature. In detail, area of both the first portion and the second portion can be selected according to actual requirements.

In some applications, there may be a limit of overall weight of an LED lamp. For example, when an LED lamp adopts an E39 head, its maximum weight limit is 1.7 Kg. Thus, besides the fundamental elements such as a power source, a lamp cover and a lamp shell, in some embodiments, weight of a heat sink is limited within 1.2 Kg. For some high-power LED lamps, the power is about 150 W~300 W, and their luminous flux can reach 20000 lumens to 45000 lumens. Under a limit of weight, a heat sink should dissipate heat from an LED lamp with 20000~45000 lumens. Under a condition of heat dissipation of natural convection, usually power of 1 W needs area of heat dissipation of at least 35 square cm. The following embodiments intend to reduce area of heat dissipation for power of 1 W under guarantee of a receiving space of the power source 5 and effect of heat dissipation. Under a precondition of weight limit of the heat sink 1 and limit of the power source 5, the best effect of heat dissipation can be accomplished.

Figure 19A:
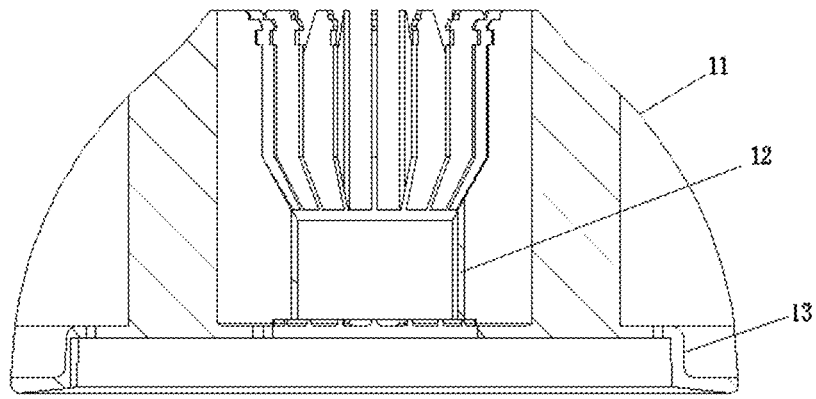
FIG. 19A is a cross-sectional view of the heat sink, according to another embodiment of the present invention.
Figure 19B:
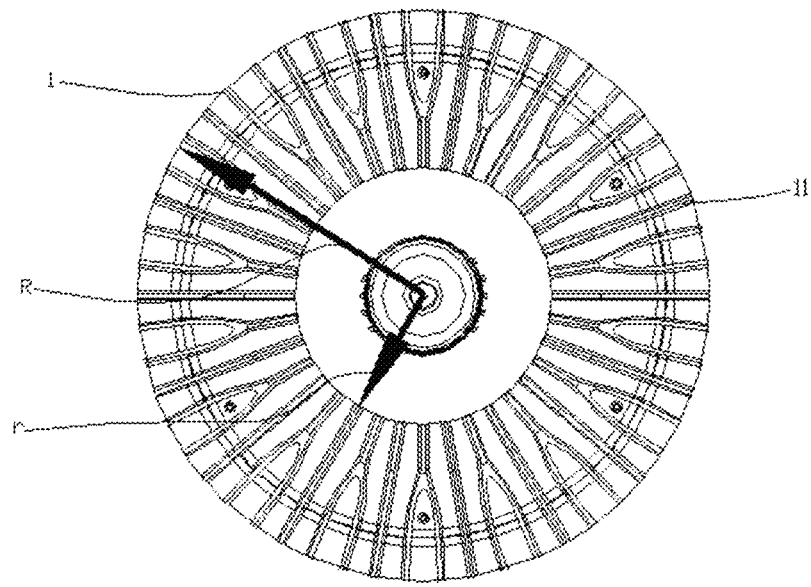
FIG. 19B is a schematic view of an LED lamp using the heat sink of FIG. 19A.

As shown in FIGS. 1 and 2, in this embodiment, the LED lamp includes passive heat dissipating elements which adopt natural convection and radiation as a heat dissipating manner without any active heat dissipating elements such as a fan. The passive heat dissipating element in this embodiment includes a heat sink 1 composed of fins 11 and a base 13. The fins 11 radially extend from and connect to the base 13. When using the LED lamp, at least part of heat from the LED chips 311 is conducted to the heat sink 1 by thermal conduction. At least part of heat occurring from the heat sink 1 is transferred to external air by thermal convection and radiation. A diameter of a radial outline of the heat sink 1, in a hanging status as shown in the figures, tapers off upward or is substantially in a taper shape for a better match with a lampshade. When the heat sink 1 in this embodiment is dissipating heat, at least part of heat is thermally radiated to air therearound to perform heat dissipation. An important factor of thermal radiation is emissivity. To improve emissivity of the heat sink 1, surfaces of the heat sink in this embodiment are specially treated. For example, surfaces of the heat sink 1 are provided with radiation heat-dissipating paint or electrophoretic coating to increase efficiency of thermal radiation and to rapidly dissipate heat of the heat sink 1. Another solution is forming a nanostructured porous alumina layer on the surfaces of the fins 11 by anodization in an electrolyte to form a layer of nanostructured porous alumina. As a result, ability of heat dissipation of the fins 11 can be enhanced without adding the number of the fins 11. Alternatively, the surfaces of the fins 11 may be coated with an anti-thermal-radiation layer to reduce thermal radiation between the fins 11. This can make more heat radiate to air. The anti-thermal-radiation layer may adopt paint or oxide coating, in which the paint may be normal paint or radiation heat dissipation paint. To further enhance heat dissipating effect of the heat sink 1. Preferably, it further contains aluminum such as a small or micro amount of aluminum. Adopting both zinc and magnesium with the above percentages can form $MgZn_2$ with a reinforcement effect. This makes a heat treatment effect of the heat sink 1 far better than a one zinc binary alloy. Tensile strength can be significantly increased. Both resistance to stress corrosion and flaking corrosion resistance also increases. Performance of thermal conduction also increases. In sum, performance of heat dissipation of the heat sink 1 is better. In addition, the heat sink 1 may be made of a material with low thermal resistance/high thermal conductivity, such as an aluminum alloy. In some embodiments, the heat sink 1 can be made of an anodized 6061 T6 aluminum alloy with thermal conductivity k=167 W/m·k. and thermal emissivity e=0.7. In other embodiments, other materials are available, such as a 6063 T6 or 1050 aluminum alloy with thermal conductivity k=225 W/m·k. and thermal emissivity e=0.9. In other embodiments, other alloys are still available, such as AL 1100, etc. In some embodiments, a die casting alloy with thermal conductivity is available. In other embodiments, the heat sink 1 may include other metals such as copper. FIG. 19A is a cross-sectional view of the heat sink 1 of an embodiment. As shown, in some embodiments, the heat sink 1 is added with a heat dissipating pillar 12. In detail, the heat sink 1 includes a heat dissipating pillar 12, fins 11 and a base 13. The heat dissipating pillar 12 connects to the base 13. The fins 11 are radially disposed around the heat dissipating pillar 12. A root portion of the fins 11 connects to the base 13 on a circle around the heat dissipating pillar 12. The heat dissipating pillar 12 supports the fins 11 to prevent the fins 11 from being skewed in machining. When using the LED lamp, the heat dissipating pillar 12 or the base 13 transfers heat from the LED chips 311 to the fins 11. The heat dissipating pillar 12 is a hollow body with two opening ends, for example, the heat dissipating pillar 12 may be a hollow cylinder. The heat dissipating pillar 12 may be made of a material which is the same as the heat sink 1. This material possesses great thermal conductivity, such as an alloy, to implement light weight and low cost. In other embodiments, the heat dissipating pillar 12 may be made of copper to enhance thermal conductivity of the heat sink 1 and implement rapid heat transfer. In other embodiments, an inner wall of the heat dissipating pillar 12 may be provided with a heat conduction layer with a thickness of 0.1 mm~0.5 mm to further improve an effect of heat dissipation. Specific surface area of the fins 11 is 4~10 times of specific surface area of the heat dissipating pillar 12, preferably, 6~8 times. FIG. 19B is a top view of an LED lamp using the heat sink of FIG. 19A. As shown, when the LED lamp is a high-power lighting device, an inner diameter r of the bottom of the heat dissipating pillar 12 may be 10~15 mm. That is, a distance from the central axis XX of the heat dissipating pillar 12 to an inner surface of the heat dissipating pillar 12 may be 10~15 mm. Because the fins 11 radially extend from the heat dissipating pillar 12, a diameter R from the axis to an outer edges of the fins 11 may be greater than or equal to 15 mm and less than 20 mm. That is, a distance from the central axis of the heat sink 1 to an outer edges of the fins 11 may be greater than or equal to 15 mm and less than 20 mm. From the bottom to the top of the heat sink 1, an inner diameter defined by the fins 11 may be identical or different. In one example, length (R–r) extending from each fin 11 to the central axis XX of the heat sink 1 may be constant along a height direction of the heat sink 1 or may vary along a height direction of the heat sink 1. Length of each fin 11 extending from an inner surface of the heat sink 1 may be identical or different. That is, length of the fins 11 may be identical or different in length. Each fin 11 may extend from the inner surface of the heat sink 1 in a direction parallel to the central axis of the heat sink 1 or spirally extend from the inner surface of the heat sink 1.

As shown in FIGS. 2, 4 and 5, the base 13 of the heat sink 1 has a lower end 133 located under the base 13, i.e. both the lower end 133 and the light board 3 are located on the same side. In this embodiment, the lower end 133 protrudes from the light board 3 in an axis of the LED lamp. In a using (hanging) status of the light board 3 being downward, the lower end 133 is lower than the light board 3 in position. As a result, the position of the lower end 133 can protect the LED board 3. When collision occurs, the lower end 133 will collide first to prevent the light board 3 from colliding. As shown in FIGS. 2 and 4, in another aspect, the base 13 has a recess 132 in which the light board 3 is placed. The recess 132 is of a cylindrical shape or a substantially cylindrical shape, or a cylindrical platform structure. When the recess 132 is of a cylindrical shape, a diameter of the cylinder is less than that of the base 13. The recess 132 in the base 13 is advantageous to reducing a glare effect of the LED lamp and improve direct vision and comfort of users (inner walls of the recess 132 screen at least part of lateral light from the LED chips 311 to decrease glare). In some embodiments, the base 13 may have no recess. In some embodiments, to make both the light board 3 and the heat sink 1 have maximum contact area to guarantee a heat dissipation effect, a surface of the base 13 is a flat plane.

Figure 20:
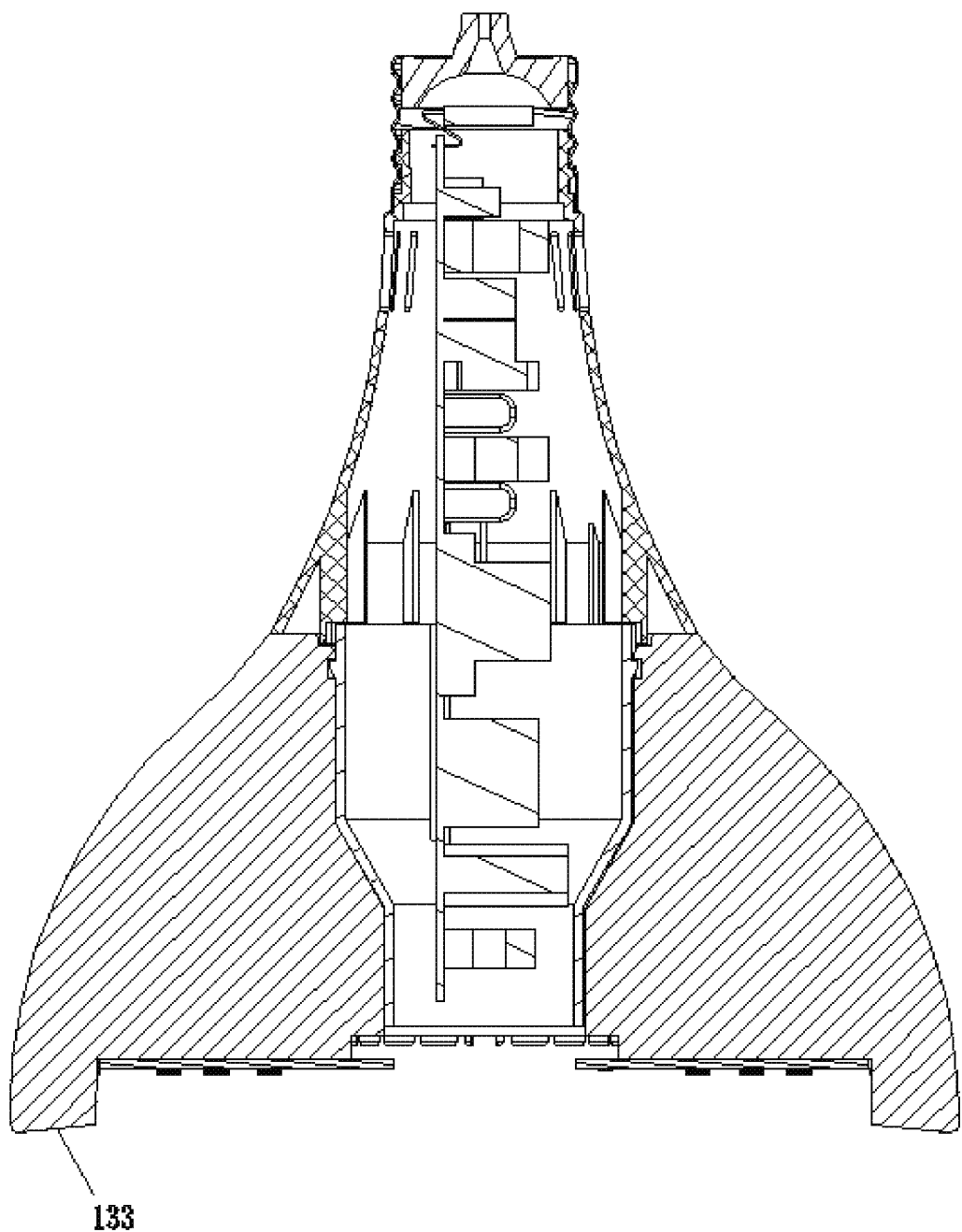
FIG. 20 is a cross-sectional view of an LED lamp without a lamp cover, according to another embodiment of the present invention.

FIG. 20 is a cross-sectional view of an LED lamp of an embodiment without the lamp cover 4. As shown, in some embodiments, the lower end 133 is configured to be slanted (relative to the horizon when the LED lamp is being hung). When the slant is flat and straight in a radial direction, an angle between the slant and the horizon is 3~4 degrees. In other embodiments, the angle is greater than 0 degrees but less than 6 degrees. In some embodiments, when the slant is arced in a radial direction, an angle between a tangent plane of the arced surface and the horizon is 3~4 degrees. In other embodiments, the angle is greater than 0 degrees but less than 6 degrees. When the lower end 133 is inclined to a specific angle (e.g. an angle between the lower end 133 and the outer reflecting surface 4302 is 120~180 degrees), it could serve as an extension of the outer reflecting surface 4302 to perform reflection.

Figure 21:
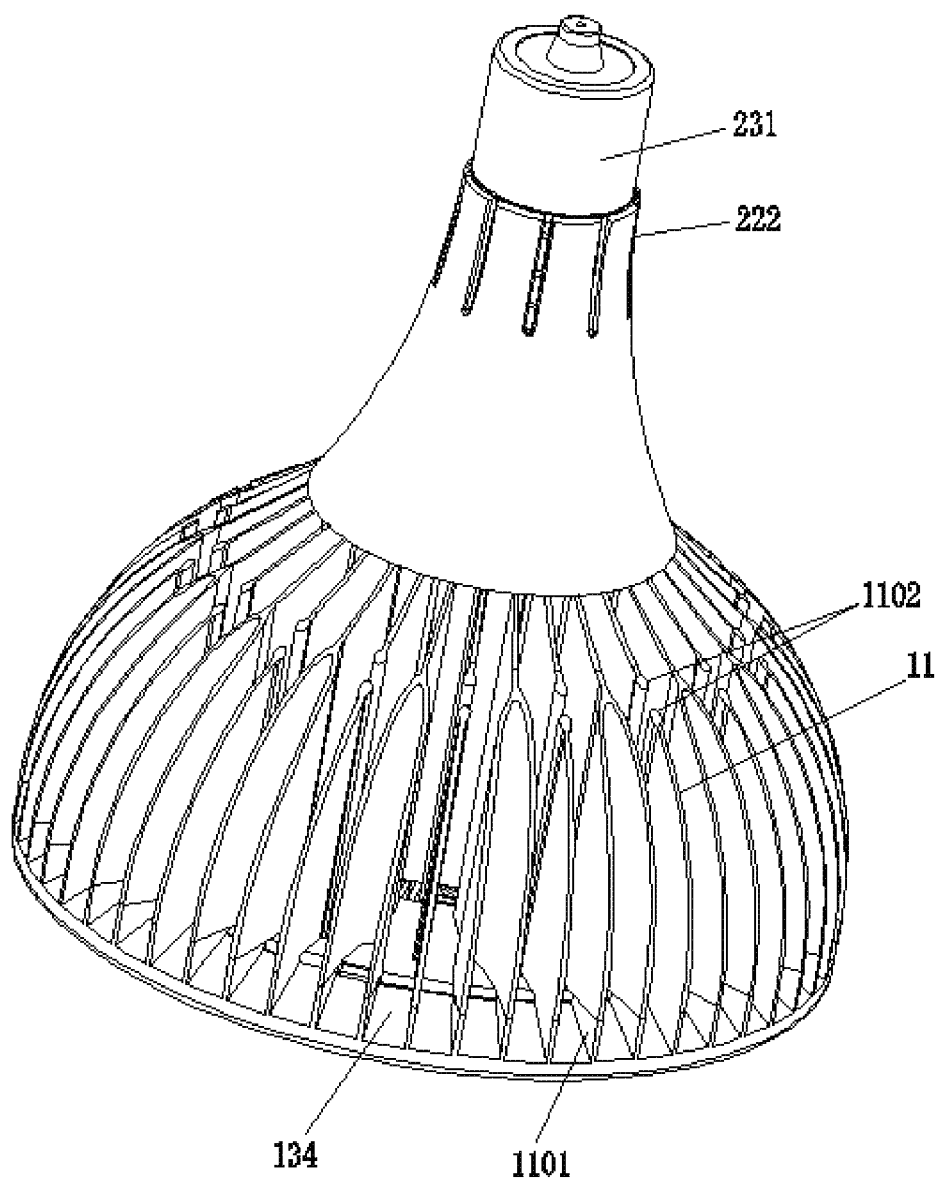
FIG. 21 is a perspective view of an LED lamp, according to another embodiment of the present invention.

FIG. 21 is a perspective view of an LED lamp of an embodiment of the present invention. As shown in FIGS. 2 and 21, another side of the base 13 of the heat sink 1, which is opposite to the lower end 133, has a back side 134. An end of each fin 11 extends to connect with the back side 134. Thus, At least part of each fin 11 projects from the LED light board 3 in an axis. In one example, in an axial direction of the LED lamp, each of the fins 11 is formed with an extension portion 1101 between the back side 134 of the base 13 and the light board 3. The extension portions 1101 can increase area of heat dissipation of the fins 11 and improve an effect of heat dissipation. In addition, the extension portion 1101 does not increase overall height of the LED lamp so as to be advantageous to controlling overall height of the LED lamp.

Figure 22:
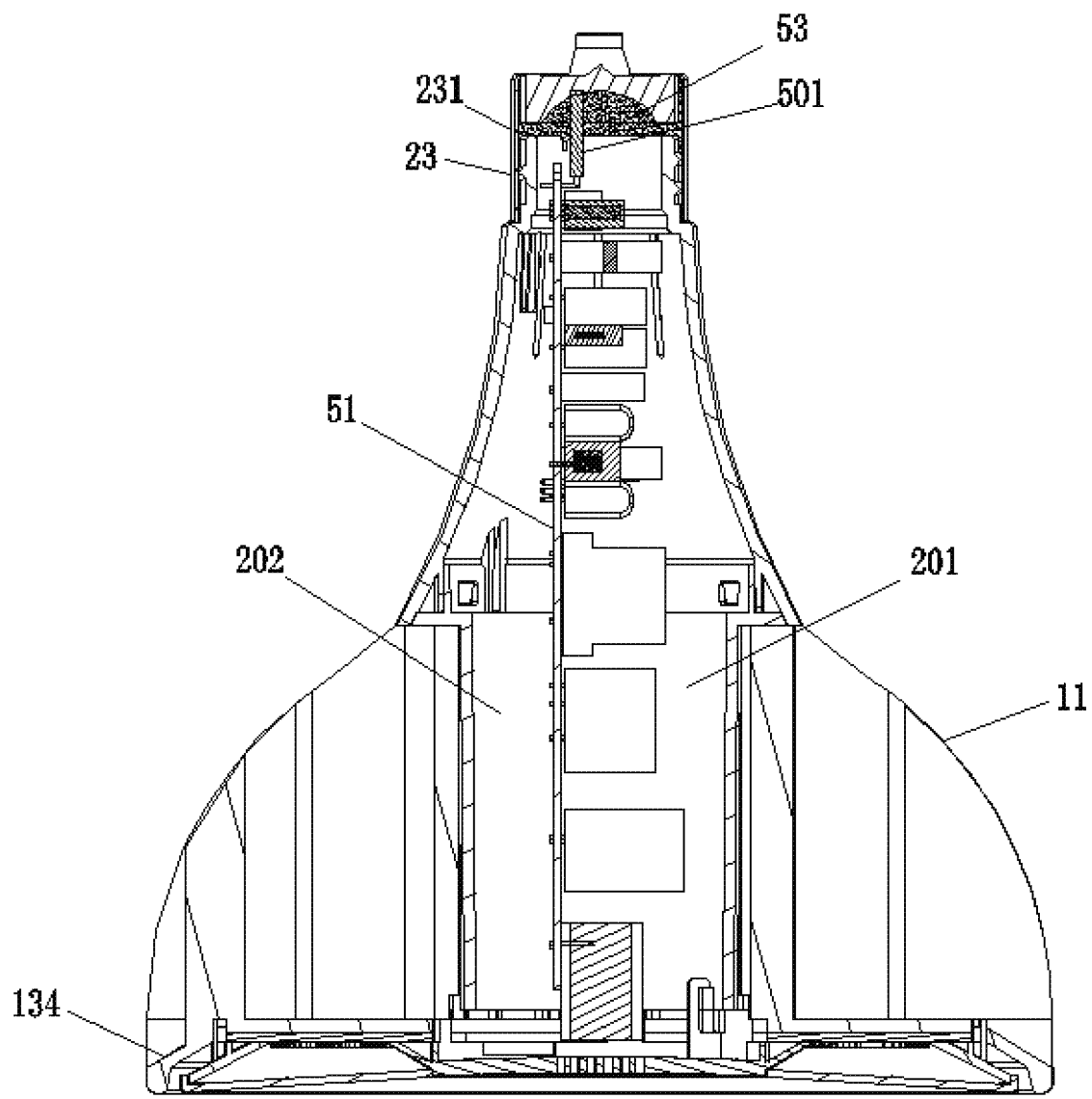
FIG. 22 is a cross-sectional view of the LED lamp of FIG. 21.

FIG. 22 is a cross-sectional view of the LED lamp of this embodiment. As shown, in this embodiment, the back side 134 of the base 13 is slanted. For example, when the LED lamp is being hung, in an inward radial direction, the back side 134 is upwardly slanted. In another aspect, in a radial direction of the LED lamp toward an axis of the LED lamp, an axial distance from the back side 134 to the light board 3 is progressively increased. Such an arrangement is advantageous to convection air is introduced along the back side 134 to bring out heat of the back side 134 and prevents the back side 134 from obstructing air flowing into.

As shown in FIGS. 2 and 5, in a using status, the light board 3 is downwardly arranged, a position of the lower end 133 is lower than an end side 44 of the lamp cover 4 and the light output surface 43. As a result, when packing, transporting or using the LED lamp, if collision occurs, then the lower end 133 will collide to prevent the lamp cover from colliding to damage the end side 44 or the light output surface 43.

As shown in FIGS. 2 and 5, a receiving space (indent 132) is encompassed by the lower ends 133 for receiving the lamp cover 4. Height of the lamp cover 4 received in the receiving space does not project from the lower end 133. Height of the LED lamp mainly includes height of the lamp shell 2, height of the heat sink 1 and height of the lamp cover 4. In this embodiment, the lamp cover 4 does not project from the lower end 133, this can control overall height of the lamp and the lamp cover 4 does not increase overall height of the lamp. In another aspect, the heat sink 1 additionally increases heat dissipating portion (downward protruding part of the light board 3 corresponding to the lower end 133). In other embodiments, a part of the lamp cover 4 may project from the lower end 133.

As shown in FIGS. 2, 4 and 5, a gap is kept between the end side 44 and the light board 3 to form a room 8. The room 8 communicates with both the first air inlet 2201 of the first heat dissipating channel 7a and the second air inlet 1301 of the second heat dissipating channel 7b. Air flows into the room 8 through the vent 41 of the end side 44 and then flows into both the first heat dissipating channel 7a and the second heat dissipating channel 7b. The room 8 allows air therein to mix and the mixed air is distributed according to negative pressure (resulting from temperature difference) of both the first and second heat dissipating channels 7a, 7b so as to make distribution of air more reasonable.

In this embodiment, when a passive heat dissipation manner (fanless) is adopted, the ratio of power (W) of the LED lamp to heat dissipating surface area (square cm) of the heat sink 1 is 1:20~30. That is, each watt needs heat dissipating surface area of 20~30 square cm for heat dissipation. Preferably, the ratio of power of the LED lamp to heat dissipating surface area of the heat sink 1 is 1:22~26.

More preferably, the ratio of power of the LED lamp to heat dissipating surface area of the heat sink 1 is 1:25. The first heat dissipating channel 7a is formed in the lamp shell 2, the first heat dissipating channel 7a has the first air inlet 2201 at an end of the lamp shell 2, and another end of the lamp shell 2 has the venting hole 222. Air flows into the first air inlet 2201 and flows out from the venting hole 222 to bring out heat in the first heat dissipating channel 7a. The second heat dissipating channel 7b is formed in the fins 11 and the base 13 and the second heat dissipating channel 7b has the second air inlet 1301. Air flows into the second air inlet 1301, passes the second heat dissipating channel 7b, and finally flows out from the spaces between the fins 11 to bring out heat radiated from the fins 11 to air therearound and enhance heat dissipation of the fins 11. By both the first and second heat dissipating channels 7a, 7b, efficiency of natural convection can be increased. This reduces required area of heat dissipation of the heat sink 1 so as to make the ratio of power of the LED lamp to heat dissipating area of the heat sink 1 be between 20 and 30. In this embodiment, overall weight of the LED lamp is less than 1.7 Kg. When the LED lamp is provided with power of about 200 W (below 300 W, preferably, below 250 W), the LED chips 311 are lit up and emit luminous flux of at least 25000 lumens.

As shown in FIG. 1, weight of the heat sink 1 in this embodiment accounts for above 50% of weight of the LED lamp. In some embodiments, weight of the heat sink 1 accounts for 55~65% of weight of the LED lamp. Under this condition, volume of the heat sink 1 accounts for above 20% of volume of the overall LED lamp. Under a condition of the same thermal conductivity of the heat sink 1 (i.e. overall heat sink 1 uses a single material or two different materials with almost identical thermal conductivity), the larger the volume occupied by the heat sink 1 is, the larger the heat dissipating area which can be provided by the heat sink 1 is. As a result, when volume of the heat sink 1 accounts for above 20% of volume of the overall LED lamp, the heat sink 1 may have more usable space to increase its heat dissipating area. Considering the arrangement space of the power source 5, the lamp cover 4 and the lamp shell 2, preferably, volume of the heat sink 1 accounts for 20%~60% of volume of the overall LED lamp. More preferably, volume of the heat sink 1 accounts for above 25~50% of volume of the overall LED lamp. Accordingly, although the overall size of the LED lamp is limited and the space for receiving the power source 5, the lamp cover 4 and the lamp shell 2 must be kept, volume of the heat sink 1 can still be maximized. This is advantageous to design of overall heat dissipation of the LED lamp.

Figure 23:
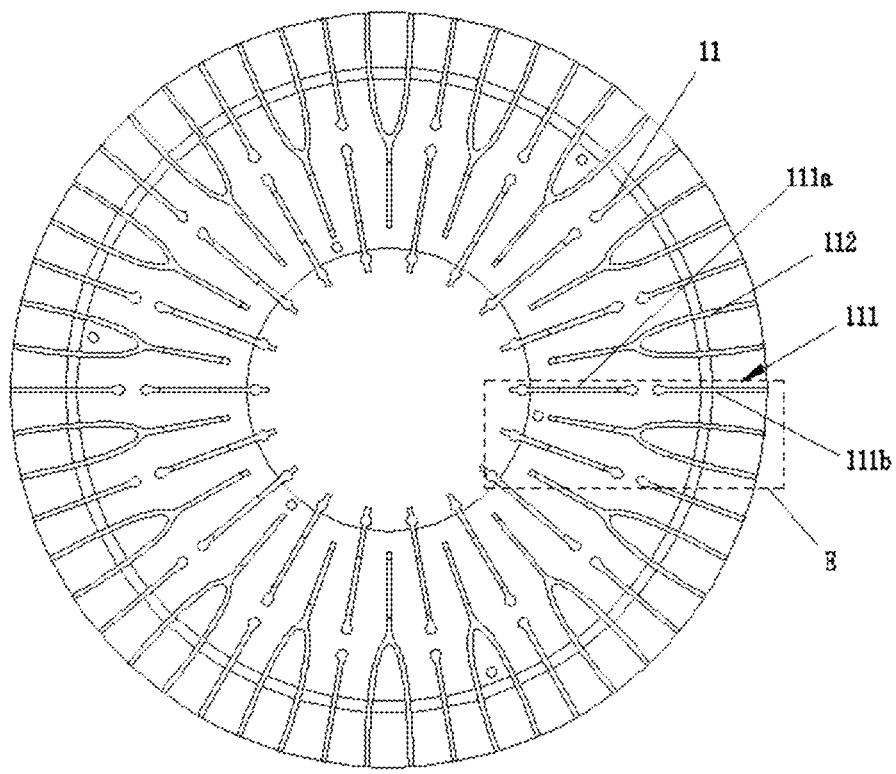
FIG. 23 is a top view of the heat sink of the LED lamp of FIG. 21.

FIG. 23 is top view of the heat sink 1 of the LED lamp of an embodiment. As shown, the heat sink 1 suffers the above volume limit, so at least part of the fins 11 are extended outward in a radial direction of the LED lamp with at least two sheets at an interval. By such an arrangement, the fins 11 in a fixed space can have larger area of heat dissipation. In addition, the extended sheets form support to the fins 11 to make the fins firmly supported on the base 13 to prevent the fins 11 from deflecting.

In detail, as shown in FIG. 23, the fins include first fins 111 and second fins 112. The bottoms of both the first fins 111 and the second fins 112 in an axis of the LED lamp connect to the base 13. The first fins 111 interlace with the second fins 112 at regular intervals. Being projected from the axial direction of the LED lamp, each of the second fins 112 is to be seen as a Y-shape. Such Y-shaped second fins 112 can have more heat dissipating area under a condition of the heat sink 1 occupying the same volume. In this embodiment, both the first fins 111 and the second fins are evenly distributed on a circumference, respectively. Every adjacent two of the second fins 112 are symmetrical about one of the first fins 111. In this embodiment, an interval between one of the first fins 111 and adjacent one of the second fins 112 is 8~12 mm. In general, to make air flow in the heat sink 1 smooth and to make the heat sink perform a maximum effect of heat dissipation, intervals between the fins 11 should be as uniform as possible.

Figure 27:
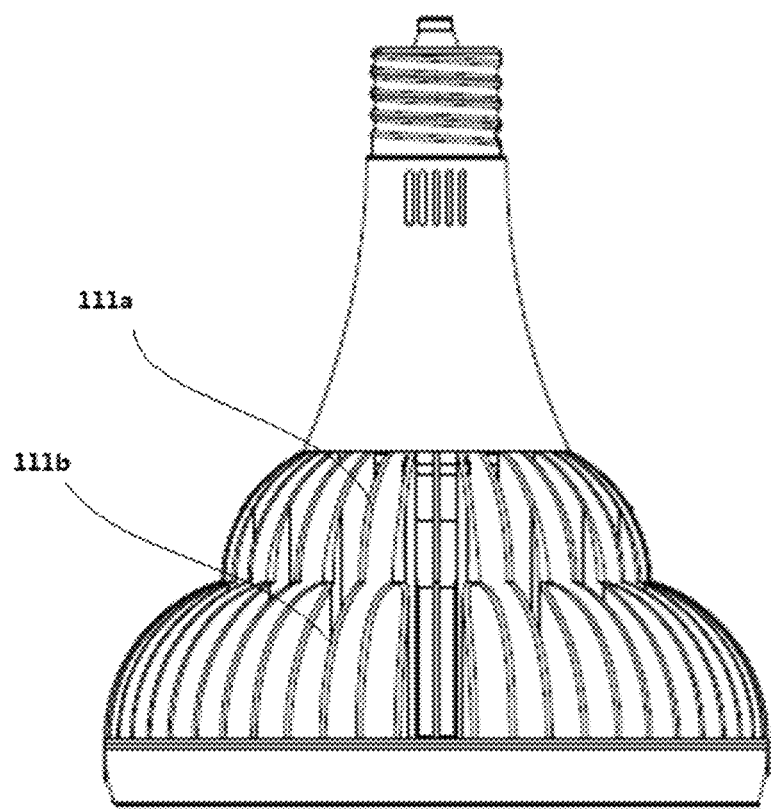
FIG. 27 is a main view of an LED lamp of another embodiment.

FIG. 27 is a main view of an LED lamp of another embodiment. As shown, the fins 11 are divided into two portions in a radial direction of the LED lamp. The first portion 111a is less than the second portion 111b in curvature (where the curvature means curvature on an outline of the LED lamp). In other embodiment, the first portion 111a is greater than or equal to the second portion 111b in curvature.

Figure 28:
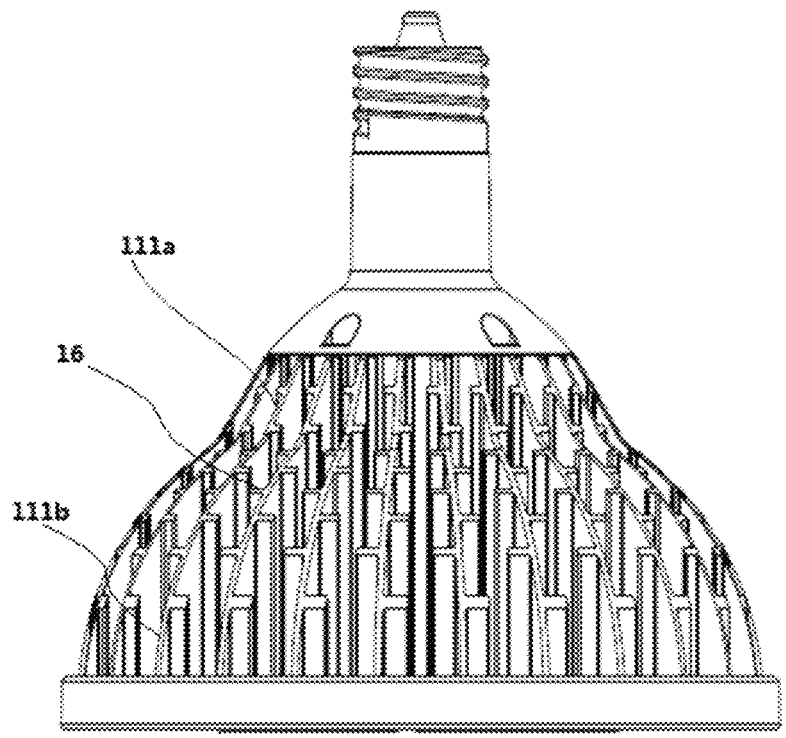
FIG. 28 is a main view of an LED lamp of another embodiment.

FIG. 28 is a main view of an LED lamp of another embodiment. As shown, two sides of each fin 11 are provided with heat dissipating bars 16. Each of the heat dissipating bar 16 on a side is located between adjacent two of the heat dissipating bars on the other side. For example, the heat dissipating bars 16 on two opposite sides do not superpose each other in a projective direction. In this embodiment, a distance between every two of the heat dissipating bars on a side is the same as a distance between every two of the heat dissipating bars on the other side. Such heat dissipating bars 16 can increase overall surface area of the fins 11 to make the fins 11 have more heat dissipating area for heat dissipation for improving performance of heat dissipation of the heat sink 1. In this embodiment, to increase surface area of the fins 11, surfaces of the fins 11 may be configured to be of a waved shape.

As shown in FIGS. 11 and 23, at least one of the fins 11 is divided into two portions in a radial direction of the LED lamp. Thus, a gap between the two portions forms a passage to allow air to pass. In addition, the projecting area of the gap directly exactly corresponds to an area that the LED chips 311 are positioned on the LED board 3 to enhance convection and improve an effect of heat dissipation to the LED chips 311. In an aspect of limited overall weight of the LED lamp, part of the fins 11 divided with a gap reduces the amount of the fins 11, decreases overall weight of the heat sink 1, and provides a surplus space to accommodate other elements. In this embodiment, as shown in FIG. 27, the fins 11 may have no above gap. That is, each of the fins 11 is a single piece in a radial direction.

Figure 24:
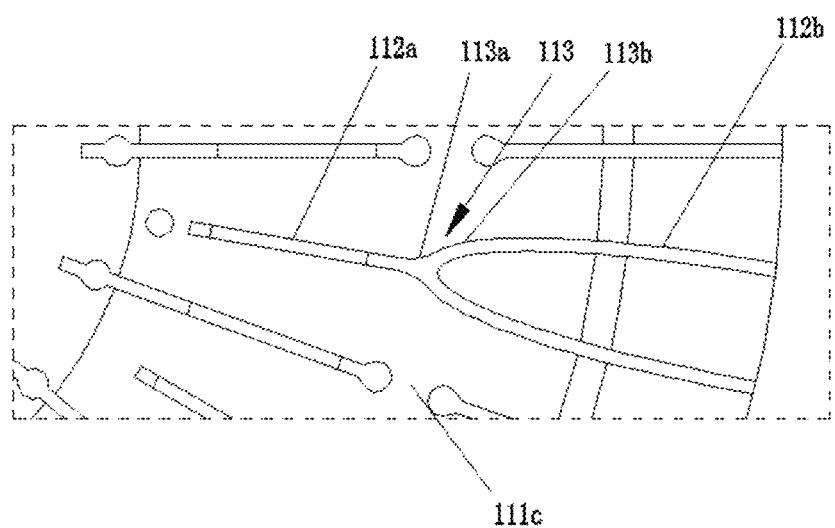
FIG. 24 is an enlarged view of portion E in FIG. 23.
Figure 25:
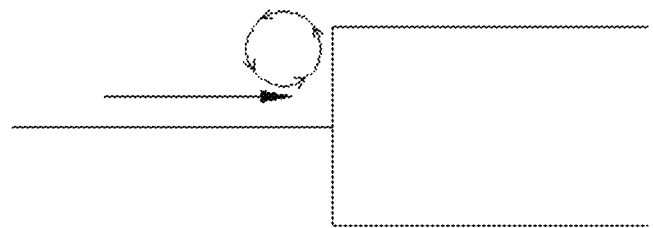
FIG. 25 is a schematic view showing a vortex formed by air near the second fins according to another embodiment of the present invention.

FIG. 24 is an enlarged view of portion E in FIG. 23. As shown in FIGS. 23 and 24, the fins 11 includes first fins 111 and second fins 112. Each of the first fins 11 is divided into two portions in a radial direction of the LED lamp, i.e. a first portion 111a and a second portion 111b. The two portions are divided with a gap portion 111c. The first portion 111a is located inside the second portion 111b in a radial direction. Each of the second fins 112 has a third portion 112a and a fourth portion 112b extending therefrom. The fourth portions 112b are located radially outside the third portions 112a to increase space utilization and make the fins have more heat dissipating are for heat dissipation. As shown in FIG. 24, the third portion 112a is connected to the fourth portion 112b through a transition portion 113. The transition portion 113 has a buffer section 113a and a guide section 113b. At least one or both of the buffer section 113a and the guide section 113b are arced in shape. In other embodiment, both the buffer section 113a and the guide section 113b are formed into an S-shape or an inverted S-shape. The buffer section 113a is configured to prevent air radially outward flowing along the second fins 112 from being obstructed to cause vortexes. Instead, the guide section 113b is configured to be able to guide convection air to radially outward flow along the second fins 112 without interference (as shown id FIG. 25).

As shown in FIG. 24, one of the second fins 112 includes a third portion 112a and two fourth portions 112b. The two fourth portions 112b are symmetrical about the third portion 112a. In other embodiments, one of the second fins 112 may include a third portion 112a and multiple fourth portions 112b such as three or four fourth portions 112b (not shown). The multiple fourth portions 112b of the second fin 112 are located between two first fins 111.

As shown in FIG. 24, a direction of any tangent of the guide section 113b is separate from the gap portion 111c to prevent convection air from flowing into the gap portion 111c through the guide portion 113b, such that the poor efficiency of heat dissipation caused by longer convection paths is able to be avoid as well. Preferably, a direction of any tangent of the guide section 113b is located radially outside the gap portion 111c. In other embodiments, a direction of any tangent of the guide section 113b is located radially inside the gap portion 111c.

Figure 26:
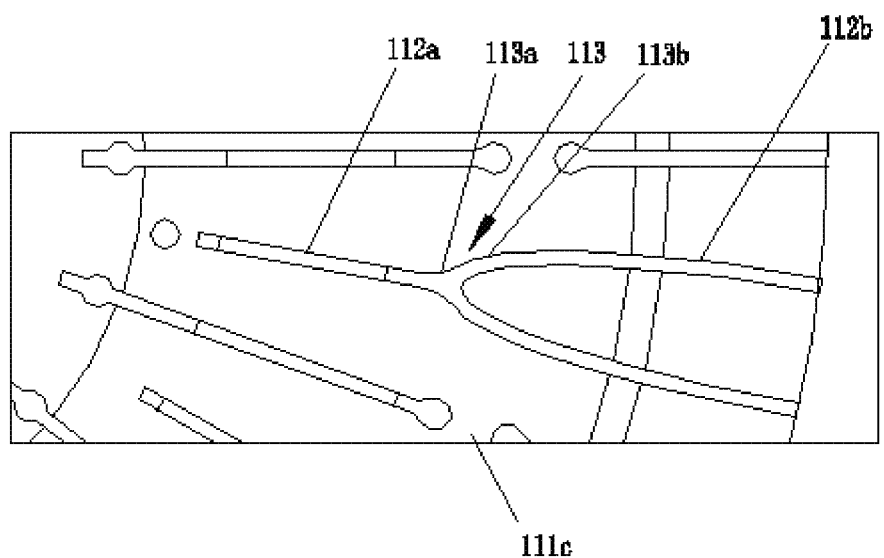
FIG. 26 is a partially schematic view of the heat sink of another embodiment.

As shown in FIG. 26, in another embodiment, a direction of any tangent of the guide section 113b falls in the gap portion 111c to make convection more sufficient but convection paths will increase.

As shown in FIG. 21, at least partially of fin 11 has a protrusion 1102 projecting from a surface of the fin 11. The protrusions 1102 extend along an axis of the LED lamp and are in contact with the base 13. A surface of the protrusion 1102 may selectively adopt a cylindrical shape or a regular or an irregular polygonal cylinder. The protrusions 1102 increase surface area of the fins 11 to enhance efficiency of heat dissipation. In addition, the protrusions 1102 also form a support effect to the fins 11 to prevent the fins 11 from being inflected in manufacture. In some embodiments, a single fin 11 is divided into two portions in a radial direction of the LED lamp. Each portion is provided with at least one protrusion 1102 to support the two portions. In this embodiment, the protrusion 1102 is located at an end portion of each fin 11 in a radial direction of the LED lamp, for example, at end portions of the first portions 111a, 111 b (the ends near the gap portion 111c).

In some embodiments, when each fin 11 is a single piece without the gap portion, the protrusion 1102 may also be disposed on a surface of each fin 11 (not shown) to increase surface area of heat dissipation of the fins 11 and have a support effect to the fins 11 to prevent the fins 11 from being inflected in manufacture.

Figure 29:
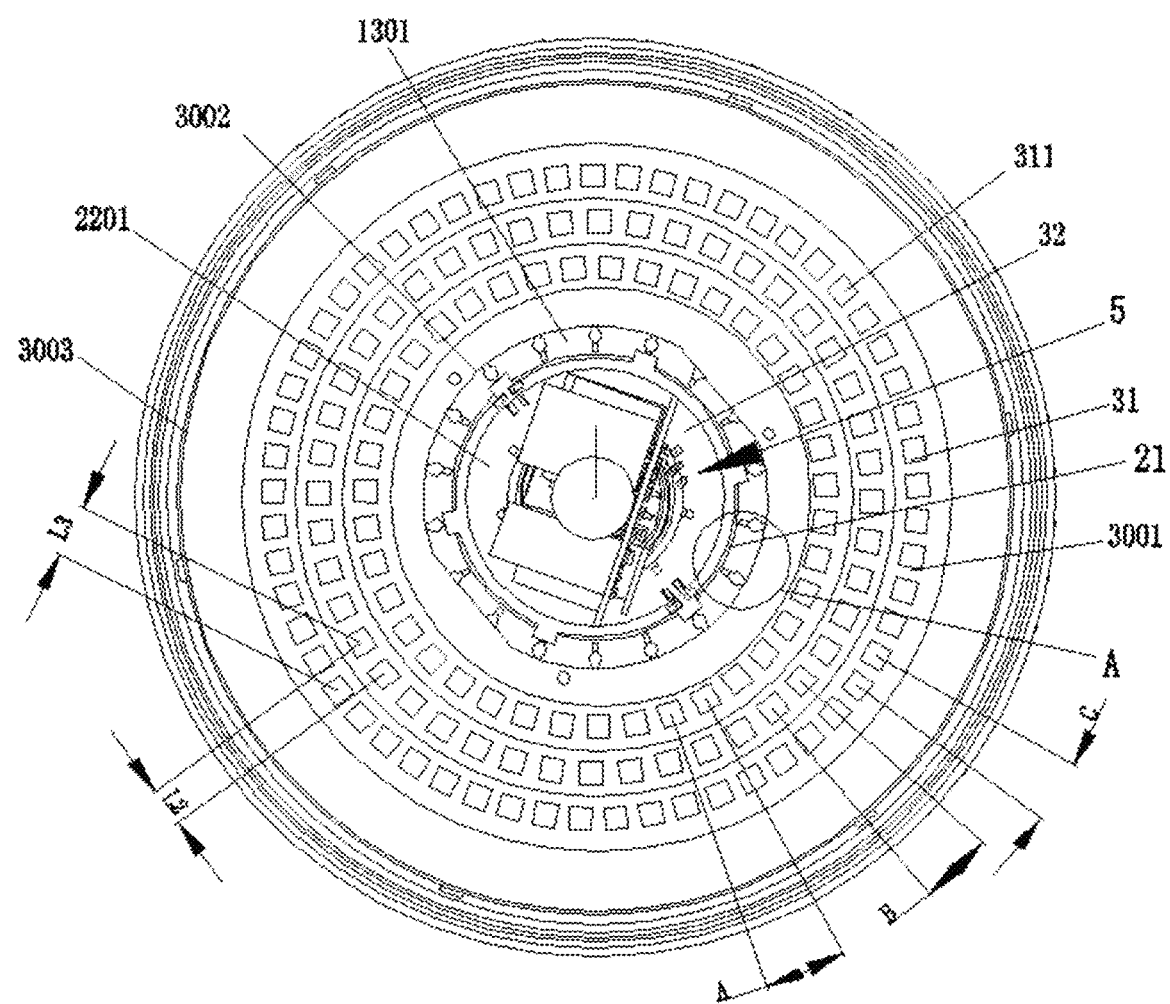
FIG. 29 is a bottom view of the LED lamp of FIG. 1 without the lamp cover.
Figure 30:
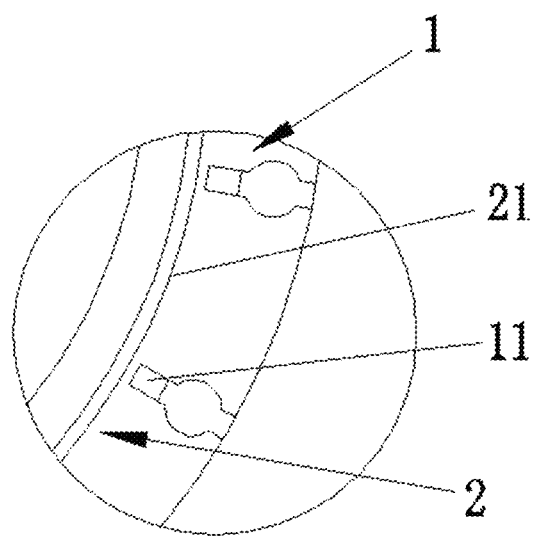
FIG. 30 is an enlarged view of portion A in FIG. 29.

FIG. 29 is a bottom view of the LED lamp of FIG. 1 without the lamp cover 4. FIG. 30 is an enlarged view of portion A in FIG. 29. As shown in FIGS. 29 and 30, the heat sink 1 is disposed outwardly of the sleeve 21, and the power source 5 is disposed in the inner space of the sleeve 21. A distance is kept between distal ends of the fins 11 and the sleeve 21. Accordingly, the sleeve 21 which has been heated to be thermally expanded will not be pressed by the fins 11 to be damaged. Also, heat from the fins 11 will not be directly conducted to the sleeve 21 to adversely affect electronic components of the power source 5 in the sleeve 21. Finally, air existing in the distance between the fins 11 and the sleeve 21 of the lamp shell 2 (as shown in FIG. 3) possesses an effect of thermal isolation so as to further prevent heat of the heat sink 1 from affecting the power source 5 in the sleeve 21. In other embodiments, to make the fins 11 have radial support to the sleeve 21, distal ends of the fins 11 may be in contact with an outer surface of the sleeve 21 and another part of the fins 11 are not in contact with the sleeve 21. Such a design may be applied in the LED lamp shown in FIG. 29. As shown in FIG. 29, the light board 3 includes a third aperture 32 for exposing both the first air inlet 2201 of the first heat dissipating channel 7a and the second air inlet 1301 of the second heat dissipating channel 7b. In some embodiments, to rapidly dissipate heat from the power source 5, the ratio of cross-sectional area of the first air inlet 2201 to cross-sectional area of the second air inlet 1301 is greater than 1 but less than or equal to 2. In some embodiments, to rapidly dissipate heat from the power source 5, the ratio of cross-sectional area of the second air inlet 1301 to cross-sectional area of the first air inlet 2201 is greater than 1 but less than or equal to 1.5.

As shown in FIGS. 21 and 22, the innermost of the fins 11 in a radial direction of the LED lamp is located outside the venting hole 222 in a radial direction of the LED lamp. In one example, an interval is kept between the innermost of the fins 11 in a radial direction of the LED lamp and the venting hole 222 in a radial direction of the LED lamp. As a result, heat from the fins 11 flowing upward will not gather to the venting hole 222 to keep an interval with the venting hole 222. This avoids heat making air around the venting hole 222 heat up to affect convection temperature speed of the first heat dissipating channel 7a (the convection speed depends upon a temperature difference between two sides of the first heat dissipating channel 7a, when air temperature near the venting hole 222 rises, the convection speed will correspondingly slowdown.).

Figure 31:
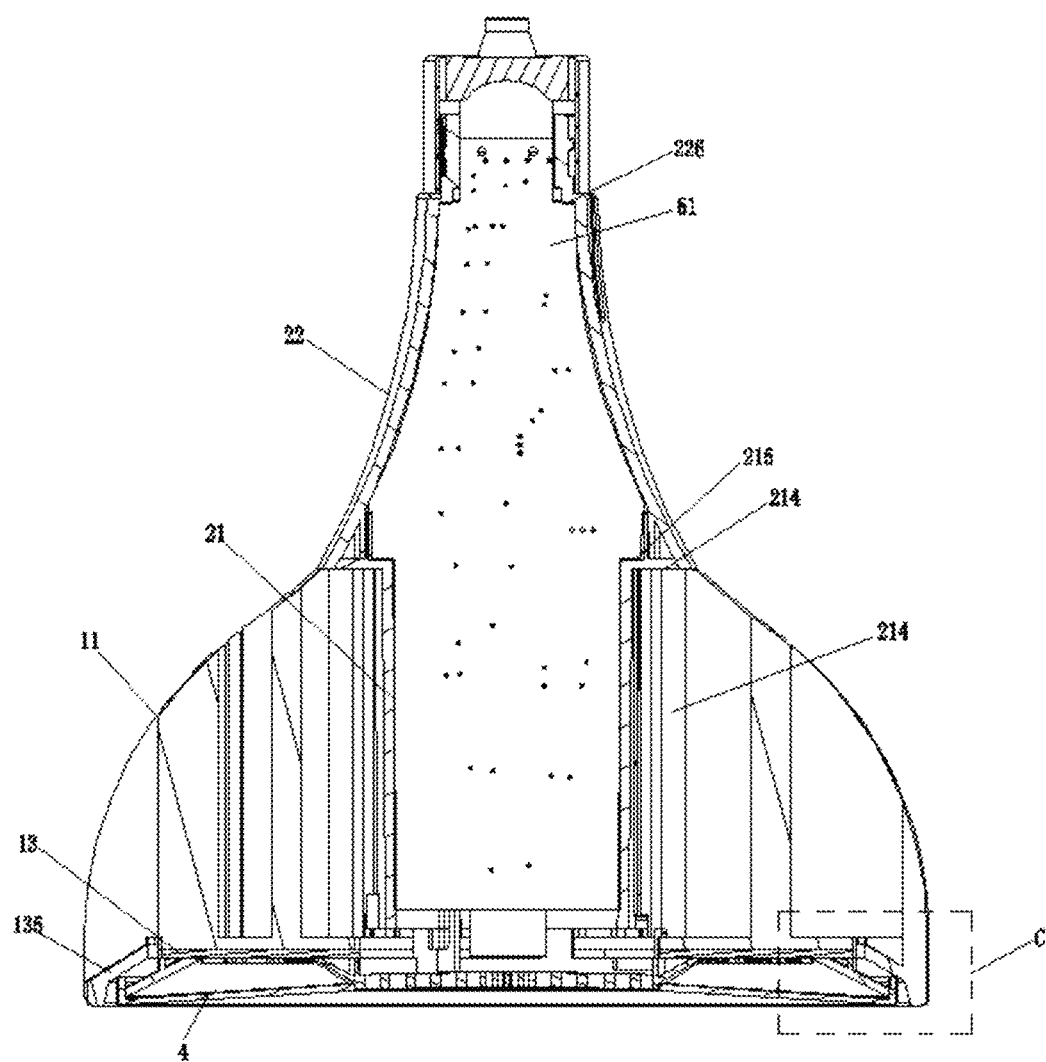
FIG. 31 is a cross-sectional view of an LED lamp, according to another embodiment of the present invention.
Figure 32:
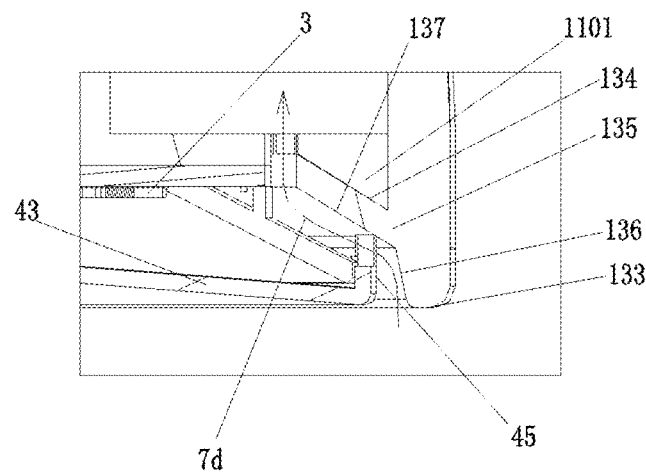
FIG. 32 is an enlarged view of the LED lamp of portion C in FIG. 31.

FIG. 31 is a cross-sectional view of an LED lamp of an embodiment. FIG. 32 is an enlarged view of the LED lamp of portion C in FIG. 31. As shown, the heat sink 1 includes the fins 11 and the base 13. The base 13 has a projecting portion 135 which is downwardly formed in an axial direction of the LED lamp. The projecting portion 135 protrudes from the light board 3 in an axial direction of the LED lamp. The lowermost position of the projecting portion 135 (lower end 133) is substantially flush with the light output surface 43 of the lamp cover 4 (in an axial direction of the LED lamp) or the lowermost position of the projecting portion 135 slightly protrudes from the light output surface 43. For example, the lowermost position of the projecting portion 135 protrudes from the light output surface 43 by about 1~10 mm to keep overall height of the heat sink 1 in the LED lamp unvarying or slightly increase volume for obtaining more heat dissipating area of both the fins 11 and the base 13.

The projecting portion 135 in this embodiment is configured to be annular and a concave structure is defined by both the projecting portion 135 and the base 13 for receiving and protecting both the light source and the lamp cover 4. Also, the concave structure can perform an effect of anti-flare (because the concave structure shades lateral light from the light source).

As shown in FIG. 32, the base 13 has a first inner surface 136 and the lamp cover 4 has a peripheral wall 45. When the lamp cover 4 has been correctly installed to the LED lamp, the first inner surface 136 corresponds to the peripheral wall 45 (the outer wall of the lamp cover 4). A gap is kept between the first inner surface 136 and the peripheral wall 45 to prevent the lamp cover 4 from thermally expanding and being pressed by the first inner surface 136 to be damaged. The gap between the first inner surface 136 and the peripheral wall 45 can reduce or avoid the abovementioned pressing. In other embodiments, a part of the peripheral wall 45 is in contact with the first inner surface 136 to radially support the lamp cover 4 by the first inner surface 136. Gaps are still kept between the other parts of the peripheral wall 45 and the first inner surface 136.

As shown in FIG. 32, the first inner surface 136 is configured to be a slant and an angle is formed between the first inner surface 136 and the light board 3. The angle may be an obtuse angle. Thus, when the lamp cover 4 is thermally expanded and its peripheral wall 45 presses the slant, the pressure exerted from the first inner surface 136 to an outer portion of the lamp cover 4 is divided into a downward component and a horizontal component to reduce horizontal pressure to the lamp cover 4 (horizontal pressure is a main cause of damage). In other embodiments, the peripheral wall 45 may abut against the first inner surface 136 (not shown) so as to support or limit the lamp cover 4. Also, because the first inner surface 136 is a slant, damage of the lamp cover 4 resulting from pressure of thermal expansion can be decreased. An end portion of the peripheral wall 45 may abut against the first inner surface 136 to decrease contact area between overall peripheral wall 45 and the base 13 and avoid excessive thermal conduction.

As shown in FIG. 32, the base further includes a second inner surface 137 and the lamp cover 4 has a peripheral wall 45. A gap is kept between the peripheral wall 45 and the first inner surface 136. An end portion of the peripheral wall 45 abuts against the second inner surface 137. An angle between the first inner surface 136 and the light board 3 is less than an angle between the second inner surface 137 and the light board 3. That is, the second inner surface 137 is flatter than the first inner surface 136. As a result, when the peripheral wall 45 abuts against the second inner surface 137 and the lamp cover 4 is thermally expanded, the horizontal pressure from the second inner surface 137 to the lamp cover 4 becomes less. In this embodiment, the angle between the second inner surface 137 and the light board 3 is between 120 degrees and 150 degrees. If the angle is too big, then radial support to the lamp cover 4 in a radial direction of the LED lamp will not be sufficient enough. While if the angle is too small, not only can the horizontal pressure exerted to the lamp cover 4 which has been thermally expanded not be reduced, but also limiting and supporting the lamp cover 4 in an axial direction of the LED lamp cannot be obtained. When the angle falls in the above range, a great balance can be accomplished. In other embodiments, both the second inner surface 137 and the first inner surface 136 may be curved. A distance difference between the second inner surface 137 and the axis of the LED lamp and between the first inner surface 136 and the axis of the LED lamp downward progressively increases. However, in general, the second inner surface 137 is flatter than the first inner surface 136.

Figure 33:
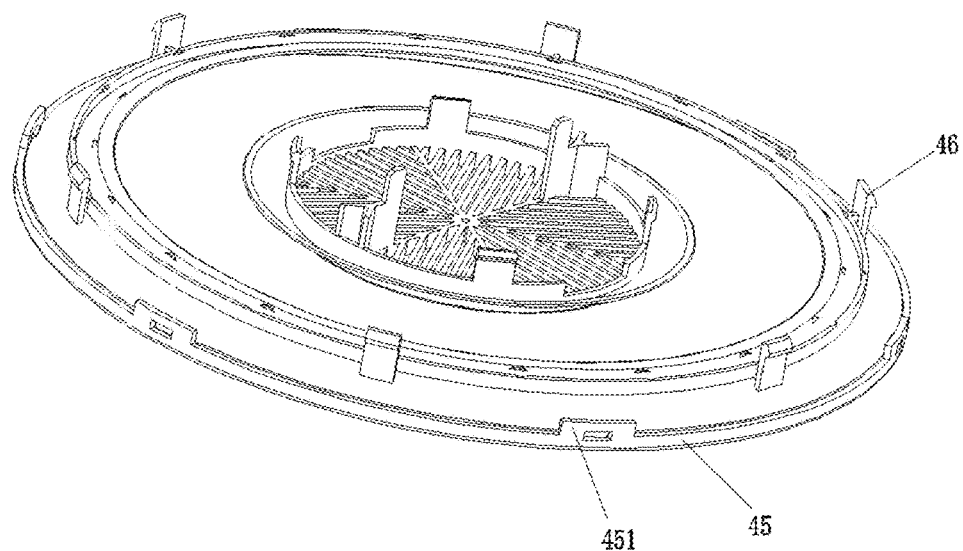
FIG. 33 is a perspective view of a lamp cover, according to another embodiment of the present invention.

As shown in FIG. 33, the end portion of the peripheral wall 45 is provided with protruding plates 451 upward extending from the peripheral wall 45 at regular intervals. The protruding plates 451 are the parts that the end portion of the peripheral wall 45 is in actual contact with the second inner surface 137. The protruding plates 451 can reduce contact area between the peripheral wall 45 and the base 13 to prevent heat of the heat sink 1 from being conducted to the lamp cover 4 to make the lamp cover 4 overheat.

Figure 34:
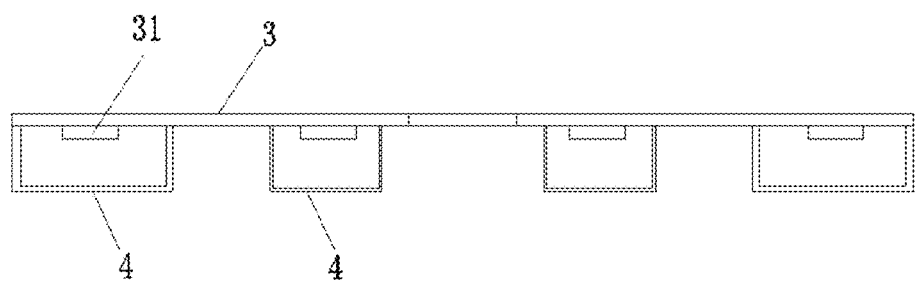
FIG. 34 is a schematic view of an embodiment of the combination of the light board and the lamp cover.
Figure 35:
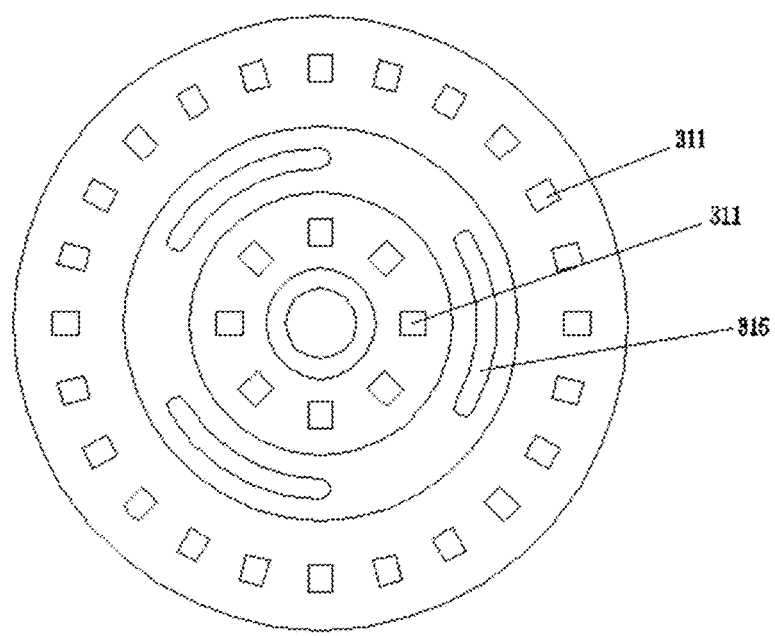
FIG. 35 is a top view of FIG. 34.

As shown in FIGS. 31 and 32, a gap is formed between the peripheral wall 45 and the base 13 and the base 13 is formed with a hole. A side of the hole communicates with the gap and the other side corresponds to the fins 11. In one example, air may flow into the gap, passes the hole and reaches the fins 11 to enhance convection. The convection path as shown by the arrow in FIG. 32 may form a fourth heat dissipating channel 7d of the LED lamp in this embodiment. Because the protruding plates 451 are arranged on the peripheral wall 45 at regular intervals, air can pass through intervals between the protruding plates 451 (as shown in FIG. 33) to accomplish the abovementioned convection. As shown in FIGS. 34 and 35, in another embodiment, the fourth heat dissipating channel 7d may also be disposed at other positions as long as a region between a lower portion of the LED lamp and the fins 11 are communicated. For example, a through hole 315 is formed between adjacent two LED chip sets 31. At this time, the lamp cover 4 may be configured to be separate, i.e. include multiple parts to separately cover different LED chip sets 31. The through hole 315 is located between two parts of the lamp cover 4 to make the through hole 315 communicate with the lower portion of the LED lamp and communicate with the spaces between the fins 11.

The heat sink 1 in this embodiment is an integrated structure so as to advantageous to reducing thermal resistance between the fins 11 and the base 13. In other embodiments, in order to be convenient to be machined and formed, the fins 11 and the base 13 may also be configured to be detachable.

In this embodiment, different positions of the fins 11 have different temperature. For example, when the LED lamp is working, a portion near the LED chips 311 is around 80° C., but the temperature of the upper portion (the opposite portion to the portion near the LED chips 311) of the fins 11 would slightly decrease. With different distribution of temperature inside the fins 11, the heat dissipation efficiency of the fin 11 is defined as a percentage of the post-dissipation temperature to the average temperature of the fins 11. The heat dissipation efficiency of the fins 11 can be calculated by thermal conductivity and size. The heat dissipation efficiency of the fins 11 is relative with thermal conductivity, thickness, width and height of the fins 11.

In this embodiment, to improve heat dissipation efficiency of the fins 11, thickness of each fin 11 is configured to be 0.8~2 mm, preferably, 1~1.5 mm. The ratio of thickness to length of the fin 11 is not less than 1:80. Preferably, the ratio of thickness to length of the fin 11 is not less than 1:70. More preferably, the ratio of thickness to length of the fin 11 is not less than 1:60~80. According to the effect of heat dissipation of the fins 11, a balance can be obtained between overall weight of the heat sink 1 and heat dissipating area to make the fins have better efficiency. The length of the fin 11 means height in an axial direction of the LED lamp. The ratio of width to length of the fin 11 in this embodiment is configured to be greater than 1:1.5, preferably, the ratio is greater than 1:1.3 to make thermal conductivity of the fins 11 better and improve efficiency of the fins 11. The length of the fin 11 means height in an axial direction of the LED lamp, and the width means length of the fin 11 in a radial direction of the ELD lamp. When the fins 11 are in irregular directions, width of the fins 11 may use their average value or a sum of a half of the maximum value of width and a half of the minimum value of width, and length of the fins 11 may use their average value or a sum of a half of the maximum value of length and a half of the minimum value of length.

$$H = 3.86 \times \sqrt{\frac{V}{L}}$$

where H stands for thermal conductivity, its unit is W/(m$^2 \cdot$° C.);

V stands for flowing speed of convection air; and

L stands for length of the fin in the convection direction.

It can be seen from the above formula that thermal conductivity is affected by arrangement of heat dissipating surface of the fins 11 much more than other factors when considering at least part of heat of the fins 11 which is dissipated by convection. In addition, when the fins 11 are transferring heat, their thickness (cross-sectional area) is an important factor, too. Temperature of downward flowing air would rise and its cooling ability correspondingly decreases. Thus, under the fins 11 with the same area, if the fins 11 are configured to have shorter length and longer width in the airflow direction, then the amount of heat dissipation would increase. Besides, under the same heat dissipating area, the above embodiment may control height of the fins 11 to make the fins 11 have more area near the LED chips 311 and enhance thermal conduction from the LED chips 311 to the fins 11. Thickness of the fin 11 may also affect efficiency of the fins 11. The larger the thickness of the fin 11 is, the higher the efficiency is, but a balance of weight and heat dissipating area should also be considered. In sum, the ratio of thickness to length of the fin 11 is configured to be not less than 1:80, and the ratio of width to length of the fin 11 is configured to be greater than 1:1.5.

FIGS. 36A~36M are schematic views of some embodiments of the heat sink 10, which can be applied in LED lamps to replace the heat sink 1 shown in FIG. 1.

Figure 36A:
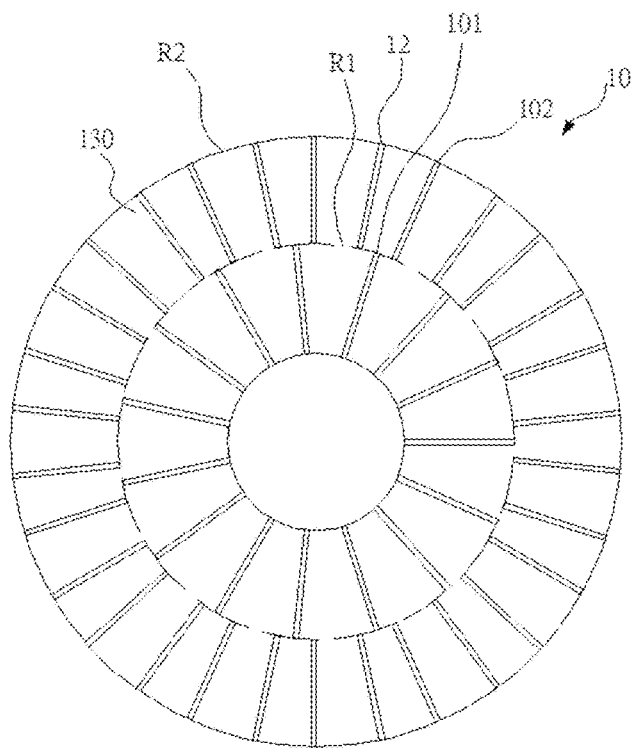
FIGS. 36A~36M are schematic views of some embodiments of the heat sink.

As shown in FIG. 36A, which shows a first embodiment of the heat sink 10. The heat sink 10 includes first fins 101 and second fins 102. The heat sink 10 is defined with a first circumference R1 and a second circumference R2, which are projected onto the base 130. The first circumference R1 is less than the second circumference R2. On the base 130, the first fins 101 extend into a cylindrical room (the part for receiving the sleeve 21, the cylindrical room mentioned in the following embodiments is the same as this) but do not exceed the second circumference R2. For example, the first fins 101 extend from the cylindrical room right to the first circumference R1. The second fins 102 extend to the first circumference R1 but do not exceed the second circumference R2, e.g. just extend to the second circumference R2. In a radial direction, both the first fins 101 and the second fins 102 are interlacedly arranged. Each adjacent of the second fins 102 is symmetrically arranged about one of the first fins 101. Intervals are formed between adjacent two of the first fins 101 and the second fins 102 for allowing air to pass and prolonging paths that air flows through the first and second fins 101, 102 to increase the amount of heat exchange between the fins 101, 102 and the airflow.

Figure 36B:
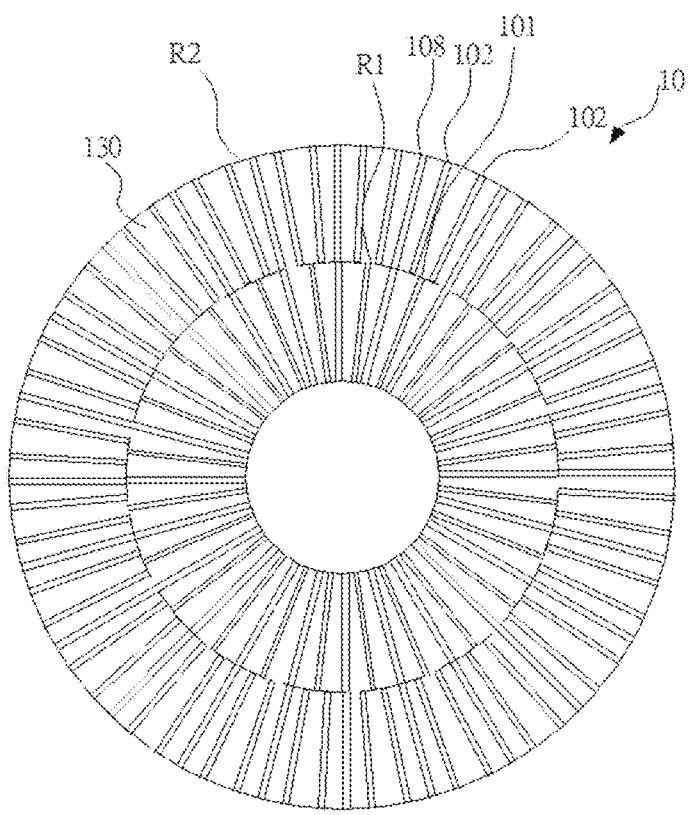

As shown in FIG. 36B, which shows a second embodiment of the heat sink 10. The heat sink in this embodiment differs from the first embodiment by the heat sink 10 further including division fins 108. The division fins 108 radially extend from an outer surface of the cylindrical room to the second circumference R2. The division fins 108 are interlacedly arranged with the first fins 101 within the first circumference R1 and are interlacedly arranged with the second fins 102 between the first circumference R1 and the second circumference R2. As a result, each of the division fins 108 is symmetrically between two of the first fins 101 and two of the second fins 102.

Figure 36C:
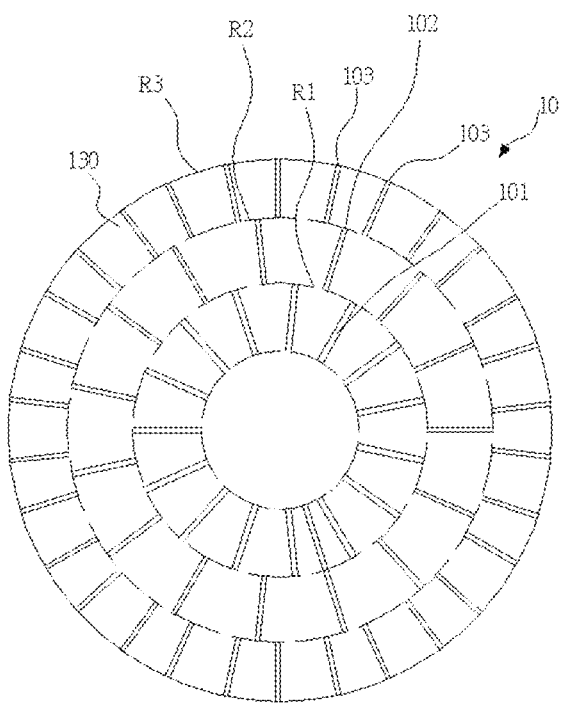

As shown in FIG. 36C, which shows a third embodiment of the heat sink 10. The heat sink in this embodiment differs from the second embodiment by the heat sink 10 further including third fins 103. A third circumference R3 is defined by being projected onto the base 103 of the heat sink 10. And the third circumference R3 is greater than the second circumference R2. On the base 103, the first fins 101 extend from the cylindrical room to the first circumference R1, the second fins 102 extend from the first circumference R1 to the second circumference R2, and the third fins 103 extend from the second circumference R2 to the third circumference R3. In a radial direction, the second fins 102 and the third fins 103 are interlacedly arranged. Each two third fins 103 are symmetrically arranged about one of the second fins 102.

The fins of the third embodiment may be further expanded to the nth fin, where n is an integer greater than two. For example, the first circumference R1 through the nth circumference with gradually getting bigger are defined on the base 130. The first fins 101 extend from the cylindrical room to the first circumference R1. The nth fin extends from the (n−1)th circumference to the nth circumference. In a radial direction, the (n−1)th fin and the nth fin are interlacedly arranged. Each two nth fins are symmetrically arranged about one of the (n−1)th fins. In addition, from first fin 101 to the nth fin, at least part thereof overlap with the light board 3 (a projection in an axial direction of the LED board 3) to ensure a direct thermal conduction path existing between the LED light board 3 and the fins.

As shown in FIG. 36C, the nth fin and the (n−1)th fin are interlaced but do not overlap. An outer edge of the (n−1)th fin does not exceed the (n−1)th circumference. The nth fin extends from the (n−1)th circumference. For example, an outer edge of the second fin 102 does not exceed the second circumference R2, and the third fin 103 extends from the second circumference R2 and does not exceed the third circumference R3.

Figure 36D:
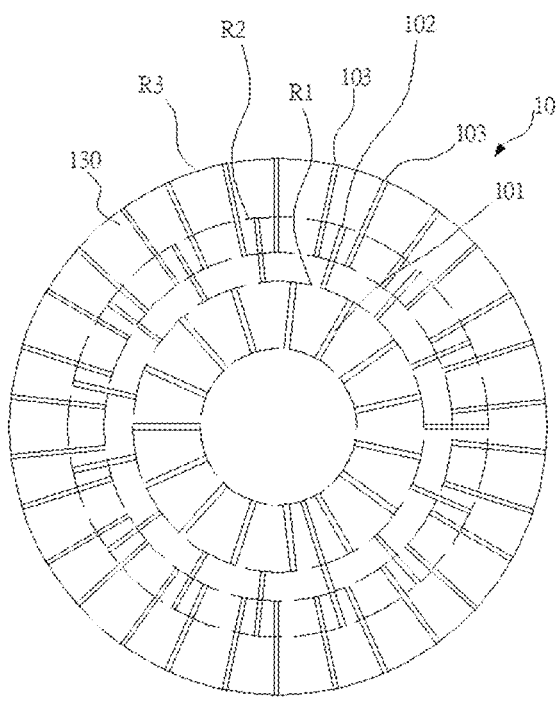

As shown in FIG. 36D, in the fins of the third embodiment, the nth fin and the (n−1)th fin may interlacedly overlap. An outer edge of the (n−1)th fin exceeds the (n−1)th circumference but does not reach the nth circumference. The nth fin extends from the (n−1)th circumference. For example, an outer edge of the second fin 12 exceeds the second circumference but does not reach the third circumference R3. The third fin 13 extends from the second circumference R2.

In the embodiment shown in FIGS. 1 and 2, an outer edge of each fin 11 is arced. In other embodiments, an outer edge of the fin may be waved, straight or stepped.

Figure 36E:
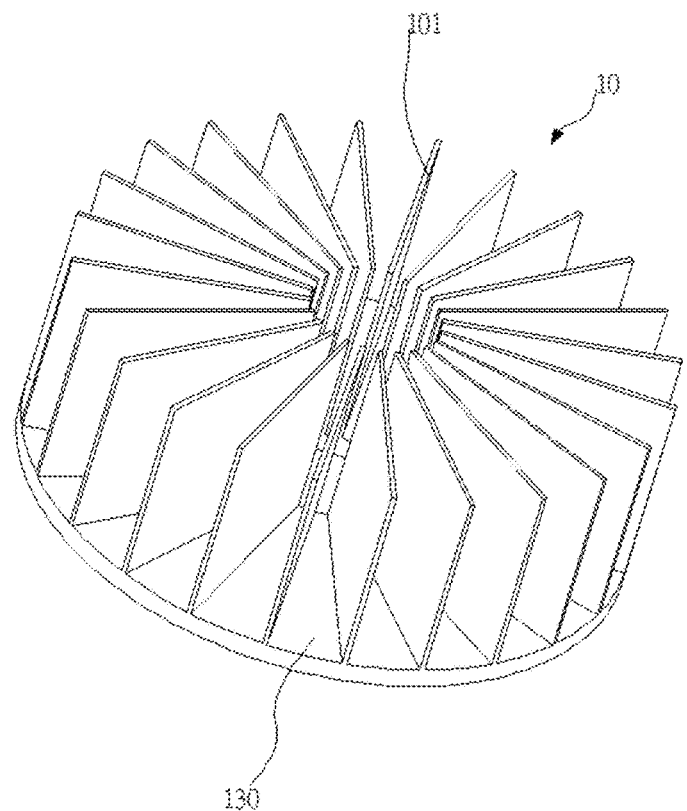

As shown in FIG. 36e, which shows a fourth embodiment of the heat sink 10. The fourth embodiment differs from FIG. 1 by the fins of the heat sink 1. For example, an outer edge of the first fin 101 is perpendicular to the base 130. Thus, observing the first fins 101 from a viewpoint in a direction perpendicular to the axis, the fins present rectangular or square instead of upward tapered curved outer edges. The rectangular first fins 101, under the limit of the same height and width, can effectively increase area of the first fins 101 and enhance thermal exchange with airflow.

Figure 36F:
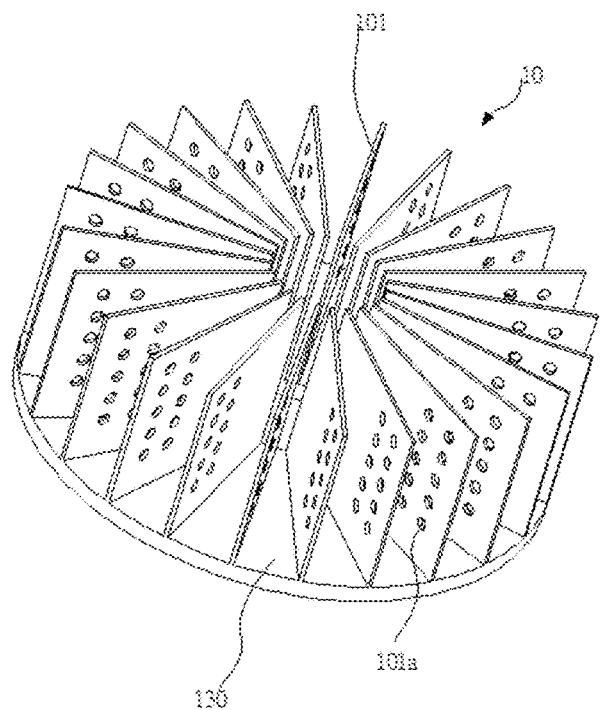

As shown in FIG. 36F, in a specific embodiment, the fins of the heat sink 1 include the first fin 101 through the nth fin. Each of the first fin through the nth fin has holes 101a penetrating through two sides of the fin. For example, the first fin shown in FIG. 36F has the holes 101a through two sides thereof. The holes 101a through two sides if the fin can promote air to flow to enhance heat dissipation and reduce weight of the heat sink 1.

Figure 36G:
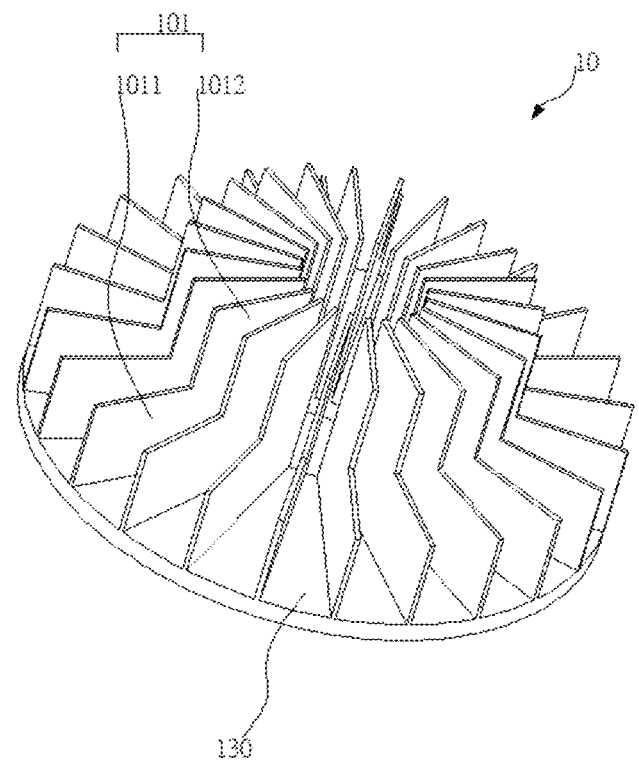

As shown in FIG. 36G, in a specific embodiment, the fins of the heat sink 10 include the first fin 101 through the nth fin. They are configured to have a two-stage step. The first stage 1011 extends from the base 130 and the second stage 1012 extends from the first stage 1011. Length of the first stage 1011 in a radial direction of the LED lamp is greater than that of the second stage 1012 in a radial direction of the LED lamp. Height of the first stage 1011 in an axial direction of the LED lamp is lower than that of the second stage 1012 in an axial direction of the LED lamp. Thus, observing the first fins 101 from a viewpoint in a direction perpendicular to the axis, the fins present stepped. Such a shape guarantees fin area in the lower portion, which is sufficient to conduct heat from the working LED chips 311. The upper portion uses both radiation and convection. As a result, fin area can be properly reduced to decrease weight.

Figure 36H:
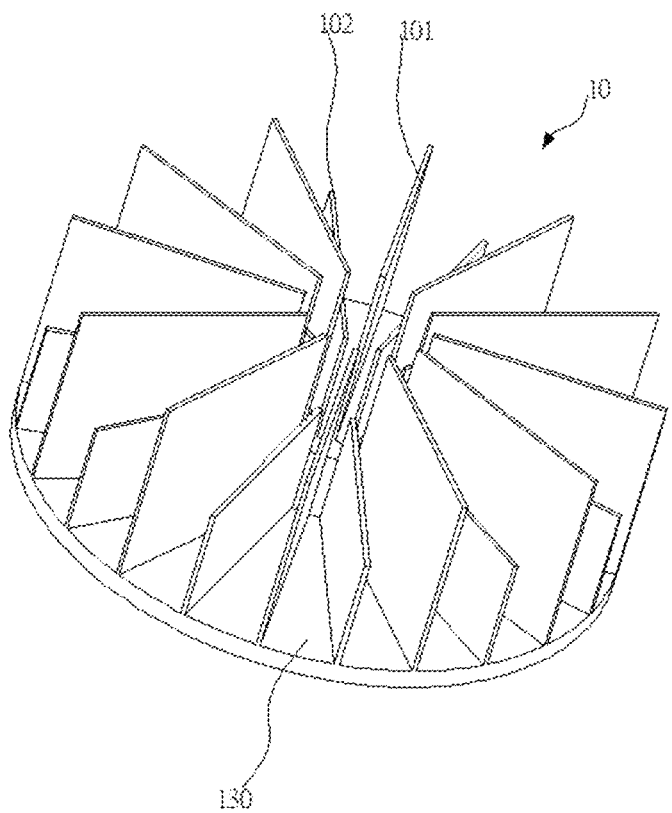

As shown in FIG. 36H, which shows a fifth embodiment of the heat sink 10. The heat sink 10 of the fifth embodiment is based on the fourth embodiment. It further includes second fins 102. An outer edge of the second fin 102 is perpendicular to the base 130 to make the second fin present rectangular or square. In addition, height of the second fin 102 on the base 130 is less than height of the first fin 101 and the second fins 102 interlace with the first fins 101. Thus, the second fins 102 can increase area of thermal exchange with airflow. However, because its height is short, thermal radiation exchange between the first fins 101 and the second fins 102 can be reduced. In this embodiment, if the total amount of both the first fins 101 and the second fins 102 is the same as the amount of the fins on the fourth embodiment (i.e. under the condition of the same amount), then this embodiment is more advantageous to overall weight reduction of the heat sink 10 and can decrease thermal radiation exchange between the first fins 101 and the second fins 102.

Figure 36I:
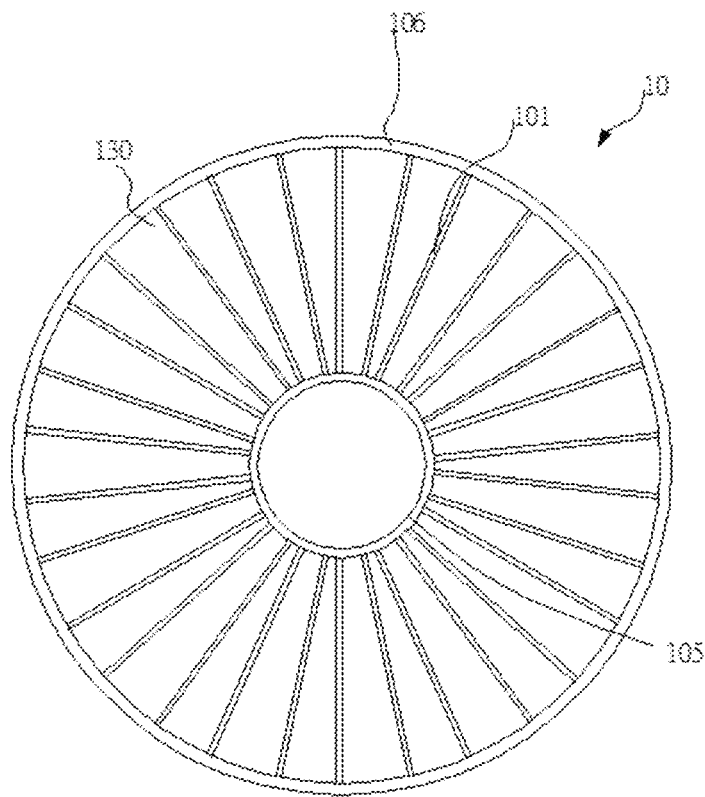
Figure 36J:
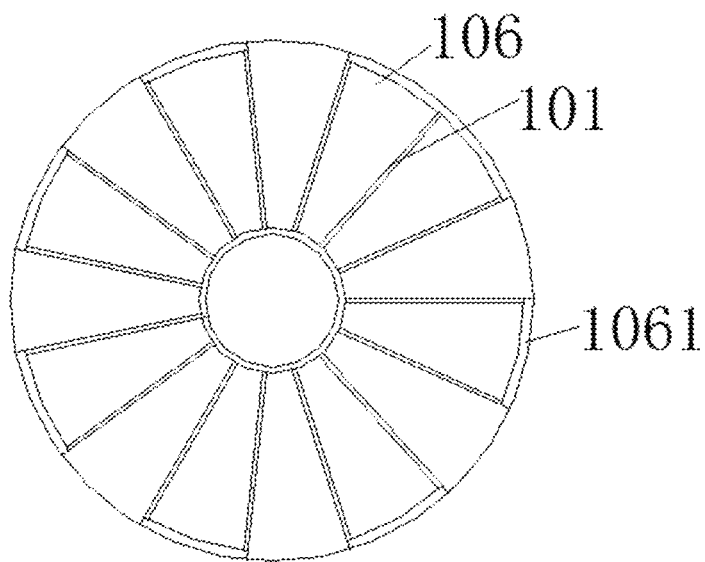

As shown in FIG. 36I, which shows the sixth embodiment of the heat sink 10. The heat sink 10 of the sixth embodiment is based on the above embodiment. It further includes an outer support wall 106 and an inner support wall 105. The outer support wall 106 connects to an outer edge of the first fins 101 and the inner support wall 105 connects to an inner edge of the first fins 101 to prevent the first fins 101 from inflecting. As shown in FIG. 36I, observing the heat sink 10 from an upper viewpoint, both the outer support wall 106 and the inner support wall 105 present annular to make the first fin 101 radially connected. Both the outer support wall 106 and the inner support wall 105 may connect to the base 130 or perpendicularly extend from an upper surface of the base 130. Both the outer support wall 106 and the inner support wall 105 may also merely connect to the first fins 101 and keep a distance with the outer surface of the base 130. In an axial direction, height of both the outer support wall 106 and the inner support wall 105 is less than height of the first fins 11 to maintain smooth axial airflow. Either of the outer support wall 106 and the inner support wall 105 may be selected to be used. It is unnecessary to use both the outer support wall 106 and the inner support wall 105. As shown in FIG. 36J, both the outer support wall 106 and the inner support wall 105 may be configured to be segmentalized, i.e. the outer support wall 106 as an example, it is divided into multiple arced segments 1061 at regular or irregular intervals on a single circumference. Each arced segment 1061 connects at least two first fins 101 to further reduce adverse influence to convection.

Figure 36K:
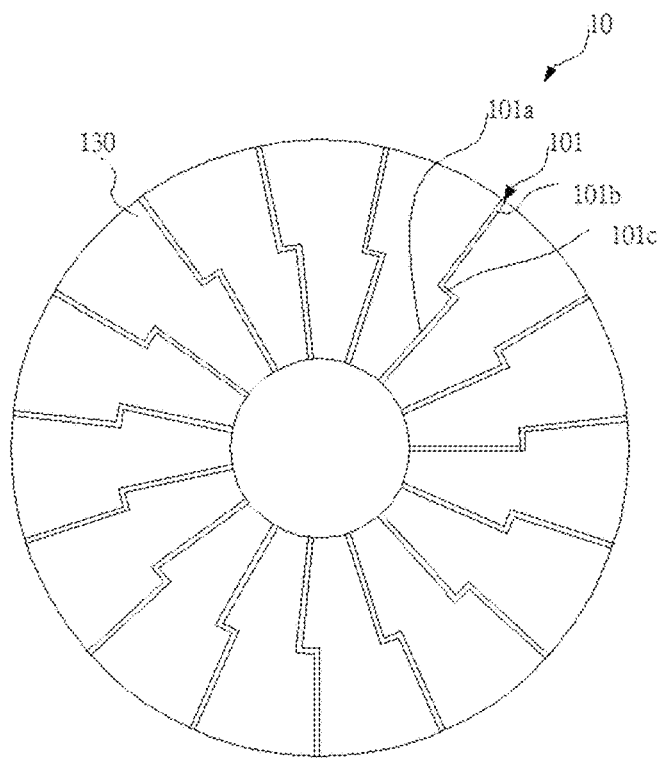

As shown in FIG. 36K, which shows a seventh embodiment of the heat sink 10. The heat sink 10 of the seventh embodiment is based on the above embodiment to modify a shape of the first fins 101. In the seventh embodiment, the first fins 101 includes a first portion 101a, a second portion 101b and a connecting portion 101c. Both the first portion 101a and the second portion 101b radially extend to connect to each other through the connecting portion 101c. The first portion 101a extends from an outer surface of the cylindrical room. The second portion 101b connects to the first portion 101a through the connecting portion 101c to further extend outward. The connecting portion 101c is not parallel to the radial direction. In one embodiment, the connecting portion 101c extends approximately along a circumferential direction or a direction perpendicular to a radial direction to make the first portion 101a and the second portion 101b are interlaced arranged in a radial direction without being located on a radial extending line. The connecting portion 101c can increase area of the first fins 11 to improve thermal exchange amount between airflow and the first fins 11. In addition, the connecting portion 101c also prevent the first fins from being inflected.

Figure 36L:
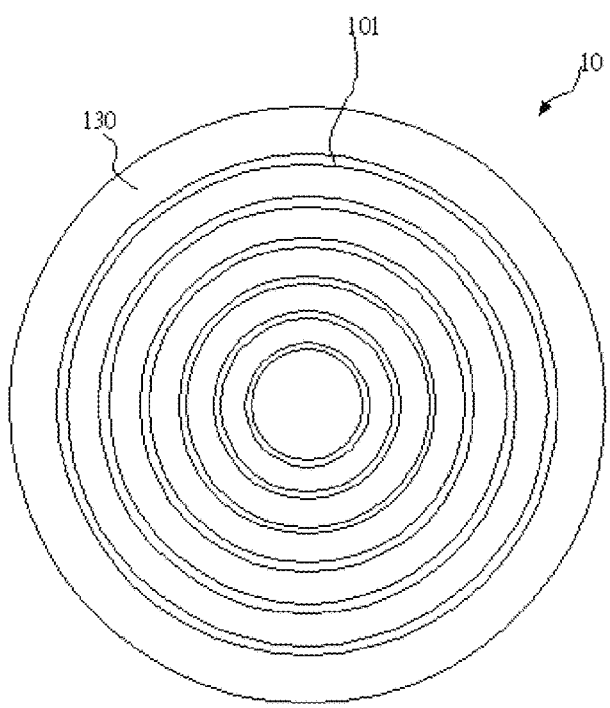
Figure 36M:
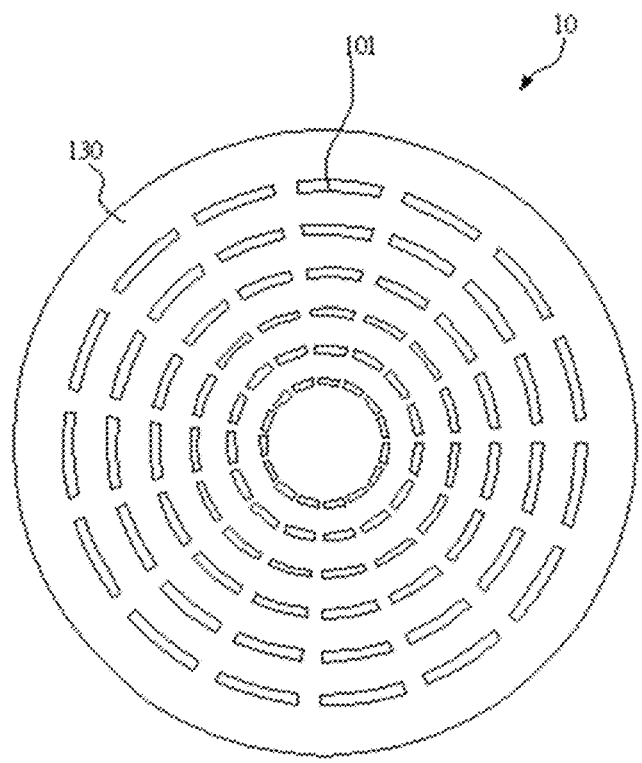

As shown in FIGS. 36L and 36M, which shows an eighth embodiment of the heat sink 10. The heat sink 10 of the eighth embodiment is based on the above embodiment to modify a shape of the first fins 101. In the eighth embodiment, multiple concentric circles are defined on the base 130 and the concentric circles perpendicularly extend from the base 130.

In FIG. 36L, each of the first fins 101 on a corresponding one of the concentric circles is continuous, i.e. the first fins 101 present continuously annular. Each concentric circle is disposed with one first fin 101.

In FIG. 36M, each of the first fins 101 on a corresponding one of the concentric circles is discontinuous, i.e. the first fins 101 present discontinuously annular. A gap is retained between two adjacent segments of the first fin 101 on the same concentric circle to allow air to flow radially.

Figure 37A:
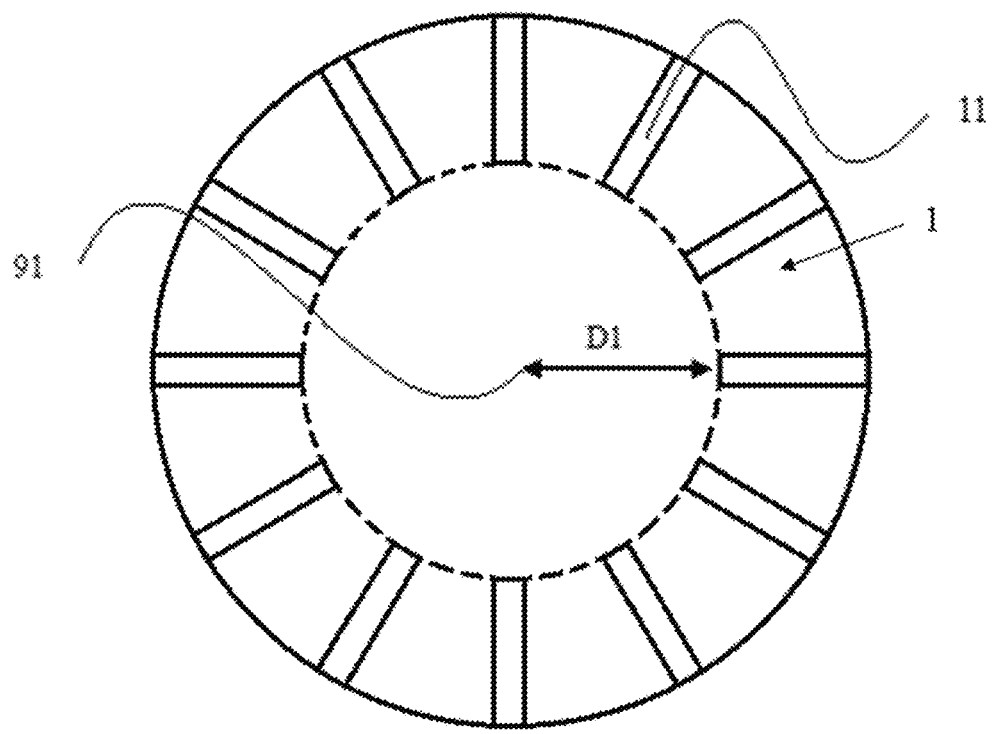
FIGS. 37A~37D are schematic views of some embodiments of the heat sink.
Figure 37B:
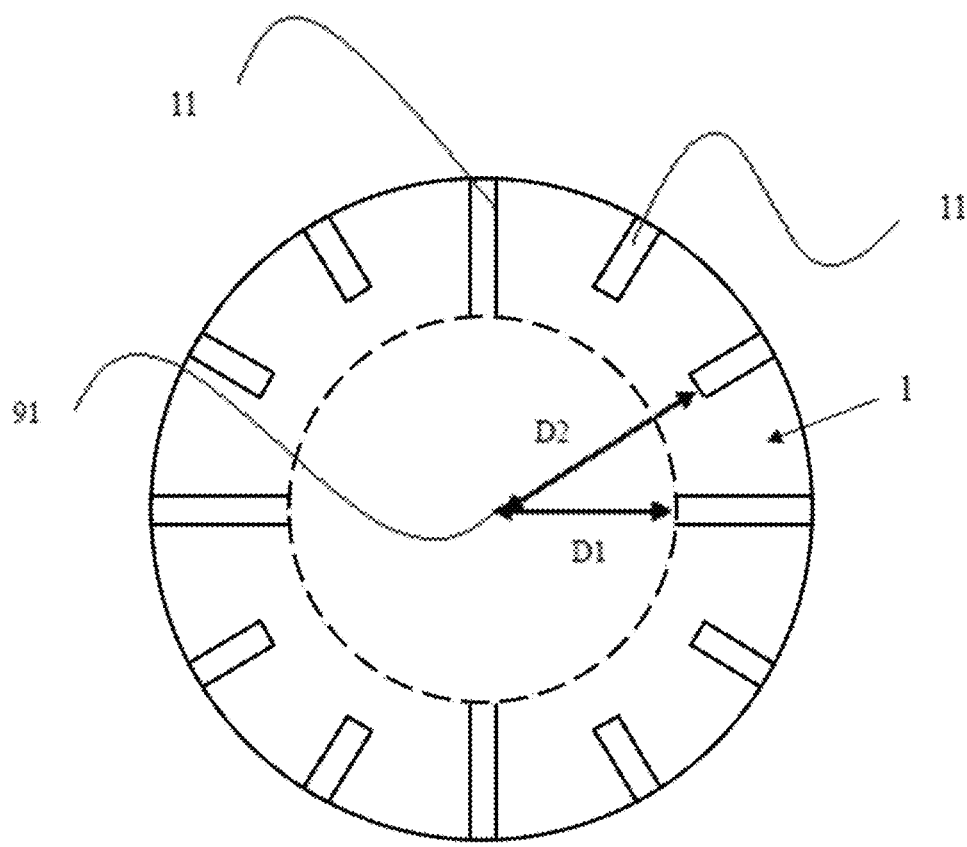

In some embodiments, the heat sink has a central axis XX. A plane A-A with the central axis XX as a normal and the central axis XX intersect at an intersection 91 in the cylindrical room of the heat sink. In some embodiments, the distance from the central axis XX to edges of the fins 11 along the plane A-A is greater than zero as shown in FIGS. 37A~37D, In FIG. 37A, the intersection 91 serves as a center, distance D1 as a radius, create a virtual circle on the plane A-A (the broken line shown in FIG. 37A). The heat sink 1 has at least one fin 11. The virtual circle abuts against an edge of the fin 11. When the heat sink 1 has a plurality if fins 11, a constant distance D1 exists from edges of the fins 11 to the central axis XX of the heat sink 1. The virtual circle abuts against edges of all the fins 11. In some embodiments, the heat sink 1 has multiple fins 11. The distances D1 and D2 from edges of at least two of the fins 11 to the central axis XX of the heat sink 1 are different. Distance D1 is less than distance D2. The intersection 91 serves as a center, the shorter distance D1 as a radius, create a virtual circle on the plane A-A (the broken line shown in FIG. 37B). The virtual circle does not abut against edges of the fins 11 with the distance D2 as shown in FIG. 37B.

Figure 37C:
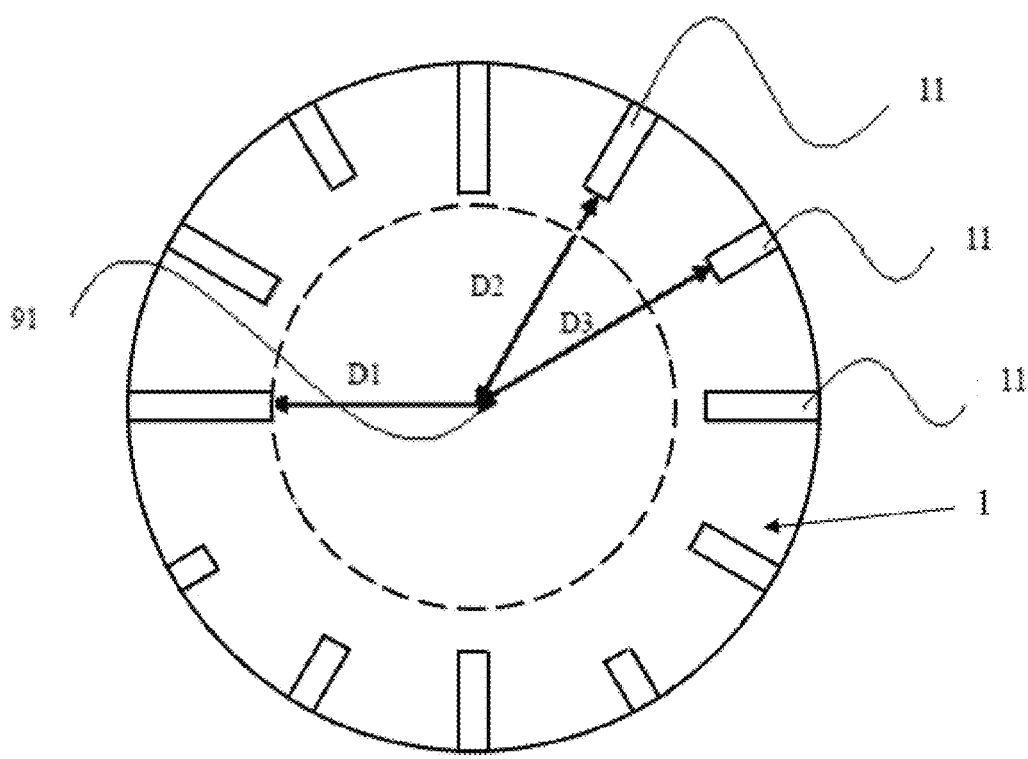

In some embodiments, the heat sink 1 has multiple fins 11. All distances D1, D2, D3 . . . Dn (only D1-D3 are shown in FIG. 37C) from edges of the fins 11 to the central axis XX are different. Distance D1 is less than distance D2 which is less than distance D3. The intersection 91 serves as a center, the shortest distance D1 as a radius, create a virtual circle on the plane A-A (the broken line shown in FIG. 37C). The virtual circle does not abut against edges of the fins 11 which are greater than the shortest distance D1 as shown in FIG. 37C.

Figure 37D:
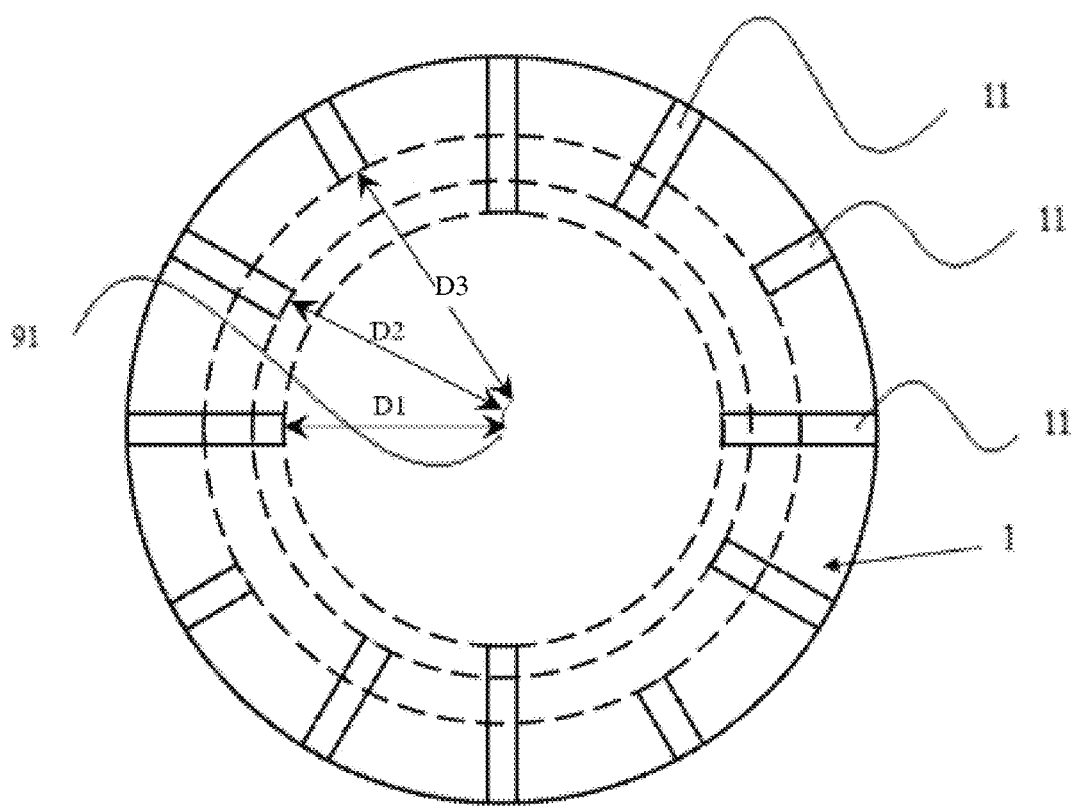

In some embodiments, the heat sink 1 has multiple fins 11. All distances D1, D2, D3 from edges of the fins 11 to the central axis XX are different. Distance D1 is less than distance D2 which is less than distance D3. The intersection 91 serves as a center, distances D1, D2, D3 as radiuses, create three virtual circles on the plane A-A (the broken line shown in FIG. 37D). Part of the virtual circles do not abut against parts of edges of the fins 11. Part of the virtual circles pass through parts of the fins 11 as shown in FIG. 37D. The virtual circle created on the plane A-A with distance D1 as a radius does not abut against the fins with distances greater than distance D1. The virtual circle created on the plane A-A with distance D2 as a radius, the fins 11 with a passing distance less than D2 do not abut against the fins with distances greater than D2.

Figure 38A:
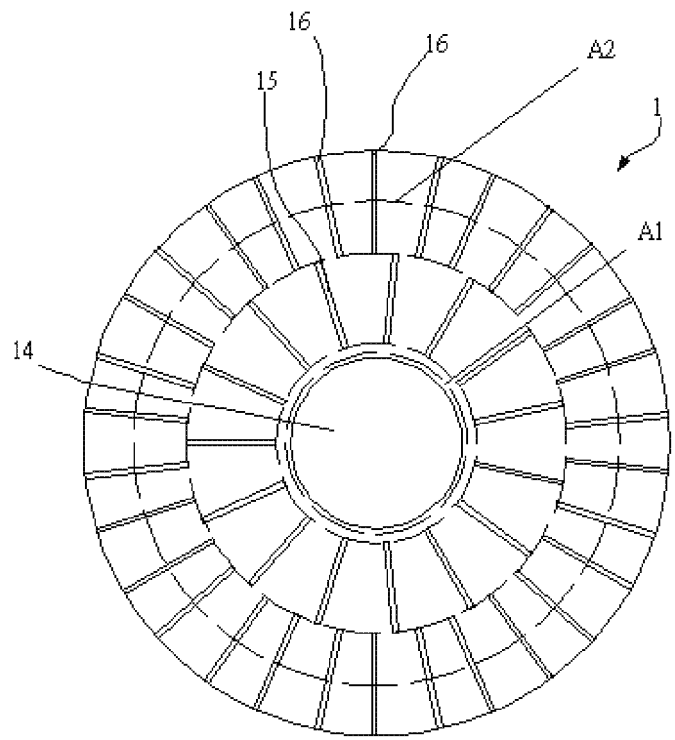
FIGS. 38A~38I are top views of some embodiments of the heat sink.

FIGS. 38A~38I are top views of some embodiments of the heat sink 1, which replace the heat sink 1 in FIG. 1 for detailed description. As shown in FIGS. 1 and 38A, the heat sink 1 includes heat dissipating units and a base 13. Each heat dissipating unit extends from the base 13 along an axial direction of the LED lamp. A specific embodiment of the heat dissipating units are fins 11. The heat dissipating units are radially arranged on the base 13. A root of each heat dissipating unit is connected to the base 13. A cylindrical room 14 is defined by inner edges of the heat dissipating units. The room 14 is used for receiving the sleeve 21. When the LED lamp is working, heat from the light board 3 is conducted by the base 13 to the heat dissipating units and finally from the heat dissipating units to external air to enhance heat dissipation. The lamp shell 1 connects to the heat sink 1 and approximately connects to upper edges of the heat dissipating units. Portions at least near the axis of the LED lamp of upper edges of the heat dissipating units are flatly cut off along a radial direction to define a flat connecting plane. A corresponding fastener can be arranged between the lamp shell 2 and upper edges of the heat dissipating units to fasten a lower end of the lamp shell 2 to the connecting plane to connect the heat sink 1.

As shown in FIGS. 1, 2 and 38A, a first cross-section A1 is defined on the connecting plane along a radial direction of the LED lamp. A second cross-section A2 is defined on a connecting surface between the heat sink 1 and the light board 3 along a radial direction of the LED lamp. In an embodiment, the amount of the heat dissipating units being projected onto the first cross-section A1 in an axial direction of the LED lamp is less than the amount of the heat dissipating units being projected onto the second cross-section A2 in an axial direction of the LED lamp. That is, in an axial direction, because air flows upward, the heat dissipating units should be prevented from being obstructed by the lamp shell 2 as much as possible. This makes upper edges of most heat dissipating units exposed to air to form heat dissipating channels which are not obstructed by the lamp shell 2 for improving convection effect of the heat dissipating units. In another aspect, by means of the amount of the heat dissipating units being projected onto the first cross-section A1 in an axial direction of the LED lamp being less than the amount of the heat dissipating units being projected onto the second cross-section A2 in an axial direction of the LED lamp can accomplish the above technical effect. In an aspect of area of axial projection of the heat dissipating units, by means of the amount of the heat dissipating units being projected onto the first cross-section A1 in an axial direction of the LED lamp being less than the amount of the heat dissipating units being projected onto the outside of the first cross-section A1 in an axial direction of the LED lamp can accomplish the above technical effect.

As shown in FIG. 38A, multiple annular zones are defined on the heat sink 1. Each annular zone owns different amount of the heat dissipating units from the others'. For example, the amount of the heat dissipating units owned by an inner annular zone is less than the amount of the heat dissipating units owned by an outer annular zone. The amount or area of the annular zones overlapping with the projection of the first cross-section A1 in an axial direction of the LED lamp is less than the amount or area of the annular zones overlapping with the projection of the second cross-section A2 in an axial direction of the LED lamp.

Figure 38B:
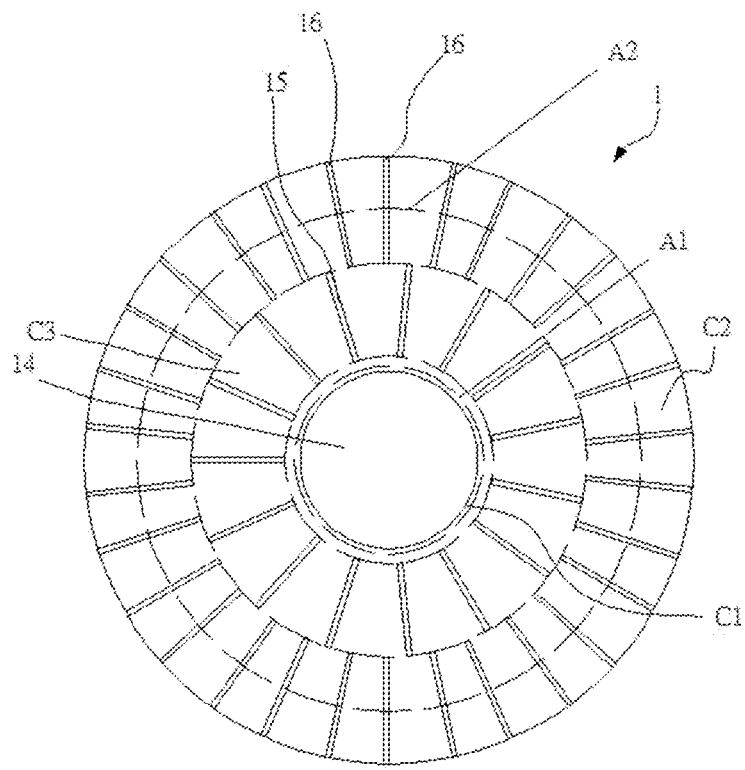

In detail, as shown in FIG. 38B, the heat dissipating units may include multiple first heat dissipating units 15 and multiple second heat dissipating units 16 (where both the first heat dissipating units 15 and the second heat dissipating units 16 are different from both the first fins 111 and the second fins 112 in FIGS. 23 and 24 in naming principle and category). In FIG. 38B, the first heat dissipating units 15 are radially inner fins and the second heat dissipating units 16 are radially outer fins. The first heat dissipating units 15 are mainly projected onto inner annular zones and the second heat dissipating units 16 are mainly projected onto outer annular zones. An outer edge of each first heat dissipating units 15 radially branches away into two second heat dissipating units 16 (the first heat dissipating units 15 and the second heat dissipating units 16 may be continued or discontinued, the latter means a radial gap is retained between the first heat dissipating units 15 and the second heat dissipating units 16) to make the second heat dissipating units 16 is greater than the first heat dissipating units 15 in number. In addition, the first cross-section A1 is projected onto inner annular zones and the second cross-section A2 is projected onto outer annular zones, so the first heat dissipating units 15 is projected onto inner annular zones in an axial direction of the LED lamp and the second heat dissipating units 16 is projected onto outer annular zones in an axial direction of the LED lamp. As a result, the amount or area of the first heat dissipating units 15 being projected onto the first cross-section A1 in an axial direction of the LED lamp is less than the amount or area of the second heat dissipating units 16 being projected onto the second cross-section A2 in an axial direction of the LED lamp.

Figure 38C:
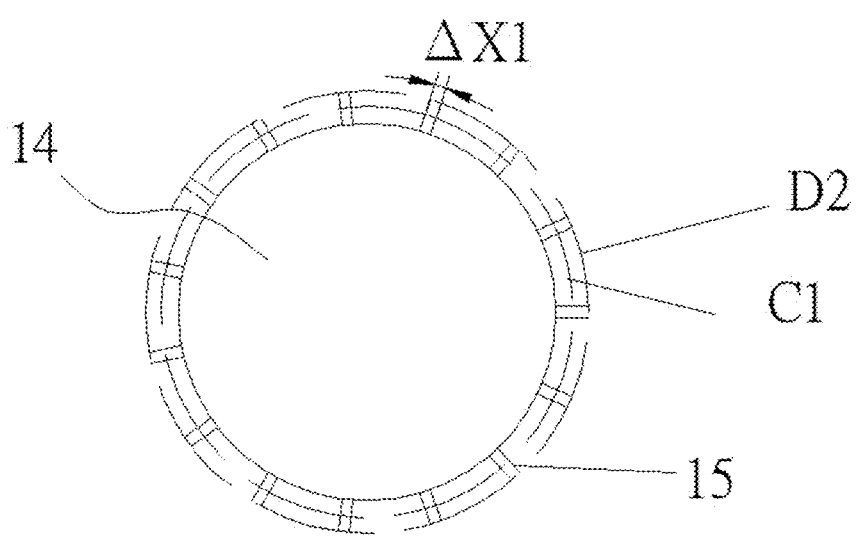
Figure 38D:
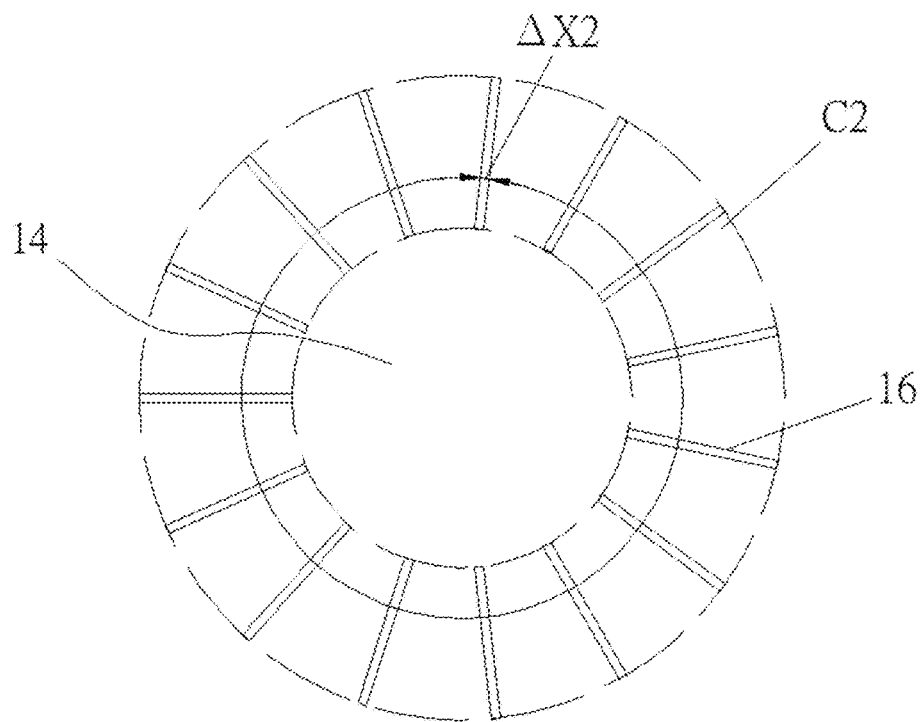

As shown in FIGS. 38C and 38D, when the first heat dissipating units 15 is greater than the second heat dissipating unit 16 in thickness, because of radial arrangement, a distance between adjacent two of the first heat dissipating units 15 near the axial axis of the LED lamp is less than a distance between adjacent two of the second heat dissipating units 16 away from the axial axis of the LED lamp. When thickness of the first and second heat dissipating unit 15, 16 is properly configured, any circumferential perimeter (sum of AX1) of the first cross-section A1 of the first heat dissipating unit 15 is equal to any circumferential perimeter (sum of AX2) of the second cross-section A2 of the second heat dissipating unit 16. The circumferential perimeter means a total length of arcs of any virtual circles with the axis of the LED lamp as a center cutting the first heat dissipating units 15 or the second heat dissipating units 16.

In detail, both the first and second heat dissipating units 15, 16 are fins which are radially distributed in the heat sink 1. The heat sink 1 is outward divided into a first annular zone C1 and a second annular zone C2. The heat sink 1 further includes a cylindrical room 14 inside the first annular zone C1. The cylindrical room 14 is mainly used for receiving part of the power source board and providing a heat dissipating channel. A virtual circle with the axis of the heat sink 1 as the center is created. When the sum of arcs which are formed by the virtual circle falling in the first annular zone C1 to cut the fins is X1 (sum of AX1), and the sum of arcs which are formed by the virtual circle falling in the second annular zone C2 to cut the fins is X2 (sum of AX2), then X1<X2. The ratio of the sum of arcs which are formed by the virtual circle to cut the fins to the circumferential perimeter of the virtual circle may be 06~0.2. This makes the fins have sufficient cross-sectional area to perform thermal conduction and maintain distances between the fins to keep sufficient sizes of convection channels. Also, surface area of the fins is sufficient enough under the same weight.

Furthermore, if the fins in the first annular zone C1 needs larger cross-sectional area to perform thermal conduction, for example, density of the LED chips 311 of the LED board 3 projected onto the first annular zone C1 is greater than density of projection on the second annular zone C2 (where the term "density" means the number of the LED chips 311 in unit area of the annular zone), and the ratios of X1 and X2 to the perimeter of the virtual circle are Ra1 and Ra2, respectively, then it can be configured that Ra1>Ra2 or X1>X2 to make the fins in the first annular zone C1 have larger cross-sectional area to perform thermal conduction and maintain distances between the fins to keep sufficient sizes of convection channels.

Contrarily, if the fins in the second annular zone C2 needs larger cross-sectional area to perform thermal conduction, for example, density of the LED chips 311 of the LED board 3 projected onto the first annular zone C1 is greater than density of projection on the second annular zone C2, and the ratios of X1 and X2 to the perimeter of the virtual circle are Ra1 and Ra2, respectively, then it can be configured that Ra1<Ra2 or X1<X2 to make the fins in the second annular zone C2 have larger cross-sectional area to perform thermal conduction and maintain distances between the fins in the first annular zone C1 to keep sufficient sizes of convection channels.

If density of the LED chips 311 of the LED board 3 projected onto the first annular zone C1 is equal to density of projection on the second annular zone C2, then it can be configured that Ra1=Ra2 or X1=X2 to make the fins in the first annular zone C1 is similar to the second annular zone C2 in efficiency of thermal conduction to avoid high temperature difference in the light board 3.

Figure 38E:
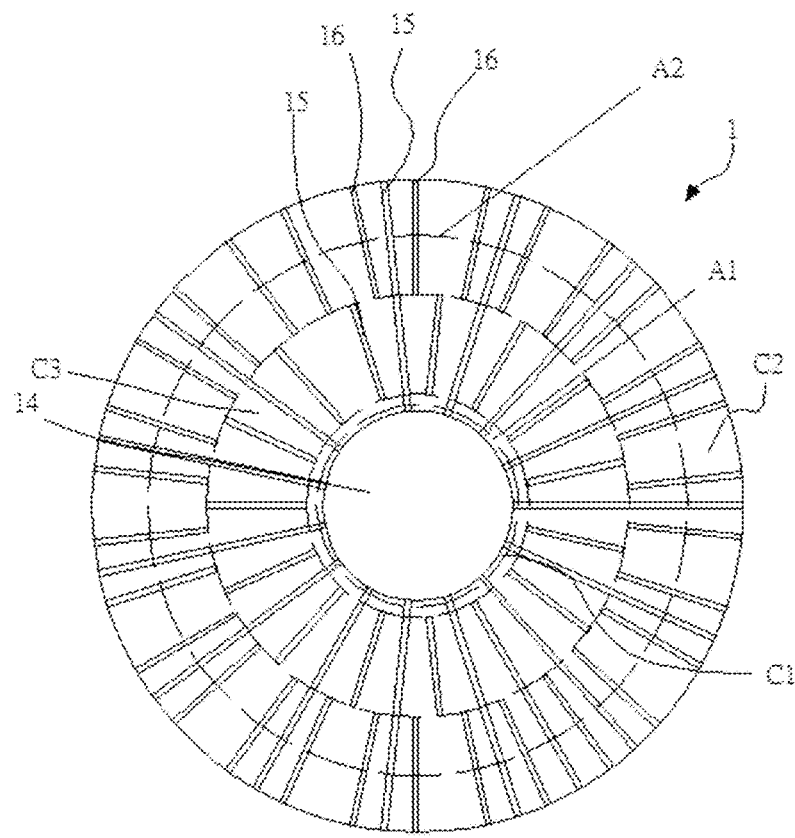

As shown in FIG. 38E, in some embodiments, outer edges of merely some first heat dissipating units 15 radially branch away into two second heat dissipating units 16 or the first heat dissipating units 15 and the second heat dissipating units 16 are individually disposed with different distribution density. The heat sink 1 in FIG. 38F, the amount or area of the first heat dissipating units 15 being projected onto the first cross-section A1 in an axial direction of the LED lamp is greater than the amount or area of the second heat dissipating units 16 being projected onto the second cross-section A2 in an axial direction of the LED lamp. Identically, in a condition of multiple annular zones, the amount or area of the first heat dissipating units 15 being projected onto inner annular zones in an axial direction of the LED lamp would be greater than the amount or area of the second heat dissipating units 16 being projected onto outer annular zones in an axial direction of the LED lamp.

Figure 38F:
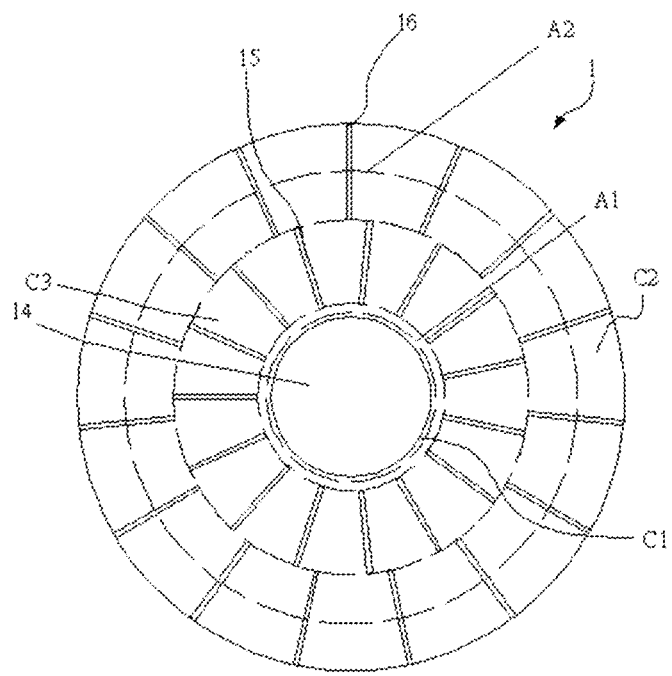

Identically, in FIG. 38F, when the first heat dissipating units 15 is less than the second heat dissipating units 16 in thickness, the interval between adjacent two of the first heat dissipating units 15 may be greater than the interval between adjacent two of the second heat dissipating units 16. When thickness of the first and second heat dissipating units 15, 16 is properly configured, any circumferential perimeter of the first cross-section A1 of the first heat dissipating units 15 is equal to any circumferential perimeter of the second cross-section A2 of the second heat dissipating units 16.

As shown in FIG. 38F, in one embodiment, outer edges of merely some first heat dissipating units 15 radially branch away into two second heat dissipating units 16 or the first heat dissipating units 15 and the second heat dissipating units 16 are individually disposed with one-to-one correspondence in a single radial line to make the amount of the first heat dissipating units 15 being projected onto the first cross-section A1 in an axial direction of the LED lamp be equal to the amount of the second heat dissipating units 16 being projected onto the second cross-section A2 in an axial direction of the LED lamp. Identically, in a condition of two or more annular zones, the amount or area of the first heat dissipating units 15 being projected onto inner annular zones in an axial direction of the LED lamp would be equal to the amount or area of the second heat dissipating units 16 being projected onto outer annular zones in an axial direction of the LED lamp.

As shown in FIG. 38F, in one embodiment, when the first heat dissipating units 15 are equal to the second heat dissipating units 16 in thickness, and the interval between adjacent two of the first heat dissipating units 15 is equal to the interval between adjacent two of the second heat dissipating units 16, any circumferential perimeter of the first cross-section A1 of the first heat dissipating units 15 is equal to any circumferential perimeter of the second cross-section A2 of the second heat dissipating units 16.

Figure 38G:
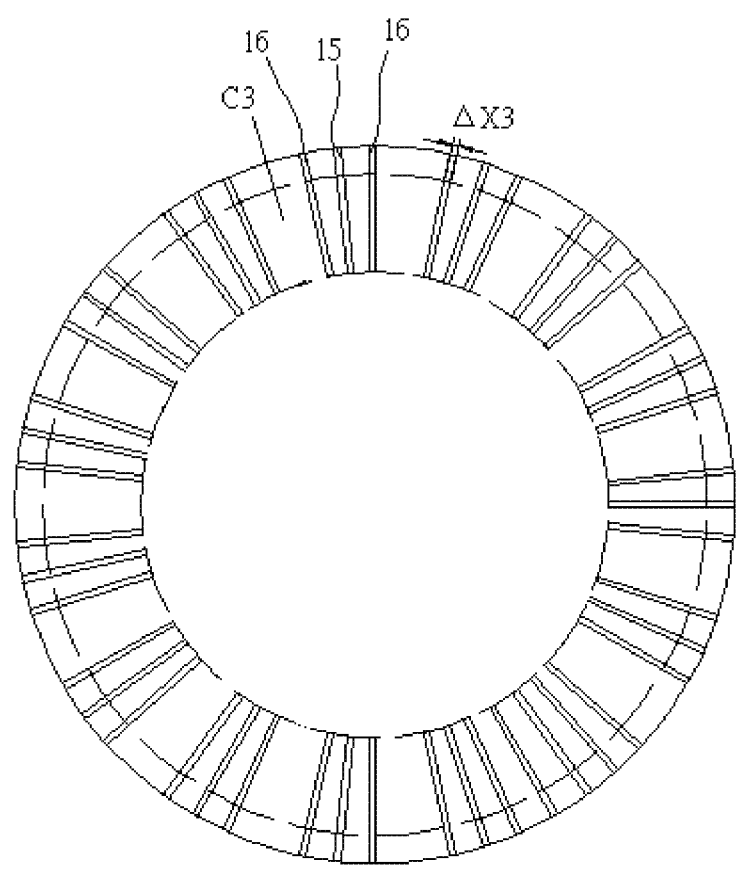

As shown in FIGS. 38A and 38G, the amount of the annular zones may be more than two, for example, the heat sink 1 further includes a third annular zone C3 outside the second annular zone C2. When the sum of arcs which are formed by the virtual circle falling in the third annular zone C3 to cut the fins is X3 (AX3), and X1<X2<X3. When the ratios of X1, X2 and X3 to the perimeter of the virtual circle are Ra1, Ra2 and Ra3, respectively, then Ra1=0.06~0.13, Ra2=0.1~0.18, Ra3=0.12~0.16, and all the values of Ra1, Ra2 and Ra3 fall in the range of 0.06~0.2. This makes the fins have sufficient cross-sectional area to perform thermal conduction and maintain distances between the fins to keep sufficient sizes of convection channels. Also, surface area of the fins is sufficient enough under the same weight.

Figure 38H:
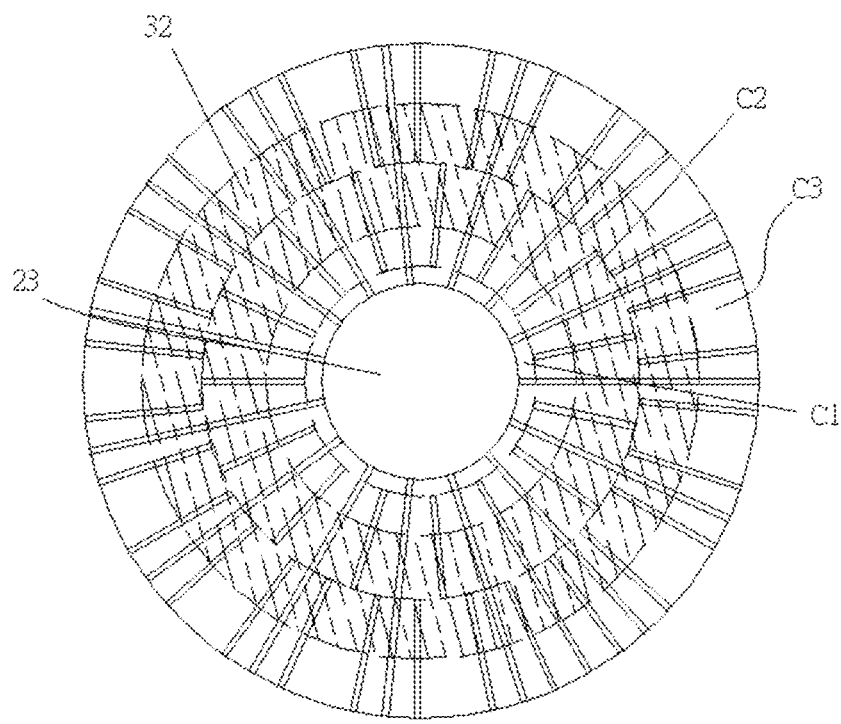
Figure 38I:
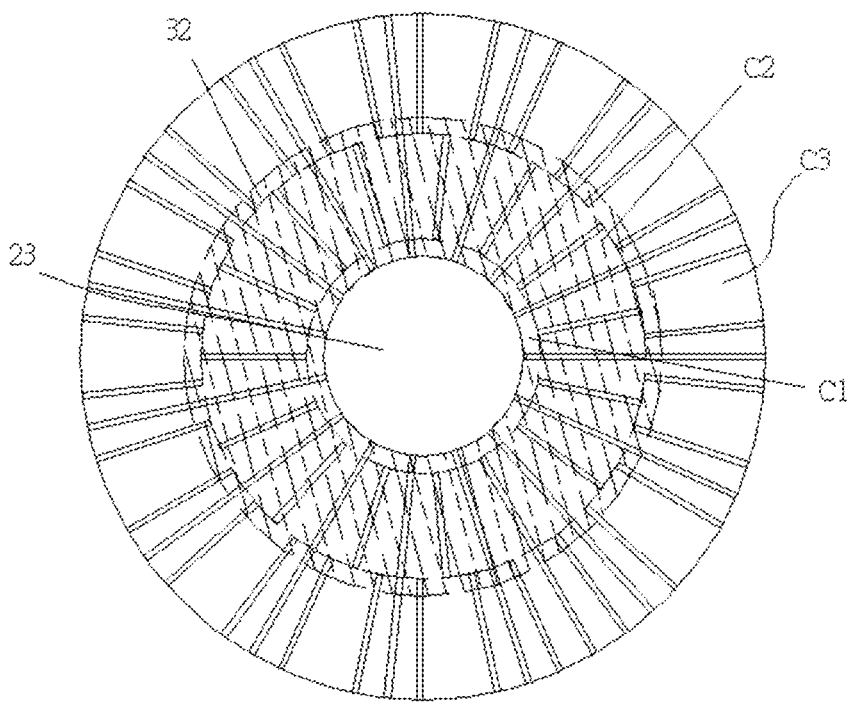

As shown in FIGS. 11, 38H and 38I, a chip mounting zone is defined on the light board 3 (a zone on which the LED chips 311 are located). The LED chips 311 are mounted on the chip mounting zone. At least part of the chip mounting zone falls in a projection of the second annular zone C2 or the third annular zone C3. In detail, the chip mounting zone overlaps the heat sink 1 in outer annular zones as much as possible so as to make the corresponding fins (the first heat dissipating units 111 or the second heat dissipating units 112) located on an outer edge of the base 13 to obtain better cooling effect and be able to correspond to more heat dissipating units (outer heat dissipating units are greater than inner heat dissipating units in number). In an embodiment, at least 80% of the chip mounting zone falls in the projection(s) of the second annular zone C2 and/or the third annular zone C3. Preferably, all the chip mounting zone falls in the projection(s) of the second annular zone C2 and/or the third annular zone C3 as shown in FIG. 38I.

When the fins are radially arranged on the heat sink 1 with even thickness, the number of the fins cut by the virtual circle falling in the first annular zone C1 is N1, the number of the fins cut by the virtual circle falling in the second annular zone C2 is N2, and N1<N2, X1<X2 would be substantially implemented. Identically, the third annular zone C3 is located outside the second annular zone C2, the number of the fins cut by the virtual circle falling in the third annular zone C3 is N3, and N1<N2<N3, X1<X2<X3 would be substantially implemented. Under such an arrangement, the chip mounting zone can still be arranged as shown in FIG. 38H.

Figure 39:
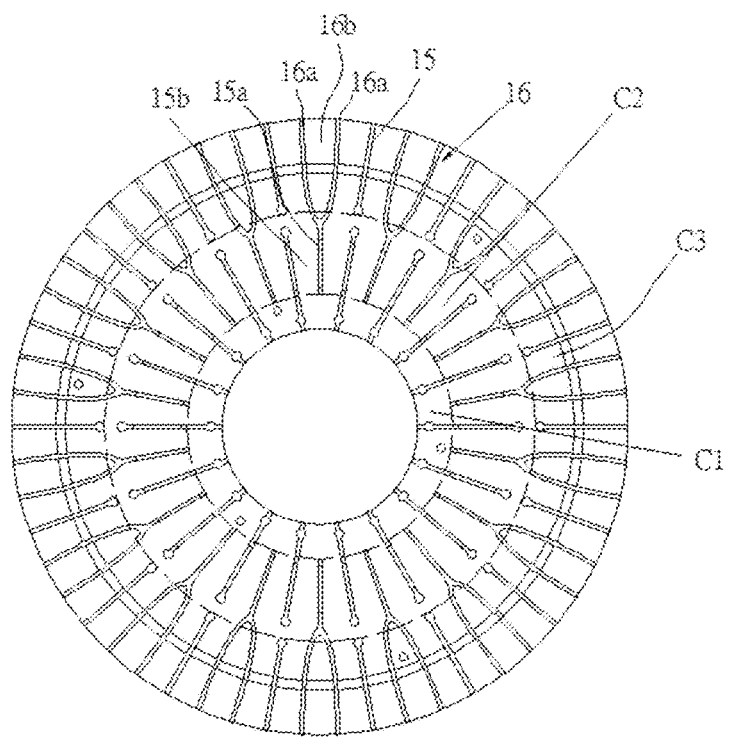
FIG. 39 is a top view of an embodiment of the heat sink.

FIG. 39 is a top view of an embodiment of the heat sink 1. As shown in FIG. 39, the heat sink 1 includes multiple first heat dissipating units 15 and multiple second heat dissipating units 16 (where both the first heat dissipating units 15 and the second heat dissipating units 16 are different from both the first fins 111 and the second fins 112 in FIGS. 23 and 24 in naming principle and category). Both the first heat dissipating units 15 and the second heat dissipating units 16 are fins. Each first heat dissipating units 15 includes a first fin 15a radially arranged on the heat sink 1 and a radial first channel 15b. The first channel 15b is a gap between two first heat dissipating units 15a. Multiple annular zones are outward defined on the heat sink 1, namely, the first annular zone C1, the second annular zone C2 and the third annular zone C3. Parts of the first channel 111b, which are located in different annular zones, have different widths. In the same annular zone, the first channel 15b in an outer portion is greater than the first channel 15b in an inner portion in width.

As shown in FIG. 39, the first heat dissipating units in different annular zones may adopt different configurations of density. The first fins of the first heat dissipating units 15 may extend in between at least two annular zones to make the first heat dissipating units interlacedly arranged and the first channel 15b in different annular zones have different widths. Alternatively, the first fins extend in between at least two annular zones and are discontinuous at a junction of the two annular zones.

As shown in FIG. 39, each second heat dissipating units 16 includes two second fins 16a and a second channel 16b formed therebetween. An end of the second channel 16b, which is toward the central axis of the heat sink 1 is discontinuously open or closed. The first heat dissipating units 15 and the second heat dissipating units 16 may be located in different annular zones, and the annular zone in which the second heat dissipating units 16 is located is outside the annular zone in which the first heat dissipating units 15 is located.

As shown in FIG. 39, when an end of the second channel 16b, which is toward the central axis of the heat sink 1 is closed, two second fins 16 may extend to an outer edge of the first fin 15. Both the closed end of the second fins 16 and an outer edge of the first fin are located on the same radial line but are discontinuous to form a gap as an additional channel.

LEDs generates heat while they are emitting. A key parameter in considering of thermal conduction of LEDs is thermal resistance. The smaller the thermal resistance is, the better the thermal conduction is. Primarily, factors of thermal resistance include length of conduction path, conduction area and thermal conductivity of a thermo-conductive material. It can be expressed by the following formula:

Thermal resistance=length of conduction path $L$/(conduction area $S$*thermal conductivity)

That is to say, the shorter the conduction path is and the larger the conduction area is, the lower the thermal conductivity is.

As shown in FIG. 29, in this embodiment, the light board 3 includes at least one LED chip set 31 having LED chips 311.

As shown in FIG. 29, in this embodiment, the light board 3 is divided into three areas comprising an inner ring, a middle ring and an outer ring. All the LED chip sets 31 are located in the three areas. In one example, the inner ring, the middle ring and the outer ring are separately mounted by different amount of LED chip sets 31. In another aspect, the light board 3 includes three LED chip set 31. The three LED chip sets 31 are respectively located in the inner ring, the middle ring and the outer ring. Each of the LED chip sets 31 separately in the inner ring, the middle ring and the outer ring has at least one LED chip 311.

Four hypothetical circle lines are defined on the light board 3 as shown in FIG. 29. The outer ring is defined by the area between the outermost two circle lines of the four, the inner ring is defined by the area between the innermost two circle lines of the four, and the middle ring is located between the two areas mentioned above. In another embodiment, the light board 3 is separated into two rings (areas), and the chip sets 31 are divided to be mounted on the two rings.

As shown in FIG. 29, several LED chips 311 in a circle or approximately in a circle compose an LED chip set. There are several LED chip sets 31 on the light board 3. In a single LED chip set 31, a center distance between two adjacent LED chips 311 is L2. A center distance between any LED chip 311 of any LED chip set 31 and the nearest LED chip 311 of an adjacent LED chip set 31 is L3. The ratio of L2 to L3 is 1:0.8~2, preferably, L2:L3 is 1:1~1.5. This makes distribution of the LED chips 311 so even to accomplish an object of even light output.

Figure 40:
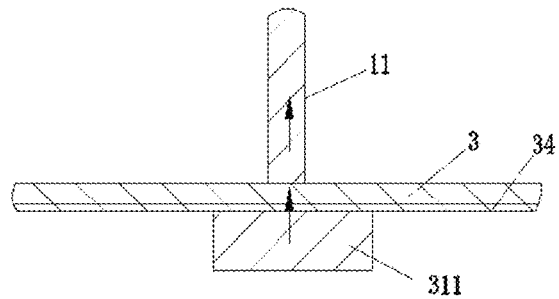
FIG. 40 is a schematic view of the combination of the fins and the LED chips of an embodiment.
Figure 41:
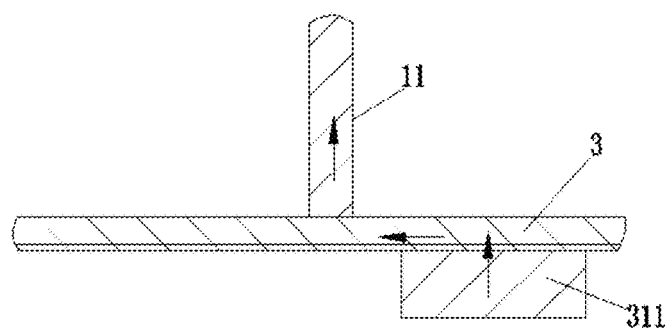
FIG. 41 is a schematic view of the combination of the fins and the LED chips, according to some embodiments of the present invention.

FIG. 40 is a schematic view of the combination of the fins 11 and the LED chips 311 of one embodiment. As shown in FIGS. 29 and 40, in this embodiment, when at least one fin 11 is projected onto the plane on which the LED chip sets 31 are located along the axial direction of the LED lamp, a projection of the fin 11 at least touches at least one LED chip 311 of the LED chip set 31. In detail, when at least one fin 11 is projected onto a plane on which the LED chip set 31 is located along the axial direction of the LED lamp, a projection of the fin 11 at least touches at least one LED chip 311 of the LED chip set 31 in the inner ring, the middle ring or the outer ring. As shown in FIG. 40, the projection of the fin 11 touches an LED chip 311. As indicated by the arrow in the figure, it is a heat dissipating path of the LED chip 311 and the fin 11. As shown in FIG. 41, the projection of the fin 41 does not touch the LED chip 311 in the figure. As indicated by the arrow in the figure, it is a heat dissipating path of the LED chip 311 and the fin 11. It can be seen that the heat dissipating path of the latter is longer than the former's. As a result, by means of a projection of a fin at least touching at least one LED chip 311 of the LED chip set 31 in the inner ring, the middle ring or the outer ring, a heat dissipating path of the LED chip 311 can be shortened. This can reduce thermal resistance to be advantageous to thermal conduction. Preferably, a fin 11 is projected onto a plane on which the LED chip set 31 is located along the axial direction of the LED lamp, a projection of any fin 11 (the first fin 111 or the second fin 112) at least touches at least one LED chip 311 of the LED chip set 31.

In this embodiment, the LED chip sets 31 in outer rings corresponding to the fins 11 are greater than the LED chip sets 31 in inner rings in number. Here the term "corresponding to" means projection relationship in the axial direction of the LED lamp, for example, when the LED chip sets 31 in outer rings are projected onto the fins 11 in the axial direction of the LED lamp, the fins 11 to which the LED chips 31 in outer rings correspond are located on a relatively outer portion of the heat sink 1. Here the LED chip sets 31 in outer rings have more LED chips 311 in number, so they need more fins 11 (area) to implement heat dissipation.

As shown in FIGS. 1 and 29, the light board 3 has an inner border 3002 and an outer border 3003. Both the inner border 3002 and the outer border 3003 separately upward extend along the axial direction of the LED lamp to form a region. An area of part of the fins 11 inside the region is greater than an area of part of the fins 11 outside the region. As a result, the most of the fins 11 can correspond to the light board 3 (a shorter heat dissipating path) to enhance heat dissipating efficiency of the fins 11 and increase effective area of heat conduction of the fins 11 to the LED chips 311.

As shown in FIGS. 3, 5 and 29, a reflecting region 3001 is disposed in a region between the inner ring and an outer edge of the light board 3 to reflect the upward light to the light output surface 43. This can reduce loss of light in an opposite direction of light output in the axial direction of the LED lamp to increase overall intensity of light output.

Figure 42:
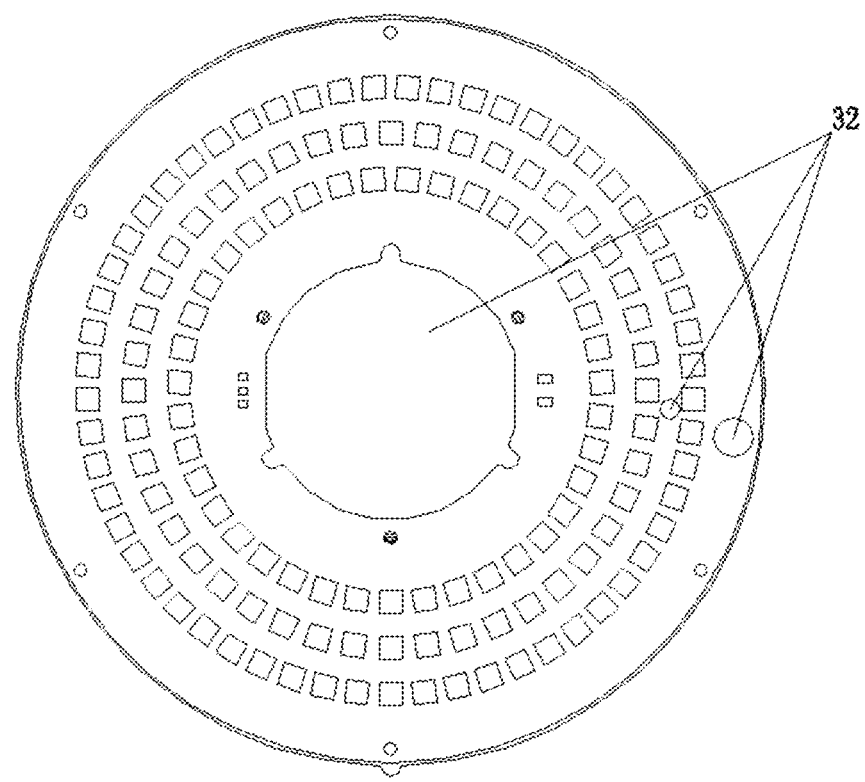
FIG. 42 is a schematic view of an embodiment of the light board.

As shown in FIGS. 4 and 29, the light board 3 is formed with a third aperture 32 separately communicating with the first heat dissipating channel 7a and the second heat dissipating channel 7b. For example, the third aperture 32 communicates with spaces between the fins 11 and the chamber of the lamp shell 2 to form air convection paths between the spaces between the fins 11 and between the chamber of the lamp shell 2 and the outside of the Led lamp. The third aperture 32 is located inside the inner ring of the LED lamp. Thus, it would not occupy the space of the reflecting region 3001 to affect reflective efficiency. In detail, the third aperture 32 is located at a central region of the light board 3 and both the first air inlet 2201 and the second air inlet 1301 make air intake through the same aperture (the third aperture 32). In one example, after convection air passes through the third aperture 32, and then enters the first air inlet 2201 and the second air inlet 1301. The third aperture 32 is located at a central region of the light board 3, so both the first air inlet 2201 and the second air inlet 1301 can commonly use the same air intake. Thus, this can prevent occupying an excessive region of the light board 3 and prevent the usable regional area of the light board 3 for disposing the LED chips 311 from decreasing due to multiple air intakes. On the other hand, the sleeve 21 corresponds to the third aperture 32, so convection air may have an effect of thermal isolation to prevent temperatures inside and outside the sleeve 21 from mutually affecting each other when air enters. In other embodiments, if both the first air inlet 2201 and the second air inlet 1301 are located at different positions, then the third aperture 32 may be multiple in number to correspond to both the first air inlet 2201 and the second air inlet 1301. In detail, as shown in FIG. 42, the third aperture 32 may be located at a middle portion or outer portion or between the LED chips 311 to correspond to both the first air inlet 2201 and the second air inlet 1301. stopped As shown in FIG. 29, in an embodiment, in the inner ring, both adjacent two of the LED chips 311 and the axis of the LED lamp form a center angle A; in the middle ring, both adjacent two of the LED chips 311 and the axis of the LED lamp form a center angle B. The center angle B is less than the center angle A in degree. In the outer ring, both adjacent two of the LED chips 311 and the axis of the LED lamp form a center angle C, and the center angle C is less than the center angle B in degree. For example, the LED chips 311 in the outer ring are more than those in the middle ring in number. Thus, a distance between adjacent two of the LED chips 311 in the outer ring is not much greater than a distance between adjacent two of the LED chips 311 in the middle ring, even, the two distances may be similar or identical. As a result, both distribution of the LED chips 311 and light output will be very even. In one example, the LED chip sets 31 are multiple in number and are annularly mounted on the light board 3. A center angle formed by adjacent two of the LED chips 311 in an inner portion and the axis of the LED lamp is greater than a center angle formed by adjacent two of the LED chips 311 in an outer portion and the axis of the LED lamp. That is, The LED chips 311 of outer LED chip sets 31 are greater than the LED chips 311 of inner LED chip sets 31 in number such that a distance between adjacent two of the LED chips 311 of outer LED chip sets 31 is less than a distance between adjacent two of the LED chips 311 of inner LED chip sets 31. As a result, both distribution of the LED chips 311 and light output will be very even.

As shown in FIG. 40, in one embodiment of the present invention, the light board 3 is provided with an insulative layer 34 with high reflectivity. The insulative layer 34 may adopt thermal grease. The insulative layer 34 is smeared on the light board 3 to an edge thereof. A distance between the LED chips 311 at the outermost position and an edge of the light board 3 is greater than 4 mm. Preferably, a distance between the LED chips 311 at the outermost position and an edge of the light board 3 is greater than 6.5 mm but less than 35 mm. In addition, a creepage distance between the outermost LED chips 311 and the heat sink 1 can be guaranteed to prevent arc occurring between the LED chips 311 and the heat sink. In addition, the insulative layer 34 may also have an effect of thermal isolation to prevent overheating and deformation of the lamp cover 4.

Figure 43:
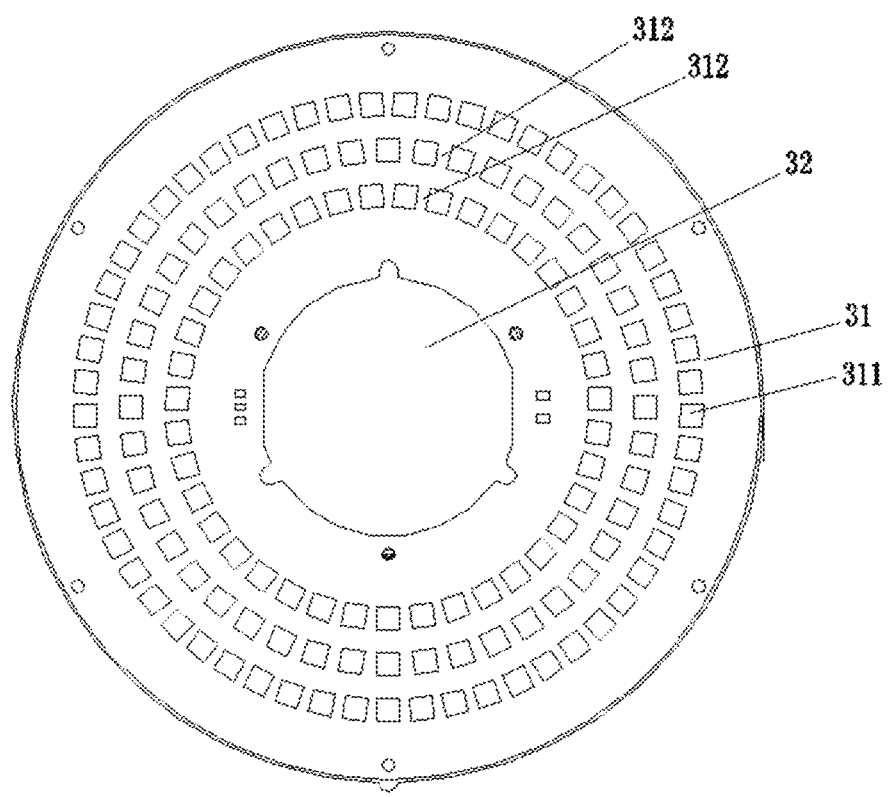
FIG. 43 is a schematic view of another embodiment of the light board.

FIG. 43 is a schematic view of the light board 3 in this embodiment. As shown in FIG. 43, in this embodiment, the LED chip sets 31 are at least two in number. The at least two LED chip sets 31 are annularly arranged on the light board 3 in order. Each LED chip set 31 includes at least one LED chip 311. Each LED chip 311 of one of the LED chip sets 31 on the light board 3 is radially interlacedly arranged with any one LED chip 311 of adjacent one of the LED chip sets 31 on the light board 3. That is, the LED chips 311 of different LED chip sets 31 are located in different directions in a radial direction of the LED lamp. In one example, if any line starting with the axis of the LED lamp and extending toward a radial direction of the LED lamp cuts two or more of the LED chips 311, then it will cut different positions of these two or more LED chips 311 and will not cut the same positions of these two or more LED chips 311. As a result, if there is convection on the light board 3 and air radially flows on the light board 3, the contact between air and the LED chips 311 will be more sufficient and a better effect of heat dissipation will be obtained because of the airflow paths. In addition, in the aspect of lighting effect, such distribution of the LED chips 311 is more advantageous to uniformity of light output.

In this embodiment, an open region 312 is formed between adjacent two of the same LED chip set 31 to allow air to flow between the LED chips 311 to bring out heat generated from the working LED chips 311. The open region 312 between any two adjacent LED chips 311 of one of adjacent two of the chip sets 31 on the light board 3 interlaces to and communicates with the open region 312 between any two adjacent LED chips 311 of another one of the chip sets 31 on the light board 3 in a radial direction of the LED board 3. As a result, if there is convection on the light board 3 and air radially flows on the light board 3, the contact between air and the LED chips 311 will be more sufficient and a better effect of heat dissipation will be obtained because of the airflow paths. If both the open region 312 between any two adjacent LED chips 311 of one of adjacent two of the chip sets 31 on the light board 3 and the open region 312 between any two adjacent LED chips 311 of another one of the chip sets 31 on the light board 3 of the LED board 3 are in the same radial direction, then air will flow along radial directions of the light board 3. The contact between air and the LED chips 311 will decrease to be disadvantageous to heat dissipation of the LED chips 311 because of the airflow paths.

For example, three LED chip sets 31 are annularly disposed along a radial direction of the light board 3 in order, any open regions 312 of the three LED chips 31 are not in the same direction in a radial direction. Thus, convection paths on the light board 3 can be optimized to increase efficiency of the heat dissipation.

In some applications, when LEDs are emitting, a light distribution region will be formed under the LED lamp. This means distribution of intensity of light source. The design of the LED lamp aims for concentrating the light distribution region to a specific zone to increase local intensity.

Figure 44A:
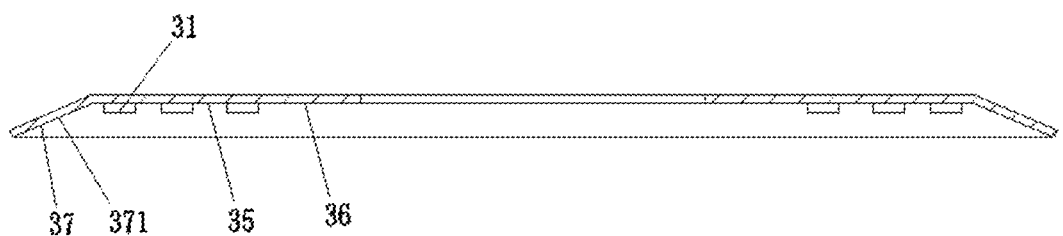
FIGS. 44A~44F are schematic views of some embodiments of the light board.
Figure 44B:
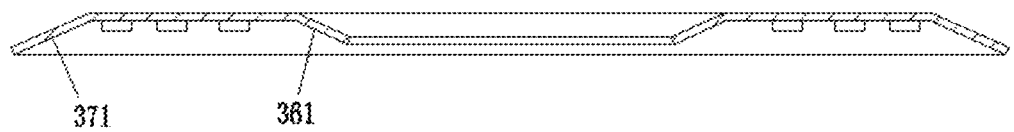

FIGS. 44A~44F are schematic views of some embodiments of the light board 3. As shown in FIGS. 44A and 44B, the light board 3 includes a first region 35 for installing the LED chip set 31, a second region 36 inside the first region 35 and a third region 37 outside the first region 35. The first region 35 restricts a range of installing the LED ship set 31. The first, second and third regions 35, 36, 37 may be provided with insulative layers (not shown) with reflectivity on the surface.

As shown in FIGS. 44A and 44B, the third region 37 is located away from the first region 35 in a radial direction of the LED board 3. The distance between the third region 37 and the first region 35 is gradually increase in the axial direction. Thus, a surface of the third region 37 is formed with an outer reflecting region 371 outside the LED chip set 31 so as to guide at least part of light from the LED chip set 31 to the light output surface. This can concentrate light to a specific area.

As shown in FIG. 44B, the second region 36 is located close to the center in a radial direction of the LED board 3. The distance between the second region 36 and the first region 35 is gradually increase in the axial direction. Thus, a surface of the second region 36 is formed with an inner reflecting region 361 inside the LED chip set 31 so as to guide at least part of light from the LED chip set 31 to the light output surface 43. This can concentrate light to a specific area.

In the above embodiments, both the inner reflecting region 361 and the outer reflecting region 371 of the light board 3 and both the inner reflecting surface 4301 and the outer reflecting surface 4302 of the lamp cover 4 may be arbitrarily combined and arranged to implement various optical effects. For example, only both the inner reflecting region 361 and the inner reflecting surface 4301 are disposed, only both the outer reflecting surface 4302 and the outer reflecting region 371 are disposed, or both either of the inner reflecting region 361 and the inner reflecting surface 4301 and either of the outer reflecting surface 4302 and the outer reflecting region 371 are disposed.

As shown in FIGS. 44A and 44B, the inner reflecting region 361 or the outer reflecting region 371 is a flat plane and inclines to the first region 35 to form an angle or is a curved surface.

Figure 44C:
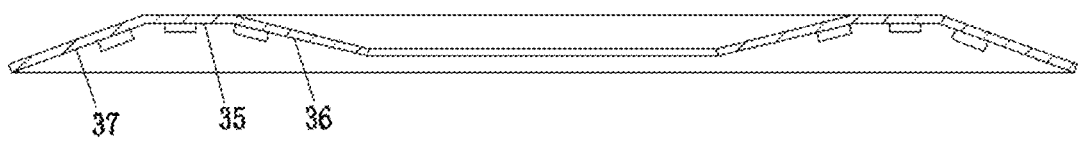

In some embodiments, a direction of light output of the LED chips 311 can be adjusted by changing a mounting direction thereof. In detail, adjusting a structure of the light board 3 can make the LED chips 311 have various effects of light output. For example, as shown in FIG. 44C, in some embodiments, the light board 3 includes a first region 35 for installing the LED chip set 31, a second region 36 inside the first region 35 and a third region 37 outside the first region 35. There are several LED chip sets 31 on the light board 3. The LED chip sets 31 are annularly arranged on the light board 3. In this embodiment, at least one LED chip set 31 is located in the third region 37 which inclines to the first region 36 to form an angle. At least one LED chip set 31 located in the third region 37 can change an angle of light output to present a different effect of light output. This can change distribution of intensity.

Identically, at least one LED chip set 31 is located in the second region 36 which inclines to the first region 36 to form an angle. At least one LED chip set 31 located in the second region 36 can change an angle of light output to present a different effect of light output. This can change distribution of intensity.

The light board 3 shown in FIG. 44C as an example, the LED chip sets 31 are three in number and the outermost LED chip set 31 is located in the third region 37. The LED chip set 31 in a middle position among the three LED ship sets 31 is located in the first region 35, and the LED chip set in an innermost position is located in the second region 36.

In the above embodiment, both the second and third regions 36, 37 are used for installing the LED chips 311. Each LED chip 311 corresponds to one second region 36 or third region 37. Both the second and third regions 36, 37 may also be an integrated region on which the LED chips 311 of the same LED chip set 31 are mounted.

Figure 44D:
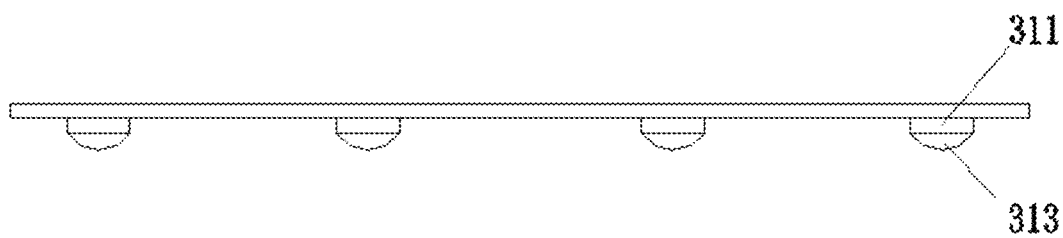

As shown in FIG. 44D, in some embodiments, to enhance lighting efficiency of the LED chips 311, surfaces of the LED chips 311 are separately disposed with silicone layers 313. Each LED chip 311 is disposed with an individually silicone layer 313. An out surface of the silicone layer 313 is a convex surface to form a lens which is capable of focusing light from the LED chips 311. This makes an effect of light output better and is advantageous to increase of illuminance. In addition, the silicone layer 313 can also improve efficiency of thermal radiation (increase its radiating area) to be advantageous to heat dissipation of the LED chips 311.

Figure 44E:
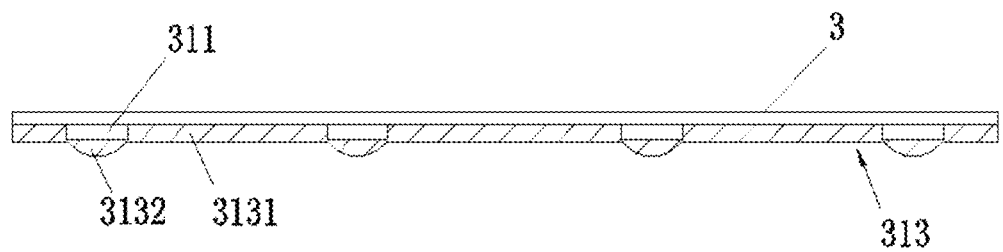

As shown in FIG. 44E, in some embodiments, the light source includes the light board 3, the LED chips 311 and the silicone layers 313. The silicone layer 313 includes a first silicone layer 3131 on a surface of the light board 3 and a second silicone layer 3132 on a surface of the LED chip 311. The first silicone layer 3131 cloaks and isolates the light board 3 to make the light board insulated. The second silicone layer 3132 has a convex surface to form a lens which focuses light from the LED chips 311. This makes an effect of light output better and is advantageous to increase of illuminance. Also, considering the manufacturing process of the first silicone layer 3131 and the second silicone layer 3132, the thickness of the first silicone layer 3131 is approximately the same as that of the LED chip 311, such that the first silicone layer 3131 will not cause any effect in the emitting of the LED chip 311.

Figure 44F:
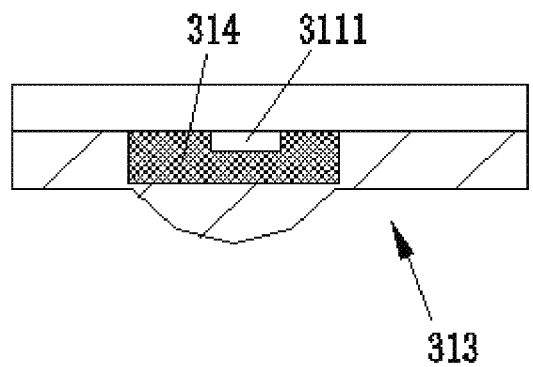

Both the first silicone layer 3131 and the second silicone layer 3132 are integratedly formed to be the silicone layer 313 for resisting dust. At this time, the lamp cover 4 may be omitted to increase lighting efficiency (unavoidably, the lamp cover 4 obstructs part of light to cause light loss). As shown in FIG. 44F, in some embodiments, silicone in LED chip packing may be omitted. The silicone layer 313 is directly disposed outside the fluorescent powder 314. That is, the fluorescent powder 314 is disposed outside the chip 3111 and the silicone layer 313 is disposed outside the fluorescent powder 314. In addition, the silicone layer 313 can also improve efficiency of thermal radiation (increase its radiating area) to be advantageous to heat dissipation of the LED chips 311.

Figure 45A:
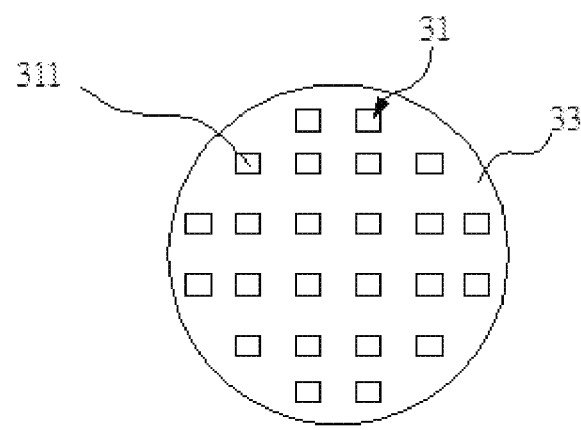
FIGS. 45A~45G are top views of some embodiments of the light board.
Figure 45B:
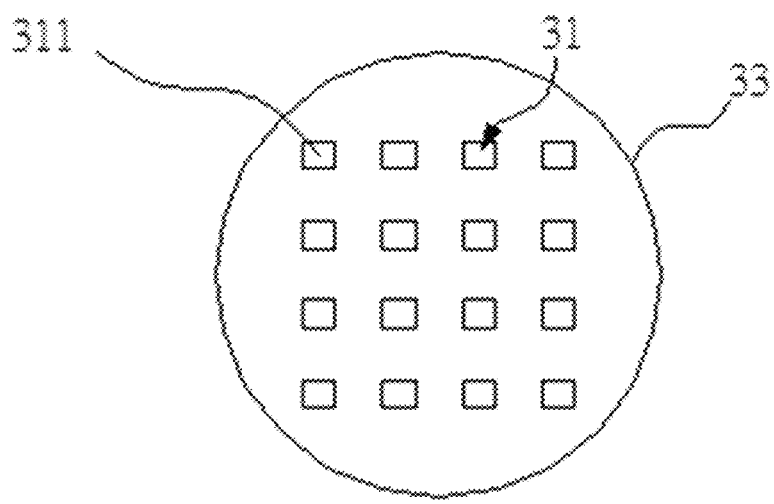
Figure 45C:
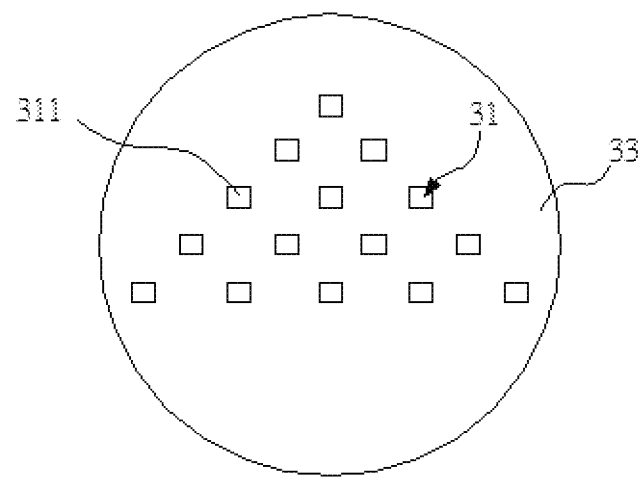

FIGS. 45A~45G are top views of some embodiments of the light board 3m which show different distribution of the LED chips 311. In FIG. 45A, the LED chips 311 of a single LED chip set 31 are directly mounted on the base board 33 at regular intervals. That is, a distance between any adjacent two of the LED chips 311 is identical to make the whole light board 3 capable of even lighting. In FIGS. 45B, and 45C, the LED chips 311 of a single LED chip set 31 are arranged in array. The array may be a matrix as shown in FIG. 45B or a triangular array as shown in FIG. 45C. Of course, the LED chips 31 may be arranged in a concentric annular shape as abovementioned. Such an array can concentrate the LED chips 311 to a local area on the base board 33 to generate a concentrated lighting effect with even light output in the local area.

Figure 45D:
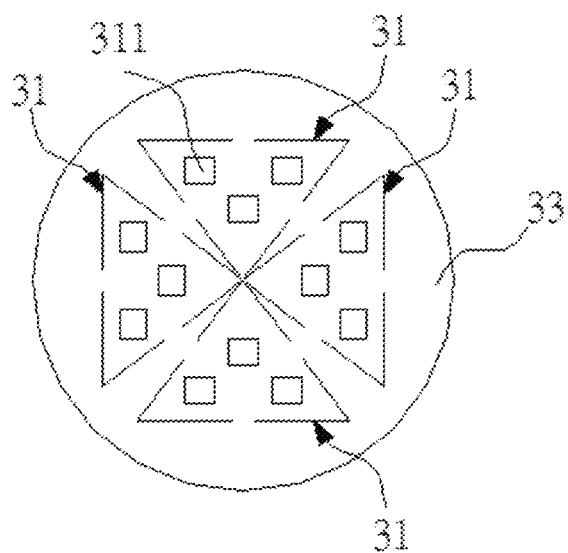

FIG. 45D shows an embodiment of multiple LED chip sets 31 independently forming respective arrays, in which each LED chip set 31 contains LED chips 311. A triangular dotted box encompasses an LED chip set 31. A distance is kept between two adjacent arrays, which is greater than a distance between adjacent two of the LED chips 311. Thus, an airflow channel is formed between two adjacent arrays to promote air convection on the light board 3.

Figure 45E:
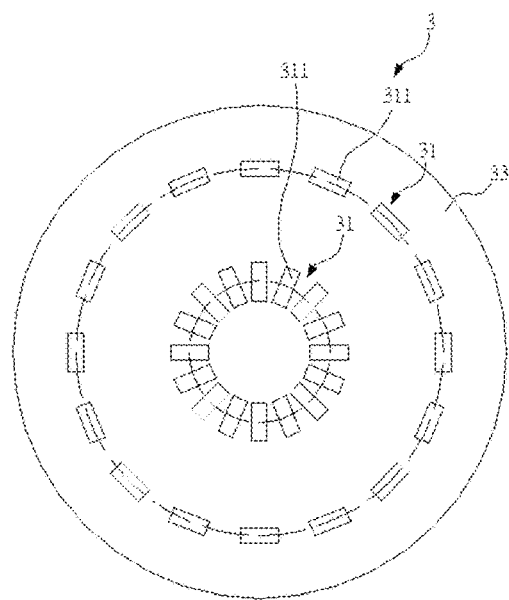

As shown in FIG. 45E, in some embodiments, each LED chip 311 of the LED chip set 31 is of a rectangular shape with a long side and a short side. As shown in FIG. 45E, the LED chips 311 are arranged along a circle and the long sides are arranged along radial directions of the LED light board 3 to make the LED chips 311 present a radial arrangement. Thus, more LED chips 311 can be arranged on this circle and concentrated in a small area. Meanwhile, the long sides provide longer convection paths in radial directions to increase thermal exchange between airflow and the LED chips 311. In addition, the LED chips 311 are arranged along a circle and the short sides are arranged along radial directions of the LED light board 3 to make the LED chips 311 distributed on a large area and to shorten a distance between two adjacent LED chips 311. Such an arrangement makes the LED chips 311 look like a lighting ring. The abovementioned two arrangements may be jointly or alternatively implemented.

Figure 45F:
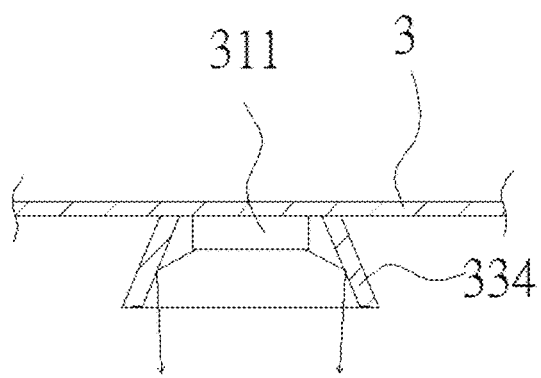
Figure 45G:
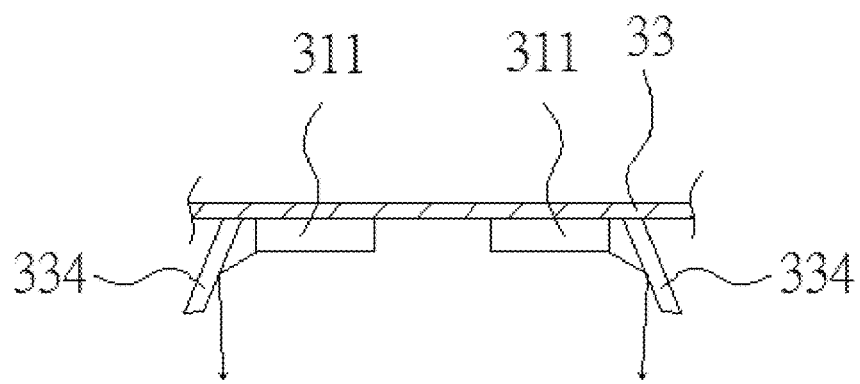

FIGS. 45F~45G are local schematic views of some diverse embodiments of the light board 3. As shown in FIGS. 45F and 45G, in some embodiments, the base board 33 of the light board 3 is provided with one or more reflecting cups 334. Opening s of the reflecting cups 334 are toward an opposite direction of the base board 33. The inside bottom of each reflecting cup 334 is disposed with an LED chip 311. An inner side of the reflecting cup 334 is formed with a material with high reflectivity. Available solutions are to coat or electroplate the inner side of the reflecting cup 334 with a coating with high reflectivity or directly make the reflecting cup 334 with a material with high reflectivity and polish the inner side. The inner side of the reflecting cup 334 can reflect lateral light output of the LED chip 311 to make the light from the LED chip 311 focused a direction to which the LED chip 311 is directed. FIG. 45G is a variation of FIG. 45F. There are multiple LED chips 311 mounted on the inside bottom of each reflecting cup 334. In one example, each reflecting cup 334 is disposed with at least one LED chip 311.

Figure 46A:
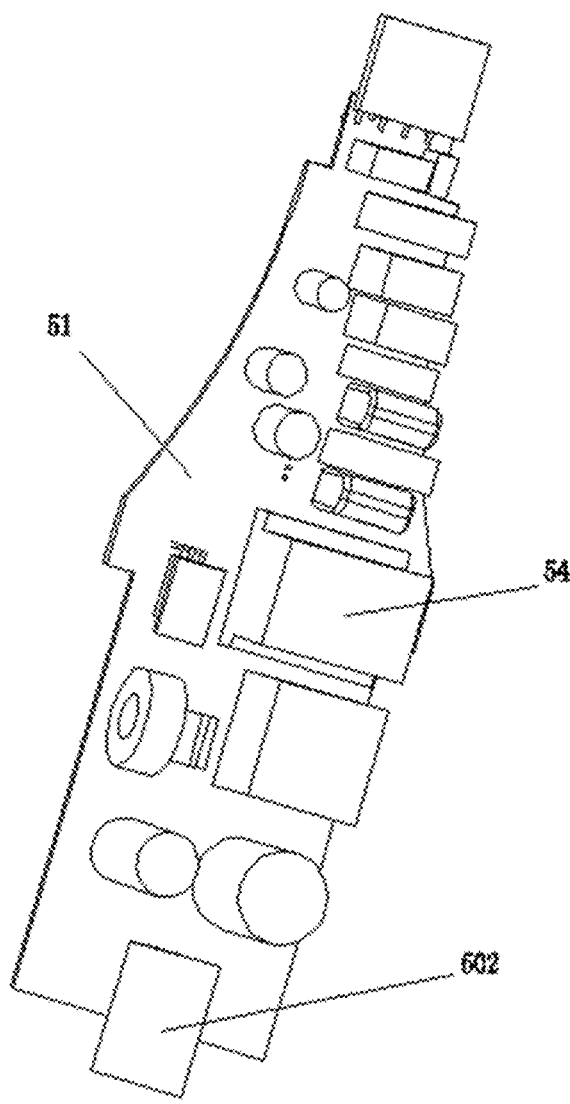
FIGS. 46A~46C are perspective views of the power source, according to some embodiments of the present invention.
Figure 46B:
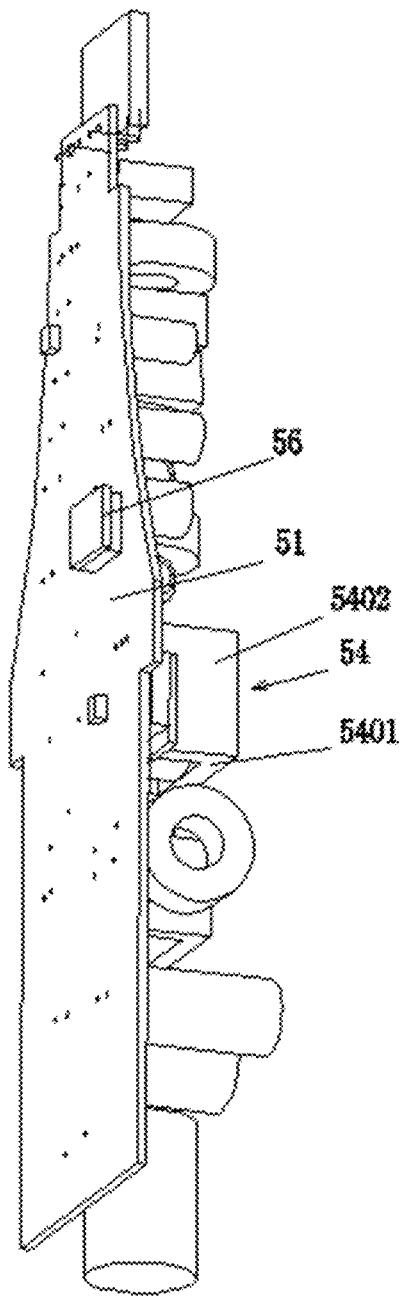
Figure 46C:
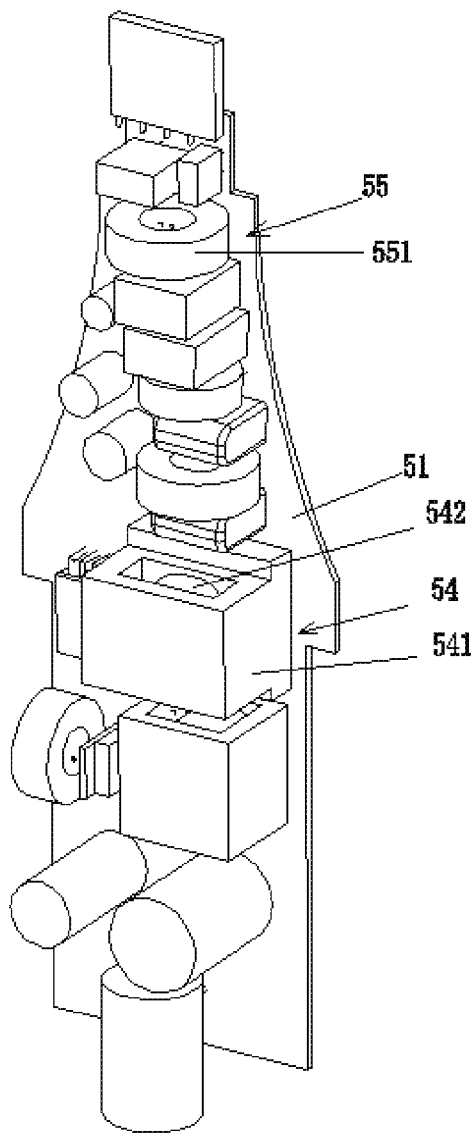
Figure 46D:
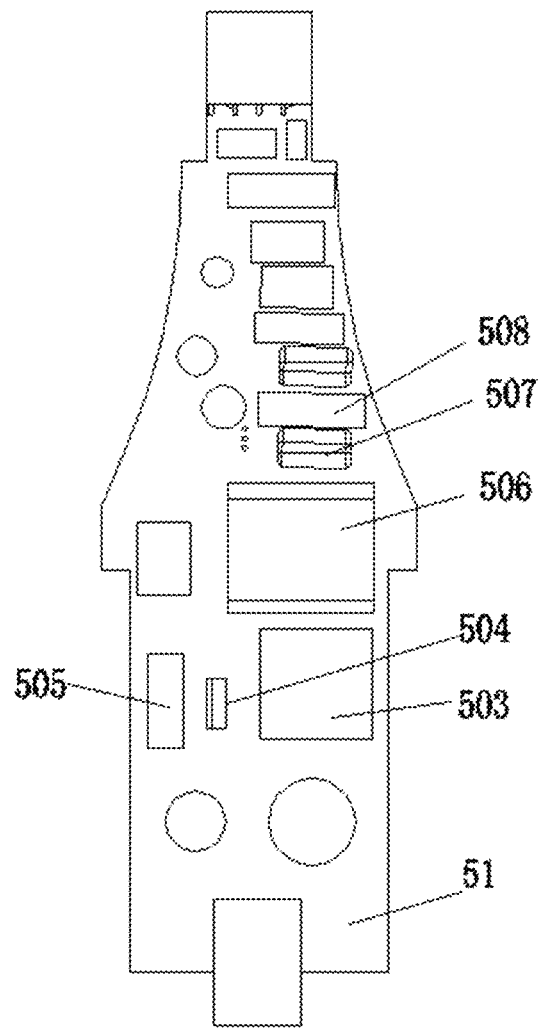
FIG. 46D is a main view of the power source of the embodiment of FIGS. 46A~46C.

FIGS. 46A~46C are perspective views of the power source 5 of one embodiment at different viewpoints. FIG. 46D is a main view of the power source 5 of one embodiment. The power source 5 is electrically connected to the LED chips 311 to power the LED chips 311. As shown in FIGS. 46A~46C, the power source 5 includes a power board 51 and a plurality of electronic components mounted thereon.

As shown in FIG. 46C, a transformer 54 in the electronic components includes a core 541 and coils 542. The core 541 has a room in which the coils 542 are received. The room has an opening in the axial direction of the LED lamp so as to make heat generated from the coils 542 and the core 541 move upward. Also, the heat dissipating direction of the transformer 54 is consistent with the convection path of the first heat dissipating channel 7a (as mentioned in the description of FIG. 4) for being advantageous to heat dissipation.

As shown in FIGS. 46B and 46C, the room is provided with two openings at two ends in the axial direction of the LED lamp to increase heat dissipating effect to the coils 542. In addition, after the coils 542 are installed in the room of the core 541, a gap is kept between the coils 542 and the room to allow air to flow. This can further increase heat dissipating effect to the coils 542.

As shown in FIG. 46B, the transformer 54 has a first side 5401 and a second side 5402, both of which are perpendicular to the power board. The first side 5401 is perpendicular to the axial direction of the lamp. The first side 5401 is less than the second side 5402 in area. Thus, such an arrangement of the small side can reduce resistance to convection of the first heat dissipating channel 7a.

As shown in FIG. 46C, the electronic components include at least one inductor 55 including an annular core 551. A coil is wound around the annular core 551 (not shown). An axis of the annular core 551 is parallel to the axis of the LED lamp to make the coil have larger area to be in contact with convection air. This can further increase heat dissipating effect to the inductor 55. In addition, a shape of the annular core 551 corresponds to the convection path of the first heat dissipating channel 7a. Thus, convection air can pass through the inside of the annular core 551 to further increase heat dissipating effect to the inductor 55.

As shown in FIGS. 46A and 46B, heat-generating elements in the electronic components include integrated circuits (ICs) 56, diodes, transistors, the transformer 54, the inductor 55 and resistors. These heat-generating elements are separately mounted on the power board 51 to distribute heat-generating sources and prevent local high temperature. In addition, the heat-generating elements may be mounted on different surfaces of the power board 51 to perform heat dissipation. At this time, the heat-generating elements are in contact with corresponding heat dissipating elements.

As shown in FIGS. 46A and 46B, at least one IC 56 is arranged to be mounted on different surface as other heat-generating elements are arranged of the power board 51. As a result, the heat-generating sources can be separated to avoid local high temperature and influence to the IC 56 from the other heat-generating elements.

As shown in FIGS. 46A and 46B, in a direction perpendicular to the power board 51 (i.e. projection relationship in a direction perpendicular to the power board 51), the IC 56 does not overlap any heat-generating elements to avoid heat accumulation.

As shown in FIG. 22, the power board 51 is parallel to the axis of the LED lamp. Thus, in the axial direction of the LED lamp, the power board 51 is divided into an upper portion and a lower portion. Arranging spaces of both the upper portion and the lower portion are identical or approximately identical to form better layout of the electronic components. Besides, if the power board 51 inclines toward the axis of the LED lamp, then air flow may be obstructed and it is disadvantageous to heat dissipation of the power source 5.

As shown in FIGS. 1 and 22, the power board 51 divides the lamp shell 2 into a first portion 201 and a second portion 202. Area of the venting hole 222 corresponding to the first portion 201 is greater than area of the venting hole 222 corresponding to the second portion 202. Thus, when implementing layout of electronic components, most or all of electronic components or some thereof which generate a large amount of heat such as inductors, resistors, transformers, rectifiers or transistors may be disposed in the first portion 201.

As shown in FIG. 22, the power board 51 divides an inner chamber of the lamp shell 2 into a first portion 201 and a second portion 202. The first portion 201 is greater than the second portion 202 in volume. When implementing layout of electronic components, most or all of electronic components or some thereof which generate a large amount of heat such as inductors, resistors, transformers, rectifiers or transistors may be disposed in the first portion 201.

Please simultaneously refer to FIGS. 22 and 29, further, area of first air inlet 2201 corresponding to the first portion 201 is greater than area of the second air inlet 2202 corresponding to the second portion 202. Thus, more air can flow into the first portion 201 to perform heat dissipation to the electronic components. Here, the specific description of the air inlet is that the first air inlet 2201 is divided into two portions by the power board 51, one of the two portions corresponds to the first portion 201 and the other one of the two portions corresponds to the second portion 202 so as to make more air flow into the first air inlet 2201 and enter the first portion 201.

As shown in FIG. 22, the electronic components 501 include heat-generating elements 501. At least one of the heat-generating elements 501 is adjacent to the lamp head 23 through which heat is dissipated without occupying resource of heat dissipation of the first heat dissipating channel 7a. The at least one heat-generating element 501 abovementioned is an inductor, a resistor, a rectifier or a control circuit.

As shown in FIG. 22, heat of the at least one heat-generating element is transferred to the lamp head 23 through thermal conduction or radiation and dissipated to air through the lamp head 23.

As shown in FIG. 22, the at least one heat-generating element 501 is in thermal contact with the lamp head 23. In detail, the at least one heat-generating element 501 is located in the lamp head 23. The heat-generating element 501 is in contact with the lamp head 23 through a thermal conductor 53 and the heat-generating element 501 is fastened to the lamp head 23 through the thermal conductor 53. Therefore, the thermal conductor not only performs an effect of heat transfer but also fixes the heat-generating element 501 to avoid loosening of the heat-generating element 501. The phrase "the heat-generating element 501 is located in the lamp head 23" means both the lamp head 23 and the heat-generating element 501 have an overlapping area in a projection perpendicular to the axis of the LED lamp.

As shown in FIG. 22, the thermal conductor 53 is disposed in the lamp head 23 through filling to implement connection between the lamp head 23 and the heat-generating element 501. The thermal conductor 53 only cloaks an end portion of the power source 5 and is higher than the venting 222 in position to prevent overweight resulting from the thermal conductor 53. Additionally, the thermal conductor 53 adopts an insulative material to guarantee safety and prevent the electronic components and metal portion 231 of the lamp head 23 from being in contact. In other embodiments, the thermal conductor 53 may also be a wire connecting the power source 5 to the lamp head 23 (not shown).

As shown in FIG. 22, the lamp head 23 includes the metal portion 231, which is in thermal contact with the thermal conductor 53. That is, at least part of an inner side of the metal portion 231 constitutes a wall of the inner chamber of the lamp shell 2 to make the thermal conductor directly connect with the metal portion 231 and perform heat dissipation by the metal portion 231. Part of the metal portion 231 would perform heat dissipation through air, and another part of the metal portion would perform heat dissipation through a lamp socket connecting to the metal portion 231.

As shown in FIGS. 2 and 46A, in this embodiment, at least one of the electronic components of the power source 5, which is the most adjacent to the first air inlet 2201 of the first heat dissipating channel 7a is a heat intolerance component, such as a capacitor, especially for an electrolytic capacitor. This arrangement can avoid overheating of the heat intolerance component to affect its performance.

In addition, to reduce influence of an electrolytic capacitor 502 suffering heat from the heat-generating elements, a surface of the electrolytic capacitor can be provided with an anti-radiation layer or a thermo-isolation layer (not shown). The thermos-isolation layer may adopt existing plastic material, and the anti-radiation layer may adopt existing paint, silver plate layer, aluminum foil or other anti-radiation materials.

As shown in FIG. 46A, in this embodiment, at least part of at least one of the electrolytic capacitors 502 is not located within the power board 51, i.e. at least part of the electrolytic capacitor exceeds the power board 51 in the axial direction of the LED lamp. Under a condition of the same number of the electronic components, length and material cost of the power board 51. In addition, this can make the electrolytic capacitor further adjacent to the first air inlet 2201 to ensure the electrolytic capacitor to be located in a relatively low temperature area.

As shown in FIG. 22, a position of at least one of the heat-generating elements 501 in the axial direction of the LED lamp is higher than a position of the venting hole 222. Most heat of the heat-generating element 501 higher than the venting hole 222 is dissipated through the lamp head 23 or other paths. Thus, most heat therefrom is not dissipated through the venting hole 222, and convection speed of the first heat dissipating channel 7a would not be affected. The heat-generating element is an IC, a transistor, a transformer, an inductor, a rectifier or a resistor.

As shown in FIG. 22, the power board 51 is divided into an upper part and a lower part in the axial direction of the LED lamp. Heat-generating elements are arranged in both the upper part and the lower part. At least one of the heat-generating elements in the upper part is located above the venting hole 222 to lower the temperature of the upper part near the venting hole 222. This can increase an air temperature difference between two venting holes 222 in the upper part and the lower part to enhance convection.

As shown in FIGS. 2, 3 and 46A, when the power board 51 is assembled in the lamp shell 2, it has a first portion in the lamp neck 22 and a second portion in the sleeve 21. The second portion more adjacent to the first air inlet 2201 of the first heat dissipating channel 7a than the first portion. Because of such an arrangement, convention air will reach the second portion first. That is, the second portion is better than the first portion in an effect of heat dissipation. Thus, at least part of heat intolerance elements (e.g. electrolytic capacitors or other elements which is sensitive to high temperature) should be disposed in the second portion.

Preferably, all electrolytic capacitors are disposed in the second portion. The power board 51 of the second portion is greater than the first portion in area, so the power board 51 of the second portion has more space for accommodating electronic components to be advantageous to more heat intolerance elements being disposed in the second portion. In this embodiment, heat intolerance elements/thermo-sensitive elements may be separately mounted on two opposite sides of the second portion. In other embodiments, hotter electronic components may be disposed in the second portion (e.g. transformers, inductors, resistors, ICs or transistors) for better heat dissipation.

Figures 51, 52:
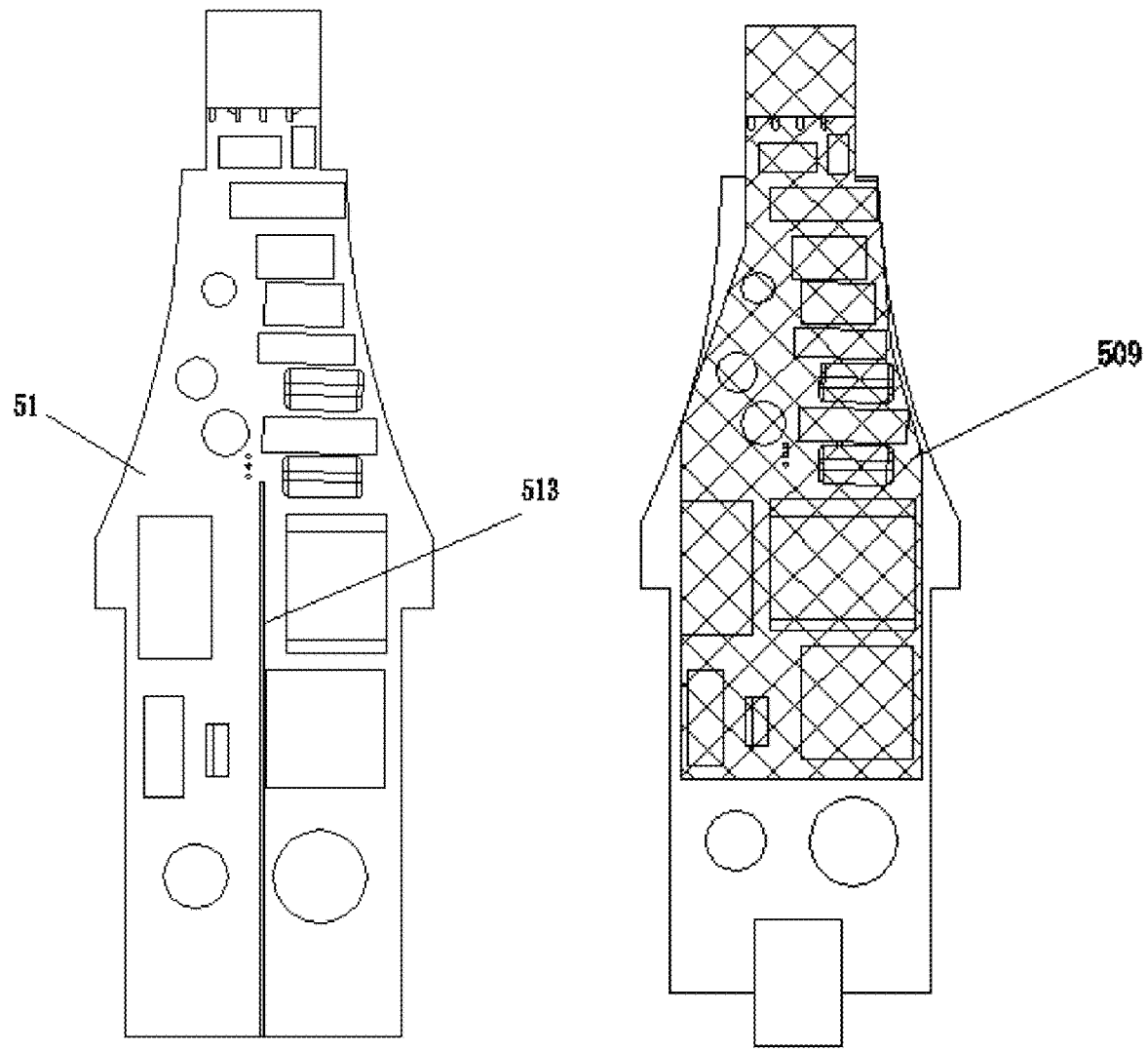
FIG. 51 is a schematic of the power source, according to an embodiment of the present invention.
FIG. 52 is a schematic of the power source of another embodiment.

FIG. 51 is a schematic of an embodiment of the power source 5. As shown in FIG. 51, the power board 51 has a thermo-isolation plate 513. The power board 51 is divided into two zones by the thermos-isolation plate 513. One of the two zones is used to be mounted by heat-generating elements (e.g. transformers, inductors, resistors, etc.), and the other zone is used to be mounted by heat intolerance/thermo-sensitive elements (e.g. electrolytic capacitors). That is, the thermos-isolation plate 513 partitions heat-generating elements and heat intolerance/thermo-sensitive elements to prevent the latter from being affected by thermal radiation from the former. In other embodiments, heat-generating elements are disposed in both zones. That is, the thermo-isolation plate 513 partitions two heat-generating elements to prevent mutual thermal radiation which causes thermal accumulation. In another aspect, temperature is an important factor of thermal radiation, so avoiding mutual thermal radiation between heat-generating elements can rise a temperature difference between a heat-generating element and air therearound so as to improve efficiency of thermal radiation. Preferably, the thermo-isolation plate 513 is arranged along the axis of the LED lamp or the convection direction of the first heat dissipating channel 7a to make heat in two sides would not make convection in a width direction of the power board 51 to prevent heat gathering when convection is processing. The thermo-isolation plate is extendedly arranged along the convection direction of the first heat dissipating channel 7a. That is, the thermo-isolation plate 513 is extendedly arranged along the axis of the LED lamp, so obstruction to convection air would not occur. In other embodiments, the thermo-isolation plate 513 may be slant to form a guiding effect to air.

Furthermore, the thermo-isolation plate 513 may be a circuit board, so the thermo-isolation plate 513 may be disposed with electronic components to increase area for mounting electronic components.

The function of the thermo-isolation plate 513 may be replaced with electronic components. As shown in FIG. 46D, there are three electronic components 503, 504, 505 on the power board 51. At least parts of projections of the three electronic components 503, 504, 505 in a radial direction of the LED lamp (or a width direction of the power board 51) overlap with another one. The one 504 of the three electronic components 503, 504, 505 is located between the other two 503, 505 to avoid mutual thermal radiation between the two electronic components 503, 505. This is advantageous to forming a greater temperature difference between the heat-generating elements and air therearound and radiating heat from the heat-generating elements to air. The abovementioned two electronic components 503, 505 are respective a heat-generating element (such as a transformer, a resistor or a transistor) and a heat intolerance elements/thermo-sensitive element (such as an electrolytic capacitor), so at least part of heat from the heat-generating elements (one of the electronic components 503 and 505) would be thermally radiated to the in-between electronic component 504 to reduce thermally radiative influence to the heat intolerance elements/thermo-sensitive element from the heat-generating elements.

In the other embodiment of the present invention, the three electronic components 503, 504, 505 on the power board 51 positioned as mentioned above, both electronic components 503, 505 are a heat-generating element (such as a transformer, a resistor or a transistor), so at least part of heat generated from the heat-generating elements (electronic components 503 and 505) would be thermally radiated to the in-between electronic component 504. Under these circumstances the electronic component 504 plays a role for preventing the heat generated from the two heat-generating elements being superposed to effect the working quality of the LED lamp due to overheated temperature occurred in the power board 51 area.

Preferably, the in-between electronic component 504 adopts non-heating or heat-resistant electronic component such as a temperature sensor or a capacitor.

As shown in FIG. 46D, in other embodiments, there are three electronic components 506, 507, 508 on the power board 51. At least parts of projections of the three electronic components 506, 507, 508 in the axial direction of the LED lamp (or in a width direction of the power board 51, i.e. along a convection direction of the first heat dissipating channel 7a) overlap with another one. The one 507 of the three electronic components 506, 507, 508 is located between the other two 506, 508 to avoid mutual thermal radiation between the two electronic components 506, 508. This is advantageous to forming a greater temperature difference between the heat-generating elements and air therearound and radiating heat from the heat-generating elements to air. The abovementioned two electronic components 506, 508 are heat-generating elements (such as transformers, resistors, inductors or transistors), so at least part of heat from the heat-generating elements 506, 508 would be thermally radiated to the in-between electronic component 507 to reduce thermally radiative influence to the heat intolerance elements/thermo-sensitive element from the heat-generating elements and to avoid heat accumulation. In this embodiment, by such an arrangement of the electronic component 507, it will obstruct upward convection air flow. For example, after heat from the lower electronic component 506 is brought out by convection air, the convection air must bypass the in-between electronic component 507 to avoid direct contact with the upper electronic component 508. In this embodiment, the in-between electronic components 507 is a non-heat-generating element (such as a capacitor). In other embodiments, the other two electronic components 506, 508 are a heat-generating element (such as transformers, resistors or inductors) and a heat intolerance element (such as a capacitor).

FIG. 52 is a schematic view of an embodiment of the power source 5. In some embodiments, to improve radiative efficiency of the heat-generating elements of the power source 5, a radiating layer 509 may be provided on surfaces of the heat-generating elements. Heat from working heat-generating elements can be thermally conducted to the radiating layer 509, and then the radiating layer 509 radiates the heat to surrounding air to bring out hot air when convection is processing in the first heat dissipating channel 7a. The radiating layer 509 is greater than the heat-generating elements in radiative efficiency so as to significantly improve efficiency of heat dissipation of the heat-generating elements with the radiating layer 509. In this embodiment, the radiating layer 509 may adopt existing black glue to increase an effect of radiating to air. The black glue covers a surface of the power source 5 and may be in thermal contact with the lamp head 23. That is, part of heat from the heat-generating elements of the power source 5 is radiated to surrounding air and another part thereof is thermally conducted to the lamp head 23 through the black glue (not shown). The lamp head 23 is metal, so the heat can be further dissipated to the outside through the lamp head 23. In this embodiment, the black glue is of a thin layer attached on a surface of a heat-generating element without obstructing convection in the first heat dissipating channel 7a. The black glue with light weight would not add substantial weight. In other embodiments, the black glue may be selectively disposed, for example, the black glue is disposed on heat-generating elements with high heat such as transformers, inductors or transistors.

In addition, in the above embodiment, to further increase radiative efficiency of the radiating layer 509, the radiating layer 509 can be configured to be a rough surface to increase surface area.

Figure 47:
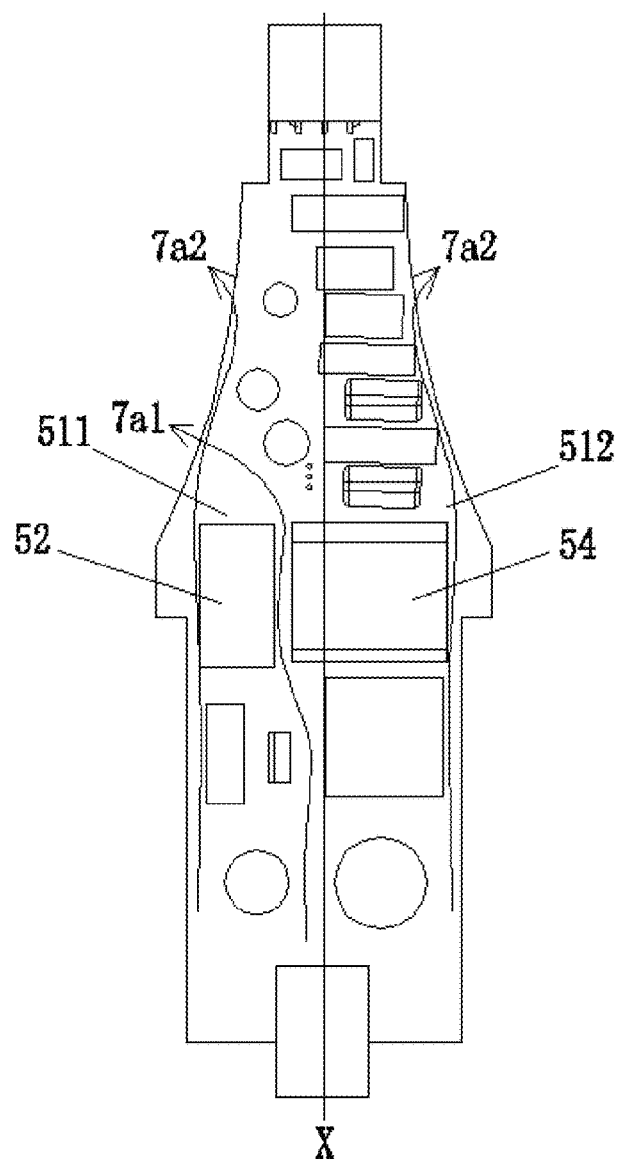
FIG. 47 is a schematic view of the power source, according to one embodiment of the present invention.

FIG. 47 is a schematic view of an embodiment of the power source 5, which can be applied to the power source 5 of the LED lamp shown in FIG. 4. As shown in FIG. 47, in some embodiments, the power board 51 is divided into a first mounting zone 511 and a second mounting zone 512 by an axis X. The axis X is between the first mounting zone 511 and the second mounting zone 512 as a border. Total weight of the electronic components on the second mounting zone 512 is greater than total weight of the electronic components on the first mounting zone 51. The first mounting zone 511 is provided with a counterweight 52 to balance the two zones 511, 512 of the power board 51 in weight. This can prevent unbalanced weight of the two zones 511, 512 of the power board 51 and prevent the hung LED lamp from tilting because of unbalanced weight.

Figure 48:
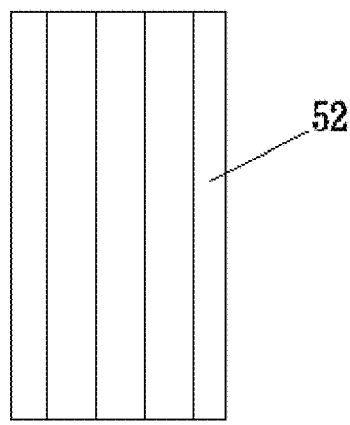
FIG. 48 is a main view of the counterweight of FIG. 47.
Figure 49:
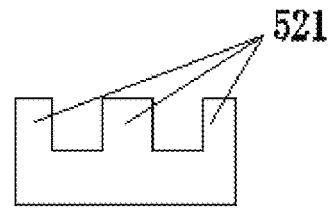
FIG. 49 is a side view of the counterweight of FIG. 48.

FIG. 48 is a main view of the counterweight 52 of FIG. 47. FIG. 49 is a side view of FIG. 48. As shown in FIGS. 48 and 49, in some embodiments, the counterweight 52 is a heat dissipating element with heat dissipating function and is disposed on the power board 51. In some embodiments, the heat dissipating assembly has fins 521 for increasing heat dissipating area. The counterweight 52 is made of metal with high thermo-conductivity such as aluminum or copper. In this embodiment, the fins 521 are extendedly arranged along the axial direction of the LED lamp. A channel is formed between two adjacent fins 521 as an air passage. Such an arrangement can increase heat dissipating area of the counterweight 52. In one embodiment, the counterweight 52 includes a long side and a short side. The channels are parallel with the long side and the long side is configured to be parallel with the axis of the LED lamp or substantially parallel with the direction of airflow to make the air flow smoothly.

As shown in FIG. 47, the electronic components include heat-generating elements which generate heat when working. At least one heat-generating element is adjacent to a heat dissipating assembly to dissipate part of heat through the heat dissipating assembly. Preferably, transformers, inductors, resistors, diodes, transistors or ICs of the heat-generating elements are adjacent to the heat dissipating assembly. More preferably, transformers, inductors, resistors, diodes, transistors or ICs of the heat-generating elements are in direct contact with the heat dissipating assembly.

In one embodiment of the present invention, two opposite sides of the circuit board all comprise the counterweight 52, such that the heat dissipating efficiency of the circuit board 51 and the weight balance between two sides of the circuit board 51 can be improved simultaneously.

As shown in FIG. 47, in some embodiments, the power board 51 is divided into a first mounting zone 511 and a second mounting zone 512 by an axis X. The axis X is between the first mounting zone 511 and the second mounting zone 512 as a border. The second mounting zone 512 is greater than the first mounting zone 511 in number of electronic components to make airflow of the first mounting zone 511 smooth and to reduce obstruction of the electronic components. In this embodiment, both the first mounting zone 511 and the second mounting zone 512 have heat-generating elements to distribute heat sources.

Figure 50:
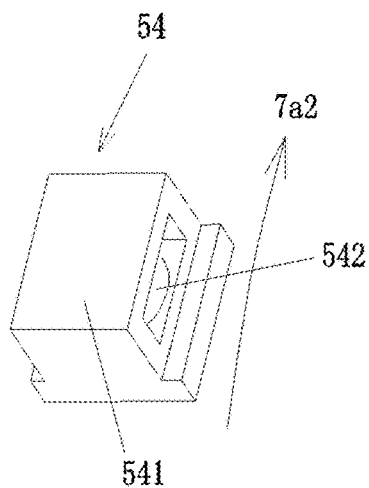
FIG. 50 is a schematic view of a transformer, according to one embodiment of the present invention.

As shown in FIGS. 4, 47 and 50, in some embodiments, the first heat dissipating channel 7a includes an inner channel 7a1 and an outer channel 7a2. The outer channel 7a2 is formed between the electronic components on an edge of the power board 51 and an inner wall of the inner chamber of the lamp shell 2. The inner channel 7a1 is formed in gaps between the electronic components. This arrangement can enhance an effect of heat dissipation of the power source 5. In detail, the power board 51 in FIG. 47 is divided into two portions (a left portion and a right portion, not necessarily symmetrical), namely, a first portion and a second portion. Both the first portion and the second portion have electronic components. The outer channel 7a2 is formed between the electronic components on both the first portion and the second portion and the inner wall of the lamp shell 2. The inner channel 7a1 is formed between the electronic components separately on the first portion and the second portion. In this embodiment, a transformer 54 of the electronic components includes a core 541 and coils 542. The core 541 has a chamber in which the coils 542 are disposed. An opening is formed at a side of the chamber in a radial direction to expose the coils 542. The opening corresponds to the inner channel 7a1 or the outer channel 7a2 to make heat from the coils 542 is rapidly ejected through convection in the inner channel 7a1 or the outer channel 7a2. Preferably, two openings are separately formed at two sides of the chamber in a radial direction. One of the two openings corresponds to the inner channel 7a1 and the other one thereof corresponds to the outer channel 7a2 to further enhance heat dissipation of the transformer.

Figure 53C:
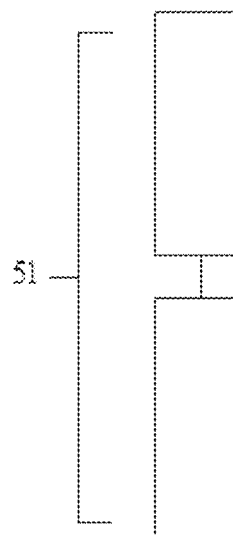
Figure 53C:
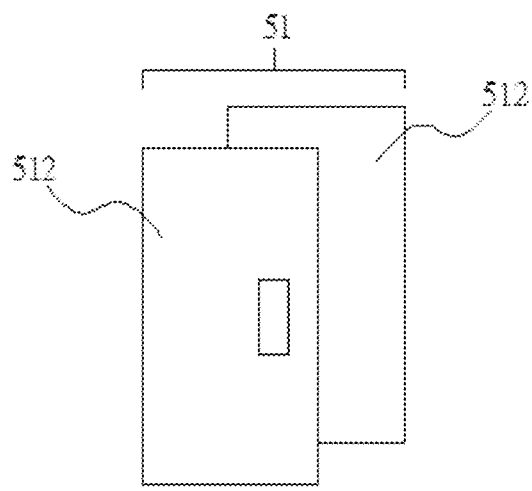
Figure 53C:
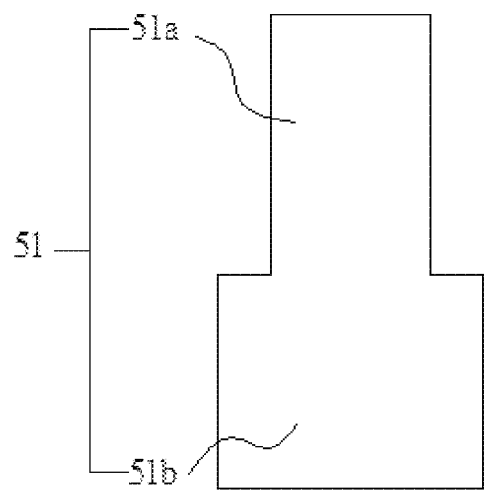

FIGS. 53A~53C are schematic view of various embodiments of the power source board 51. As shown in FIG. 53A, the power board 51 includes multiple sub-boards 512 which electrically connect to each other. As shown in FIG. 53A, the sub-boards 512 are connected by one or more wires 513. When multiple wires are used, they can be combined to be a flexible flat cable. Relative positions of the sub-boards 512 can be changed by bending the wire 513, for example, two sub-boards 512 are kept parallel at an interval and are separately mounted by different groups of electronic components. As shown in FIG. 53B, the sub-boards 512 are connected by one or more electric connectors 514 by which the sub-boards 512 can be firmly combined in a parallel or coplanar manner. For example, two sub-boards 512 are kept parallel at an interval and are separately mounted by different groups of electronic components. As shown in FIG. 53C, the power board 51 includes a first zone 51a and a second zone 51b. The second zone is greater than the first zone in width for accommodating more heat intolerance electronic components. The second zone 51b is adjacent to an intake 172 of the base 17 and the first zone 51a is adjacent to the venting hole 222 of the lamp neck 22.

Figure 54:
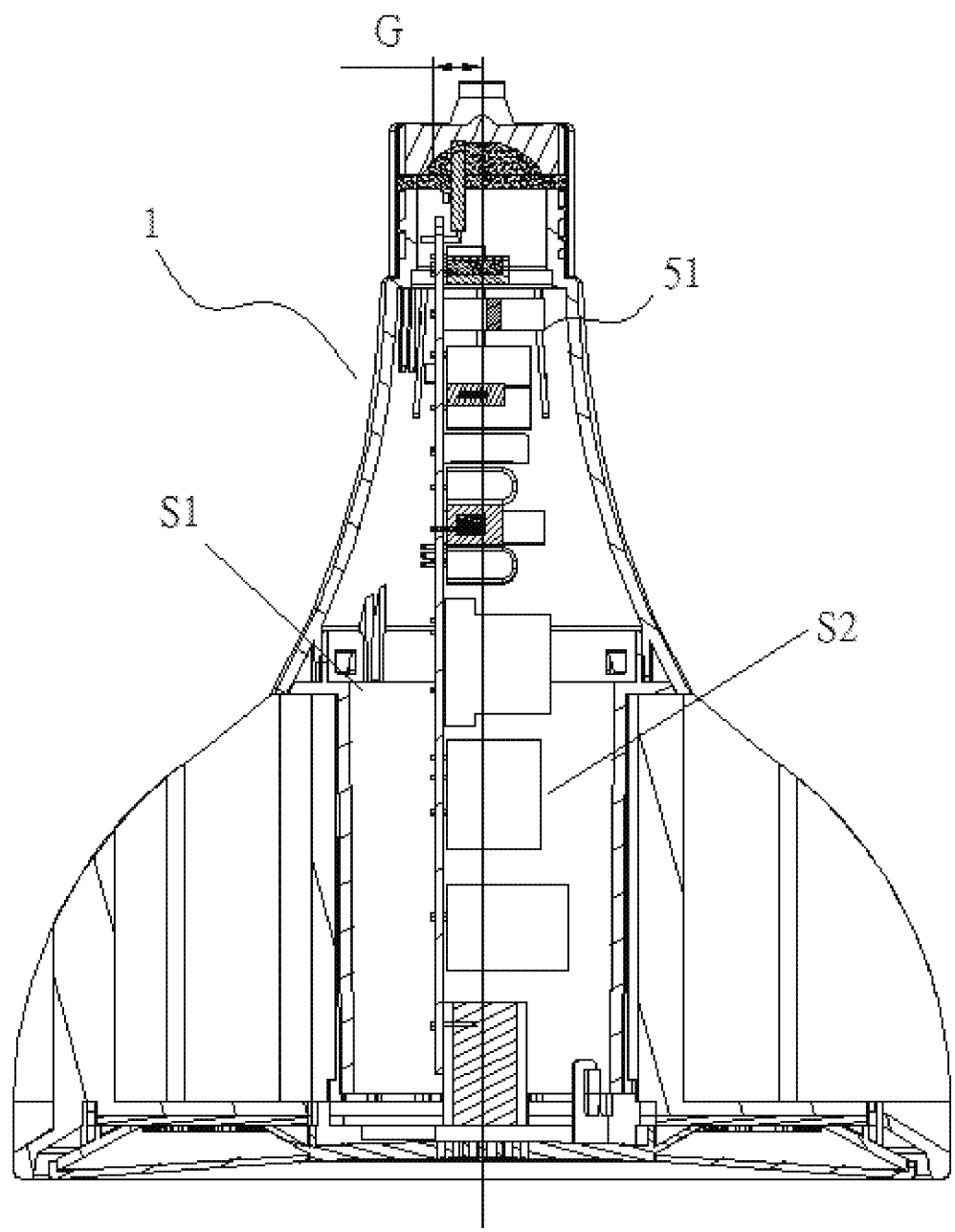
FIG. 54 is a cross-sectional view of the LED lamp of an embodiment.

FIG. 54 is a cross-sectional view of the LED lamp of one embodiment. As shown in FIG. 54, the power board 51 divides the heat dissipating channel (here it means the first heat dissipating channel 7a) into a first channel S1 and a second channel S2 along the axis of the heat dissipating channel. The power board 51 includes a first side and a second side. The first side corresponds to the first channel S1 and the second side corresponds to the second channel S2.

When an electronic component has large volume, the heat dissipating channel it is located has to need correspondingly large volume. As a result, a sufficient channel space can be kept after the volume of the heat dissipating channel minus the total volume of the electronic component. Thus, when the first channel S1 is less than the second channel S2 in volume, volume of the electronic components on the first side (a total volume of all electronic components on the first side) must be less than volume of the electronic components on the second side (a total volume of all electronic components on the second side). The ratio of volume of the first heat dissipating channel S1 to the second channel S2 is defined as R1, and R1 is between 0.3 and 0.5. The ratio of volume of the electronic components on the first side to volume of the electronic components on the second side is defined as R2, and R2 is between 0.05 and 0.2. In the aspect of the ratio relationship, the ratio R1 of volume of the first channel S1 to volume of the second channel must be less than the ratio R2 of volume of the electronic components on the first side to volume of the electronic components on the second side. If weight of the electronic components on the first side is less than weight of the electronic components on the second side, then a counterweight (not shown) may be added on the first side to balance weight on two sides.

Figure 55:
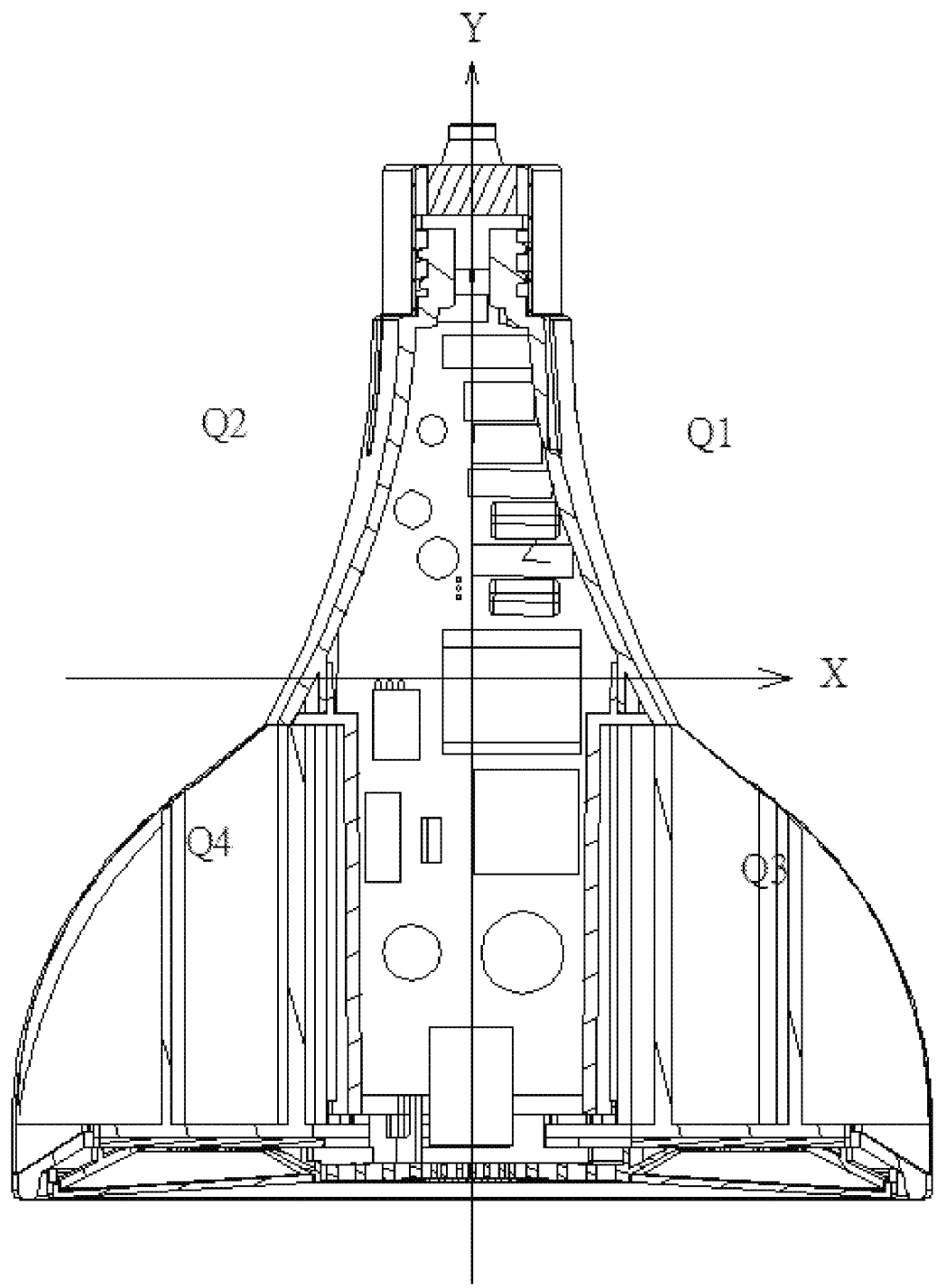
FIG. 55 is a cross-sectional view of the LED lamp of an embodiment.

FIG. 55 is a cross-sectional view of the LED lamp of one embodiment. As shown in FIG. 55, if further divide upper and lower relationship, on the same side (either the first side or the second side), heat dissipating channel must be considered (here the heat dissipating channel means the first heat dissipating channel 7a), i.e. relationship of air flow zones (not cover electronic components). The second side as an example, a first quadrant Q1, a second quadrant Q2, a third quadrant Q3 and a fourth quadrant Q4 are defined on the second side by an X-axis and a Y-axis. The first quadrant Q1, the second quadrant Q2, the third quadrant Q3 and the fourth quadrant Q4 communicate with each other. Both the first quadrant Q1 and the second quadrant Q2 correspond to the lamp shell 2, and both the third quadrant Q3 and the fourth quadrant Q4 correspond to the heat sink 1. The first quadrant Q1 abuts against the third quadrant Q3, and the second quadrant Q2 abuts against the fourth quadrant Q4. The X-axis is located on an upper edge of the heat sink 1, and the Y-axis is the central axis shown in the figure.

As shown in FIG. 55, an ideal manner is to place all electronic components on a single side (one side of Y-axis), for example, gathering in both the second quadrant Q2 and the fourth quadrant Q4, and lower electronic components are less than upper electronic components in number and high heat or heat intolerance electronic components (such as transformers or electrolytic capacitors) are located in the lower portion. As shown, volume of the electronic components in the second quadrant Q2 is less than volume of the electronic components in the first quadrant Q1 to make an air flow zone (not cover electronic components) shown in the second quadrant Q2 is greater than the first quadrant Q1 to keep a zone allowing air to rapidly flow. Thus, the second side as an example, the ratio of volume of the first channel S1 in the second quadrant Q2 to volume of the electronic components in the second quadrant Q2 is greater than 3 to make air flow zone in the second quadrant Q2 have a sufficient size. Of course, a contrary arrangement is also available, i.e. the ratio of volume of the first channel S1 in the first quadrant Q1 to volume of the electronic components in the second quadrant Q2 is greater than 3.

As abovementioned, volume of the electronic components in the second quadrant Q2 is less than volume of the electronic components in the first quadrant Q1. In an aspect of proportional relationship, a ratio of volume of the electronic components in the second quadrant Q2 is less than a ratio of volume of the electronic components in the first quadrant Q1.

As for the arrangement of the lower portion, volume of the electronic components in the fourth quadrant Q4 is less than volume of the electronic components in the third quadrant Q3, so a sufficient air channel can be kept from the fourth quadrant Q4 to the first quadrant Q1. In an aspect of proportional relationship, a ratio of volume of the electronic components in the fourth quadrant Q4 to volume of the first channel S1 in the fourth quadrant Q4 is less than a ratio of volume of the electronic components in the third quadrant Q3 to volume of the first channel S1 in the third quadrant Q3.

If multiple electronic components are categorized to heat-generating elements, an ideal position of the heat-generating elements is the upper portion, i.e. both the first quadrant Q1 and the second quadrant Q2. Thus, the heat-generating elements are arranged in both the first quadrant Q1 and the second quadrant Q2. That is, the heat-generating elements may be in contact with cooling airflow at a distal end of the heat dissipating channel to prevent the cooling airflow from being heated first not to affect cooling of other electronic components. The ratio of the number of the heat-generating elements in the first quadrant Q1 corresponding to the heat-generating elements in the second quadrant Q2 to the number of the heat-generating elements in the second quadrant Q2 is between 0 and 0.5 to reduce the number of the heat-generating elements on the same cross-section. This is advantageous to enlarging temperature gradient on the same cross-section and radiating heat from the heat-generating elements to surrounding air. In detail, heat from the heat-generating elements must be radiated to air through thermal radiation, and a temperature difference is one of the key factors. Thus, interference between heat-generating elements must be as less as possible to guarantee the temperature difference between heat-generating elements and air to ensure thermally radiative efficiency.

In the aspect of upward and downward flow of cooling air, volume of the first channel in both the third quadrant Q3 and the fourth quadrant Q4 is greater than volume of the first channel in the first quadrant Q1 and the second quadrant Q2 to prevent the cooling airflow from meeting high flow resistance at a starting end not to affect flowing of the cooling airflow.

In general, preferably, the ratio of a cross-sectional area of the electronic components in a radial direction to a cross-sectional area of the heat dissipating channel in a radial direction is between 0 and 0.4, where the ratio 0 means no electronic component on the cross-section, and the ratio 0.4 means avoiding cross-sectional area of the electronic components in a radial direction exceeding half of the heat dissipating channel.

On a single side, such as the first side, the ratio of a cross-sectional area of the electronic components in the first channel S1 in a radial direction to a cross-sectional area of the first channel S1 in a radial direction is between 0 and 0.3. Contrarily, on the second side, the ratio of a cross-sectional area of the electronic components in the second channel S2 in a radial direction to a cross-sectional area of the second channel S2 in a radial direction is between 0 and 0.6. In one example, the electronic components on the first side and the second side adopt different proportion of distribution to make one side have better flowing of airflow.

As shown in FIG. 54, the abovementioned proportion may be arranged by biasing the power board 51 from the axis. A biasing distance G is formed between the power board 51 and the axis of the heat dissipating channel. The ratio of the biasing distance G to a radius of the heat dissipating channel is between 0.15 and 0.4. Such a biasing distance can adjust the center of gravity to make the equivalent center of gravity falls on the axis of the heat dissipating channel.

Figure 56:
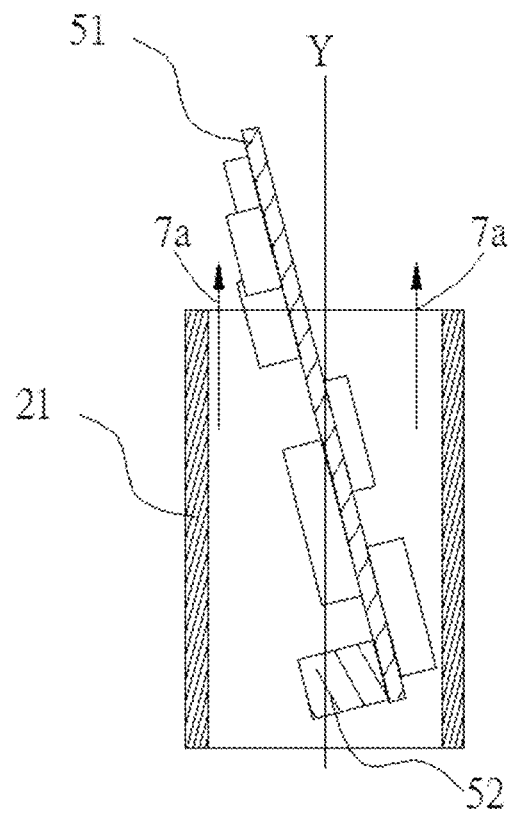
FIG. 56 is a schematic view of the combination of the power source and the sleeve, according to some embodiments of the present invention.

FIG. 56 is a schematic view of the combination of the power source 5 and the sleeve 21 of an embodiment. As shown in FIG. 56, the power board 51 is configured to incline to the axis of the LED lamp. The side with high flow resistance, such as the side on which more electronic components are mounted, may be arranged to be the upward side of the inclined power board 51. The side with low flow resistance, such as the side on which less electronic components are mounted, may be arranged to be the downward side of the inclined power board 51. As a result, the side with high flow resistance still have sufficient airflow to pass. The counterweight 52 may be mounted on the downward side of the power board 51 according to a tilting status to balance weight on the Y-axis and make the center of gravity of the LED lamp keep on the Y-axis.

As shown in FIGS. 1, 2, 3 and 4, the lamp shell 2 includes the lamp head 23, the lamp neck 22 and the sleeve 21. The lamp head 23 connects to the lamp neck 22 which connects to the sleeve 21. The sleeve 21 is located in the heat sink 1 (in the axial direction of the LED lamp, all or most of the sleeve 21, for example, at least 80% of height of the sleeve 21, does not exceed the heat sink 1). The lamp neck 22 projects from the heat sink 1. Both the sleeve 21 and the lamp neck 22 can provide sufficient space to receive the power source 5 and perform heat dissipation, especially for the power source 5 of a high power LED lamp (in comparison with a low power LED lamp, a power source of a high power LED lamp has more complicated composition and larger size). The power source 5 is received in both the lamp neck 22 and lamp head 23. Total height of the lamp neck 22 and the lamp head 23 is greater than height of the heat sink 1 so as to provide more space for receiving the power source 5. The heat sink 1 is separate from both the lamp neck 22 and the lamp head 23 (not overlap in the axial direction, the sleeve 21 is received in the heat sink 1). Thus, the power source 5 in both the lamp neck 22 and the lamp head 23 is affected by the heat sink 1 slightly (heat of the heat sink 1 would not be conducted to the lamp neck 22 and the lamp head 23 along a radial direction). In addition, the configuration of height of the lamp neck 22 is advantageous to the chimney effect of the first heat dissipating channel 7a to guarantee convection efficiency of the first heat dissipating channel 7a. In other embodiments, height of the lamp neck 22 is at least 80% of height of the heat sink 1 to accomplish the above function. The sleeve 21 is made of a thermo-isolated material to prevent mutual influence of heat from the fins and the power source.

As shown in FIG. 2, the second air inlet 1301 is located in a lower portion of the heat sink 1 and radially corresponds to an inner side or the inside of the heat sink 1, i.e. the second air inlet 1301 radially corresponds to the inner side or the inside of the fins 11. The inner side or the inside of the fins 11 corresponds to an outer wall (a radially inner side of the fins 11, which nears or abuts against the sleeve 21) of the sleeve 21 of the lamp shell 2. Thus, after convection air flows into the second air inlet 1301, it flows upward along the outer wall of the sleeve 21 to perform convection and radially dissipates heat in the inner side or the inside of the fins 11 and the outer wall of the sleeve 21 to implement an effect of thermal isolation. That is, this can prevent heat of the heat sink 1 is conducted from the outer wall of the sleeve 21 to the inside of the sleeve 21 not to affect the power source 5. From the above, the second heat dissipating channel 7b can not only enhance heat dissipation of the fins 11, but also implement an effect of thermal isolation. Make a positional comparison between the second air inlet 1301 and the LED chips 311, the second air inlet 1301 is located radially inside all of the LED chips 311.

Figure 57:
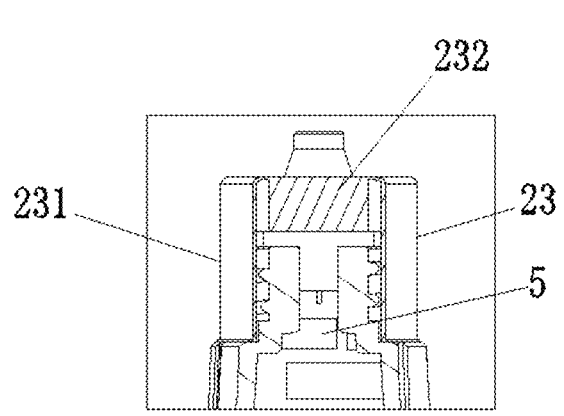
FIG. 57 is an enlarged view of portion B in FIG. 2.
Figure 58:
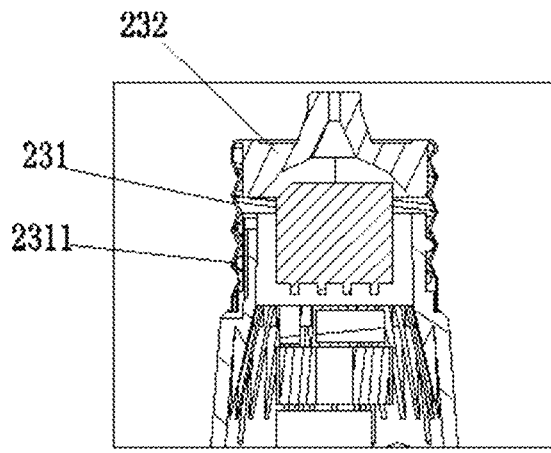
FIG. 58 is a partially schematic view of an LED lamp.

FIG. 57 is an enlarged view of portion B in FIG. 2. As shown in FIG. 57, the lamp head 23 includes a metal portion 231 and an insulative portion 232. Wires of the power source 5 penetrates through the insulative portion 232 to connect with an external power supply. The metal portion 231 connects to the lamp neck 22. In detail, as shown in FIG. 58, an inner surface of the metal portion 231 is provided with a thread through which the lamp neck 22 can be screwed on with the metal portion 231. While the metal portion 231 is dissipating heat generated from the power source 5 in the lamp shell 2 (as described in the above embodiment, at least part of the inner wall of the metal portion 231 forms a wall of the inner chamber of the lamp shell 2, so the thermal conductor directly connects with the metal portion 231 and the metal portion 231 can be used for heat dissipation), an outer surface of the metal portion 231 is formed with a projecting structure 2311 as shown in FIG. 58 to add surface area of the outer surface of the metal portion 231 and enlarge heat dissipating area of the metal portion 231 to increase efficiency of heat dissipation. As for the power source 5, at least part of the power source 5 is located in the lamp head 23, and at least part of heat generated from the power source 5 can be dissipated through the lamp head 23. The inner wall of the metal portion 231 may also be formed with a projecting structure to add surface area of the inner chamber of the lamp shell 2. In this embodiment, the projecting structure can be implemented by forming a thread on the inner surface of the metal portion 231.

Figure 59A:
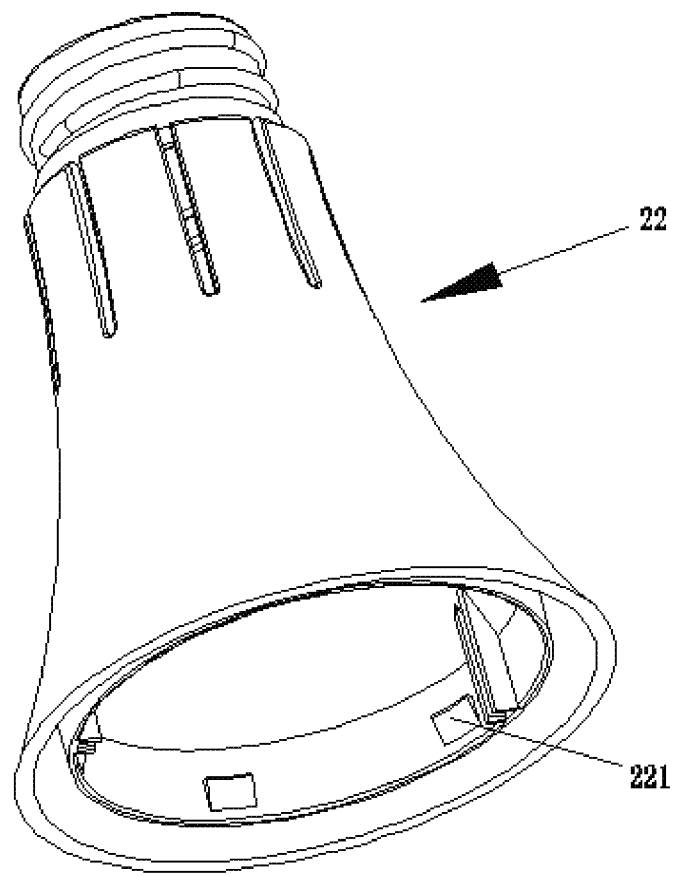
FIGS. 59A~59B are perspective views of the lamp neck of an embodiment.
Figure 59B:
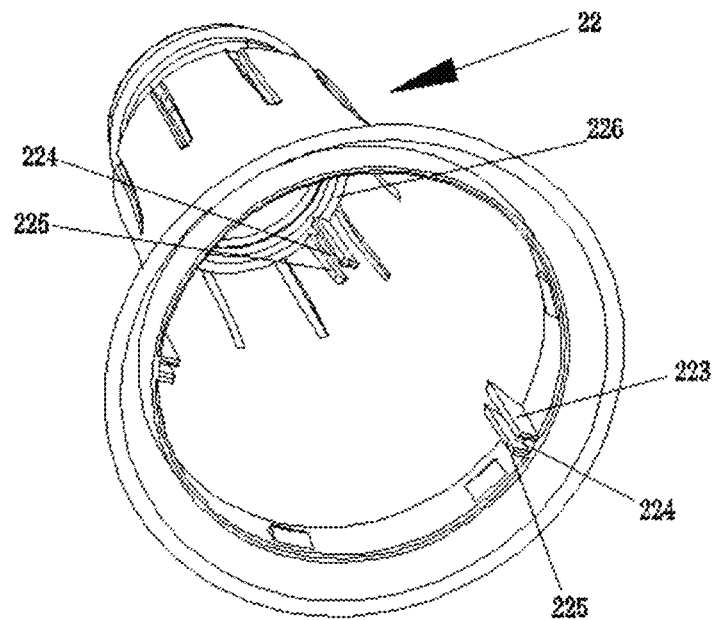
Figure 59C:
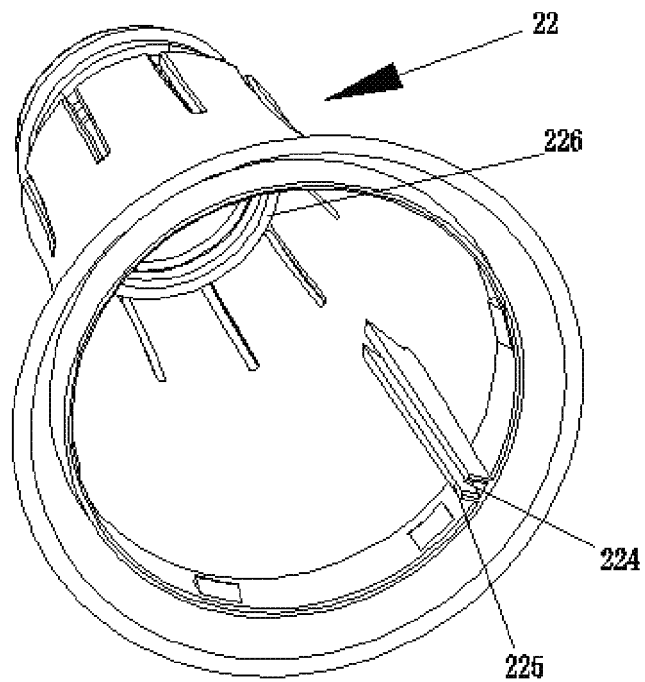
FIG. 59C is a perspective view of the lamp neck of another embodiment.
Figure 60:
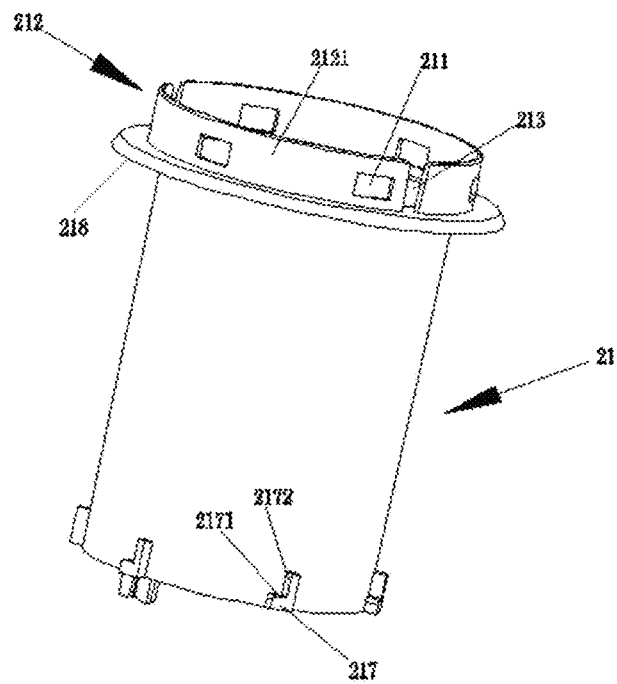
FIG. 60 is a perspective view of the sleeve of an embodiment.

Next, please refer to FIGS. 59A~59C and FIG. 60. FIG. 59A is a perspective views of the lamp neck 22 of one embodiment, and FIG. 59B is another perspective view of the lamp neck 22 of this embodiment. FIG. 60 is a perspective view of the sleeve 21 of this embodiment. As shown in FIGS. 2, 59A, 59B and 60, the lamp neck 22 is connected to the sleeve 21 by engagement. In detail, the sleeve 21 has a first positioning unit 211 and the lamp neck 22 has a second positioning unit 221. The sleeve 21 can be connected with the lamp neck 22 by engaging the first positioning unit 211 and the second positioning unit 221.

In this embodiment, the first positioning unit 211 is an engaging portion on the sleeve 21, and the second positioning unit 221 is a latch on the lamp neck 22. The engaging portion can fasten with the latch. In other embodiments, alternatively, the first positioning unit 211 is a latch on the sleeve 21, and the second positioning unit 221 is an engaging portion on the lamp neck 22. The engaging portion can fasten with the latch.

In this embodiment, the sleeve 21 has a connecting portion 212. The connecting portion 212 includes at least two sheet-shaped bodies 2121 on a circumferential portion of the LED lamp. The first positioning unit 211 is formed on the sheet-shaped bodies 2121. When the lamp neck 22 engages with the sleeve 21, the second positioning unit 221 is embedded into the first positioning unit 211. When embedding, the second positioning unit 221 exerts radial pressure to the sheet-shaped bodies 2121. When the sheet-shaped bodies 2121 are more than two in number, their radially structural strength would be weakened to make the engagement easier, and the connecting portion 212 would have a larger amount of radial deformation. In this embodiment, the engaging portion 212 is a trough or a through hole formed in the sheet-shaped bodies 2121.

In this embodiment, two gaps are formed between the two sheet-shaped bodies 2121 and the gaps constitute a positioning trough 213. The lamp neck 22 has a third positioning unit (plates 223 and 225) corresponding to the positioning trough 213. When the sleeve 21 engages with the lamp neck 22, the third positioning unit (plates 223 and 225) is inserted into the positioning trough 213 to limit the sleeve 21 to be un-rotatable.

In this embodiment, the connecting portion 212 is coaxially put in the lamp neck 22. By the coaxial connection, both the connecting portion 212 and the lamp neck 22 have mutual guiding and supporting effects to make the connection easy, simple and stable.

In this embodiment, both the lamp neck 22 and the sleeve is an integrated structure (not shown) to simplify a structure of the lamp shell 2.

As shown in FIG. 59B, the lamp neck 22 has a slot 224 formed between plate 223 and plate 225. In detail, the slot 224 allows the power board 51 to be inserted for fixture. In this embodiment, two sets of plates 223 and 225 are disposed along the axial direction of the LED lamp to make the LED lamp keep in the axial direction and a gap is kept between the two sets of plates 223 and 225. When the power board 51 has been inserted into the slot 224, convection can be performed between two sides of the power board 51 through the gap. In this embodiment, when two sets of plates 223 and 225 are disposed in the axial direction of the LED lamp, the ratio of length L1 of the lower set of plates 223 and 225 in the axial direction of the lamp neck 22 to length L2 of the power board 51 is 1:14~22. When the ratio falls within this range and the power board 51 is inserted into the lower slot 224, two sides of the power board 51 are limited by the plates 223 and 225, so the power board 51 would not tilt to be advantageous to make the power board 51 easy to align with the other slot 224. This can reduce difficulty in assembling.

In this embodiment, the two plates 223 and 225 are formed by two parallel ribs. A set of ribs is disposed on an inner wall of the lamp neck 22 and extends along the axial direction of the lamp neck 22. After the power board 51 has been inserted into the slot 224, the ribs are parallel to the power board 51.

In this embodiment, the third positioning unit formed by two plates 223 and 225, two opposite sides of the positioning trough 213 have effects of positioning and guiding.

FIG. 59C is a perspective view of the lamp neck 22 on an embodiment. As shown in FIG. 59C, in some embodiments, the plates 225 are of a single set along the axial direction of the LED lamp and with longer length. Such a long slot 224 formed the plates 225 can fix the power board 51 more firmly. In this embodiment, length of the plate 225 is 15%~45% of length of the power board 51 to make the power board 51 held by the slot 224.

In other embodiments, the slot 224 may also be a trough on an inner wall of the lamp neck 22 (not shown). Thus, no plate is required for structural simplification.

As shown in FIGS. 59B and 31, in this embodiment, a first stopping portion 226 is provided in the lamp neck 22 to correspond to the power board 51. When the power board 51 is inserted, it will be stopped by the first stopping portion 226 to prevent the power board 51 from being excessively pressed and being damaged. On the other hand, the first stopping portion 226 can keep a gap between the power board 51 and an end portion of the lamp head 23 to guarantee convection in the gap.

As shown in FIG. 31, the sleeve 21 has a second stopping portion 215 corresponding to the power board 51 for limiting downward movement of the power board 51 in the axial direction. Both the first stopping portion 226 and the second stopping portion 215 limit two sides of the power board 51 in the axial direction to fasten the power board 51 in the axial direction.

As shown in FIGS. 1 and 31, the lamp shell 2 has an airflow limiting surface 214 which extends radially outwardly and is located away from the venting hole 222. The airflow limiting surface 214 cloaks at least part of the fins 11. When the fins are dissipating heat, hot airflow heated by the part of fins 111 cloaked by the airflow limiting surface 214 rises but is blocked by the airflow stopping surface 214 to change its direction (outward along the airflow stopping surface 214). Thus, rising hot airflow is forced to go away from the venting hole 222. This can prevent hot air from both gathering around the venting hole 222 and affecting convection speed of the first heat dissipating channel 7a. Also, this arrangement can prevent rising hot air from both being in contact with the metal portion 231 of the lamp head 23 and affecting heat dissipation of the metal portion 231. Even hot air directly passing the metal portion 231 to conduct into the inner chamber of the lamp shell 2 can also be avoided. The airflow stopping surface 214 may be formed on the sleeve 21. As shown in FIG. 12, in another embodiment of the present invention, the airflow stopping surface 214 may also be formed on the lamp neck 22.

As shown in FIG. 31, in this embodiment, upper portions of at least part of the fins 11 in the axial direction of the LED lamp correspond to the airflow stopping surface 214. When the lamp shell 2 is inserted into the heat sink 1, the airflow stopping surface 214 will have a limiting effect to the lamp shell 2. In this embodiment, the fins abut against the airflow stopping surface 214.

As shown in FIG. 31, in this embodiment, the sleeve 21 is made of a material whose thermal conductivity is less than that of the material of which the lamp neck 22 is made. The airflow stopping surface 214 is formed on the sleeve 21. Height of the heat sink 1 in the axial direction does not exceed the airflow stopping surface 214 to reduce contact area between the heat sink 1 and the lamp neck 22. As for the sleeve 21, the lower its thermal conductivity is, the less the heat conducted from the heat sink 1 to the inside of the sleeve 21 is, and the less the influence to the power source 5 is. As for the lamp neck 22, the less the contact area between the lamp neck 22 and the heat sink 1 is, the lower the thermal conductivity is. The lamp neck 22 has better thermal conductivity than that of the sleeve 21. The lamp neck 22 can dissipate at least part of heat from the power source 5. In other embodiments, both the sleeve 21 and the lamp neck 22 may adopt the same material, a material with relatively low thermal conductivity, such as plastic.

As shown in FIG. 31, in this embodiment, both a wall of the sleeve 21 and a wall of the lamp neck 22 jointly constitute a wall of the inner chamber of the lamp shell 2. Height of the heat sink 1 in the axial direction does not exceed height of the sleeve 21 to make the heat sink 1 corresponds to the sleeve 21 in a radial direction of the LED lamp. That is, the sleeve 21 has an effect of thermal isolation to prevent heat of the heat sink 1 from being conducted to the sleeve 21, so that electronic components of the power source 5 world not be affected. All the lamp neck 22 is higher than a position of the heat sink 1. That is, in a radial direction of the LED lamp, the heat sink 1 does not overlap the lamp neck 22. This can make thermal conduction between the heat sink 1 and the lamp neck 22, and prevent heat from the heat sink 1 to conduct to the inside of the lamp neck 22, so that the electronic components therein would not be affected. As a result, in this embodiment, heat conducting efficiency of the wall of the sleeve 21 is configured to be lower than heat conducting efficiency of the wall of the lamp neck 22. Advantages of such configuration are as follows: (1) because heat conducting efficiency of the sleeve 21 is relatively low, thermal conduction from the heat sink 1 to the sleeve 21 can be reduced to prevent electronic components in the sleeve 21 form being affected by the heat sink 1; and (2) because thermal conducting from the heat sink 1 to the lamp neck 22 does not need to be considered, heat conducting efficiency of the lamp neck 22 can be increased to be advantageous to dissipating heat from the electronic components of the power source 5 through the lamp neck 22. This can avoid life shortening of the power source 5 due to overheating. In this embodiment, in order to make heat conducting efficiency of the wall of the sleeve 21 be lower than heat conducting efficiency of the wall of the lamp neck 22, the sleeve 21 is made of a material with low thermal conductivity and the lamp neck 22 is made of a material with relatively high thermal conductivity. To increase thermal conductivity of the lamp neck 22, the lamp neck 22 may be provided with a venting hole 222 or a heat conducting portion (not shown) such as metal or other materials with high thermal conductivity.

As shown in FIG. 31, the lamp neck 22 has an upper portion and a lower portion. The venting hole 222 is located in the upper portion. Cross-sectional area of the upper portion is less than cross-sectional area of the lower portion. Airflow speed in the upper portion is faster than that in the lower portion, so that initial speed of air ejected from the venting hole 222 can be increased to prevent hot air from gathering around the venting hole 222. In this embodiment, cross-sectional area of the lamp neck 22 upward tapers off in the axial direction to avoid obstruction to air flowing. In this embodiment, cross-sectional area of an inlet of the lower portion of the sleeve 21 is greater than that of the upper portion of the lamp neck 22.

As shown in FIG. 1, the venting hole 222 of the lamp neck 22 is of a strip shape and extends along the axial direction of the LED lamp. Because of gravity of the LED lamp itself, the lamp neck 22 would suffer an axial pulling force. The venting hole 222 are configured to be of a strip shape extending the axial direction of the LED lamp, so stress concentration caused by the venting hole 222 in the lamp neck 22 can be prevented. A maximum diameter of an inscribed circle of the venting hole 222 is less than 2 mm, preferably, between 1 mm and 1.9 mm. As a result, the venting hole 222 can prevent bugs from entering and prevent most dust from passing. On the other hand, the vent 41 can keep better efficiency of air flowing. On the other hand, if the venting hole 222 is configured to annular extending along an circumferential portion of the lamp neck 22, then the lamp neck 22 may be deformed by weight of the heat sink 1 to make the venting hole 222 become larger. This would cause that a maximum diameter of an inscribed circle of the venting hole 222 is greater than 2 mm, this cannot satisfy the requirement.

As shown in FIG. 21, the venting hole 222 is outside an outer surface of the metal portion 231 in radial directions. This can reduce influence to the metal portion 231 because of rising air ejected from the venting hole 222 and prevent heat from being conducted back to the lamp shell 2.

Figure 61:
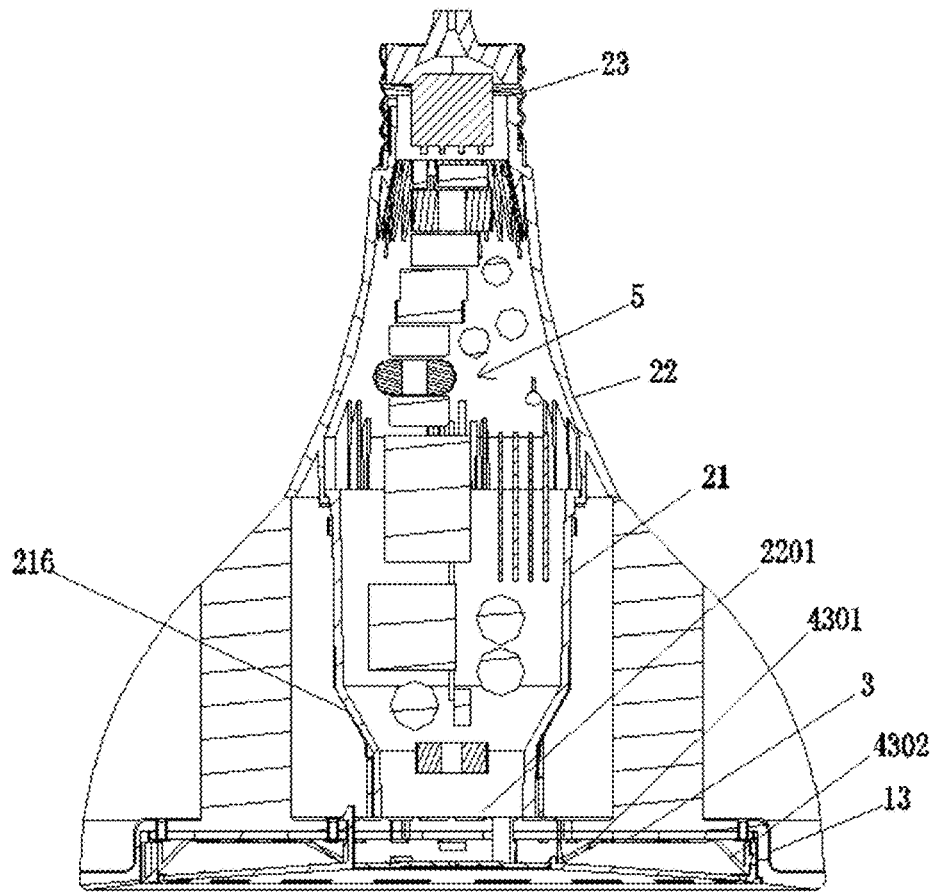
FIG. 61 is a cross-sectional view of the LED lamp of another embodiment.
Figure 62:
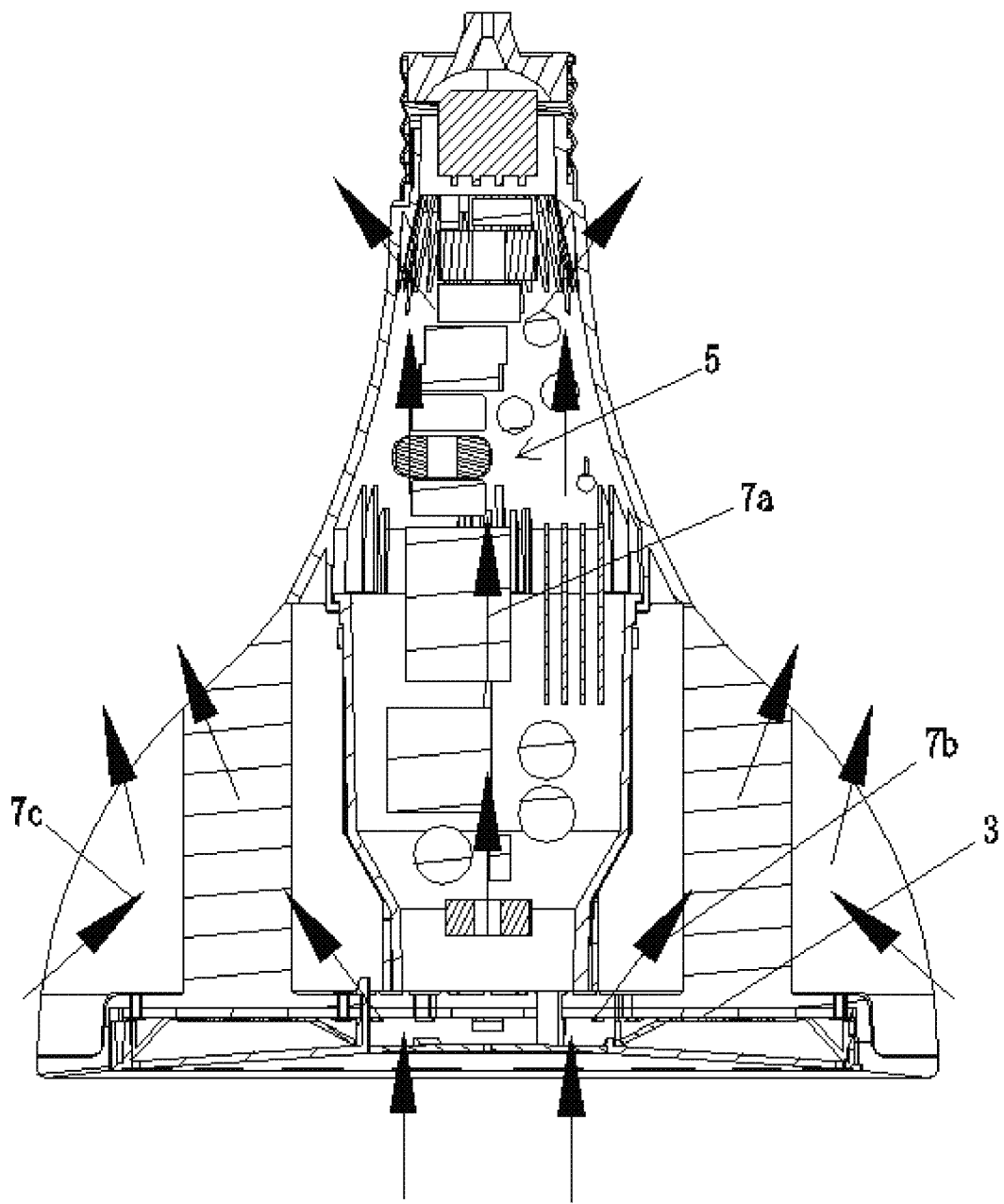
FIG. 62 is a schematic view of an arrangement of the convection channels of the LED lamp of FIG. 61.

FIG. 61 is a cross-sectional view of the LED lamp of another embodiment. FIG. 62 is a schematic view of arrangement of the convection channels in the LED lamp. As shown in FIGS. 61 and 62, in some embodiments, a fundamental structure of the LED lamp is identical to the LED lamp shown in FIG. 1. In some embodiments, the sleeve 21 has an upper portion and a lower portion. The upper portion is connected to the lower portion through an air guiding surface 216. A diameter of cross-section of the air guiding surface 216 downward tapers off along the axis of the LED lamp (along the convection direction of the first heat dissipating channel 7a). That is, the air guiding surface 216 can guide air in the second heat dissipating channel 7b toward the radial outside of the heat sink 1 so as to make air be in contact with more area of the fins 11 to bring out more heat of the fins 11. The sleeve 21 includes a first portion and a second portion in the axial direction. The second portion is a part of the sleeve 21 below the air guiding surface 216 (including the air guiding surface 216). The first portion is the other part of the sleeve 21 above the air guiding surface 216 (but not including the air guiding surface 216). Electronic components of the power source 5, which are located in the second portion of the sleeve 21, include heat intolerance elements such as capacitors, especially electrolytic capacitors so as to make the heat intolerance elements work in low temperature environment (near the first air inlet 2201). In other embodiments, high heat-generating elements may be disposed in the second portion of the sleeve 21, such as resistors, inductors and transformers. As for the second heat dissipating channel 7b, when convection air flows into the second heat dissipating channel 7b and reaches the lower portion of the sleeve 21, the convection air would lean against the outer wall of the sleeve 21 to rise. This can generate an effect of thermal isolation, i.e. heat of the fins 11 is prevented from being conducted to the inside of the sleeve 21 so that the heat intolerance elements therein would not be affected. When the convection air continues to rise, the convection air will flow outward along radial directions of the fins 11 under the guide of the air guiding surface 216 so as to make the convection air be in contact with more area of the fins 11 to enhance an effect of heat dissipation of the fins 11. In this embodiment, the inner chamber of the sleeve 21 is of a wide-upper-side-and-narrow-lower-side channel structure. This significantly enhances the chimney effect and promotes air flowing in the sleeve 21. In addition, the venting hole 222 can be designed on the lamp neck 22 away from the vent to further improve the chimney effect.

Figure 63:
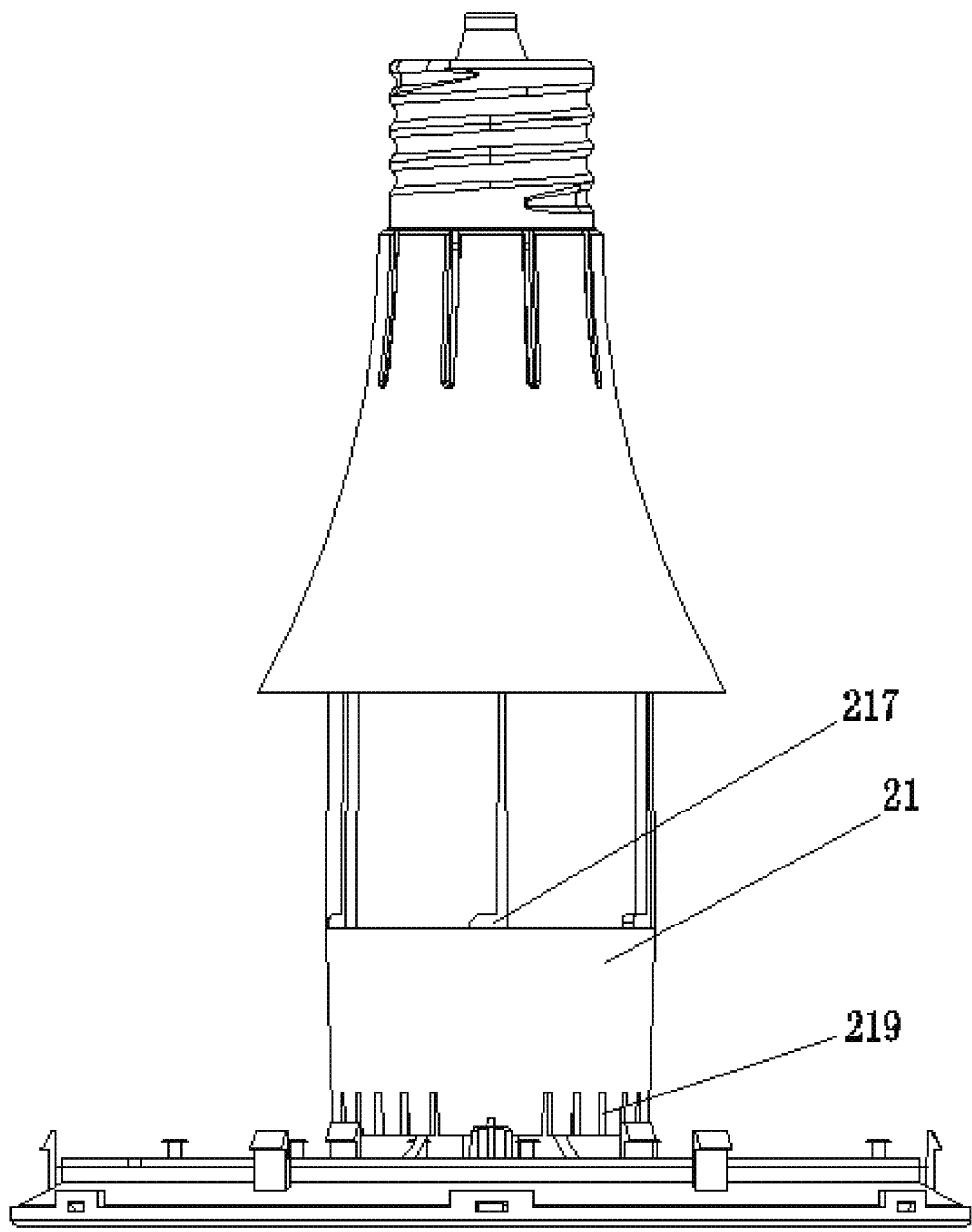
FIG. 63 is a main view of an embodiment of the LED lamp without the heat sink.
Figure 64:
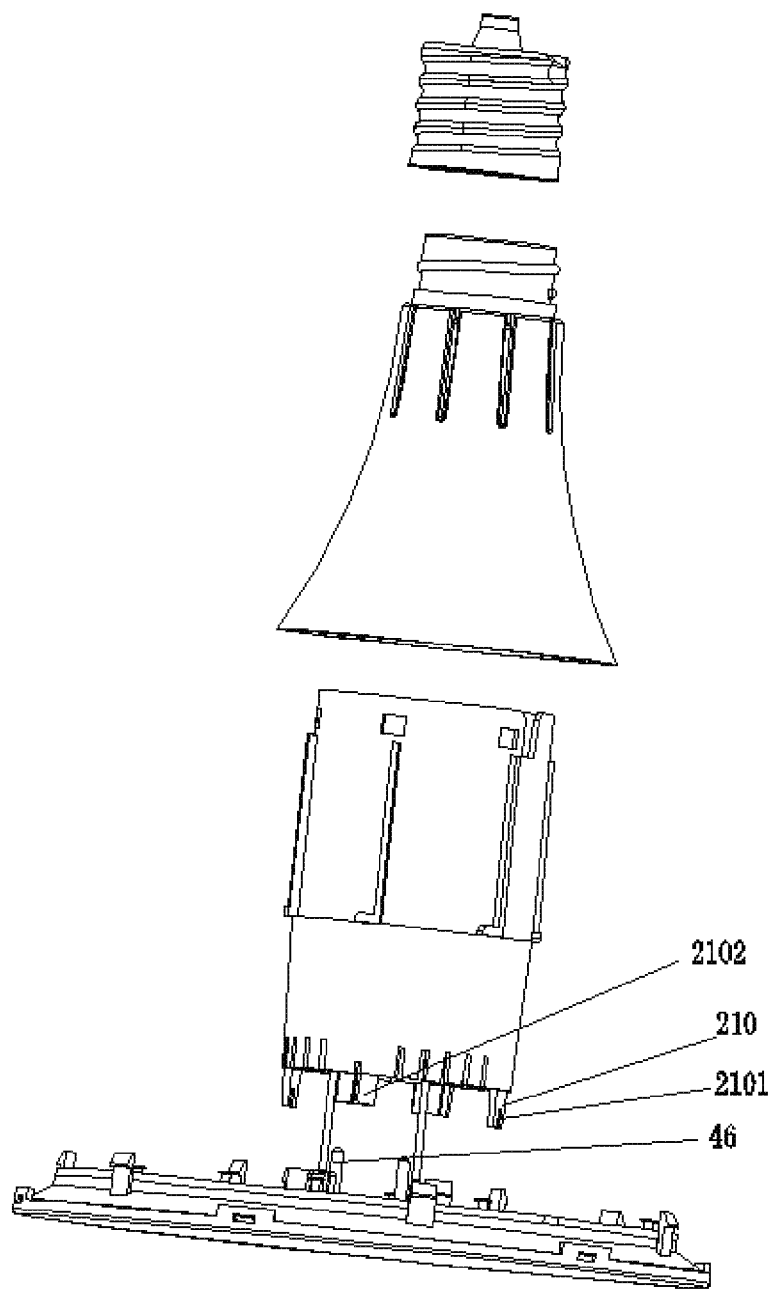
FIG. 64 is an exploded view of the LED lamp of FIG. 63.

FIG. 63 is a main view of an embodiment of the LED lamp without the heat sink 1. FIG. 64 is an exploded view of FIG. 63. Features mentioned in this embodiment may be applied to the LED lamp of FIG. 1. As shown in FIG. 63, in some embodiments, an outer wall of the sleeve 21 is provided with a passage 219 to make part of convection air pass through the passage 219 to reach the heat sink 1. In this embodiment, the passage 219 may be a slot at the lower portion of the outer wall of the sleeve 21 or a hole at the lower portion of the outer wall of the sleeve 21. The passage 219 may be multiple in number. The multiple passages 219 are radially distributed on the sleeve 21. At this time, positions of the blocks 217 are correspondingly adjusted.

As shown in FIG. 64, the sleeve 21 is provided with a wire pressing portion 210 downward projecting from a bottom edge of the sleeve 21. The wire pressing portion 210 is formed with a wire pressing trench 2101 for allowing the wire connecting the power source 5 and the light board 3 to be embedded into the wire pressing trench 2101 to fix the wire.

As shown in FIG. 64, the sleeve 21 has a fourth positioning unit 2102, and the lamp cover 4 has a fifth positioning unit 46. The fifth positioning unit 46 corresponds to the fourth positioning unit 2102 to limit rotation of the sleeve 21 against the lamp cover 4. In detail, the fourth positioning unit 2102 and the fifth positioning unit 46 are a positioning hole and a positioning bar, respectively. The positioning bar is inserted into the positioning hole for engagement. It is noted that the positioning bar is not arranged in the axial direction of the sleeve 21. Preferably, both the positioning bar and hole are multiple in number. In other embodiments, the fourth positioning unit 2102 and the fifth positioning unit 46 are a positioning bar and a positioning hole, respectively. The positioning bar is inserted into the positioning hole for engagement.

Next, please refer to FIG. 1, which shows an outline of the LED lamp of one embodiment. Create a Cartesian coordinate system with the axis of the LED lamp as the y-axis, a radial of the LED lamp as the x-axis and the center of the LED lamp as the origin. A lateral outline of the LED lamp detours around the axis of the LED lamp 360 degrees to turn around to form a contour of the LED lamp (not including the lamp head 23). Any point on the outline (usually, the lamp head 23 is a standard one, thus, here does not include the lamp head 23; in detail, the outline is composed of the heat sink 1 and the lamp head 22) meets a formula as follows:

$$y = -ax^3 + bx^2 - cx + K$$

where K is a constant, range of K is 360~450, range of a is 0.001~0.01, range of b is 0.05~0.3, range of c is 5~20, preferably, 10~18, more preferably, 12~16.

Hereinafter, as an example, values of a, b and c are supposed as follows:

$$y = -0.0012x^3 + 0.2235x^2 - 14.608x + K$$

where range of K is 360~450.

The above formula can be interpreted as any point on the outline falling within a range between two lines of $y = -0.0012x^3 + 0.2235x^2 - 14.608x + 360$ and $y = -0.0012x^3 + 0.2235x^2 - 14.608x + 450$.

In sum, comprehensively considering various factors of an effect of heat dissipation, principles of thermodynamics and fluid mechanics, satisfying this formula can obtain a great effect of heat dissipation.

Figure 67:
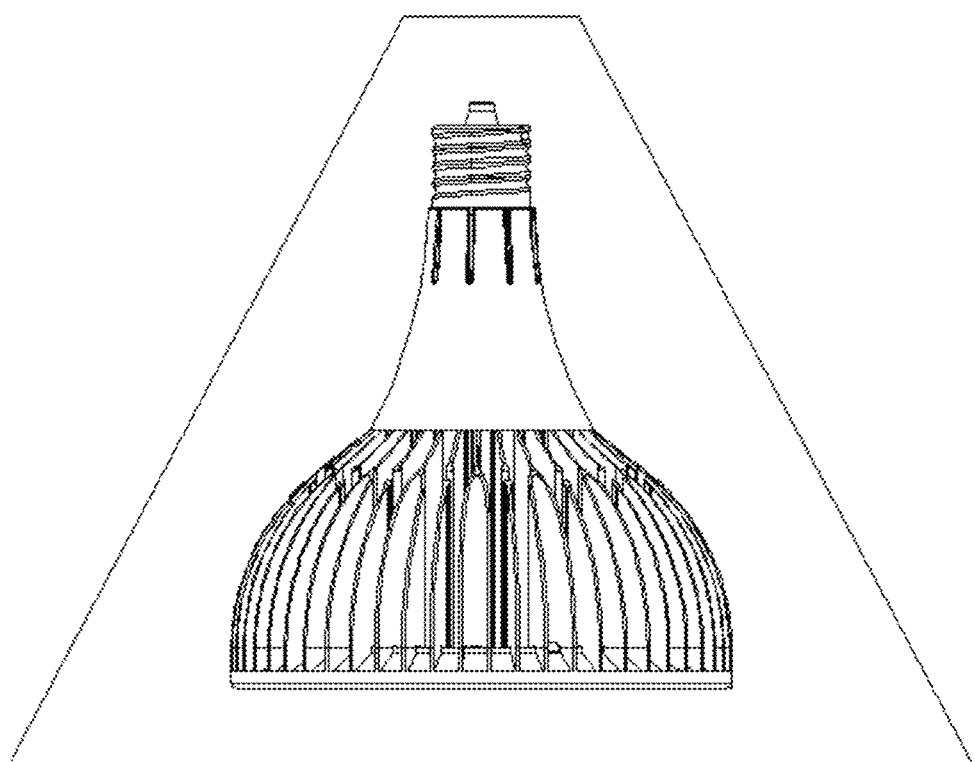
FIG. 67 is a schematic view of the combination of the LED lamp with a lampshade, according to one embodiment of the present invention.

In detail, in one aspect, when any point on the outline satisfy the above formula, a better match between the LED lamp and a lampshade (especially a conic lampshade) as shown in FIG. 67 can be made. In another aspect, when any point on the outline satisfy the above formula, the LED lamp axially tapers off from its bottom to top to make overall width of the LED lamp approximately progressively decreases. For the heat sink 1, heat from the LED chips 311 can be rapidly conducted to the lower portion of the heat sink 1 to perform heat dissipation. The upper portion of the heat sink 1 mainly relies upon both radiation and convection to perform heat dissipation. Thus, the lower portion of the heat sink 1 is configured to have more area to perform thermal conduction (the lower portion of the heat sink 1 has large width and heat dissipating area). For the lamp neck 22, the lamp neck 22 has a large lower portion and a small upper portion. That is, Cross-sectional area of the lamp neck 22 axially upward tapers off. When the lamp neck 22 dissipate heat from the power source 5 through convection and the venting hole 222 is located in the upper portion of the lamp neck 22, the rising convection airflow would speed up because of tapered cross-sectional area of the lamp neck 22. This makes the convection air ejected from the venting hole 222 have faster initial speed, so ejected air would rapidly leave away from the venting hole 222 to prevent hot air from gathering near the venting hole 222.

Figure 68:
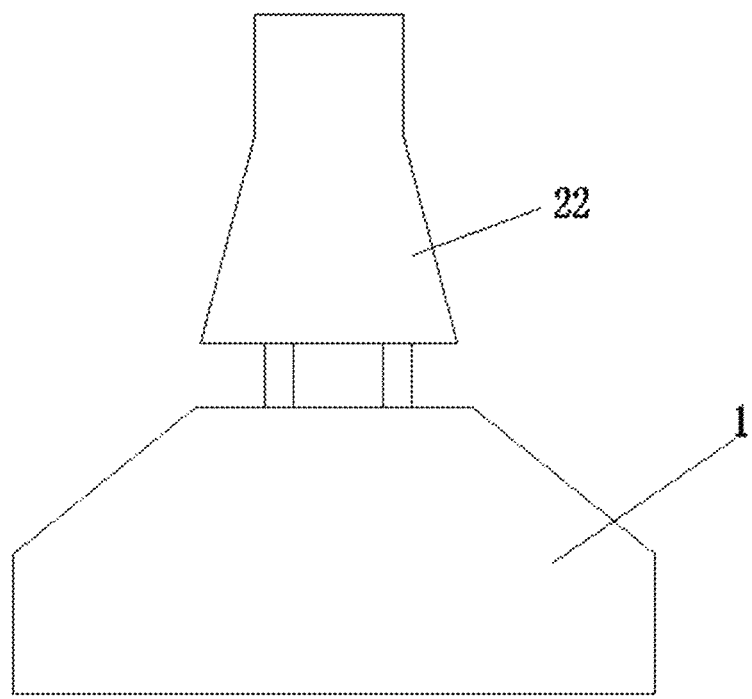
FIG. 68 is a schematic view of another embodiment of the LED lamp.

In this embodiment, the outline is a continuous line. In other embodiments, the outline may be a multiple sectional line (as shown in FIG. 68)

In this embodiment, the outline is a smooth or approximately smooth curve to avoid forming angles with possibility of cutting hands. On the other hand, this makes convection air flowing along the outside of the LED lamp smoother. In this embodiment, the outline of the LED lamp is a substantially S-shaped curve including a curve on the lamp neck 22 and a curve on the heat sink 1. It is noted that a junction of the lamp neck 22 and the heat sink 1 may form an angle which destroys smoothness of the curve. However, in general, overall outline still presents smooth. In addition, LED lamps with the same width, whose outlines are curves, in comparison with a straight line, have more area of an outline surface to provide more area for thermal radiation.

Figure 66:
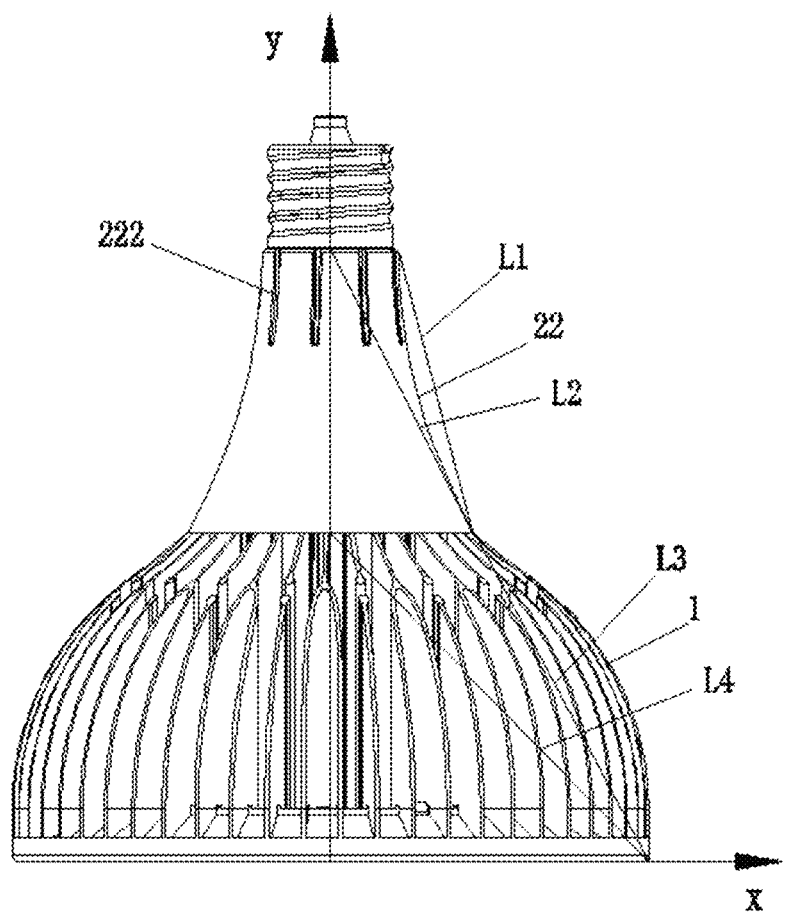
FIG. 66 is a main view of the LED lamp, according to one embodiment of the present invention.

As shown in FIG. 66, which shows an outline of the LED lamp of one embodiment. Create a Cartesian coordinate system with the axis of the LED lamp as the y-axis, a radial of the LED lamp as the x-axis and the center of the LED lamp as the origin. A lateral outline of the LED lamp detours around the axis of the LED lamp 360 degrees to turn around to form a contour of the LED lamp (not including the lamp head 23). The outline includes an outline of the LED neck 22 and an outline of the heat sink 1.

The lamp neck 22 is used for receiving the power source 5 and primarily adopts convection to implement heat dissipation to the power source 5. The outline of the lamp neck 22 has a slope a, which is a constant. As shown in FIG. 66, when the outline of the lamp neck 22 is a curve, a straight line may represent an approximate slope of the outline of the lamp neck 22. For example, a line L1 between the top point and the bottom point of the outline of the lamp neck 22 can be used to represent an outline of the lamp neck 22 or a line L2 between the center of the top and the bottom point of the outline of the lamp neck 22 can be used to represent an outline of the lamp neck 22. In this embodiment, Line L1 between the top point and the bottom point of the outline of the lamp neck 22 is used to represent an outline of the lamp neck 22 for description.

The heat sink 1 primarily adopts conduction to implement heat dissipation to the LED chips 311. The outline of the heat sink 1 has a slope b which is a constant. As shown in FIG. 66, when the outline of the heat sink 1 is a curve, a straight line may represent an approximate slope of the outline of the heat sink 1. For example, a line L3 between the top point and the bottom point of the outline of the heat sink 1 can be used to represent an outline of the heat sink 1 or a line L4 between the center of the top and the bottom point of the outline of the heat sink 1 can be used to represent an outline of the heat sink 1. In this embodiment, Line L3 between the top point and the bottom point of the outline of the heat sink 1 is used to represent an outline of the heat sink 1 for description.

In this embodiment, slope a is greater than slope b or an absolute value of slope a is greater than an absolute value of slope b. Thus, in general, the outline of the lamp neck 22 is steeper than that of the heat sink 1. For the lamp neck 22, under a condition of the same space required for installing the power source 5, in order to guarantee the chimney effect of convection in the lamp neck 22, a certain height of the lamp neck 22 must be kept. If a slope of the outline of the lamp neck 22 is gentle (small slope), to keep the same height, internal volume of the lamp neck 22 would increase. However, it is actually unhelpful to an installing space of the power source 5. For the heat sink 1, an overall height of the lamp is controlled to guarantee an effect of heat dissipation. Thus, the heat sink 1 needs to be configured to be gentle (small slope) to control its overall height. In addition, when the heat sink 1 is gentle (small slope), under a condition of the same area of heat dissipation, the lower portion of the heat sink 1 would have more area for thermal conduction to the LED chips 311.

In this embodiment, slope a is greater than 2, preferably, 2.5~5, more preferably, 3~4, the most preferably, 3.2~3.8, to make the chimney effect of convection in the lamp neck 22 better.

In this embodiment, slope b is smaller than 3, preferably, 1~2.5, more preferably, 1.4~2, the most preferably, 1.5~1.9, to make the lower portion of the heat sink 1 have more area for conduction.

In this embodiment, the outline of the Led lamp is a continuous line, i.e. the bottom of the outline of the lamp neck 22 is connected to the top of the outline of the heat sink 1. In other embodiments, the outline may be multiple sectional lines (as shown in FIG. 68). For example, a gap is formed between the bottom of the outline of the lamp neck 22 and the top of the outlie of the heat sink 1. Thus, the overall outline is discontinuous.

In this embodiment, the outline of the lamp neck 22 is a concave curve. In one example, if a straight line is connected between the top and the bottom of the outline of the lamp neck 22, then all of the outline of the lamp neck 22 is inside the straight line (i.e. the side near the axis of the LED lamp). The outline of the heat sink 1 is a convex curve. In one example, if a straight line is connected between the top and the bottom of the outline of the heat sink 1, then all of the outline of the heat sink 1 is outside the straight line (i.e. the side away from the axis of the LED lamp). The outline is a smooth or approximately smooth curve to avoid forming angles with possibility of cutting hands. On the other hand, this makes convection air flowing along the outside of the LED lamp smoother. In this embodiment, the outline of the LED lamp is a substantially S-shaped or an inverted S-shaped including a curve on the lamp neck 22 and a curve on the heat sink 1. Both a curve on the lamp neck 22 and a curve on the heat sink 1 jointly constitute an S-shaped or an inverted S-shaped curve. It is noted that a junction of the lamp neck 22 and the heat sink 1 may form an angle which destroys smoothness of the curve. However, in general, overall outline still presents smooth. In addition, the LED neck 22 may be separate from the heat sink 1 (for example, a certain gap is kept between the lamp neck 22 and the heat sink 1). That is, a curve on the lamp neck 22 and a curve on the heat sink 1 are discontinuous. However, in general, overall outline still presents smooth. The outline of the lamp neck 22 is a concave curve, so in the downward section, an enlarging extent of the lamp neck 22 increases in size to make the final bottom of the lamp neck 22 have a larger size to connect with the heat sink 1. In one example, an initial position of the upper portion of the heat sink 1 may obtain a larger size. The outline of the heat sink 1 is a convex curve, so in the upward section, a reducing extent of the heat sink 1 increases in size to make the size reduction of the lower portion of the heat sink 1 become gentler and gentler. Thus, the lower portion have larger area of the heat sink 1 for heat dissipation. In other embodiments, the outline of the lamp neck 22 may be a straight line and the outline of the heat sink 1 is a curve. In addition, the straight line may be parallel to the LED lamp. In other embodiments, both the outline of the lamp neck 22 and the outline of the heat sink 1 are straight lines or multiple sectional lines.

In this embodiment, any point on the outline of the lamp neck 22 must meet a formula as follows:

$$y=-ax+k1+h,$$

where k1 is a constant and h is height of the heat sink 1.

any point on the outline of the heat sink 1 must meet a formula as follows:

$$y=-bx+k2,$$

where k2 is a constant.

In this embodiment, when overall width of the LED lamp is configured to be between 100 mm and 220 mm, k1 is 100~200 and k2 is 100~200. For example, when maximum overall width of the LED lamp is 200 mm, k1 is 140~150 and k2 is 170~200.

In this embodiment, height of the lamp neck 22 is greater than 80% of height of the heat sink 1. Because the lamp neck 22 is axially separate from the heat sink 1 without overlapping, the power source 5 in the lamp neck 22 is less affected by the heat sink 1. Thus, when height of the lamp neck 22 is greater than 80% of height of the heat sink 1, more space for installing the power source 5 can be obtained and the power source 5 is less affected by the heat sink 1. In addition, when heat of the power source 5 in the lamp shell 2 is dissipated by convection, configuration of height of the lamp neck 22 can guarantee height of the lamp shell 2 to guarantee the chimney effect of convection of heat dissipation.

Figure 69:
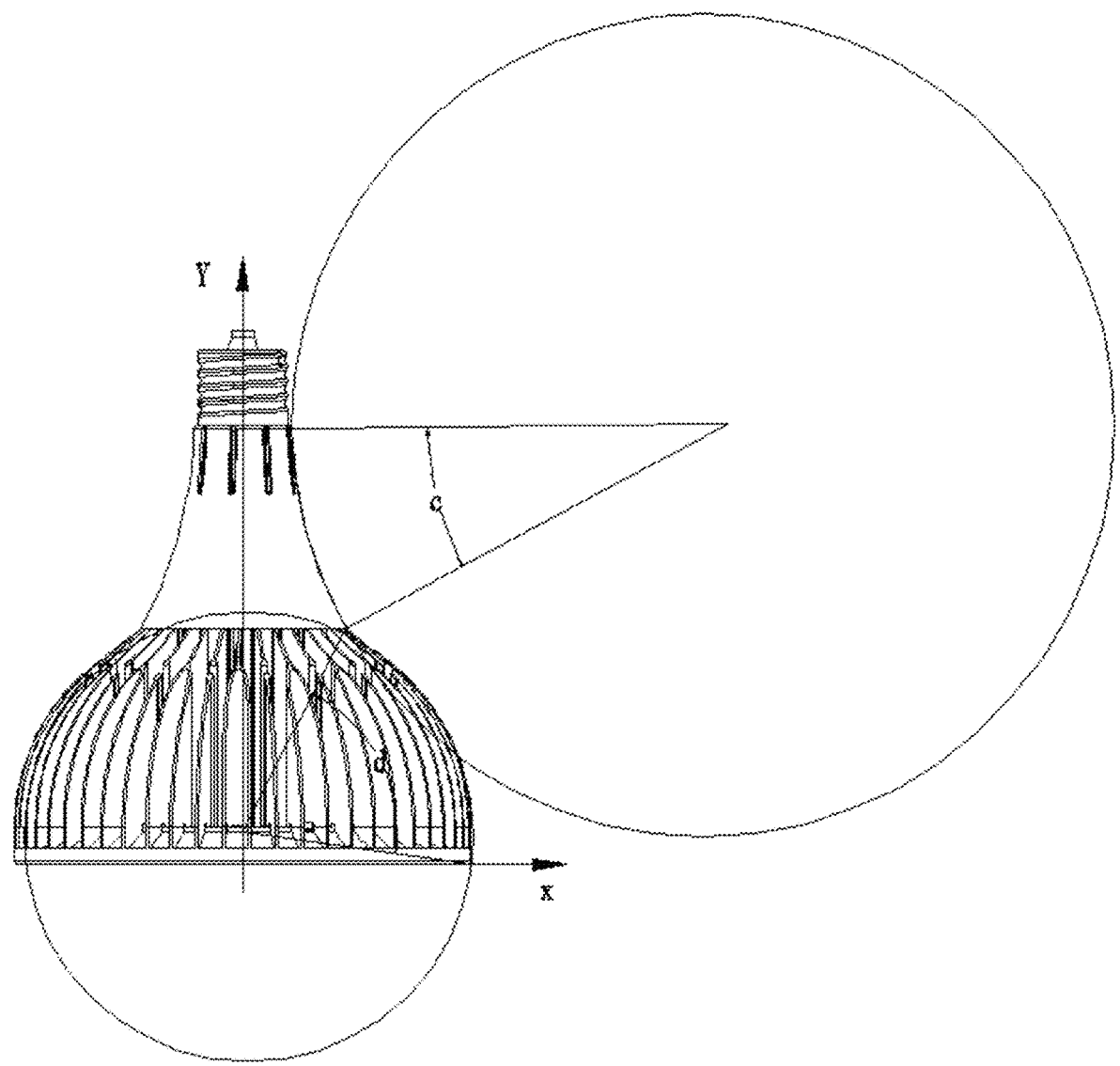
FIG. 69 is a main view of the LED lamp, according to one embodiment of the present invention.

As shown in FIG. 69, which shows the outline of the LED lamp. Create a Cartesian coordinate system with the axis of the LED lamp as the y-axis, a radial of the LED lamp as the x-axis and the center of the LED lamp as the origin. A lateral outline of the LED lamp detours around the axis of the LED lamp 360 degrees to turn around to form a contour of the LED lamp (not including the lamp head 23). The outline includes an outline of the lamp neck 22 and an outline of the heat sink 1. As shown in FIG. 69, in this embodiment, the outline of the LED lamp includes a first curved surface and a second curved surface. Both the first curved surface and the second curved surface jointly constitute a curved surface of the outline of the LED lamp. The first curved surface includes the curved surface of the outline of the lamp neck 22 or the curved surface of both the outline of the lamp neck 22 and the outline of part of the heat sink 1. The second curved surface include the curved surface of the outline of the heat sink 1 or the curved surface of the outline of part of the heat sink 1.

In this embodiment, the outline of the lamp neck 22 is a smooth or approximately smooth curve and the outline of the heat sink 1 is a smooth or approximately smooth curve to avoid forming angles with possibility of cutting hands. On the other hand, this makes convection air flowing along the outside of the LED lamp smoother. In this embodiment, the radius of curvature of the outline of the lamp neck 22 is greater than the radius of curvature of the outline of the heat sink 1. It is noted that the phrase "the radius of curvature of the outline of the lamp neck 22 is greater than the radius of curvature of the outline of the heat sink 1" means that the radius of curvature of 60% of the outline of the lamp neck 22 being greater than the radius of curvature of 60% of the outline of the heat sink 1 can be deemed as the radius of curvature of the outline of the lamp neck 22 being greater than the radius of curvature of the outline of the heat sink 1.

As shown in FIG. 69, in this embodiment, a radius of curvature of the outline of the lamp neck 22 is 120 mm~3000 mm, preferably, 150 mm~200 mm, more preferably, 160 mm~190 mm, and the most preferably, 170 mm~185 mm. A radius of curvature of the outline of the heat sink 1 is 30 mm~150 mm, preferably, 70 mm~130 mm, more preferably, 80 mm~120 mm, and the most preferably, 90 mm~110 mm. Based on the abovementioned, if at least 60% of the radius of curvature falls in the range or curvature of a curve which is the most consistent with the outline can be deemed as the radius of curvature of the outline of the lamp neck 22 and the heat sink 1. For example, if a radius of curvature of at least 60% of the outline of the lamp neck 22 is 180 mm, then the radius of curvature of the lamp neck 22 can deemed as 180 mm. Based on the abovementioned, it can also be interpreted that a curve similar to an outline can represent curvature of the outline. That is, an outline itself may not be a curve. In some embodiments, considering overall width of the LED lamp, the outline of the lamp neck 22 and the outline of the heat sink 1 are separately related to overall width of the LED lamp. If width of the LED lamp (a size of the widest portion of the LED lamp) is L, then the radius of curvature of the outline of the lamp neck 22 is 0.6 L~15 L, preferably, 0.75 L~L, more preferably, 0.8 L~0.95 L, and the most preferably, 0.85 L~0.925 L; and the radius of curvature of the outline of the heat sink 1 is 0.15 L~0.75 L, preferably, 0.35 L~0.65 L, more preferably, 0.4 L~0.6 L, and the most preferably, 0.45 L~0.55 L. That is, both curvature of the outline of the lamp neck 22 and curvature of the outline of the heat sink 1 vary with change of overall width of the LED lamp. In some embodiments, if an outer diameter of the largest portion of the lamp neck 22 is R, then curvature of the outline of the heat sink 1 must be greater than L/2–R/2 to guarantee both the heat sink 1 having sufficient height and the chimney effect of the second heat dissipating channel 7b.

In this embodiment, a center angle c occupied by the outline of the lamp neck 22 is 10~50 degrees, preferably, 20~35 degrees, and more preferably, 25~30 degrees, to guarantee both the lamp neck 22 having sufficient height and the chimney effect of convection in the lamp neck 22.

In this embodiment, a center angle d occupied by the outline of the heat sink 1 is 40~120 degrees, preferably, 55~90 degrees, more preferably, 65~80 degrees, and the most preferably, 70~75 degrees, to control overall height of the heat sink 1.

Figure 70A:
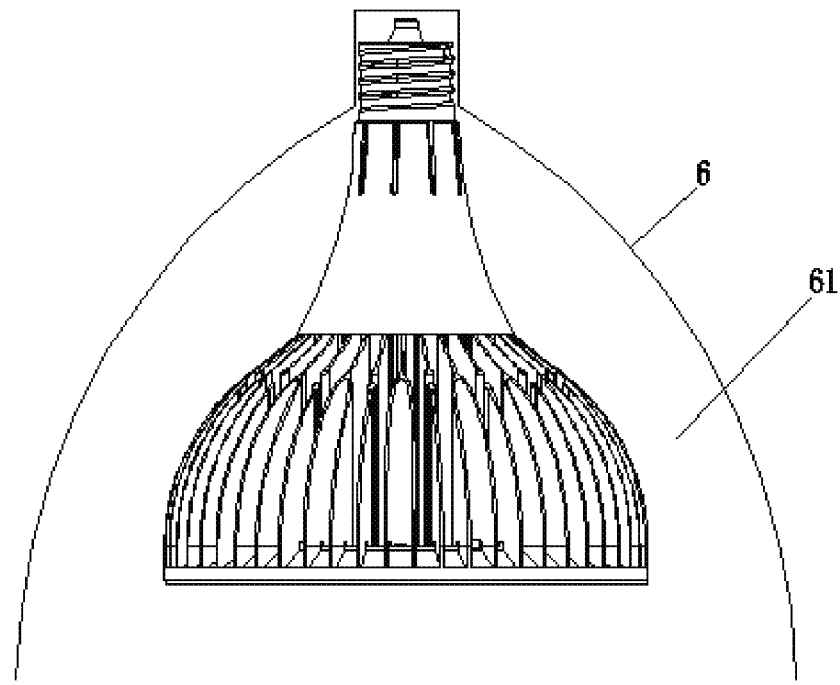
FIGS. 70A~70C are a schematic view of the combination of the LED lamp with a lampshade, according to some embodiments of the present invention.

As shown in FIG. 70A, which is a schematic view of the combination of the LED lamp and a lampshade of one embodiment. In this embodiment, the lampshade 6 has a receiving room 61 in which the LED lamp is accommodated. A lower portion of the receiving room 61 is open to allow the LED lamp to be installed into the receiving room 61 from the lower portion of the lampshade 6. After heat from the LED lamp is diffused to the receiving room 61, and then dissipated outward through the opening by air convection. In this embodiment, when heat of the LED lamp is being dissipated, part of heat is directly delivered to the lampshade 6 by thermal radiation and the lampshade 6 further delivers the heat to the outside. Another part of heat is delivered to air between the lampshade 6 and the LED lamp by conduction and convection, and then delivered to the outside of the lampshade 6 by convection, conduction or radiation.

Figure 70B:
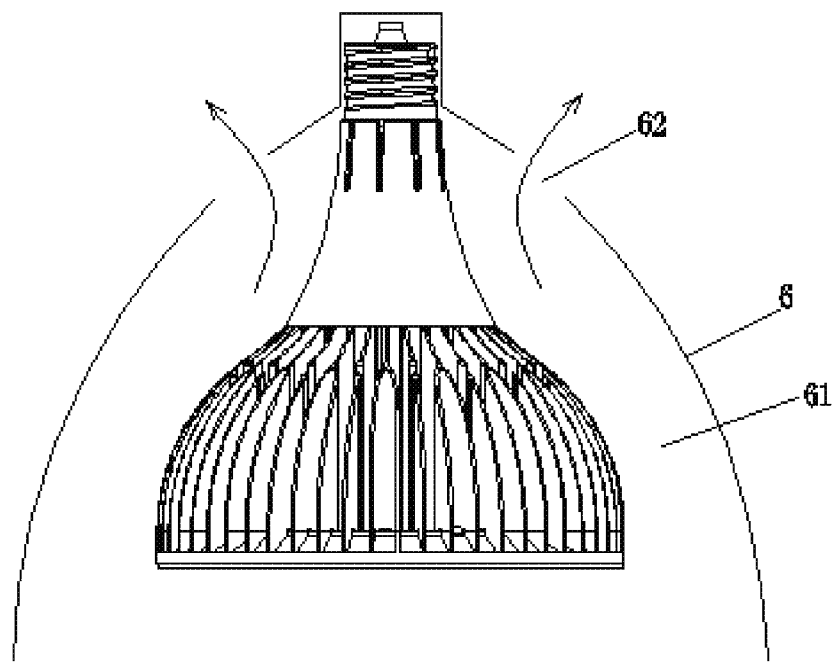

As shown in FIG. 70B, which is a schematic view of the combination of the LED lamp and an embodiment of a lampshade 6, in this embodiment, the lampshade 6 is formed with a convection hole 62 located at an upper portion thereof, such that when heat from the LED lamp is delivered to air in the receiving room 61, the air would flow upward to pass through the convection hole 62 to bring out the hot air.

Figure 70C:
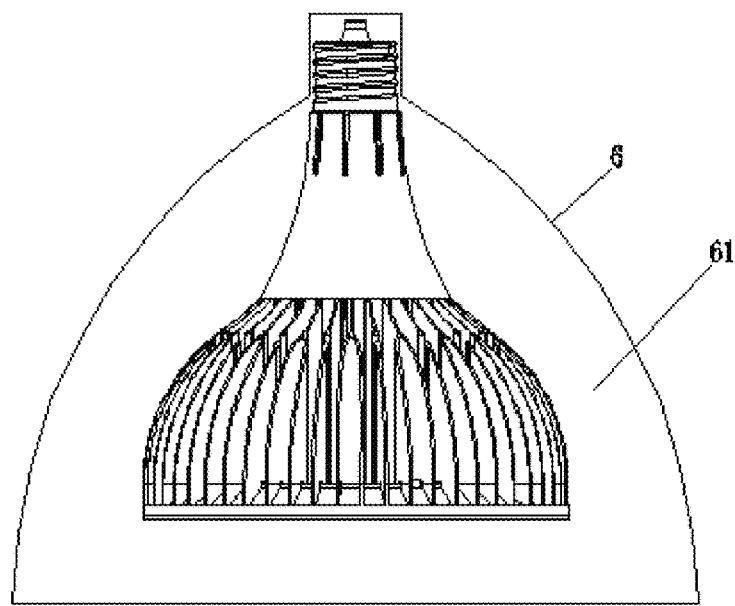

As shown in FIG. 70C, which is a schematic view of the combination of the LED lamp and an embodiment of a lampshade 6, in this embodiment, the lampshade 6 has a closed receiving room 61. After the LED lamp has been installed in the receiving room 61, because of isolation with the outside, it would have a dust-proof effect to prevent dust from accumulating inside or outside the LED lamp. After heat from the LED lamp is delivered to air in the receiving room 61, the air circles round in the receiving room 61, then is delivered to the lampshade 6, and finally delivered to the outside through the lampshade 6.

In this embodiment, the lampshade 6 may be made of a metal or plastic material. The former is advantageous to heat dissipation, and the latter would make weight and cost become light and low, respectively. Also, a plastic lampshade may be configured to be light-permeable. When the lampshade 6 is closed, for a better effect of heat dissipation, a metal material is preferred.

Figure 65A:
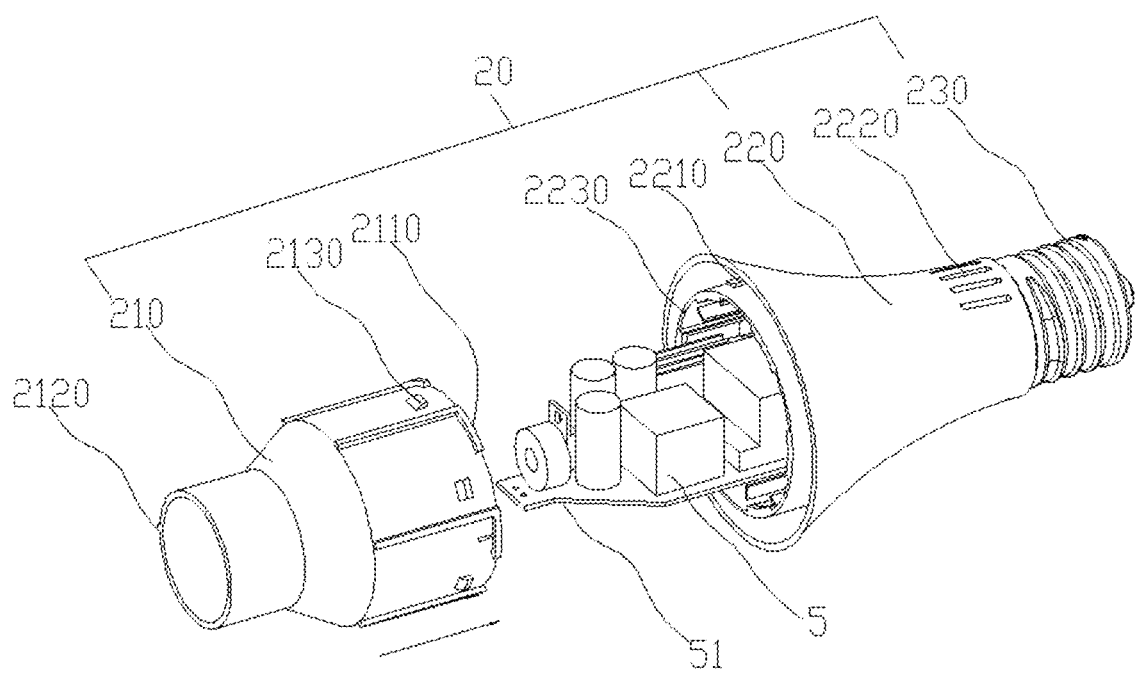
FIG. 65A is an exploded view of the lamp shell of the LED lamp of another embodiment.
Figure 65B:
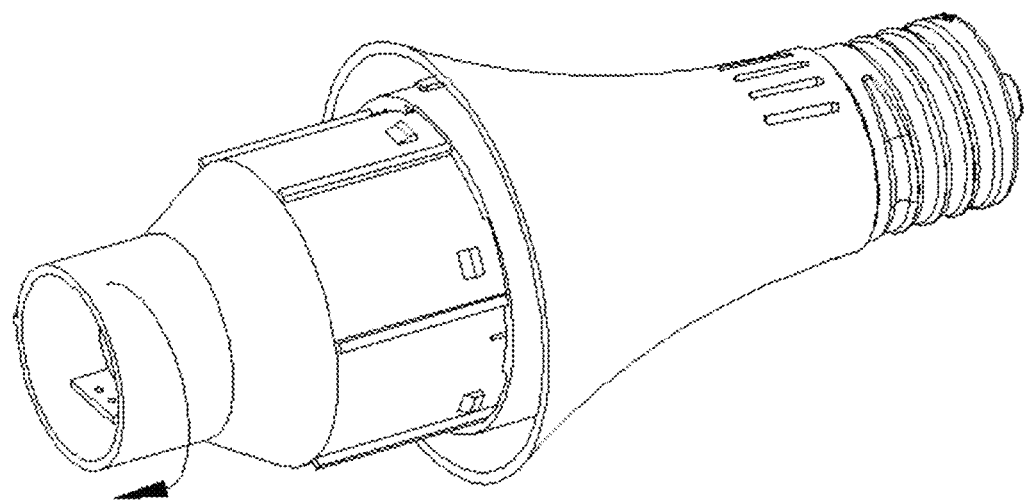
FIG. 65B is a schematic assembling view of FIG. 65A.
Figure 65C:
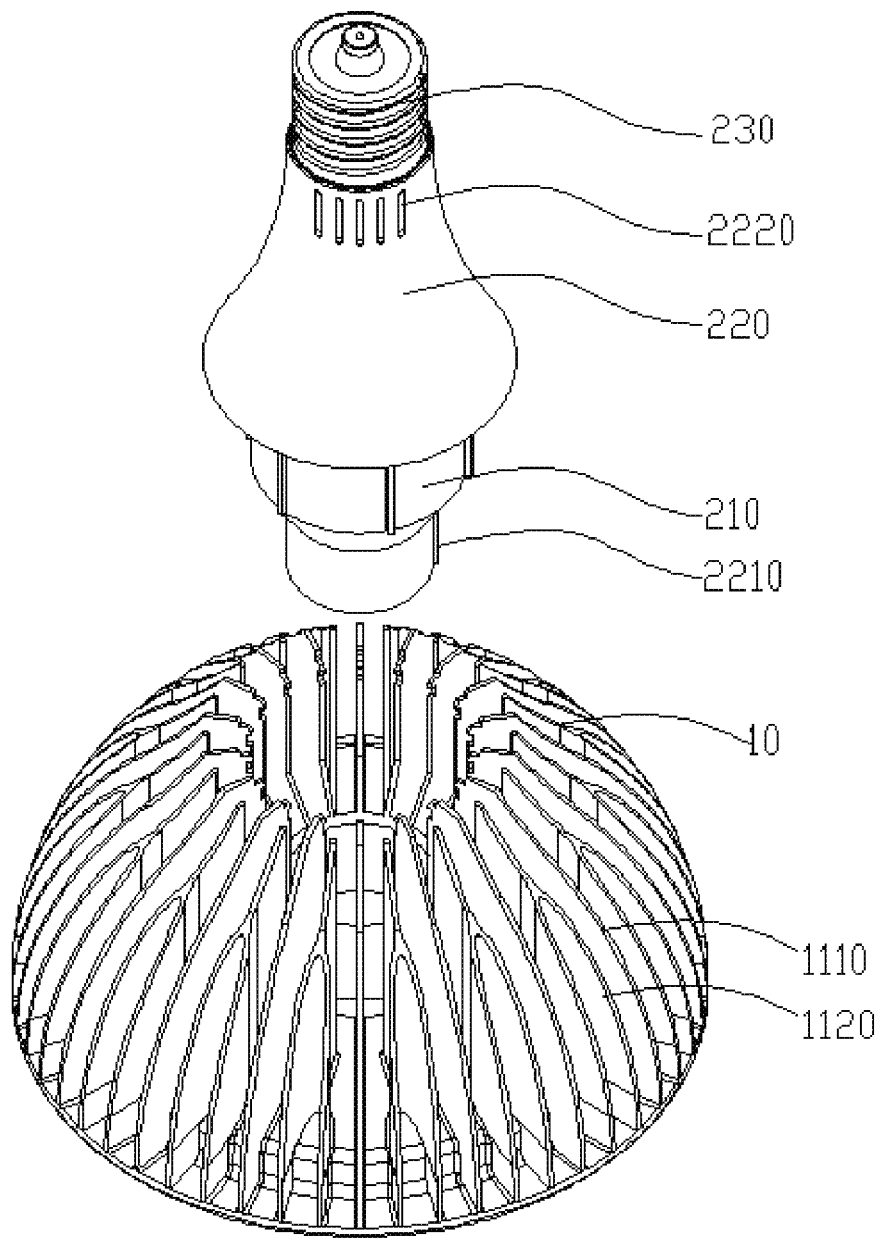
FIG. 65C~65D are exploded views of the LED lamp with the lamp shell of FIG. 65A.
Figure 65D:
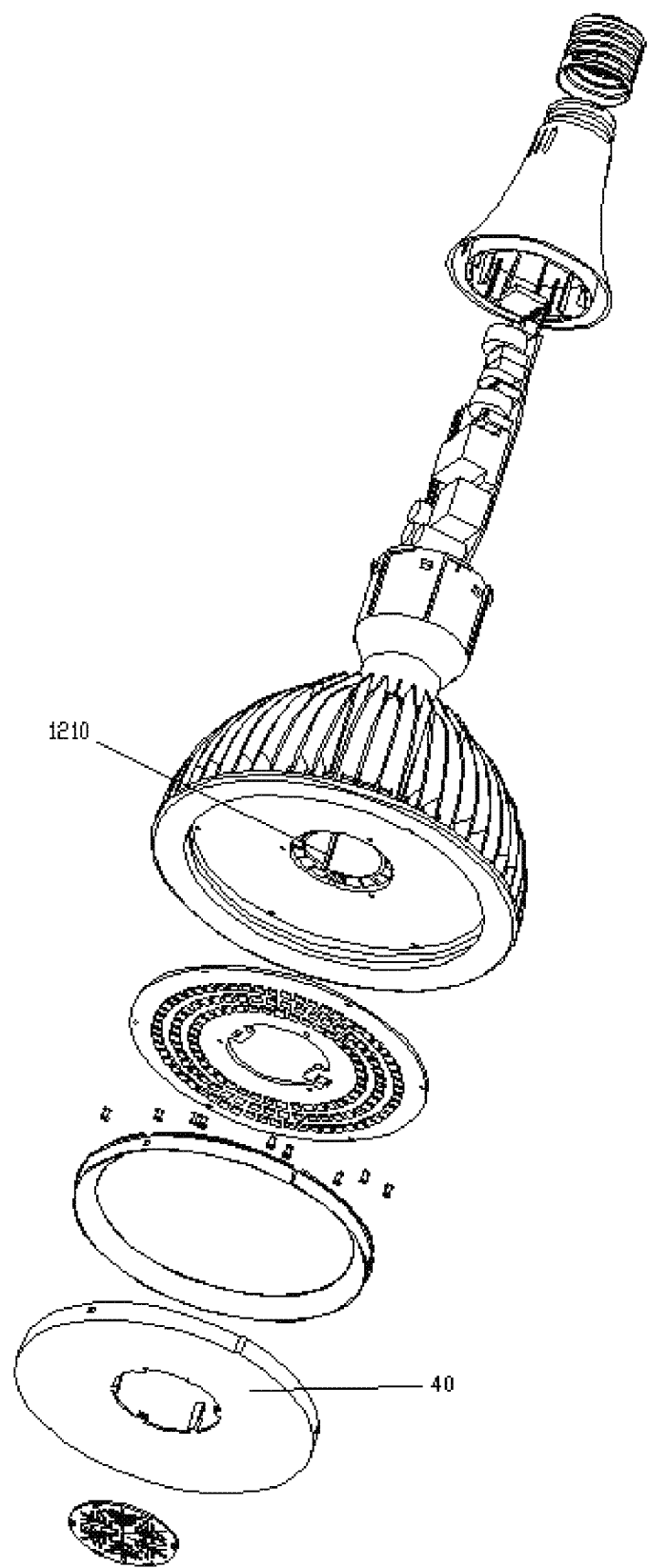
Figure 65E:
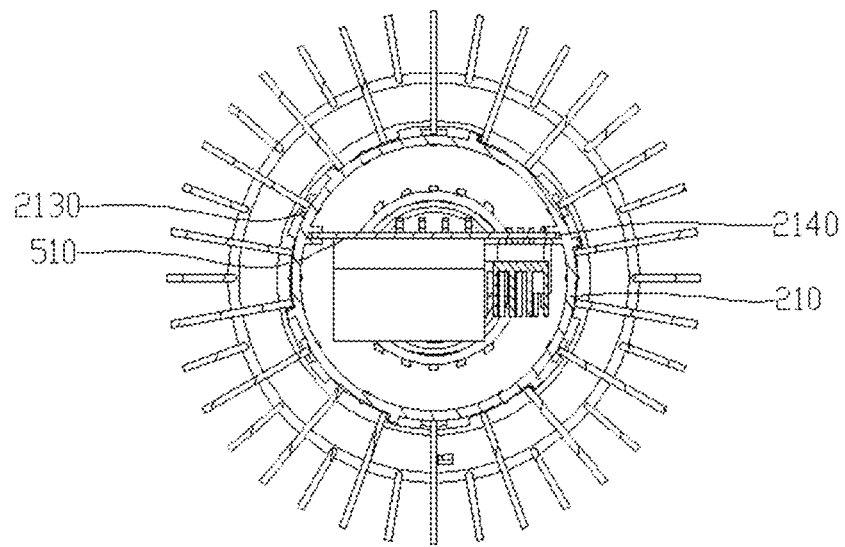
FIG. 65E is a cross-sectional view of the LED lamp with the lamp shell of FIG. 65A.

FIG. 65A is an exploded view of the lamp shell of the LED lamp of another embodiment with a different lamp shell 20. FIG. 65B is a schematic assembling view of FIG. 65A. FIG. 65C~65D are exploded views of the LED lamp. FIG. 65E is a cross-sectional view of the LED lamp of FIG. 65A. As shown in FIGS. 65A, 65B and 65C, in some embodiments, the lamp shell 20 includes a lamp head 230, a lamp neck 220 and a sleeve 210. The lamp head 230 is screwed with the lamp neck 220. The lamp neck 220 connects to the sleeve 210. The sleeve 210 connects to the heat sink 10. In detail, a circumferential edge of the lamp neck 220 is formed with a breach 2230. A protruding bar 2110 on the sleeve 210 corresponds to the breach 2230. The sleeve 210 is pushed toward the lamp neck 220 and then rotate the lamp neck 220 to fasten with the sleeve 210. The heat sink 10 is formed with a positioning trench 1210 located on an inner wall of a heat dissipating post 120. An engaging trough 2140 is formed on an inner wall of the sleeve 210. The power board 510 is embedded into the engaging trough 2140 to be secured. The number of the engaging trough 2140 depends on shapes of the power board 510. For example, when the power board 510 is of a two-dimensional shape, the number of the engaging trough 2140 is two. In addition, in another embodiment of the present invention, the engaging trough 2140 may be configured to be rib-like. Two parallel or perpendicular ribs formed on an edge of an inner wall of the sleeve 210 can fix the power board 510 in the sleeve 210, but limited to this. The power source 50 may further include other electronic components such as transformers, capacitors, resistors, inductors, fuses, MOSFETs, etc. When the power board 510 is inserted into the sleeve 210, the power source 50 would heat up. When heat-generating elements such as transformers, capacitors or MOSFETs are located near the bottom end of the sleeve in layout, i.e. in comparison with other electronic components, these heat-generating elements are relatively adjacent to the inlet of airflow channel of the heat sink 10. Because when these heat-generating elements are relatively adjacent to the bottom end of the heat sink 10, the path through which cool air flows to these heat-generating elements is the shortest, heat dissipation to the heat-generating elements can be effectively implemented to reduce temperature in the chamber of the lamp shell 20 and to improve working stability of the LED lamp. The sleeve 210 is disposed with a positioning bar 2120 corresponding to the positioning trench 1210 of the heat sink 10. The positioning bar 2120 is inserted into the positioning trench 1210, and the sleeve 210 is pushed toward the heat sink 10 to fasten the sleeve 210 to the heat sink 10.

As shown in FIGS. 65A~65E, when assembling the LED lamp, the lamp head 231 is screwed up with the lamp neck 220 first, then the power board 510 is inserted into the engaging trough 2140, the lamp neck 220 connects to the sleeve 210, the positioning bar 2120 is inserted into the positioning trench 1210 of the heat sink 10 to make the sleeve 210 pushed to the bottom of the central chamber of the heat sink 1, and finally, the light board 3 is fixed on the heat sink 1 by riveting to fasten the lamp cover 40 to the heat sink 10. When assembling, the invention adopts detachable engagement to simplify assembling and disassembling with guaranteeing connective strength, no part will be damaged when assembling and disassembling, all parts can be repeatedly used to solve the drawbacks of conventional screwing connection, including time consuming, high labor cost and high damage rate in assembling and disassembling parts.

As shown in FIG. 65C, the fins include first fins 1110 and second fins 1120. The first fins 1110 interlace with the second fins 1120 at regular intervals. Each second fin 1120 has a connecting notch 150 correspondingly engaging with a connecting bar 2130 of sleeve 210 to enhance connective strength between the sleeve 210 and the heat sink 10.

As shown in FIGS. 65C and 65B, the sleeve 210 is of a substantially hollow cylindrical shape. The inner chamber of the sleeve 210 is a channel formed by a wide upper portion and narrow lower portion (the lower portion of the sleeve 210 is less than the upper portion thereof in cross-sectional area). The ratio of height to width of the whole sleeve 210 is greater than 2.5 to make the chimney effect more effective, preferably, the ratio is 2.5~10. According to the standards of the most common A19, A20 and A67 bulb lamps, overall height H of the sleeve 210 may be 40~80 mm. Such a wide-lower-portion-and-narrow-upper-portion structure can enhance the chimney effect to promote air convection in the sleeve 210. A top end of the sleeve 210 is connected to a top flowing passage of the lamp neck 220. When heat in the sleeve 210 gathers to the top thereof, the heat would flow to the venting hole 2220 of the lamp neck 220 through the top flowing passage, and then be ejected from the lamp shell 20 to accomplish heat dissipation. The abovementioned specification of the sleeve 210 is merely an exemplar embodiment and cannot be limited to this.

The heat dissipating method of the LED lamp:

In this embodiment, the heat dissipating method of the LED lamp includes heat dissipation to both the LED chips 311 and the power source.

As shown in FIGS. 1, 4 and 6, the heat dissipating method for the LED chips 311 (heat from the working LED chips 311) includes the following steps:

S101: providing a light board 3 on which the LED chips 311 are mounted for conducting at least part of heat from the LED chips 311 to the light board 3 by thermal conduction; and S102: providing a heat sink 1 on which the light board 3 is mounted for conducting at least part of heat from the LED chips 311 to the heat sink 1 through the light board 3 by thermal conduction and radiating the heated air from the heat sink 1 to the outside by convection;

The step S102 further includes:

a) The heat sink 1 is provided with fins 11. The heat sink 1 includes a second heat dissipating channel 7b with a second air inlet 1301. Convection air flows into the second air inlet 1301 to enter spaces between the fins 11 to bring out heat radiated from the fins 11 to air. The second air inlet 1301 is located in the lower portion of the heat sink 1.

b) The heat sink 1 is provided with a third heat dissipating channel 7c formed between adjacent two of the fins 11 or between two sheets extending from a single fin 22. A radially outer portion between two fins 11 forms an intake of the third heat dissipating channel 7c. Air flows into the third heat dissipating channel 7c through the radially outer portion of the LED lamp to bring out heat radiated from the fins 11 to air.

As shown in FIG. 21, in this embodiment, at least one fin 11 is divided into two portions in a radial direction of the LED lamp, and the two portions are arranged at an interval in a radial direction of the LED lamp so as to form a passage. When the LED lamp is working, convection air may perform thermal convection in the interval to improve efficiency of convection.

When heat dissipation is performed to the LED chips 311, preferably, 20~30 square mm of heat dissipating area of the heat sink per watt of the LED lamp is configured to obtain a balance between an effect of heat dissipation to the LED chips 311 and both volume and weight of the heat sink 1. This can control both volume and weight of the heat sink 1 under guaranteeing an effect of heat dissipation. In this embodiment, to make the lampshade have more area for heat dissipation, weight of the heat sink 1 is set to occupy above 50% of overall weight of the LED lamp, preferably, 55%~65%; and volume of the heat sink 1 is set to occupy above 20% of overall volume of the LED lamp, preferably, 25%~50%.

As shown in FIG. 40, when heat from the LED chips 311 is being dissipated, a projection (projected onto the plane on which the LED chips 311 are mounted) of at least part of fins 11 in the height direction (axial direction) is in contact with at least one LED chip 311. That is, in the height direction (axial direction), a projection of at least part of the fins 11 is superposed or overlapped with at least one LED chip 311. Thus, a heat conducting path of the LED chips 311 can be shortened to reduce thermal resistance and to be advantageous to thermal conduction. Preferably, a projection (projected onto the plane on which the LED chips 311 are mounted) of any fin 11 in the height direction (axial direction) is in contact with at least one LED chip 311.

As shown in FIGS. 1 and 29, when heat from the LED chips 311 is being dissipated, the light board 3 has an inner border 3002 and an outer border 3003. Both the inner border 3002 and the outer border 3003 extend upward along the axial direction of the LED lamp to form a region. Area of part of the fins 11 inside the region is greater than area of another part of the fins 11 outside the region. As a result, most of the fins 11 correspond to the light board 3 to enhance utilization rate of the fins 11 and increase effective heat conducting area of the fins 11 for the LED chips 311.

As shown in FIG. 4, the method for dissipating heat of the working power source includes the following steps:

S201: providing a lamp shell 2 having a first heat dissipating channel 7a in which the power source 5 is disposed, wherein the first heat dissipating channel 7a has a first air inlet 2201 and a venting hole 222; and S202: convection air flowing into the first heat dissipating channel 7a through the first air inlet 2201, wherein heat from the power source 5 is radiated to surrounding air, and heated air is ejected from the venting hole 222 by convection to prevent the power source 5 from working in high temperature environment.

As shown in FIG. 22, at least one heat-generating element 501 (a resistor, an inductor, a transformer or a rectifier) is arranged at a position in the first heat dissipating channel 7a near the lamp head 23. In a projection of in a direction perpendicular to the axis of the LED lamp, heat from at least one heat-generating element 501 is delivered to the lamp head 23 by thermal conduction or thermal radiation and the heat of the lamp head 23 is dissipated to air or the socket connected thereto.

In other embodiments, at least one heat-generating element 501 is in thermal contact with the lamp head 23, at least one heat-generating element 501 is located in the lamp head 23, the heat-generating element 501 is in contact with the lamp head 23 through a thermal conductor 53, and the heat-generating element 501 is fastened to the lamp head 23 through the thermal conductor 53. As a result, the thermal conductor 53 can not only conduct heat to the lamp head 23, but also fasten the heat-generating element to prevent the heat-generating element from loosening.

As for design of heat dissipation of the power source 5, a position of at least one heat-generating element in the axial direction of the LED lamp is higher than a position of the venting hole 222. Most heat from the heat-generating element 501 higher than the venting hole 222 is dissipated through the lamp head or other ways.

In addition, at least one heat-generating element and other heat-generating elements are mounted on different sides of the power board 51 so as to make convection air bring out heat from the heat-generating elements to surrounding air along these two sides.

The assembling method of the LED lamp is described as follows.

As shown in FIG. 2, in an embodiment, the method includes the following steps:

S301: providing a light board 3 on which the LED chips 311 are mounted;

S302: providing the heat sink 1;

S303: providing the power source 5;

S304: providing the lamp shell 2;

S305: installing the power source 5 in the lamp shell 2;

S306: installing the lamp shell 2 on the heat sink 1 and electrically connecting the power source 5 with the light board 3; and S307: providing a lamp cover 4 and fastening the lamp cover 4 on the heat sink 4 to cover the light board 3.

The order of the above steps can be adjusted according to actual requirements. After the step S304, the light board 3 is attached on the heat sink 1 to form an integrated body.

In the step S304, providing the lamp shell 2, the lamp head 23 and the lamp neck 22 are provided with corresponding threads to allow the lamp head 23 to screw with the lamp neck 22 to implement connection.

In the step S307, the sleeve 21 of the lamp shell 2 is detachably engaged with the heat sink 1. Here, after the lamp shell 2 has been assembled, the sleeve 21 with the lamp shell 2 as a whole connects to the heat sink 1. In an embodiment of the present invention, the sleeve 21 is connected to the heat sink 1 first, and then the other elements of the lamp shell 2 are fixed to the sleeve 21, i.e. the lamp neck 22 is connected to the sleeve 21.

As shown in FIGS. 31 and 60, the heat sink 1 has a center hole and the sleeve is formed with a block 217 on a surface thereof. The block 217 has a first limiting side 2171 disposed and corresponding to an edge of outer surface of the sleeve 21. A distance between two fins 11 in a radially inner portion is greater than a width of the block 217. When the sleeve 21 in inserted into the center hole of the heat sink 1, the block 217 aligns with an interval between two fins 11 to be inserted into the heat sink 1 until the first limiting side 2171 exceeds the bottom of the fins 11 in the axial direction of the LED lamp. At this time, rotate the sleeve 21 to make the first limiting side 2171 abut against the bottom of the fins 11. In addition, the sleeve 21 may have a second limiting side 218. When the first limiting side 2171 abuts against the bottom of the fins 11, the second limiting side 218 abuts against the top of the fins 11. As a result, the sleeve 21 is connected to the heat sink 1 without any other external elements such as screws. When disassembling, reverse the above steps.

Preferably, the sleeve 21 is provided with a third limiting side 2172 at a side of the block 217 in a circumferential direction for limiting rotation of the fins 11. When the sleeve 21 is installed to the heat sink 1, the block 217 aligns with an interval between two fins 11 to be inserted into the heat sink 1 until the first limiting side 2171 exceeds the bottom of the fins 11 in the axial direction of the LED lamp. At this time, rotate the sleeve 21 to make the first limiting side 2171 abut against the bottom of the fins 11 and keep rotating until a lateral side of the fins 11 abuts against the third limiting side 2172 to avoid over-rotation which causes dislocation between the first limiting side 2171 and the fins 11.

As shown in FIGS. 59A~59B and 60, the sleeve 21 has a first positioning unit 211 and the lamp neck 22 has a second positioning unit 221. The first positioning unit 211 engages with the second positioning unit 221. In detail, the first positioning unit 211 is an engaging portion on the sleeve 21 and the second positioning unit 221 is a latch on the lamp neck 22.

As shown in FIGS. 31~33, in the step S308, the lamp cover 4 is provided with a latch 46 and the heat sink 1 is provided with a hole corresponding thereto. The lamp cover 4 is fastened to a back 134 of the base 13 of heat sink 1 by inserting the latch 46 into the hole.

Figure 71:
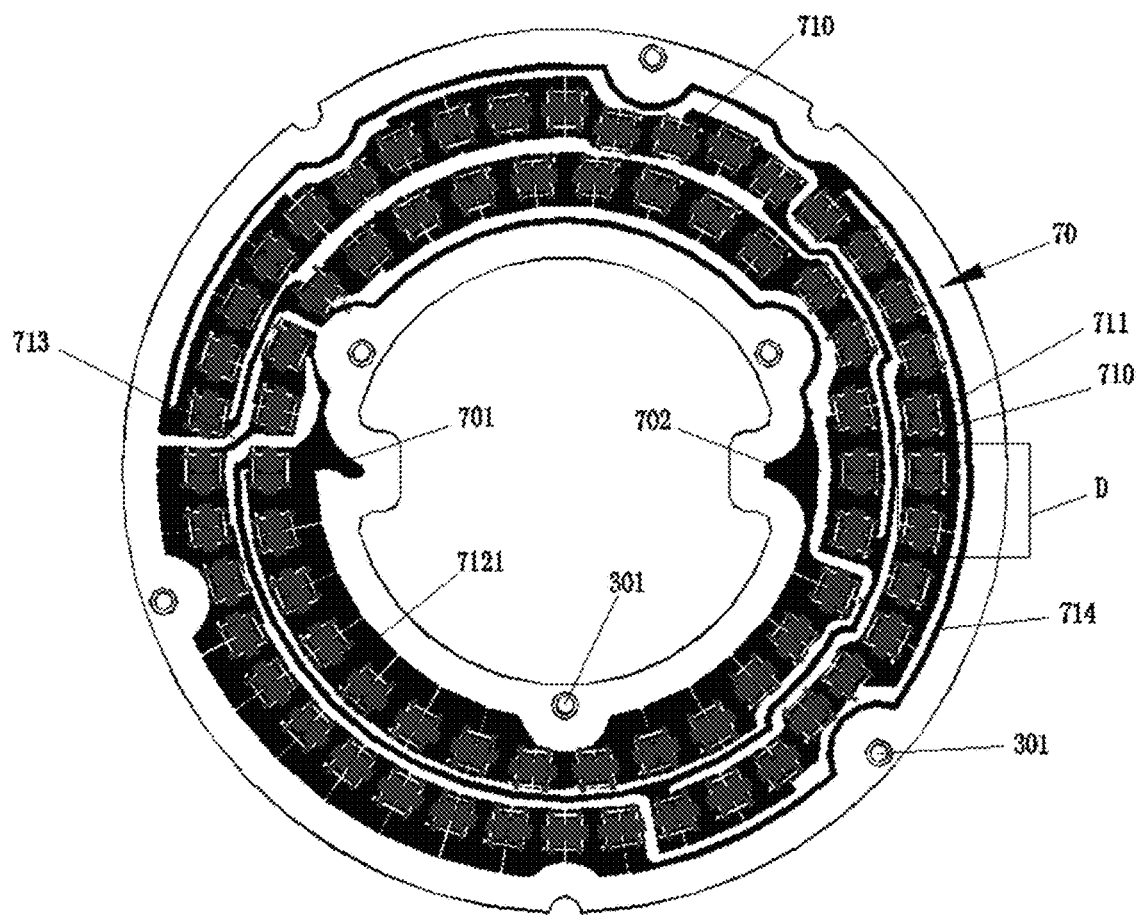
FIG. 71 is a layout diagram of the LED module, according to an embodiment of the present invention.
Figure 72:
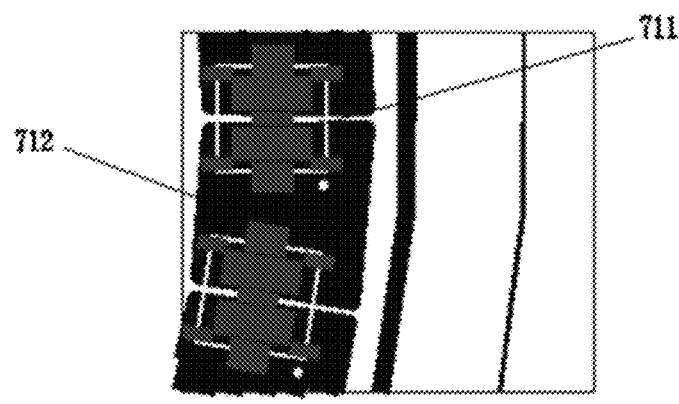
FIG. 72 is an enlarged view of portion D in FIG. 71.
Figure 73:
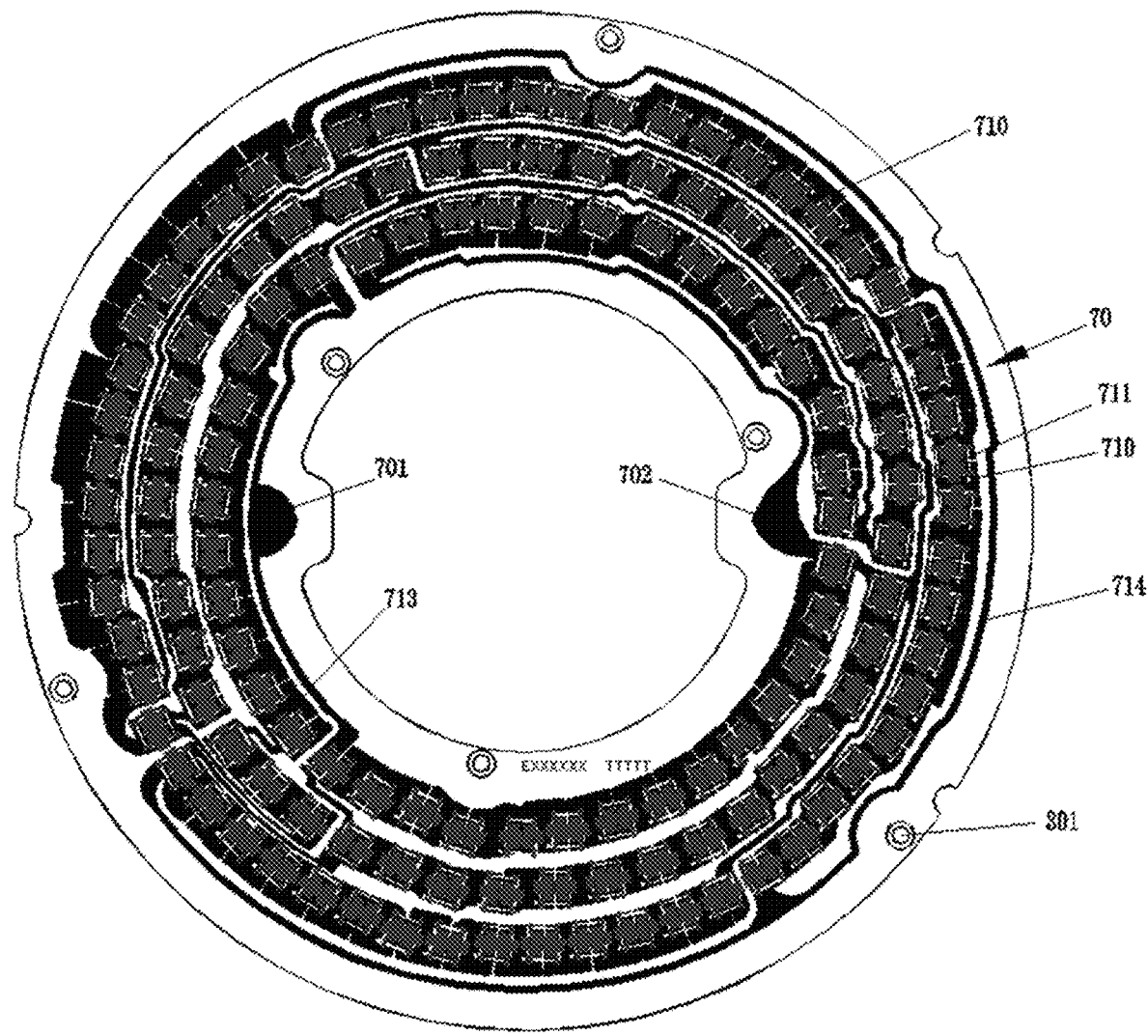
FIG. 73 is an enlarged view of the LED module of another embodiment.

FIG. 71 is a layout diagram of the LED module of an embodiment. FIG. 72 is an enlarged view of portion D in FIG. 71. FIG. 73 is an enlarged view of the LED module of another embodiment. The LED modules shown in both FIGS. 71 and 72 may be applied to the LED lamp of FIG. 1. As shown in FIGS. 71~73, the LED module 70 includes at least one LED unit 710. The LED units 710 are two or more in number and electrically connected in parallel. Each LED unit 710 includes at least one LED 711. When an LED unit 710 includes multiple LEDs 711, the LEDs 711 in the same LED unit 710 are electrically connected in series. A positive terminal of the first LED 711 is coupled to a positive terminal of the LED unit 710. A negative terminal of the first LED 711 is coupled to next or a second LED 711. A positive terminal of the last LED 711 is coupled to a negative terminal of a former LED 711. A negative terminal of the last LED 711 is coupled to a negative terminal of the LED unit 710.

As shown in FIG. 71, in some embodiments, the LED module 70 includes five LED units 710. As shown in the figure, the LED module 70 are distributed on two circumferences, i.e. an inner circumference and an outer circumference. The inner circumference is disposed with two complete LED units 710, and the outer circumference is disposed with two complete LED units 710, too. As for the fifth LED unit 710, most LEDs 611 thereof are located on the outer circumference and a few thereof are located on the inner circumference. That is, the LEDs 711 of the fifth LED unit 710 on the inner circumference is less than the LEDs 711 on the outer circumference.

As shown in FIG. 73, in some embodiments, the LED module 70 includes ten LED units 710. In the shown embodiment as an example, the LED module 70 is distributed on three circles, i.e. an inner circle, a middle circle and an outer circle. There are two, four and three complete LED units 710 on the inner circle, the outer circle and the middle circle, respectively. Most of the tenth LED unit 710 is mounted on the inner circle, and a few of the tenth LED unit 710 is mounted on the outer circle. That is, the LEDs 711 of the tenth LED unit 710 on the inner circle are greater than the LEDs 711 of the tenth LED unit 710 on the outer circle in number.

Preferably, the number of the LEDs 711 of the LED unit 710 is 10~20, more preferably, 12~16.

As shown in FIGS. 71, 72 and 73, the LEDs 711 are mounted on the light board 3 along a circumferential direction of the light board 3. When the LEDs 711 of the same LED unit 710 are on the same circle, all LEDs 711 are connected by a first wire 712. That is, connecting in series of the LEDs 711 on the same circle is implemented by the first wire 712. If the LEDs 711 of the same LED unit 710 are divided into two groups, one group is located on a circle and the other group is located on another circle, then the LEDs 711 of the same LED unit 710 on the same circle are connected by the first wire 712, and the LEDs 711 of the same LED unit 710 on another circle are connected by a second wire 713. The second wire 713 is less than the first wire in width to provide a better layout for the LEDs 711. If width of the second wire 713 is excessively wide, then pitch of the LEDs 711 on the corresponding circle would be affected to become larger than the others.

As shown in FIGS. 71, 72 and 73, width of the first wire 712 is at least greater than width of the LEDs 711 (LED chips 311). The first wire 712 adopts a metal material with great thermal conductivity to be advantageous to heat dissipation of the LEDs 711 (LED chips 311). Because width of the first wire 712 is at least greater than width of the LEDs 711 (LED chips 311), it is more advantageous to installation of the LEDs 711 and forming electrical connection with the first wire.

As shown in FIGS. 71, 72 and 73, the LEDs 711 are distributed on different circles on the light board. That is, there are at least two circles for mounting LEDs 711. The two circles are approximately concentric. The LEDs 711 on the innermost or the outermost circle are connected in series by the first wire 712. At least part of the first wire 712 connecting the LEDs 711 on the innermost or the outermost circle is greater than the other part thereof in width. Because no LED 711 is mounted outside the outermost circle or inside the innermost circle, width of the first wire 712 connecting the LEDs 711 on the innermost or the outermost circle has no limit. Thus, the first wire 712 connecting the LEDs 711 on the innermost or the outermost circle may be provided with an extension portion 7121 on a radial outside or inside to increase its width and area. This is advantageous to be heat dissipation. FIG. 73 as an example, it has three circles for mounting the LEDs 711, wherein width of the first wire 712 on the innermost or outermost circle is greater than width of the first wire 712 on the middle circle.

As shown in FIGS. 71 and 72, the light board 3 is provided with fixing holes 301. The light board 3 is fastened onto the base 13 by inserting screws or rivets into the fixing holes 301. The fixing holes occupy some area, so parts of the first wire 712 corresponding to the fixing holes 712 must detour around the fixing holes 301. And width of these detouring parts of the first wire 712 is less than width of the first wire 712 with the extension portion 7121 so as to reduce extent of detour of the first wire 712.

As shown in FIGS. 71 and 72, in a direction perpendicular to the light board 3, area of a single LED 711 is M1, and area of part of the first wire 712 encompassed by a projection of a single LED 711 projected onto the light board 3 is M2, which satisfies the following relationship: M2:M1=1: (0.85~0.96), preferably, M2:M1=1:(0.9~0.96), so as to make the LEDs 711 be able to correspond to more area of the first wire 711 for heat dissipation.

As shown in FIGS. 71 and 72, different LED units 710 are coupled by a third wire 714. The third wire 714 connects positive electrodes of the first LEDs 711 of two different LED units 710 or the third wire 714 connects negative electrodes of the last LEDs 711 of two different LED units 710. The third wire 714 is less than the first wire 712 in width.

As shown in FIGS. 71 and 72, the LED module 70 includes two electrode terminals such as the positive terminal 701 and the negative terminal 702. Both the positive terminal 701 and the negative terminal 702 are located radially inside all of the LEDs 711, the first wire 712, the second wire 713 and the third wire 714. In other embodiments, alternatively, both the positive terminal 701 and the negative terminal 702 are located radially outside all of the LEDs 711, the first wire 712, the second wire 713 and the third wire 714. Both the positive terminal 701 and the negative terminal 702 are used to connect with the power source 5. In addition, both the positive terminal 701 and the negative terminal 702 have different shapes for distinction.

As shown in FIGS. 74 to 82, the present disclosure provides a power supply module for LED lamp. The power supply module includes input ends (ACN, ACL) for receiving AC driving signal; a first rectifying circuit 100 for converting the AC driving signal into rectified signal; a filtering 200 for converting the rectified signal into filtered signal; a power converter 400 for converting the filtered signals into power signal which is capable of lighting up an LED light source 500; and a bias generating circuit 600 electrically connected to the input ends (ACN, ACL) and the power converter 400 for performing buck-conversion to the AC driving signal to generate a working voltage of the power converter 400.

In the power supply module of certain embodiments, the bias generating circuit 600 performs buck-conversion to the AC driving signal and converts the AC driving signal into a working voltage of the power converter 400. The working voltage is provided to the power converter 400 so that the power converter 400 can drive the LED light source 500 to emit light. It can be seen that, by utilizing the bias generating circuit 600 to perform active power conversion to externally input AC driving signal, to the working voltage can be generated rapidly generate the so as to effectively improve starting speed of an LED lamp.

When using the power supply module as shown in FIGS. 75 to 82, starting speed of HID-LED can be reduced to be about 60 ms, which possesses a very high value of application and very great experience of using.

The power supply module can be applied to high power LED lamps. Output power of the power converter 400 may be above 30 W. As shown in FIG. 2, the input ends (ACN ACL) may be two ends of the power supply module: a first end ACL and a second end ACN. The AC driving signal is input through the two ends. The AC driving signal may be AC signal of 220V or any other voltage values. Of course, the input ends (ACN, ACL) may have more than two ends, for example, four ends. It is not limited as long as AC power can be input.

Figure 76:
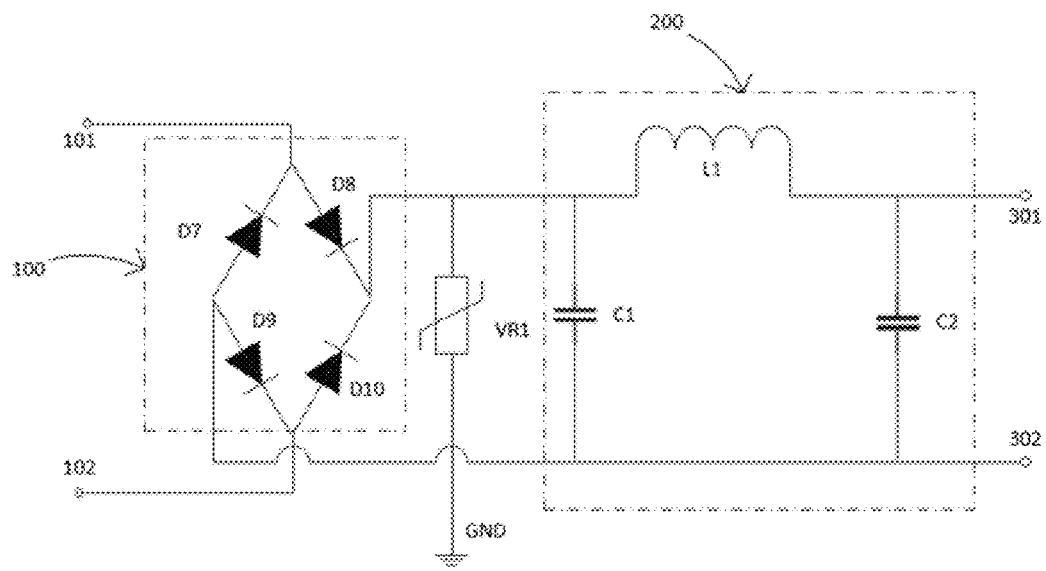
FIG. 76 is a circuit diagram of a rectifier and a filter of an embodiment of the invention.

In this embodiment, the first rectifying circuit 100 may be a bridge rectifier. As shown in FIG. 76, which is a circuit diagram of a rectifying circuit and a filtering circuit of an embodiment of the invention, the first rectifying circuit 100 includes diodes D7, D8, D9 and D10. The first rectifying circuit 100 performs full wave rectification to the AC driving signal to generate DC driving signal (DC power).

In detail, as shown in FIG. 76, anodes of diodes D7, D9 are electrically connected to a first end of the filtering circuit 200, cathodes of diodes D7, D9 are electrically connected to anodes of diodes D8, D10, and cathodes of diodes D8, D10 are electrically connected to a second end of the filtering circuit 200. Contacts of diodes D7 and D8 are electrically connected to the first end ACL. A cathode of diode D8 is electrically connected to a cathode of diode D10. Contacts of diodes D9 and D10 are electrically connected to the second end ACN.

In addition, the first rectifying circuit 100 may also be any other types of full wave rectifier or half wave rectifier, which can also accomplish the desired function.

In this embodiment, the filtering circuit 200 includes capacitors C1, C2 and an inductor L1. First ends of both capacitor C1 and inductor L1 serve as the second end of the filtering circuit 200 to electrically connect with cathodes of diodes D8 and D10. The second end of inductor L1 is electrically connected to the first end of capacitor C1. The second ends of capacitors C1 and C2 serve as the first end of the filtering circuit 200 to electrically connect with anodes of diodes D7 and D9. The filtering circuit 200 receives the DC power (the rectified signal) rectified by the first rectifying circuit 100 and filters high frequency components of the DC power. The DC power filtered by the filtering circuit 200 is a relatively flat DC waveform. The filtered signal is sent to a post-stage circuit through connecting ends 301 and 302.

In some embodiments, the filtering circuit 200 may include only capacitor C1 to implement filtration without affecting the desired function of the invention.

An electro-magnetic interference (EMI) reduction circuit 900 may be disposed between the input ends (ACN, ACL) and the rectifying circuit 100. The EMI reduction circuit 900 can reduce influence to the driving signal from an interference magnetic field. In the EMI reduction circuit 900, a power line (including a main line and/or a branch of the main line) electrically connected to two ends of the input ends ACN, ACL is electrically connected with an excitation coil LF2 connecting a resistor branch (e.g. a branch at which resistor R1 is located) and capacitor branches (e.g. branches at which capacitors CX1, CX2, CX3 are located), and separately electrically connecting inductor Li1, Li2 at two branches.

Of course, the EMI reduction circuit 900 may adopt an EMI filter having multiple filtering elements. In detail, the EMI filter has differential mode capacitors, common mode inductors, and common mode capacitors.

In this embodiment, the power converter 400 converts the filtered signal into an electrical signal which is capable of lighting up the LED light source 500. The power converter 400 may change voltage level of the filtered signal to generate DC driving signal with target voltage value. The power converter 400 has an output end for outputting DC driving signal with target voltage values.

In addition, the branch electrically connected to the input ends ACN, ACL may further be connected with a fuse F1 in series. The fuse F1 may be a current fuse or a temperature fuse.

Figure 74:
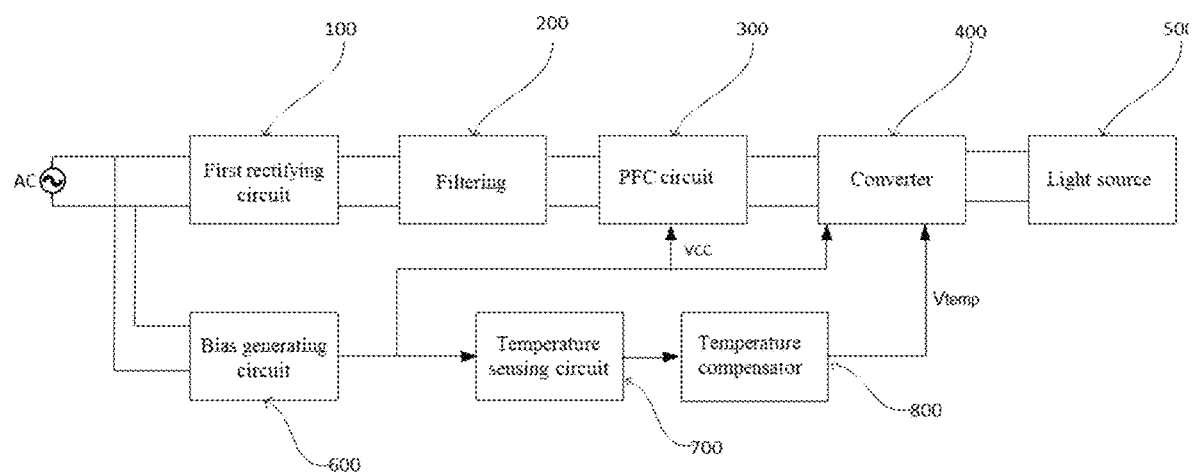
FIG. 74 is a block diagram of the power module of an embodiment of the invention.
Figure 78:
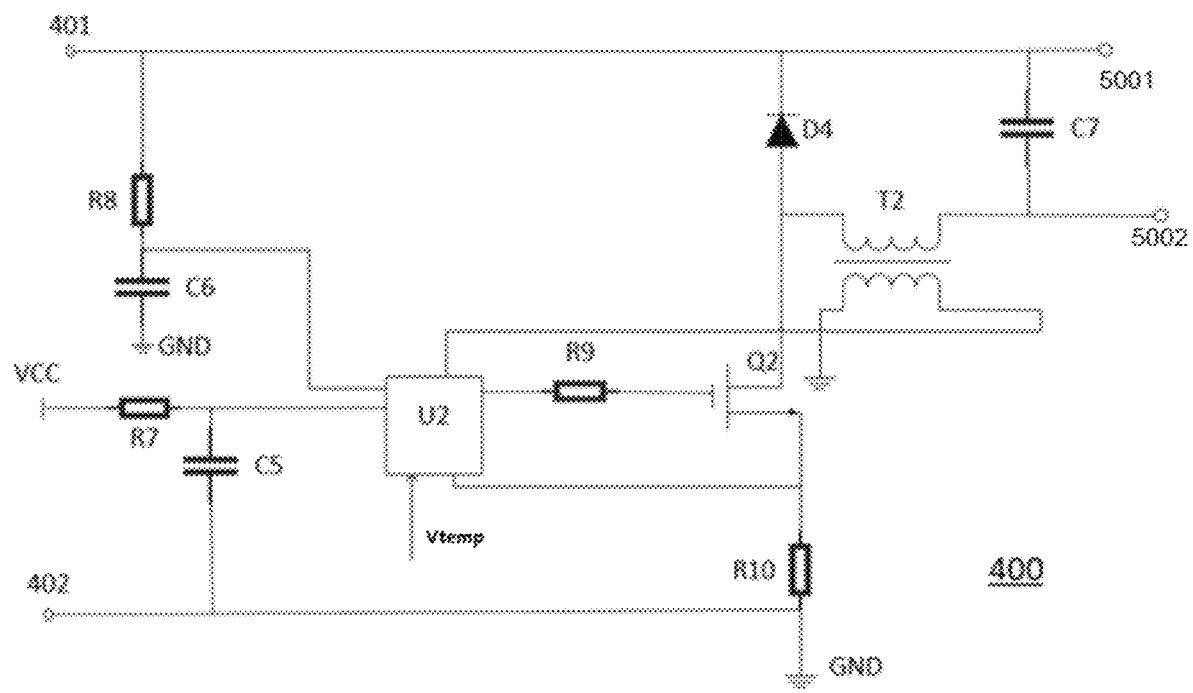
FIG. 78 is a circuit diagram of a power converter of an embodiment of the invention.

FIG. 78 is a circuit diagram of a power converter of an embodiment of the invention. As shown in FIGS. 74 and 78, the power converter 400 receives signal from a pre-stage circuit through the connecting end 401, 402, and the power signal are provided to a post-stage through the connecting ends 5001, 5002. The power converter 400 may adopt a PWM (Pulse Width Modulation) circuit, which controls pulse width to output target signal. In detail, the power converter 400 includes a controller U2, a power switch Q2, a transformer T2 and a diode D10. Controller U2, power switch Q2, diode D10 and an energy storage coil (a coil of the transformer T2, which is electrically connected between the power switch Q2 and the connecting end 5002) cooperate to output power signal (DC driving signal) with required voltage and/or current. The controller U2 is activated by a working voltage VCC provided by the bias generating circuit 600 to output PWM control signal to control switching of the power switch Q2, so that the energy storage coil repeatedly charge and discharge in response to the switching state of power switch and the continuity of the current can be maintained through diode D4 (which is operated as a flyback diode), and thus generate the required power signal between the connecting ends 5001, 5002.

Power switch Q2 may be a MOSFET. A first end (power end) of controller U2 electrically connects to an output end of the bias generating circuit 600. A second end of controller U2 electrically connects to an end of transformer T2. An end of the energy storage coil of transformer T2 electrically connects to a negative end (i.e. connecting end 5002) of the DC output ends and the other end thereof electrically connects to an anode of diode D4. An anode of diode D4 electrically connects to a positive end (i.e. the connecting end 5001) of the DC output ends. An end of the induction coil of transformer T2 electrically connects to a second end of controller U2 and the other end of the induction coil is grounded. A third end of controller U2 electrically connects to a control end of power switch Q2 through resistor R9. A first end of power switch Q2 electrically connects to a connecting point between diode D4 and transformer T2, and a second end of power switch Q2 connects to a fourth end of controller U2. Power converter 400 may be further provided with a sampling circuit to sample its working status and serve as a reference of output signal of the controller U2.

For example, the sampling circuit includes resistors R8, R10, capacitor C6 and an induction coil of the transformer T2. The controller U2 may sample voltage of the main line from resistor R8 and capacitor C6 through its first end, sample output current from the induction coil through its second end and sample current flowing through the power switch Q2 from an end of resistor R10 through its fourth end. Configuration of the sampling circuit is related to the control manner of the controller U2, the invention is not limited to this embodiment.

In this embodiment, at least one end of the switch controller U3 electrically connects to a branch at which inductor L2 is located. A filtering element and/or current stabilizer may be added between the switch controller and the inductor. The present invention is not limited thereto.

To reduce both influence resulting from harmonic to circuit properties and conversion loss, a power factor correction (PFC) circuit 300 may be disposed between the power converter 400 and filtering circuit 200. The PFC circuit 300 can increase power factors of the filtered signal by adjusting signal properties (e.g. phase, level or frequency) of the filtered signal. PFC circuit 300 electrically connects to an output end of bias generating circuit 600. In detail, PFC circuit 300 may be an active PFC circuit.

Figure 77:
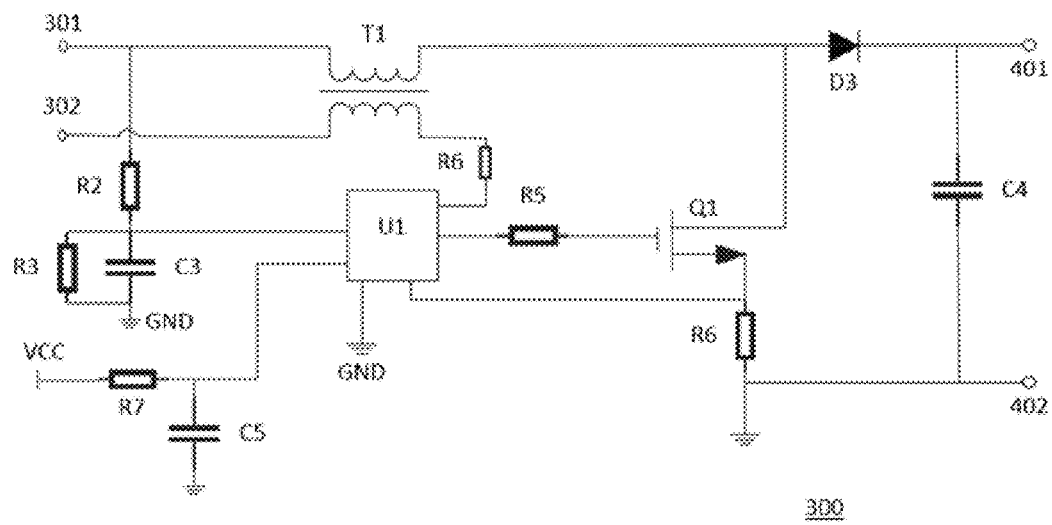
FIG. 77 is a circuit diagram of a PFC of an embodiment of the invention.

FIG. 77 is a circuit diagram of a PFC circuit of an embodiment of the invention. As shown in FIG. 77, PFC circuit 300 receives signal from the filtering circuit 300 through the connecting ends 301, 302 and sends corrected signal to the post-stage power converter 400 through connecting ends 401, 402. PFC circuit 300 includes a controller U1, a power switch Q1 electrically connected to controller U1, a transformer T1 and a diode D3. Power switch Q1 may be a MOSFET. A first end (power end) of the controller U1 electrically connects to an output end 607 of bias generating circuit 600. A second end of controller U1 electrically connects to an end of transformer T1. A coil of transformer T1 electrically connects to a main branch in series. The other end of the coil electrically connected to a second end of controller U1 is grounded. A positive end (also called connecting end 5001) of the DC output ends electrically connects to the main branch. Diode D3 is electrically connected in the branch in series. An anode of diode D3 electrically connects to both an end of transformer T1 and the filtering circuit 200, and a cathode thereof electrically connects to connecting end 401 for electrically connecting to both power converter 400 and connecting end 5001. A third end of controller U1 electrically connects to power switch Q1. An end of power switch Q1 electrically connects to a fifth electrically connecting point between diode D3 and transformer T1. Controller U1 may further electrically connects to a sampling circuit (a connecting point between resistor R2 and capacitor C3 electrically connects to the controller U1, and capacitor C3 electrically connects to resistor R3 in parallel) and other circuits as shown in FIG. 77.

It should be noted that, the PFC circuit may have various implementation manners or circuit configurations, all which can be applied to the invention, so they would not be described here.

Figure 75:
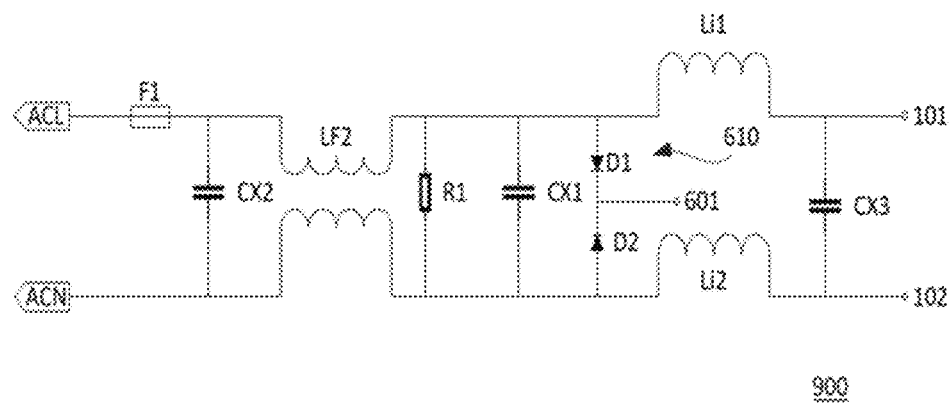
FIG. 75 is a circuit diagram of an EMI reduction circuit of an embodiment of the invention.
Figure 79:
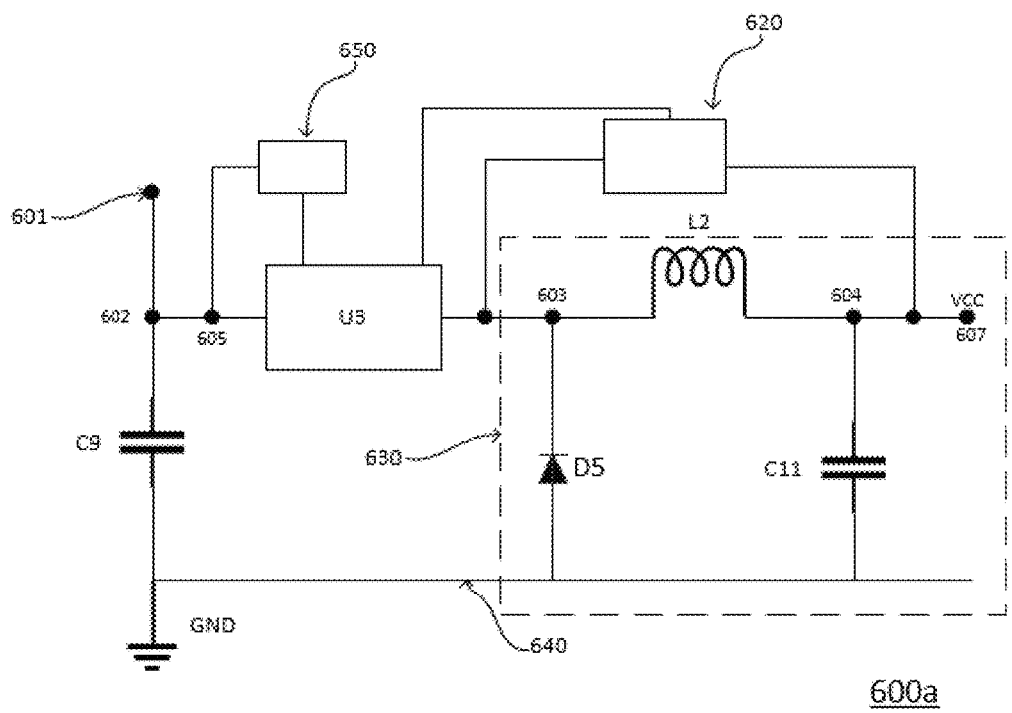
FIG. 79 is a circuit diagram of a bias generator of an embodiment of the invention.

FIG. 79 is a circuit diagram of a bias generating circuit of the first embodiment of the invention. As shown in FIGS. 75 and 79, bias generating circuit 600a may include an electricity obtainer 610, a switch controller U3 and an energy storage flyback unit 630. Electricity obtainer 610 electrically connects to both the input ends (ACN, ACL) and switch controller U3. Switch controller U3 electrically connects to energy storage unit 630 having an output end 607 for outputting a working voltage (VCC). Output end 607 electrically connects to power converter 400 to provide the working voltage (VCC) to the power converter 400.

Switch controller U3 controls switching frequency of the energy storage unit 630 according to an electricity obtaining signal from the electricity obtainer 610 to generate the working voltage of the power converter 400 and uses the output end 607 to output the working voltage to the power converter 400. The switch controller U3 is activated by responding to the electricity obtaining signal from the electricity obtainer 610 and repeatedly switches on and off to periodically charge and discharge by controlling conducting time of the energy storage unit 630. And diode D5 is used to keep flyback. Thus, the working voltage of the power converter 400 is formed and is output to the power converter 400 through the output end 607.

In an embodiment, the electricity obtainer 610 can convert AC driving signal into DC electricity obtaining signal which are equal to the AC driving signal. As shown in FIGS. 75 and 79, electricity obtainer 610 can be implemented by a second rectifying circuit (hereinafter "second rectifying circuit 610"). Second rectifying circuit 610 includes a first diode D1 and a second diode D2, which are electrically connected in series with opposite polarity (i.e. cathodes of diodes D1 and D2 are electrically connected together). Second rectifying circuit 610 has an electricity obtaining end 601 between diodes D1 and D2. The electricity obtaining end 601 electrically connects to the switch controller U3. By the opposite polarity, the two diodes D1 and D2 rectify the AC driving signal to output DC driving signal at the electricity obtaining end 601.

In detail, the electricity obtaining end 601 further electrically connects to an end of first capacitor C9, and the other end thereof electrically connects to the ground end GND. Switch controller U3 electrically connects to an end of inductor L2, and the other end thereof connects to the output end 607. Inductor L2 can perform both energy storage and release and maintain the current continuity when switch controller U3 is switching.

In this embodiment, energy storage flyback unit 630 may include an inductor L2, a third diode D5 and a second capacitor C11. A cathode of the third diode D5 connects to a connecting end 603 disposed between the switch controller U3 and inductor L2. An anode of third diode D5 connects to ground end GND. An end of second capacitor C11 electrically connects to a second connecting end 604 disposed between inductor L2 and the output end 607. The other end of second capacitor C11 electrically connects to the ground end GND. an end of a load resistor electrically connects to a third connecting end (not shown in FIG. 75) disposed between the second connecting end 604 and the output end 607. The other end of the load resistor electrically connects to ground end GND.

Further, switch controller U3 may be a MOSFET switch or an IC ship integrated with a MOSFET switch. Of course, in some embodiments, switch controller U3 may be a BJT switch. Switch controller U3 has multiple connecting ends (also called connecting port). An electricity obtaining branch is formed between the electricity obtaining end 601 and the ground end GND. The first capacitor C9 is connected in the electricity obtaining branch in series. At least one connecting end of switch controller U3 electrically connects to the electricity obtaining end 601 through the electricity obtaining branch. A branch at which both the electricity obtaining branch and capacitor C9 are located electrically connects to the electricity obtaining end 601 through the fourth connecting end 602. The ground end GND electrically connected to a grounding line 640. All of the third diode D5, the second capacitor C11 and the load resistor electrically connect to the grounding line 640.

The bias generating circuit 600 may be further provided with a sampling circuit to sample its working status and to be a reference of output signal of the switch controller. In addition, in the practical application, switch controller U3 may be a chip or IC integrated with at least a control circuit and a power switch, but the present invention is not limited thereto.

For example, the sampling circuit may include a first sampling circuit 650 and a second sampling circuit 620. First sampling circuit 650 electrically connects to both the electricity obtaining end 601 (forming a connecting point 605 in FIG. 79) and switch controller U3. The second sampling circuit 620 electrically connects to both the output end 607 and switch controller U3. Switch controller U3 outputs a stable working voltage according to sampling signal from both the first sampling circuit 650 and second sampling circuit 620. Configuration of the sampling circuit is related to the control manner of switch controller U3, the invention is not limited to this. FIG. 79 is a circuit diagram of the bias generating circuit of the first embodiment of the invention.

Figure 80:
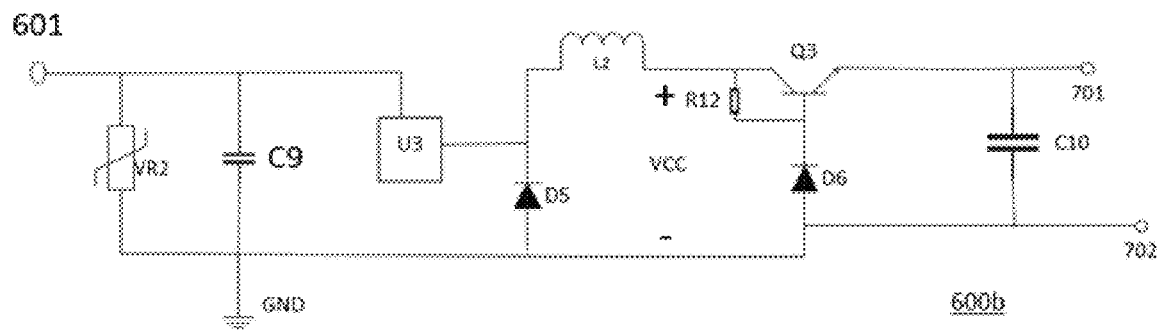
FIG. 80 is a circuit diagram of a bias generator of another embodiment of the invention.
Figure 81:
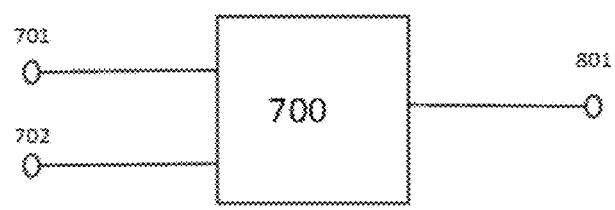
FIG. 81 is a circuit diagram of a temperature detector of an embodiment of the invention.

In other embodiments, the bias generating circuit may also be used for providing a working voltage to a temperature sensing circuit 700. FIG. 80 is a circuit diagram of the bias generating circuit of the second embodiment of the invention. FIG. 81 is a circuit diagram of a temperature sensing circuit of an embodiment of the invention. As shown in FIGS. 80 and 81, the temperature sensing circuit 700 electrically connects to power converter 400 for sending temperature detecting signal to power converter 400. The temperature sensing circuit 700 has a temperature sensor electrically connecting to bias generating circuit 600*b* to make bias generating circuit 600*b* provide a working voltage to temperature sensing circuit 600*b*.

In this embodiment, in comparison with the embodiment shown in FIG. 79, the bias generating circuit 600*b* of this embodiment further includes a transistor Q3, a diode D6, a resistor R12 and a capacitor C10. Transistor Q3 may be a BJT as an example (hereinafter refer as BJT Q3). The temperature detector 700 electrically connects to BJT Q3 of the bias generating circuit 600*b*. The collector of BJT Q3 electrically connects to output end 607. The base of BJT Q3 electrically connects to the grounding line with the ground end GND.

The temperature sensing circuit 700 is activated by responding to the working voltage provided by the bias generating circuit 600*b* through the connecting ends 701 and 702 and feeds temperature data (Vtemp) back to the controller U2 of the power converter 400. When a temperature exceeds a threshold value (indicating a situation of overheating), the controller U2 of the power converter 400 would reduce output power to decrease temperature and guarantee the safety during operation.

Figure 82:
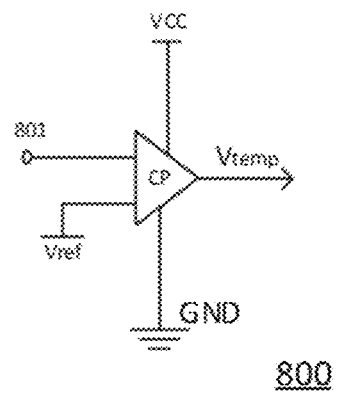
FIG. 82 is a circuit diagram of a temperature compensator of an embodiment of the invention.

Moreover, as shown in FIG. 82, the temperature sensing circuit 700 further electrically connects to a temperature compensator 800. FIG. 82 is circuit diagram of a temperature compensator of an embodiment of the invention. Temperature sensing circuit 700 electrically connects between temperature compensator 800 and bias generating circuit 600*b*. Temperature compensator 800 electrically connects to power converter 400.

Temperature compensator 800 makes a reference temperature of a free end of the temperature sensing circuit more reasonable. The temperature compensator 800 in this embodiment can be implemented by a comparator CP (but not limited to this). An input end of comparator CP receives a voltage, indicating a temperature information, through connecting end 801 and compares the voltage indicating the temperature information with a reference voltage Vref of another input end of comparator CP, such that whether the temperature sensed by the temperature sensing circuit 700 exceeds a threshold value can be determined and a temperature sensing result signal Vtemp indicating whether the sensed temperature exceeds a threshold value is generated at an output end of the comparator CP. The output end of the temperature compensator 800 electrically connects to the controller U2 of the power converter 400 to make the temperature sensing result signal Vtemp fed back to controller U2 of power converter 400, so that controller U2 can adjust the output power depending on the system environment temperature.

In another embodiment, the temperature compensator 800 may have a regulator diode and a thermistor. After the thermistor, the temperature compensator 800 electrically connects to an amplifier through an adjustable potentiometer. A negative end of the amplifier electrically connects to an output end of the temperature compensator 800.

In detail, a circuit diagram of the temperature compensator 800 may be as shown in FIG. 82. It should be noted that, the temperature compensator 800 can be implemented by various manners. The invention is not limited to the circuit shown in FIG. 82.

The invention further provides a high power LED lamp including an LED light source 500 and a power supply module as abovementioned connecting with the LED light source 500. In some embodiments, the high power LED lamp means all types of LED lamps whose output power exceeds 30 w, LED lamps which are equivalent to xenon lamps with output power of at least 30 W or LED lamps using high power lamp beads (e.g. lamp beads with rated current above 20 mA).

All digital values mentioned in the description include all values between an upper limit and a lower limit with upper or lower values of increment or decrement by one unit, an interval of at least two units between any lower value and its higher value is available. For example, if a value of a recited quantity of an element or a process variable (e.g. temperature, pressure, time, etc.) is between 1 and 90, preferably, between 20 and 80, more preferably, between 30 and 70, it means inclusion of between 15 and 85, between 22 and 68, between 43 and 51, between 30 and 32, etc. For a value less than 1, one unit may be properly deemed as 0.0001, 0.001, 0.01 and 0.1. This merely intents to clearly express exemplary values. That is, all values and their combinations between the lowest value and the highest value are included in ranges described in the specification.

Unless otherwise defined, all ranges used herein include two end points and all numbers therebetween. The terms "approximately", "about" or "similar" associated with the ranges are suitable for the two endpoints of the range. Thus, "about 20 to 30" intents to cover "about 20 to about 30", and at least includes the two endpoints indicated.

It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Multiple elements, compositions, parts or steps can be provided by a single integrated element, composition, part or step. Contrarily, a single integrated element, composition, part or step can be divided into multiple separate elements, compositions, parts or steps. As used herein, the singular forms "a", "an" and "the" are intended to include the plural forms as well, unless the context clearly indicates otherwise.

It should be understood that the above description is for the purpose of describing particular embodiments only and is not intended to be limiting of the disclosure. Although the present disclosure is illustrated and described with reference to specific embodiments, those skilled in the art will understand that many variations and modifications are readily attainable without departing from the spirit and scope thereof as defined by the appended claims and their legal equivalents.

The above depiction has been described with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

What is claimed is:

1. An LED (light emitting diode) lamp comprising:
   a lamp shell;
   a passive heat dissipating element having a heat sink connected to the lamp shell, wherein the heat sink comprises fins and a base;
   a power source disposed in the lamp shell;
   a light board connected to the base of the passive heat dissipating element and comprising LED chips electrically connected to the power source; and
   a first heat dissipating channel formed in a first chamber of the lamp shell for dissipating heat generated from the power source while the LED lamp is working;
   wherein the first heat dissipating channel comprises a first end on the light board to allow air flowing from outside of the LED lamp into the first chamber, and a second end on the upper portion of the lamp shell to allow air flowing from inside of the first chamber out of the LED lamp.

2. The LED lamp of claim 1, wherein a second heat dissipating channel formed between the fins and the base of the heat sink for dissipating the heat generated from the LED chips and transferred to the heat sink.

3. The LED lamp of claim 2, wherein the second heat dissipating channel comprises a third end on the light board to allow air flowing from outside of the LED lamp into the second heat dissipating channel, and flowing out from spaces between every adjacent two of the fins.

4. The LED lamp of claim 1, wherein a weight of the heat sink accounts for at least 50% of that of the LED lamp, and a volume of the heat sink accounts for at least 20% of an overall volume of the LED lamp.

5. The LED lamp of claim 4, wherein a volume of the heat sink accounts for 20%~60% of an overall volume of the LED lamp.

6. The LED lamp of claim 4, wherein the heat sink comprises first fins and second fins, bottoms of both the first fins and the second fins in an axis of the LED lamp connect to the base, the first fins interlace with the second fins at regular intervals, and each of the second fins is of a Y-shape.

7. The LED lamp of claim 2, further comprising a lamp cover with a light output surface and an end surface, wherein the end surface is formed with a vent to let air flowing from outside of the LED lamp into both the first heat dissipating channel and the second heat dissipating channel through the vent.

8. The LED lamp of claim 7, wherein a ratio of area of the light output surface to area of the end surface is 4~7.

9. The LED lamp of claim 7, wherein a ratio of area of the lamp cover to area of the end surface is 6~7.

10. The LED lamp of claim 7 further comprising an inner reflecting surface disposed inside the light output surface of the lamp cover, wherein the inner reflecting surface is disposed in a position of an inner circle of the array of the LED chips.

11. The LED lamp of claim 10 further comprising an outer reflecting surface disposed in the outer circle of the array of the LED chips, wherein the outer reflecting surface is set to correspond to the LED chips on the light board.

12. The LED lamp of claim 11, wherein the inner reflecting surface is configured to reflect part of light emitted from the innermost LED chips of the array of LED chips, the outer reflecting surface is configured to reflect part of light emitted from the outermost LED chips of the array of LED chips, and the outermost LED chips of the array of LED chips are greater than the innermost LED chips of array of LED chips in number, and the outer reflecting surface is greater than the inner reflecting surface in area.

13. The LED lamp of claim 12, wherein a relationship as follows is satisfied between the LED chips and the inner and outer reflecting surface:

$$(A1/N1):(A2/N2)=0.4{\sim}1$$

where A1 and A2 respectively represent area of the inner and outer reflecting surface;
where N1 and N2 respectively represent number of the innermost and outermost of the array of LED chips of the light board.

14. The LED lamp of claim 11, wherein an angle is formed between two extending lines of both the inner and outer reflecting surfaces, and the angle is between 80 degrees and 150 degrees.

15. The LED lamp of claim 7 further comprising a second chamber formed between the lamp cover and the light board, and the light board and the LED chips of the light board are located in the second chamber.

16. The LED lamp of claim 7, wherein the distance between the light output surface and the light board is gradually outwardly larger and larger, such that the light output surface is made concave in shape.

17. The LED lamp of claim 2 further comprising a third heat dissipating channel formed between adjacent two of the fins or in a space between two sheets extending from a single of the fins of the heat sink, such that air flows from outside of the LED lamp into the third heat dissipating channel through the radial outer portion of the LED lamp to bring out heat radiated from the heat sink to air.

18. The LED lamp of claim 1, wherein the base of the heat sink further has a lower end located under the base and protruding from the light board in an axis direction of the LED lamp.

19. The LED lamp of claim 1, wherein the fins of the heat sink comprises a first portion and a second portion in a radial direction of the LED lamp, and the first portion is less than the second portion in curvature.

20. The LED lamp of claim 1, wherein the heat sink includes first heat dissipating units and second heat dissipating units, both the first heat dissipating units and the second heat dissipating units are of fin type; wherein each of the first heat dissipating units includes a first fin radially arranged on the heat sink and a radial first channel, the first channel is a gap between two of the first heat dissipating units.

* * * * *